US011442700B2

United States Patent
Rossi et al.

(10) Patent No.: US 11,442,700 B2
(45) Date of Patent: Sep. 13, 2022

(54) HARDWARE ACCELERATOR METHOD, SYSTEM AND DEVICE

(71) Applicants: STMICROELECTRONICS S.R.L., Agrate Brianza (IT); STMicroelectronics International N.V., Geneva (CH)

(72) Inventors: Michele Rossi, Salerno (IT); Giuseppe Desoli, San Fermo Della Battaglia (IT); Thomas Boesch, Rovio (CH); Carmine Cappetta, Battipaglia (IT)

(73) Assignees: STMICROELECTRONICS S.r.l., Agrate Brianza (IT); STMicroelectronics International N.V., Geneva (CH)

( * ) Notice: Subject to any disclaimer, the term of this patent is extended or adjusted under 35 U.S.C. 154(b) by 155 days.

(21) Appl. No.: 16/833,340

(22) Filed: Mar. 27, 2020

(65) Prior Publication Data

US 2020/0310761 A1    Oct. 1, 2020

Related U.S. Application Data

(60) Provisional application No. 62/826,861, filed on Mar. 29, 2019.

(51) Int. Cl.
*G06F 7/72* (2006.01)
*H03M 7/18* (2006.01)

(52) U.S. Cl.
CPC .............. *G06F 7/729* (2013.01); *G06F 7/722* (2013.01); *G06F 7/724* (2013.01); *G06F 7/727* (2013.01); *H03M 7/18* (2013.01)

(58) Field of Classification Search
CPC .. H03M 7/18; G06N 3/04; G06N 3/06; G06N 3/063; G06F 7/722; G06F 7/724; G06F 7/727; G06F 7/729; G06F 7/5443
See application file for complete search history.

(56) References Cited

U.S. PATENT DOCUMENTS 10,387,122 B1   8/2019 Olsen
2019/0189172 A1   6/2019 Higo et al.
(Continued)

OTHER PUBLICATIONS

F. Pourbigharaz et al., Modulo-fee Architecture for Binary to Residue Transformation with respect to Residue Transformation with respect to {2m-1, 2m, 2m+1} Moduli Set, Proceedings of IEEE International Symposium on Circuits and Systems—ISCAS '94, 1994 (Year: 1994).*

(Continued)

*Primary Examiner* — Emily E Larocque
(74) *Attorney, Agent, or Firm* — Seed Intellectual Property Law Group LLP

(57) ABSTRACT

A system includes an addressable memory array, one or more processing cores, and an accelerator framework coupled to the addressable memory. The accelerator framework includes a Multiply ACcumulate (MAC) hardware accelerator cluster. The MAC hardware accelerator cluster has a binary-to-residual converter, which, in operation, converts binary inputs to a residual number system. Converting a binary input to the residual number system includes a reduction modulo $2^m$ and a reduction modulo $2^m-1$, where m is a positive integer. A plurality of MAC hardware accelerators perform modulo $2^m$ multiply-and-accumulate operations and modulo $2^m-1$ multiply-and-accumulate operations using the converted binary input. A residual-to-binary converter generates a binary output based on the output of the MAC hardware accelerators.

25 Claims, 59 Drawing Sheets

(56) References Cited

U.S. PATENT DOCUMENTS

2019/0244646 A1 8/2019 Lee et al.
2019/0245137 A1 8/2019 Choi et al.

OTHER PUBLICATIONS

Abdelhamid et al., "Applying the Residue Number System to Network Inference," arXiv: 1712.04614v1: 2017, 5 pages.
Adamidis, et al., "RNS multiplication/sum of squares units", *IET Comput. Digit. Tech.*, vol. 1(1) 2007, pp. 38-48.
Andraos, "A New Efficient Memoryless Residue to Binary Converter", *IEEE Transactions on Circuits and Systems*, vol. 35(11), 1988, pp. 1441-1444.
Ansuura, et al., "Optimizing the New Chinese Remainder Theorem 1 for the Moduli Set {2(2n+2)+3,2(2n+1)+1,22n+1,2}", *International Journal of Computer Applications*, vol. 148(4), 2016, 7 pages.
Arrigoni et al., "Approximate operations in Convolutional Neural Networks with RNS data representation," *Proceedings of the European Symposium on Artificial Neural Networks, Computational Intelligence and Machine Learning*, Bruges, Belgium, Apr. 26-28, 2017, 6 pages.
Ba et al., "Do Deep Nets Really Need to be Deep?", ArXiv, 2014, 9 pages.
Bankas, "A Modified RNS-to-Binary Converter Scheme for {2(2n+1)-1,2(2n+1),22n-1} Moduli Set", *14th IEEE International New Circuits and Systems Conference*, 2016, 4 pages.
Brunel et al., "Single neuron dynamics and computation", *Current Opinion in Neurobiology*, vol. 25, 2014, pp. 149-155.
Curiger et al., "Regular VLSI Architectures for Multiplication Modulo 2n+1", *IEEE Journal of Solid State Circuits,*, vol. 26(7), 1991, pp. 990-994.
Cybenko, "Approximation by superpositions of a Sigmoidal Function", *Mathematics of Control, Signals, and Systems*, vol. 2, 1989, pp. 303-314.
Dhanabal R et al., "Implementation of Floating Point Mac Using Residue No. System," *International Conference on Reliability, Optimization and Information Technology*, Faridabad, India, Feb. 6-8, 2014, pp. 461-465.
Dimitrakopoulos et al., "New Architectures for Modulo 2N-1 Adders", *12th IEEE International Conference on Electronics, Circuits and Systems*, 2005, 4 pages.
Dumoulin, et al., "A guide to convolution arithmetic for deep learning", ArXiv, 2018, 31 pages.
Efstathiou, "Area time efficient modulo 2n-1 adder design", *IEEE Transactions on Circuits and Systems*, vol. 41(7), 1994, pp. 463-467.
Efstathiou, "Fast parallel prefix modulo 2n+1 adders", *IEEE Transactions on Computer*, vol. 53(9), 2004, pp. 1211-1216.
Efstathiou et al., "Modulo 2n±1 Fused Add Multiply Units", *IEEE Computer Society Annual Symposium on VLSI*, 2015.
Efstathiou et al., "Modified Booth Modulo 2n-1 Multipliers", *IEEE Transactions on Computers*, vol. 53(3), 2004, pp. 370-374.
Elleithy et al., "A systolic architecture for modulo multiplication", *IEEE Transactions on Circuits and Systems*, vol. 42(11), 1995, pp. 725-729.
Goodfellow et al, *Deep Learning*. MIT Press, 2015, 705 pages.
Goniemat, "A High Speed Residue to Binary Converter for Three Moduli {2(2n+2)-1,2(2n+1)-1,2n } set", *Engineering and Technology Computer Basics and Applied Science*, vol. 10(4), 2013, p. 297-305.
Han et al., "Learning both Weights and Connections for Efficient Neural Networks", ArXiv, 2015, 9 pages.
Hartley, et al., *Digit-Serial Computation*, Springer Science+Business Media, LLC, 1995, 312 pages.
Hiasat, "An Efficient Reverse Converter for the Three Moduli Set $(2^{n-1}-1, 2^n, 2^n-1)$", *IEEE Transactions on Circuits and Systems*, 2017, vol. 64(8), pp. 962-966.
Kalampoukas et al., "High Speed Parallel Prefix Modulo $2^n-1$ Adders", *IEEE Transactions on Computer*, vol. 49(7), 2000, pp. 673-680.
Karpathy, "Notes from Stanford CS class CS231n: Convolutional Neural Networks for Visual Recognition", http://cs231n.github.io/, 112 pages.
Karthik, et al., "Efficient Reverse Converters Designs for RNS based Digital Signal Processing Systems", *IEEE 2nd Global Conference on Consumer Electronics*, 2013, pp. 153-154.
Kucherov et al., "A High Speed Residue to Binary Converter Based on Approximate Chinese Remainder Theorem", *IEEE Conference of Russian Young Researchers in Electrical and Electronic Engineering*, 2018, pp. 325-328.
LeCun, et al., "Convolutional networks for images, speech, and time series", *The Handbook of Brain Theory and Neural Networks*, vol. 3361, 1995, 14 pages.
Murthy, et al., "Modulo $2^n\pm1$ Adder/Subtractors for DSP", *International Conference on Energy, Communication, Data Analytics and Soft Computing*, 2017, pp. 715-720.
Nakahara et al., "A Deep Convolutional Neural Network Based on Nested Residue Number System," *25th International Conference on Field Programmable Logic and Applications (FPL)*, London, United Kingdom, Sep. 2-4, 2015, 6 pages.
Nakahara et al., "A Deep Convolutional Neural Network Based on Nested Residue Number System," PowerPoint presentation, *25th International Conference on Field Programmable Logic and Applications (FPL)*, London, United Kingdom, Sep. 2-4, 2015, 28 pages.
Nakahara et al., "A High speed Low power Deep Neural Network on an FPGA based on the Nested RNS: Applied to an Object Detector", *IEEE International Symposium on Circuits and Systems*, 2018, 5 pages.
Olsen, "RNS Hardware Matrix Multiplier for High Precision Neural Network Acceleration", *IEEE International Symposium on Circuits and Systems*, 2018, 5 pages.
Ohkubo et al., "A 4.4-ns CMOS 54×54-b Multiplier Using Pass-transistor Multiplexer", *IEEE 1994 Custom Integrated Circuits Conference*, 1994, pp. 599-602.
Omodi, "Residue Number Systems: Theory and Implementation", Imperial College Press, 2007, 311 pages.
Pierstrak, "Design of Residue Generators and Multi-Operand Modular Adders User Carry-Save Adders", *Proceedings 10th IEEE Symposium on Computer Arithmetic*, 1991, pp. 100-107.
Piestrak, "Design of cost-efficient multipliers modulo 2a—1", *Proceedings of IEEE International Symposium on Circuits and Systems*, 2010, pp. 4093-4096.
Prakash et al., "Low-Power Radix-8 Booth Encoded Modulo $2^n-1$ Multiplier with Adaptive Delay," *Proceedings of the Second International Conference on Emerging Research in Computing, Information, Communicating and Applications*, Bangalore, India, Aug. 1-2, 2014, 8 pages.
Premkumar, "A Formal Framework for Conversion From Binary to Residue Numbers", *IEEE Transactions on Circuits and Systems*, vol. 49(2), 1988, pp. 135-144.
Rossi, "Convolutional Neural Networks," thesis, STMicroelectronics' Advanced Systems Technology Group, 142 p. 2019.
Samimi et al., "Res-DNN: A Residue Number System-Based DNN Accelerator Unit," *IEEE Transactions on Circuits and Systems—I: Regular Papers* 67(2):658-671.
Shedletsky, "Comment on the sequential and indeterminate behavior of an end-around-carry adder", *IEEE Transactions on Computers*, 1977, pp. 271-272.
Soderstrand et al., "A High-Speed Low-Cost Modulo $P_i$ Multiplier with RNS Arithmetic Applications", *Proceedings of the IEEE*, vol. 68(4), 1980, pp. 529-532.
Taylor, "Large Moduli Multiplier for Signal Processing", *IEEE Transactions on Circuits and Systems*, vol. 28(7), 1981, pp. 731-736.
Wang et al., "An Improved Residue-to-Binary Converter", *IEEE Transactions on Circuits and Systems*, vol. 47(9), 2000, pp. 1437-1440.
Wang, "Residue-to-Binary Converters Based on New Chinese Remainder Theorums", *IEEE Transactions on Circuits and Systems*, vol. 47(3), 2000, pp. 197-205.

(56) References Cited

OTHER PUBLICATIONS

Zhou et al., "Computation of optical flow using a neural network", *IEEE International Conference on Neural Networks*, 1988, pp. 71-78.
Zimmerman, "Efficient VLSI implementation of modulo 2n–1 addition and multiplication", *Proceedings, 14th Symposium on Computer Arithmetic*, 1999, 10 pages.
Parhami, Computer Arithmetic, Oxford University Press, Oxford, United Kingdom, 2000, 513 pages.
Szabo et al., Residue Arithmetic and its Applications to Computer Technology, McGraw-Hill Book Company, New York, New York, 1967, 262 pages.
Wakerly, "One's complement adder eliminates unwanted zero", Electronics 16:103-105, 1976.

\* cited by examiner

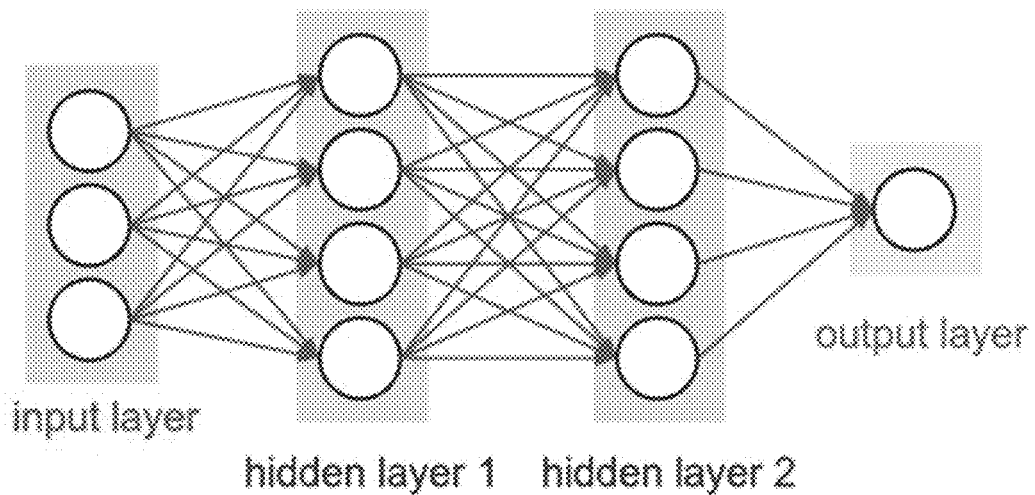
*Fig. 9*
| Three hidden neurons | Six hidden neurons | Twenty hidden neurons |
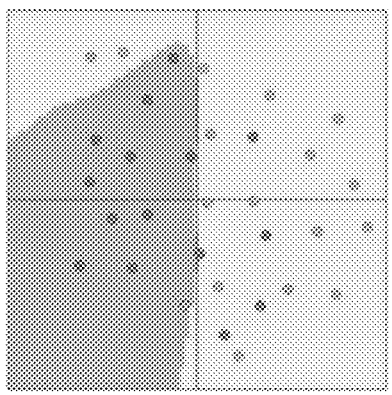 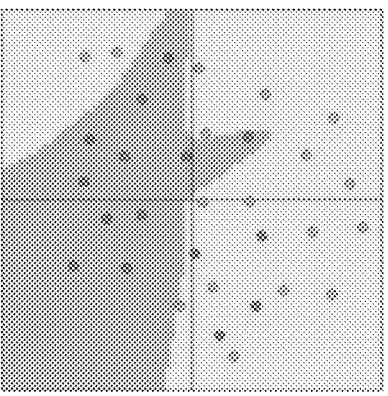 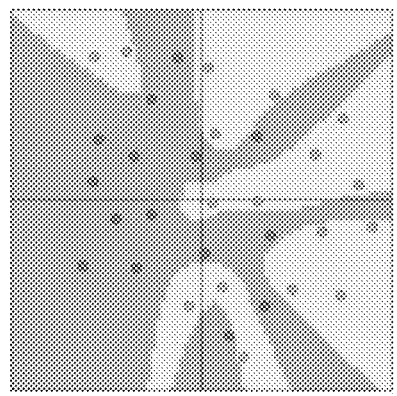
*Fig. 10*

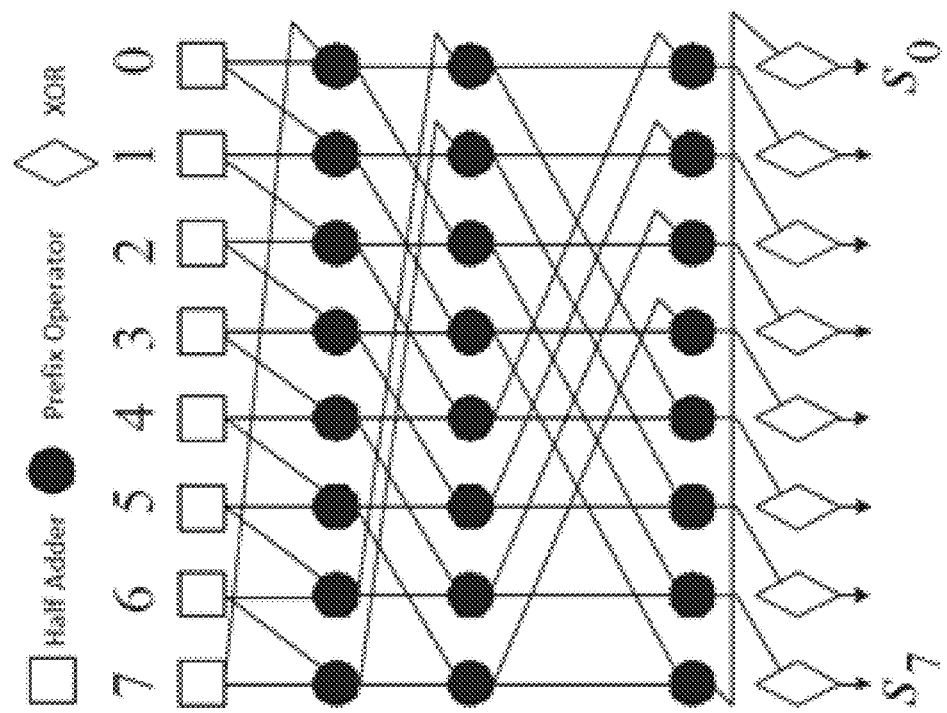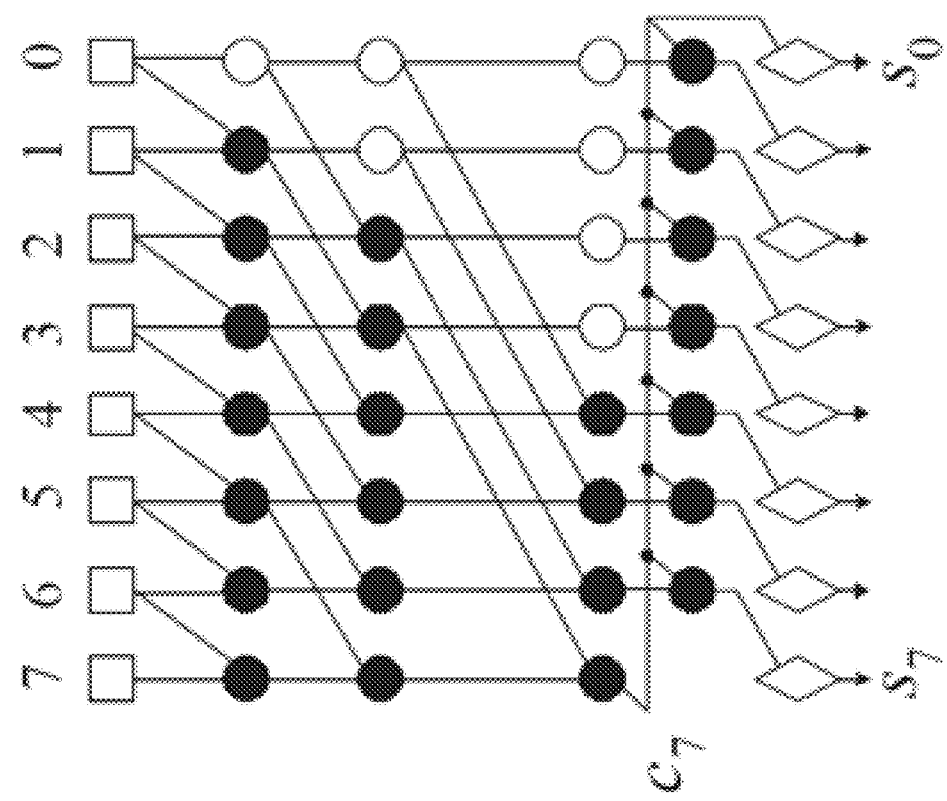
Fig. 31

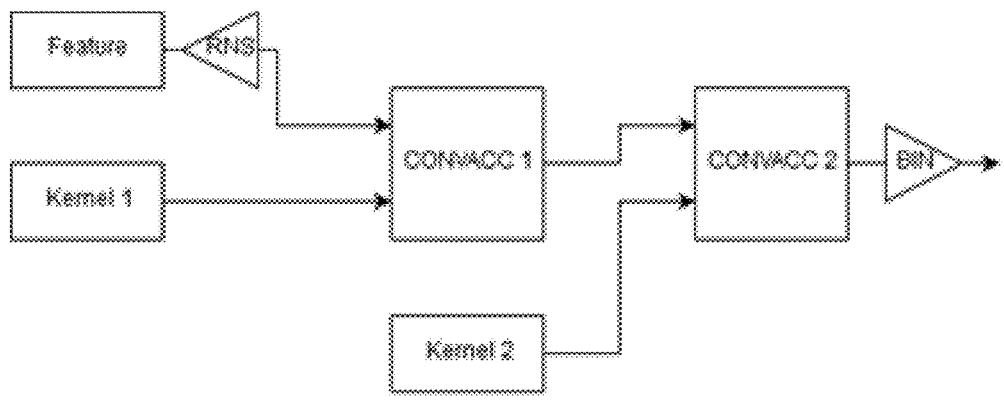
*Fig. 46A*
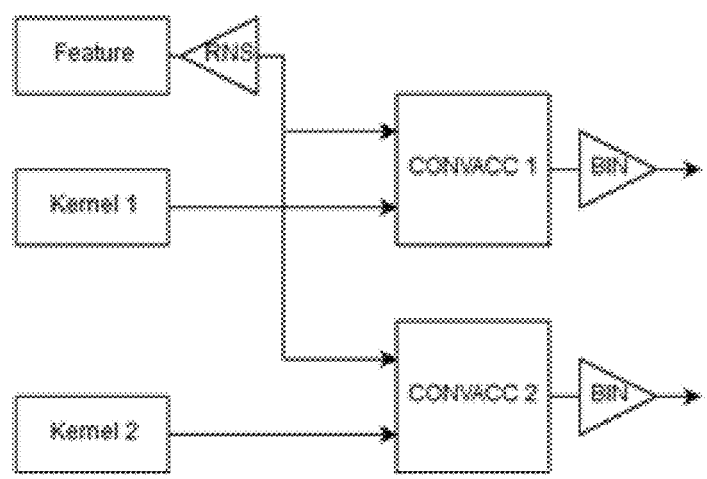
*Fig. 46B*
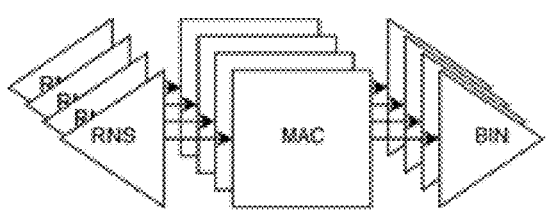 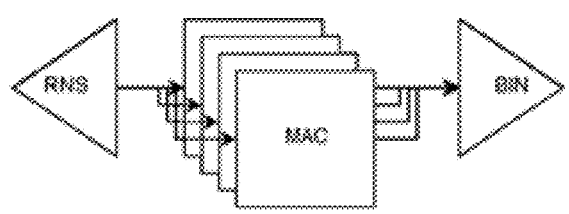
*Fig. 47A*  *Fig. 47B*

HARDWARE ACCELERATOR METHOD, SYSTEM AND DEVICE

TECHNICAL FIELD

The present disclosure generally relates to deep convolutional neural networks (DCNN).

DESCRIPTION OF THE RELATED ART

Known computer vision, speech recognition, and signal processing applications benefit from the use of deep convolutional neural networks (DCNN). A seminal work in the DCNN arts is "Gradient-Based Learning Applied To Document Recognition," by Y. LeCun et al., Proceedings of the IEEE, vol. 86, no. 11, pp. 2278-2324, 1998, which led to winning the 2012 ImageNet Large Scale Visual Recognition Challenge with "AlexNet." AlexNet, as described in "ImageNet Classification With Deep Convolutional Neural Networks," by Krizhevsky, A., Sutskever, I., and Hinton, G., NIPS, pp. 1-9, Lake Tahoe, Nev. (2012), is a DCNN that significantly outperformed classical approaches for the first time.

A DCNN is a computer-based tool that processes large quantities of data and adaptively "learns" by conflating proximally related features within the data, making broad predictions about the data, and refining the predictions based on reliable conclusions and new conflations. The DCNN is arranged in a plurality of "layers," and different types of predictions are made at each layer.

Nowadays, the most successful class of machine learning algorithms are those based on Deep Learning: taking inspiration from the interconnected structure of actual brains, Artificial Neural Networks are set up in a layer-wise architecture, with the number of layers determining the depth of the network. This architecture allows the machine to learn complex ideas by means of simpler one, organizing the knowledge in a hierarchy of concepts.

Most neural networks are used to perform those tasks that are very easy for human beings, like visual or speech recognition; in general, every task that utilizes classification.

For example, if a plurality of two-dimensional pictures of faces is provided as input to a DCNN, the DCNN will learn a variety of characteristics of faces such as edges, curves, angles, dots, color contrasts, bright spots, dark spots, etc. These one or more features are learned at one or more first layers of the DCNN. Then, in one or more second layers, the DCNN will learn a variety of recognizable features of faces such as eyes, eyebrows, foreheads, hair, noses, mouths, cheeks, etc.; each of which is distinguishable from all of the other features. That is, the DCNN learns to recognize and distinguish an eye from an eyebrow or any other facial feature. In one or more third and then subsequent layers, the DCNN learns entire faces and higher order characteristics such as race, gender, age, emotional state, etc. The DCNN is even taught in some cases to recognize the specific identity of a person. For example, a random image can be identified as a face, and the face can be recognized as Orlando Bloom, Andrea Bocelli, or some other identity.

In other examples, a DCNN can be provided with a plurality of pictures of animals, and the DCNN can be taught to identify lions, tigers, and bears; a DCNN can be provided with a plurality of pictures of automobiles, and the DCNN can be taught to identify and distinguish different types of vehicles; and many other DCNNs can also be formed. DCNNs can be used to learn word patterns in sentences, to identify music, to analyze individual shopping patterns, to play video games, to create traffic routes, and DCNNs can be used for many other learning-based tasks too.

SUMMARY

In an embodiment, a system comprises: an addressable memory array; one or more processing cores; and an accelerator framework coupled to the addressable memory and including a Multiply ACcumulate (MAC) hardware accelerator cluster, the MAC hardware accelerator cluster having: a binary-to-residual converter, which, in operation, converts binary inputs to a residual number system, wherein converting a binary input to the residual number system includes a reduction modulo $2^m$ and a reduction modulo $2^m-1$, where m is a positive integer; a plurality of MAC hardware accelerators, which, in operation, perform modulo $2^m$ multiply-and-accumulate operations and modulo $2^m-1$ multiply-and-accumulate operations; and a residual-to-binary converter. In an embodiment, the accelerator framework comprises a plurality of MAC hardware accelerator clusters. In an embodiment, the reduction modulo $2^m-1$ is performed based on a property of a periodicity. In an embodiment, the residual-to-binary converter, in operation, performs reduction operations on outputs of the MAC hardware accelerators. In an embodiment, the accelerator framework multiplies input weight values by input feature values, the weight values are stored in the memory array as residual numbers, and the binary-to-residual converter converts feature values to the residual number system. In an embodiment, the residual-to-binary converter, in operation, performs conversions based on the Chinese Remainder Theorem. In an embodiment, the residual-to-binary converter, in operation, performs conversions based on a modified Chinese Remainder Theorem. In an embodiment, a MAC hardware accelerator of the plurality of MAC hardware accelerators includes a seven-bit multiply-and-accumulate circuit, a six-bit multiply-and-accumulate circuit, and a three-bit multiply-and-accumulate circuit. In an embodiment, the reduction modulo $2^m$ is performed using the seven-bit multiply-and-accumulate circuit, the reduction modulo $2^m-1$ is performed using the six-bit multiply-and-accumulate circuit, and the six-bit multiply-and-accumulate circuit comprises two six-bit adders. In an embodiment, the reduction modulo $2^m$ is performed on the m least significant bits of the binary input, and the reduction modulo $2^m-1$ is performed based on a periodicity. In an embodiment, a MAC hardware accelerator of the plurality of MAC hardware accelerators comprises a (m-1)-bit multiplier and a plurality of logic gates. In an embodiment, the MAC hardware accelerator comprises a m-bit adder and a register.

In an embodiment, a Multiply ACcumulate (MAC) hardware accelerator comprises: a binary-to-residual converter, which, in operation, converts binary inputs to a residual number system, wherein converting a binary input to the residual number system includes a reduction modulo $2^m$ and a reduction modulo $2^m-1$, where m is a positive integer; a MAC circuit, which, in operation, performs modulo $2^m$ multiply-and-accumulate operations and modulo $2^m-1$ multiply-and-accumulate operations; and a residual-to-binary converter. In an embodiment, the residual-to-binary converter, in operation, performs reduction operations on outputs of the MAC circuit. In an embodiment, the MAC circuit multiplies input weight values by input feature values, the weight values are retrieved as residual numbers, and the binary-to-residual converter converts feature values to the residual number system. In an embodiment, the MAC circuit includes a seven-bit multiply-and-accumulate circuit, a six-bit multiply-and-accumulate circuit, and a three-bit multiply-and-accumulate circuit. In an embodiment, the reduction modulo $2^m$ is performed using the seven-bit multiply-and-accumulate circuit, the reduction modulo $2^m-1$ is performed using the six-bit multiply-and-accumulate circuit, and the six-bit multiply-and-accumulate circuit comprises two six-bit adders. In an embodiment, the reduction modulo $2^m$ is performed on the m least significant bits of the binary input, and the reduction modulo $2^m-1$ is performed based on a periodicity. In an embodiment, the MAC circuit comprises a (m−1)-bit multiplier and a plurality of logic gates. In an embodiment, the MAC circuit comprises a m-bit adder and a register. In an embodiment, the MAC hardware accelerator comprises a plurality of MAC circuits.

In an embodiment, a method comprises: converting a binary input to a residual number system, the converting including a reduction modulo $2^m$ and a reduction modulo $2^m-1$, where m is a positive integer; multiplying the converted binary input by a second input, the multiplying including a modulo $2^m$ multiply-and-accumulate operation and a modulo $2^m-1$ multiply-and-accumulate operation; and generating a binary output based on a result of the multiplying. In an embodiment, performing the reduction modulo $2^m-1$ based on a property of a periodicity. In an embodiment, the second input is a weight value in a residual number format, and the binary input is a feature value. In an embodiment, the method comprises generating an output of a convolutional neural network based on the binary output. In an embodiment, generating the binary output includes applying the Chinese Remainder Theorem. In an embodiment, generating the binary output includes applying a modified Chinese Remainder Theorem.

BRIEF DESCRIPTION OF THE SEVERAL VIEWS OF THE DRAWINGS

FIG. 9 depicts a schematic diagram of a simplistic convolutional neural network.

FIG. 10 depicts three alternative scenarios in which various quantities of hidden neurons are representationally depicted.

FIGS. 30-32 illustrate various exemplary embodiments of carry-lookahead modulo-based adders.

FIGS. 40A, and 40B-1 and 40B-2, collectively FIG. 40B, illustrate exemplary embodiments of modulo-based adders utilizing periodicity of modulus $2^M-1$.

FIG. 46A illustrates an exemplary architecture for one embodiment of a convolutional acceleration framework utilizing multiple convolution accelerators in a chain arrangement.

FIG. 46B illustrates an exemplary architecture for one embodiment of a convolutional acceleration framework utilizing multiple convolution accelerators in a forked arrangement.

FIG. 47A illustrates an exemplary chained arrangement for sharing converted residue data between multiple MAC units.

FIG. 47B illustrates an exemplary forked arrangement for sharing converted residue data between multiple MAC units.

DETAILED DESCRIPTION

Figure 1:
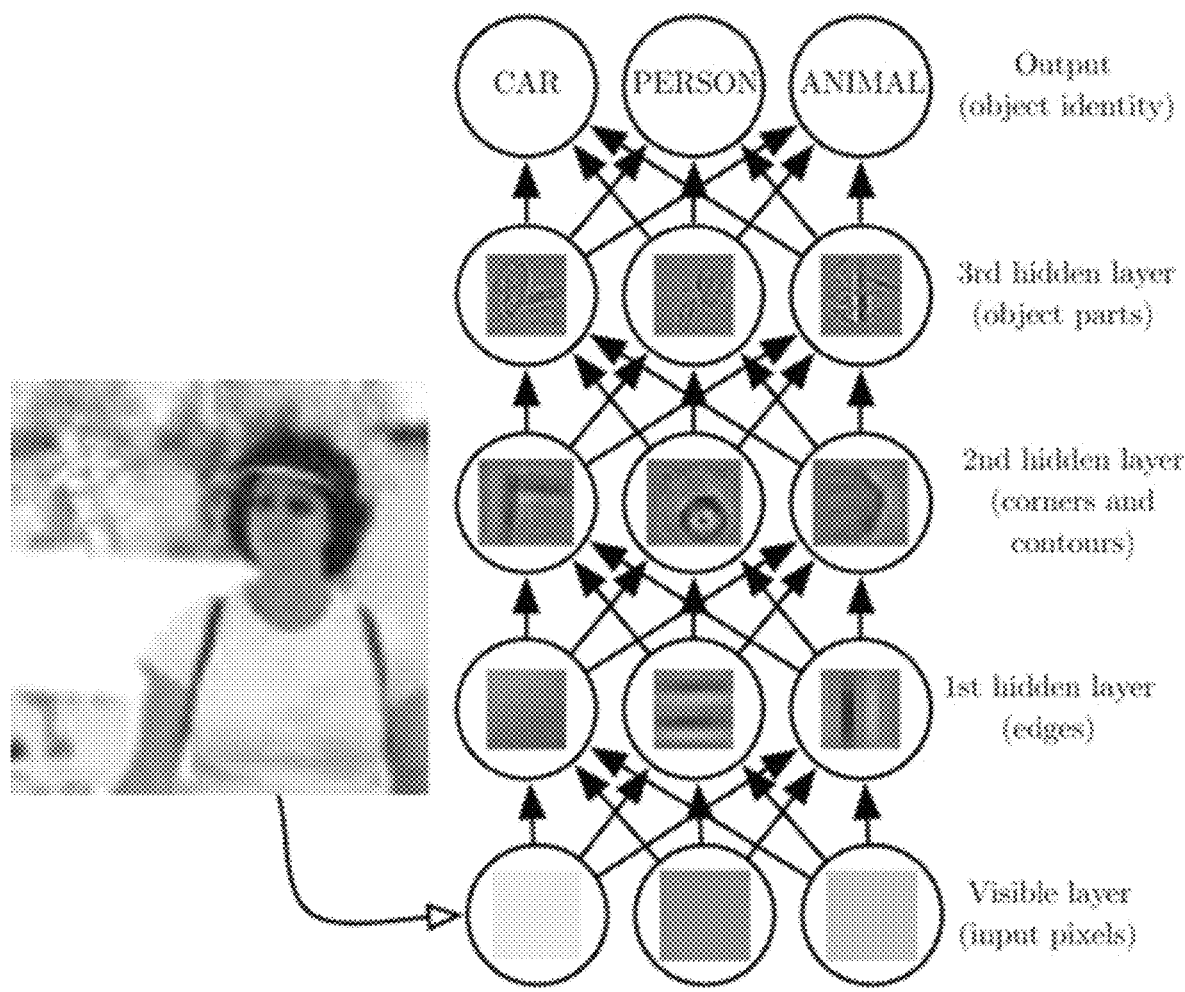
FIGS. 1-2 illustrate schematic overviews of classification tasks, in which images are analyzed by a CNN to classify a subject of those images.

In the following description, certain details are set forth in order to provide a thorough understanding of various embodiments of devices, systems, methods and articles. However, one of skill in the art will understand that other embodiments may be practiced without these details. In other instances, well-known structures and methods associated with, for example, circuits, such as transistors, multipliers, adders, dividers, comparators, transistors, integrated circuits, logic gates, finite state machines, memories, interfaces, bus systems, etc., have not been shown or described in detail in some figures to avoid unnecessarily obscuring descriptions of the embodiments.

Unless the context requires otherwise, throughout the specification and claims which follow, the word "comprise" and variations thereof, such as "comprising," and "comprises," are to be construed in an open, inclusive sense, that is, as "including, but not limited to." Reference to "at least one of" shall be construed to mean either or both the disjunctive and the inclusive, unless the context indicates otherwise.

Reference throughout this specification to "one embodiment," or "an embodiment" means that a particular feature, structure or characteristic described in connection with the embodiment is included in at least one embodiment. Thus, the appearances of the phrases "in one embodiment," or "in an embodiment" in various places throughout this specification are not necessarily referring to the same embodiment, or to all embodiments. Furthermore, the particular features, structures, or characteristics may be combined in any suitable manner in one or more embodiments to obtain further embodiments.

The headings are provided for convenience only, and do not interpret the scope or meaning of this disclosure.

The sizes and relative positions of elements in the drawings are not necessarily drawn to scale. For example, the shapes of various elements and angles are not drawn to scale, and some of these elements are enlarged and positioned to improve drawing legibility. Further, the particular shapes of the elements as drawn are not necessarily intended to convey any information regarding the actual shape of particular elements, and have been selected solely for ease of recognition in the drawings.

Convolutional Neural Networks are typically used in order to process images because they can exploit their stationarity property, and are based on Convolutions and Pooling, operations that ensure some degree of invariance to shift and distortion. The learning capabilities of these networks greatly depend on their depth, thus the computational effort utilized for deep learning is particularly huge.

Moreover, convolutional neural networks have proven very useful in real-time applications, especially mobile or embedded platforms and wearables, where storage and power consumption are constrained. Accelerating convolutions by means of simplification and/or approximation of the computations is relevant for a wide spread of these technologies.

Convolutional neural networks are dominated in complexity by convolutions and matrix products, and residue number systems allow to simplify these operations. Moreover, convolutional nets are tolerant to noise, so the introduction of approximations and small errors has no great impact on performances. In fact, residue numbers do not utilize carry propagation between subsequent digits, reducing the delay paths and consequently the power consumption. However, being the residue number system an integer system, overflow and rounding errors represent obviously an issue. Moreover, operations like relative-magnitude comparison or sign detection are very complex in the residue system, but luckily, they are not utilized in convolutional accelerators. On the other hand, multiplication and addition are key operations, together with the forward conversion from the standard domain to the residue one and the relative backward conversion. Residue numbers show a variety of useful properties that simplify the latter operations.

Described herein is a parametric design for new residual multiply-and-accumulate units; we evaluate their performances in terms of area, power and timing and finally to integrate them in an accelerated Framework for Neural Networks.

A hardware architecture for convolution acceleration in Convolutional Neural Networks (CNNs) is disclosed. To reduce area and power consumption, approximated convolutions are performed, representing data in a Residue Number Systems (RNS) at low precision. The multiply-and-accumulate (MAC) units perform convolutions in the residue domain, while conversion from/to binary numbers is obtained by dedicated converters. RNS hardware implementations performance bottleneck is the backward conversion, thus low-cost moduli set were chosen and further optimization with respect to the state-of-art were performed. In fact, both CNNs and RNS properties were exploited, in particular RNS' property of periodicity and a delayed modulo reduction approach. A comparison with a standard 32-bit MAC is also issued within a Convolution Acceleration Framework (CAF).

I. INTRODUCTION

Intelligent behaviour is considered an unsolved riddle for science. In fact, even considering the complexity of simple brains in the animal kingdom, no satisfying model has yet been developed that can explain some of the most trivial tasks that intelligent life forms can perform.

Moreover, the quest of mimicking intelligent behaviour as can be found in the animal and human kingdoms is still ongoing. Apart from the benefits that would derive from automation of tasks like recognition or self-driving cars, Artificial Intelligence Systems can be employed to execute automatic routine labour, speech or image recognition, medical diagnoses, or be used as a support for scientific and technological research.

Nowadays, computers are built to perform tasks that are very difficult for a human being to complete, such as computations that utilize a very large number of steps and/or a huge quantity of memory to be executed.

Computers behave in a structured, procedural and algorithmic way: their behaviour is hard coded, that is, the space of every operation they can perform is known a priori by the programmer. They follow formal rules that describe exhaustively the outcome of every possible operation.

Hence computers are best suited to be employed in environments where it is easy to quantitatively describe all of their inputs and outputs. However, they struggle to tackle problems which are very easy for the human brain to perform, because they do not have any efficient mechanism of adaptation to the environment.

Even though one could think about hard coding said mechanism of adaptability in the machine, this was shown to be a very difficult task, since there is no efficient way to quantitatively describe the inputs and outputs that a computer should receive for these tasks. For example, determining whether a picture represents an animal or a person would require to hard code an enormous amount of different cases of operation, since there is no mathematical model of what an animal or a man is in terms of pixels.

The solution is to let the computer learn from experience. Just like human beings, the computer should be able to describe the environment with a hierarchy of concepts: starting from the most simple one, such as what a line or a contour is, through the intermediate concepts of geometrical shapes that lines can generate, like eyes or a mouth, and finally to the highest concept of the hierarchy, which can be the concept of a face, made up by the simpler concepts of its parts.

Hence, one could state that knowledge is structured in layers of concepts, and the hierarchy is developed as the number of layers increases.

Obviously, while going deeper and deeper in this hierarchy, one could learn the most complex concepts, built upon all the previous layers of concepts. This is how nowadays Deep Learning could be roughly described.

The first experiments for the development of artificial intelligence followed a knowledge base approach, which includes using an inference engine based on a database of statements described in a certain language. This approach was very unfruitful for the reason explained earlier. Artificial intelligence needed to extract patterns by themselves from raw data, and not to be hard coded with said patterns, because extracting a pattern is somehow a very difficult task to perform in a way that is the most general: that is why this branch of artificial intelligence science is called Machine Learning.

Researchers discovered that the performance of machine learning algorithms has a strong dependency on data representation. An artificial intelligence inputs are usually denoted as features and the internal structure of these features has a strong impact on results (e.g. the fact that an image has a 2D geometry rather than being just a vector of values).

The artificial intelligence's job is to autonomously find patterns and inner correlations lying within the features. Anyway, the artificial intelligence cannot be completely autonomous since it cannot define what a feature is by itself; the programmer must also specify the most useful features in order to correctly infer a solution (e.g. useful features for a face recognition machine learning algorithm can be pictures of faces).

Even though data representation can greatly simplify some tasks, finding the right representation, the useful feats, is not an easy task itself: how can a face be described in terms of pixels? What if there is shadowing, or the shot is taken from a different angle?

The solution to this is letting the artificial intelligence also determine which the best representation of data is: this is called Representation Learning. This is the best approach known to determine the correct representation of data because it has been shown that computers are much faster than human beings in determining which the best features are.

The goal of feature-learning algorithms is to separate the factors of variation that can explain the observable data: these factors may be age, sex, accent and language of a person, in a speech recognition algorithm, and can help us recognize who the person is, but there is no easy way to quantitatively describe these attributes.

Since these factors of variation have a strong influence on the features, the need arises to disentangle them from the input data and throw away the useless ones, and this is a much more complicated task. Luckily this can be obtained with deep learning algorithms, exploiting the hierarchy of concepts.

The first deep learning algorithms were exploited to provide quantitative models that would explain how the task of learning is performed in a brain, which is known to be a network of neurons. Brains are therefore called Biological Neural Networks, and by analogy machine learning is performed in Artificial Neural Networks (or simply Neural Networks).

Neural Networks nowadays are exploited in a variety of real-time applications, such as ultra-low power wearables, IoT and mobile devices. Convolutional Neural Networks (CNNs) have shown superior performances compared to other machine learning algorithms, and are now widely exploited, for example, for visual and speech recognition. More than 90% of operations performed in a CNNs are convolutions. The need arises to perform energy-efficient convolutions while allowing real-time performances. Approximate or low-precision convolutions can be employed. This is justified by the well-established principle that CNNs are resilient to algorithmic-level noise.

In a Residue Number System (RNS) system, the operations of addition and multiplication are simplified compared to a conventional number system since no inter-digit carries exist. This leads to shorter delay paths and consequently reduced power consumption. Some operations, especially overflow detection, are impractical in RNS, but they have limited use in CNNs. Furthermore, RNS achieve smaller dynamic range, or accuracy, when compared to conventional number systems with the same bit-width. Therefore, errors may derive from rounding and ignoring overflow.

II. FRAMEWORK

In an exemplary framework for accelerating neural networks, data are transferred within the framework in a streamed fashion, and multiple multiply-and-accumulate (MAC) units are clustered together to exploit CNNs' parameter sharing property. All MACs in a cluster work in parallel, allowing to compute multiple kernels at the same to increase the throughput. A number of these clusters together form a convolution accelerator (CA). The availability of multiple CAs facilitates forking the same data stream to multiple CAs to increase the throughput or to chaining them to evaluate multiple layers of a network without storing the intermediate results. Every convolution may be split in batches of smaller ones that are accumulated in sequence. This allows to transfer batches to subsequent CAs when chaining them or to evaluate in parallel multiple batches of the same convolution using multiple CAs.

RNS fit very well in this architecture: parameter sharing allows to perform a single binary-to-RNS conversion within a MAC cluster, whereas a RNS-to-binary conversion is utilized when the accumulation round is over, and may not be utilized at all when CAs are chained together. Moreover, neural networks are generally trained offline, so that kernels can be stored directly in RNS. In addition, residue number systems are well-suited to improve area, power consumption and timing of hardware convolutional accelerators.

2.2 the Classification Problem

To better understand the genesis and the technological development of Artificial Neural Networks, an introduction to the problem of Classification is introduced, with a focus on Image Classification, because within this context the discussion of the variables of interest is simpler and more intuitive.

In general, the problem of Classification comprises attributing a label to a test subject; this label determines the membership of the test subject to a class or category. A simple image classification problem may be determining if the subject of a picture is an animal or a person. The correct label is known in literature by the name of ground truth.

Theoretically, the number of labels can be undefined, however physical constraints exist, so that classification generally occurs within a finite set of labels; in addition, there may be no interest in a broad classification, depending on the specific application.

The first challenge is to properly select which the labels are, and what their number is. These are considered design parameters of the classifier.

Figure 2:
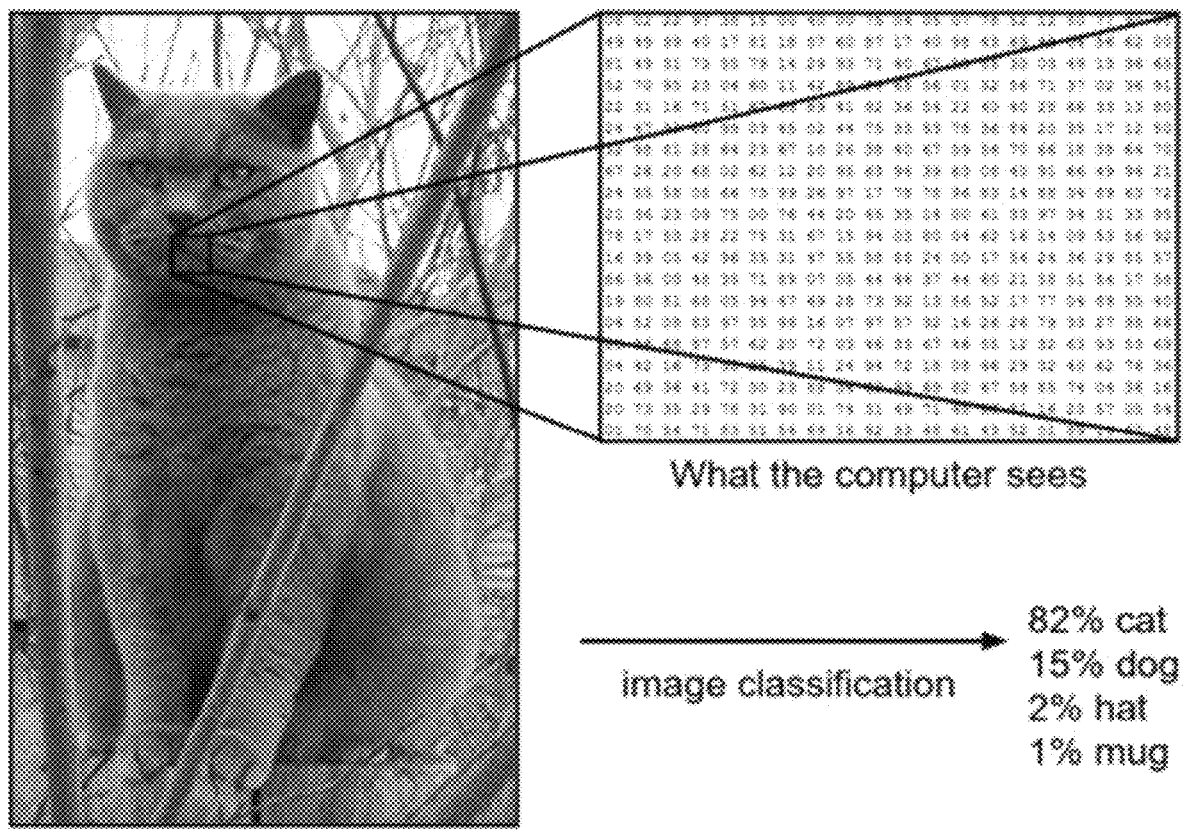

FIG. 1 presents a schematic overview of a classification task, in which an image is analyzed by a CNN to classify a photograph. After deployment, the classifier autonomously assigns the correct label to a test subject (in this case, to images). Alternatively, it could assign to each label a certain probability of membership to a class. The actual realization depends, of course, on the specific application and the classification method is chosen at design time. An example is depicted in FIG. 2, where the classifier processes the image of a cat.

There are various methods to realize a classifier with regard to how it performs classification. In a data-driven approach, the classifier undergoes a training process before its deployment. The training includes letting the classifier process a set of inputs whose ground truth is known a priori by the designer, the classification criteria being determined by a certain set of parameters.

After the classification, the results are compared with the ground truths to check for errors. A cost function is defined that evaluates the magnitude of these errors and provides a new set of parameters that improves the classification performance. Multiple tests are then performed, in an iterative fashion. This procedure stops when the desired accuracy is met. It is said that the classifier learned the parameters for a correct classification.

It is evident that the classification, rather than being performed according to algorithmic models that describe the inputs' properties, is based on previous history of the classifier, e.g., its experience.

2.3.1 Nearest Neighbor Classifier

In this section, a simple, straightforward way to implement a classifier is described, the Nearest Neighbour Classifier, to better understand the classification algorithms currently available and theoretically justify the employment of Neural Networks as classifiers.

Images are represented, in a digital context, by matrices of pixels called frames, they are quantitatively described by values of intensity of each channel of the pixel. These channels may be, for example, red, green and blue in an RGB color model.

A simple approach to the image classification problem is to simply add up all pixel values and use the result for comparison with another image's result. It is evident that this approach is blind to the properties of the picture that could help the classification, for example to its 2D geometry, but can be employed nonetheless.

Every image is associated with a vector V obtained by flattening the pixel matrix I. The elements of V are $V_{Nj+i}=I_{ij}$, given I is a [M×N] matrix and V has width W=MN.

Figures 3, 4:
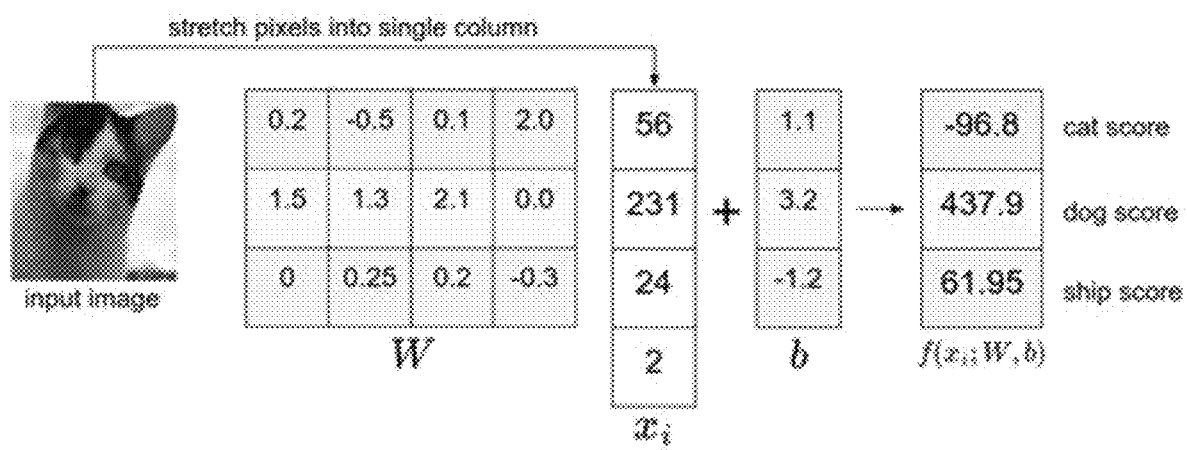
FIG. 3 depicts an exemplary formulation of determining a pixel-wise absolute value difference between two images represented via matrix subtraction.
FIG. 4 demonstrates an exemplary use of a score function in relation to image classification.

FIG. 3 depicts an exemplary formulation of determining a pixel-wise absolute value difference between two images (a test image and training image, respectively) represented via matrix subtraction. Intuitively, two pictures will be similar if their individual sums are very close in magnitude, e.g., if their distance in a vector space is small, hence the name Nearest Neighbor Classifier. Mathematically, many kinds of distances can be defined, and their choice can impact the classifier's performance. Two simple examples of Euclidean distance, or norm, are given.

$L_1$ distance: it's the simplest kind of distance. Given two vectors A and B of W elements, their $L_1$ distance $d_{L1}(A, B)$ is:

$$d_{L1}(A, B) = \sum_{i=0}^{W-1} |A_i - B_i| \quad (2.1)$$

$L_2$ distance: also known as root-mean square distance. Given two vectors A and B of W elements, their $L_2$ distance $d_{L2}(A, B)$ is:

$$d_{L2}(A, B) = \sqrt{\sum_{i=0}^{W-1} (A_i - B_i)^2} \quad (2.2)$$

It is evident in both cases that two images are considered the same if their distance is zero.

As stated earlier, these distances generally cannot be employed directly, because they do not consider any qualitative property of the images, like the mutual position of pixels within a frame.

Any other kind of distance similarly defined will suffer from the same limitations but could lead to benefits from the standpoint of numerical complexity, noise reduction or robustness of the results.

Once the distance for the comparison is selected, a set of reference images is chosen. It is evident that the choice of the set has a great impact on the classifier's performance, since it represents its experience. For example, the set of reference images is associated with a certain amount of memory to be stored, and also, in practical realizations, will contain a large number of images to facilitate the classifier attributing the correct label to the possible inputs.

2.3.2 Validation Sets

The selection of the reference images for the comparison that is performed by measurement of the distance may be considered a key point in designing a classifier.

All the parameters that describe the classifier are known in literature as hyper-parameters. Are considered hyper-parameters, for example, the typology of norm employed and the extension of the set of learned images.

The problem arises for whichever is the best way to train the classifier. In fact, training the classifier is utilized in order to determine the optimal hyper-parameters that provide the robustness of the classifier. Hence, a process of validation of these hyper-parameters is employed.

The most intuitive way to tackle this problem is to feed the classifier the whole image dataset as a training set during the validation process. With this approach, however, one could overfit the dataset, meaning that the classifier might show reduced performance after deploying the model because it is too "specialized": it can detect perfectly images very similar to the ones in the training set, but the loss in generality might lead to very bad decisions regarding any other type of image.

This is avoided by splitting the initial dataset in a so-called validation set, containing most of the images and used to validate the robustness of the classifier by tweaking the hyper-parameters, and a smaller training set.

If the image dataset is very small, and there is no way to determine a validation set and a training set big enough to obtain good results, one can make use of cross-validation by splitting the dataset in multiple validation sets, iterating the validation procedure on these sets and then averaging the results. This procedure is computationally expensive, so it is avoided whenever it is possible.

The classifier described so far is very simple to be implemented, has a zero training time (the dataset is stored in the memory) but the labeling procedure is costly, since it involves a number of comparison that depends on the training dataset size. A very desirable feature would be the inverse, meaning high train time and minimal amount of computations during the labeling. This may be obtained by neural networks, for example as described in 2.4, below. In order to understand how neural networks work, the necessary mathematical background will be developed in the next section, introducing the linear classification problem.

2.3.3 Linear Classification

It may be convenient defining a high number of hyper-parameters for a classifier because these can be tuned during the training, stored and re-used after deploying. Once optimized hyper-parameters are found, classification is obtained by means of a score function.

The score function maps all pixel values of a frame in a confidence score for any label, e.g., how likely is a single label to be the correct one. FIG. 4 demonstrates use of such a score function in relation to image classification and the following discussion.

For each $x_i \in R^D$ image of the dataset of dimensionality D there is a label $y_i=\{1, \ldots, K\}$ to be assigned out of K labels, for $i=\{1, \ldots, N\}$ where N is the size of the dataset. It will be appreciated that every pixel can have more than one channel, thus D=rows×columns×channels. The score function is then any function such that $f: R^D \to R^K$.

For a linear classifier the score function is a simple linear function $f(x_i, W, b) = Wx_i+b$, where $W \in R^{K \times D}$ is called the weights matrix and $b \in R^K$ the bias vector (both weights and biases are hyper-parameters). This means that, in a sense, the score function evaluates K classifiers in parallel, one for every possible label, since W has size [K×D] and $x_i$ is [D×1]. Hence the result is a [K×1] vector containing all the scores for each label.

Once the training is completed, the learned {W, b} can be stored and the training dataset can be ignored, saving memory, since the classification is obtained by means of the score function. This function evaluates the score of each label as a weighted sum over all pixel values plus a bias. W determines how much one of the channels of the pixel and the position of a feature in the frame has impact on the overall sum relative to each label.

Figure 5:
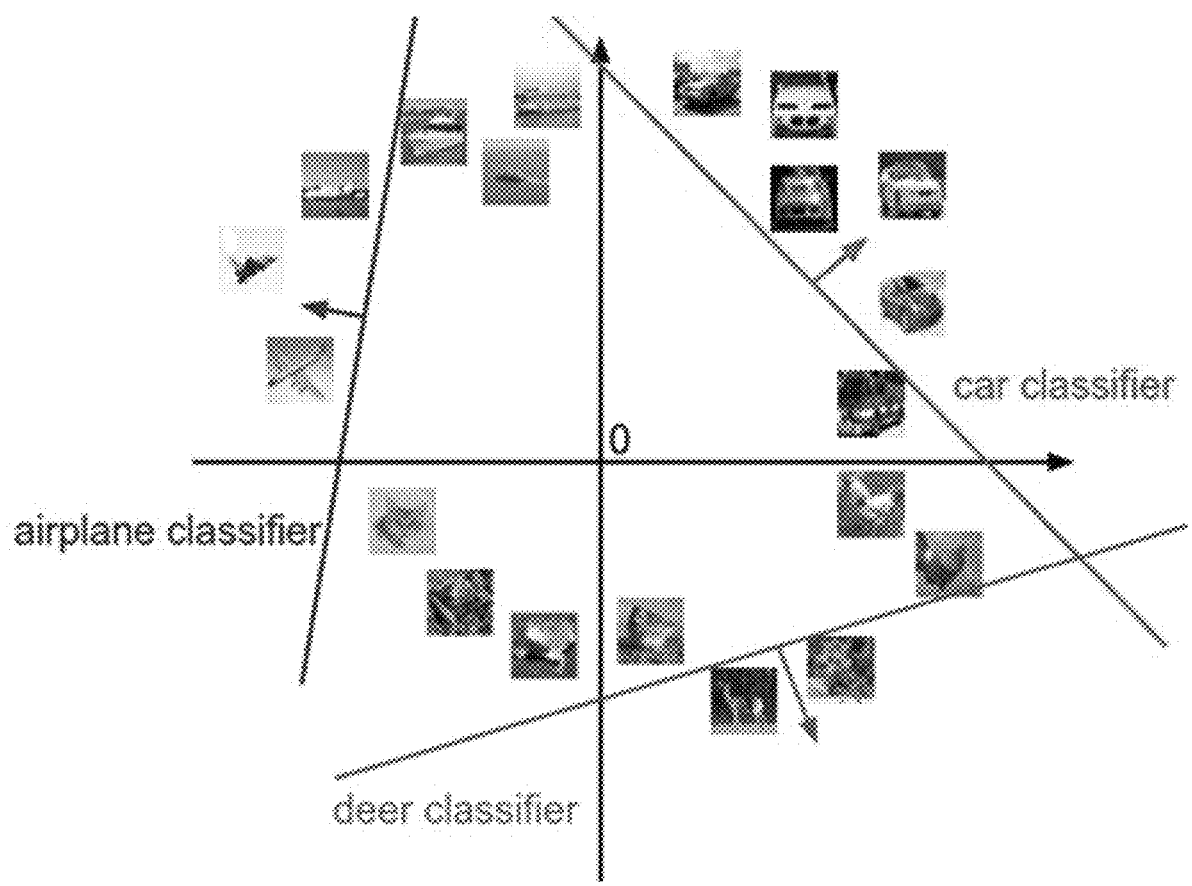
FIG. 5 illustrates a two-dimensional vector space in which one or more score functions are utilized in order to place multiple photographs within the vector space according to an exemplary image classifier.

Another interpretation is the following: if every $x_i$ is thought of as a point in some vector space, the score function defines multi-dimensional boundaries in this space; whenever a point falls within these boundaries, the classifier infers the label accordingly. These are, of course, linear boundaries, and from linear algebra it is easy to understand that multiplication by W has the effect of rotating such bounds, while b translates them. FIG. 5 illustrates a two-dimensional vector space in which one or more score functions are utilized in order to place multiple photographs within the vector space according to an exemplary image classifier.

Every row of W is said to be a template or prototype of a label, and a comparison is made between such template and the image using a dot product, which is a Euclidean distance measurement. Hence, unlike the Nearest Neighbour Classifier, this operation of template matching is made image-wise rather than by comparison with the entirety of the training dataset.

2.3.4 Loss Function

In this section the criteria for tuning the hyper-parameters will be explained. Tuning is usually performed by means of a loss function (or cost function) that measures the error that the classifier makes when inferring the wrong label. The loss can be defined in several ways.

A first way to define it is the Multiclass Support Vector Machine loss $L_i$ relative to the i-th image:

$$L_i = \Sigma_{j \neq y_i} \max(0, s_j - s_{y_i} + \Delta) \tag{2.3}$$

where $s_j$ is the j-th row of the score function vector, $y_i$ is the ground truth for the image under test and $\Delta$ is a certain fixed margin. This function needs the correct label to have a value greater than the sum of the one of the wrong class plus $\Delta$, e.g., there is zero loss when the correct label score exceeds the incorrect label score by at least the margin $\Delta$. Any additional difference above the margin is clamped at zero with the max(•) operation. Hence, loss is accumulated when the incorrect label has a score greater than the difference between the score of the ground truth minus the margin.

This version of the support vector machine loss function is also called hinge loss. Other definitions may be used, like the squared hinge loss which makes use of a $\max(\cdot)^2$ function instead of max(•).

Whatever the definition of the loss function is, it is evident that it should return low values when the classifier is making good choices and high values if making poor ones. The hyper-parameters, and the weights in particular, can be tuned in order to minimize such loss, e.g., train a better classifier.

Unfortunately, the loss function has an issue: the set of hyper-parameters that minimize $L_i$ may not be unique. In fact, if the set W allows the classifier to label correctly the entire training dataset, determining zero loss, then any multiple γW does. For the set of hyper-parameters to be unique, a normalization may be performed, e.g., a rule for choosing in an unambiguous way the hyper-parameters is employed.

This may be done by introducing a regularization penalty that penalizes numerically large weights in order to improve generalization. In this way the influence of any input dimension on the scores by itself may be limited.

2.3.5 Hyper-parameters Tuning

The focus of this section is about the procedures that involve the evaluation of the loss function in order to perform a fine-tuning of the hyper-parameters.

A straightforward method of tuning the hyper-parameters of a classifier is to first set them to some initial random values and then evaluate the classifier's performance with the loss function. This is repeated in a trial and error fashion by randomly choosing the hyper-parameters until the set that met the desired accuracy is found. This is called iterative refinement and is most likely an inefficient way of optimization.

A much more efficient method is the random local search: an initial set $W_0$ of random hyper-parameters is generated, then their loss is evaluated. The next iteration will use the same set $W_0$ perturbated by a small amount δW chosen randomly, $W_0+δW$. If the loss of the new hyper-parameters is smaller, the old hyper-parameters are updated, else a new perturbation is performed. The loss is computed for each new set until the desired accuracy is met.

A random local search can be greatly improved if another piece of information is taken into account: the gradient of the loss function. This quantity can help speeding up the process because it represents the local slope of the loss function: since a change in the slope sign may indicate a relative minimum or maximum, the perturbation δW can be chosen such that the loss of W+δW decreases towards a minimum, according to the loss' gradient.

2.3.6 Numerical Gradient

Computing the analytical gradient of a function may be overwhelming, since limits are involved, so a computer can only elaborate some arbitrarily close approximation of it if the right amount of memory and word size for representation are provided.

Using the definition of gradient $$\frac{df}{dx}$$

and supposing the loss function is $f(x)$, it holds:

$$\frac{df}{dx} = \lim_{h \to 0} \frac{f(x+h) - f(x)}{h} \tag{2.4}$$

A good approximation of the gradient may be:

$$\frac{df}{dx} \cong \frac{f(x+h) - f(x)}{h}, h = 10^{-6} \tag{2.5}$$

where h is the step size, also called learning rate, and represents the perturbation δW in this 1-dimensional case. As stated earlier, the gradient determines the best direction to follow in order to optimize the hyper-parameters.

However, there is no information about how strong the perturbation shall be. Hence, the learning rate itself is a hyper-parameter and is a trade-off between accuracy (e.g., determining the minimal loss) and training speed (e.g., number of iterations to find such minimum).

Since the number of hyper-parameters can be very large, this approach is not very efficient because evaluating the numerical gradient has complexity linear in the number of parameters.

This is solved considering that the loss function is known a priori, thus its gradient can be derived analytically by the designer and stored as a function. While speeding up the computation of the gradient, this method is more error prone to implement, so it's common practice to compare the analytical gradient to the numerical gradient. This practice is called gradient check.

The state-of-the-art procedure for hyper-parameters' tuning is thus considered to be the gradient descent: an iterative process that involves a loop of gradient computation and hyper-parameters update.

2.3.7 Backpropagation

The backpropagation is a very efficient way of computing the gradient of the loss function. It is based on a simple idea, demonstrated with an example.

Given the function $f(x, y, z)=(x+y)z$, if $q(x, y)=x+y$, the following equations hold:

$$\frac{\partial f}{\partial x} = \frac{\partial f}{\partial q}\frac{\partial q}{\partial x} = z*1 \quad (2.6)$$

$$\frac{\partial f}{\partial y} = \frac{\partial f}{\partial q}\frac{\partial q}{\partial y} = z*1 \quad (2.7)$$

$$\frac{\partial f}{\partial z} = \frac{\partial f}{\partial z} = q = x+y \quad (2.8)$$

Four quantities have been found:

$$\frac{\partial q}{\partial x} = 1, \frac{\partial q}{\partial y} = 1, \frac{\partial f}{\partial q} = z, \text{ and } \frac{\partial f}{\partial z} = q.$$

These are obtained by the so-called chain rule of derivatives, which states that, given $f[g(x)]$, its derivative is $$\frac{\partial f}{\partial g}\frac{\partial g}{\partial x}.$$

Figure 6:
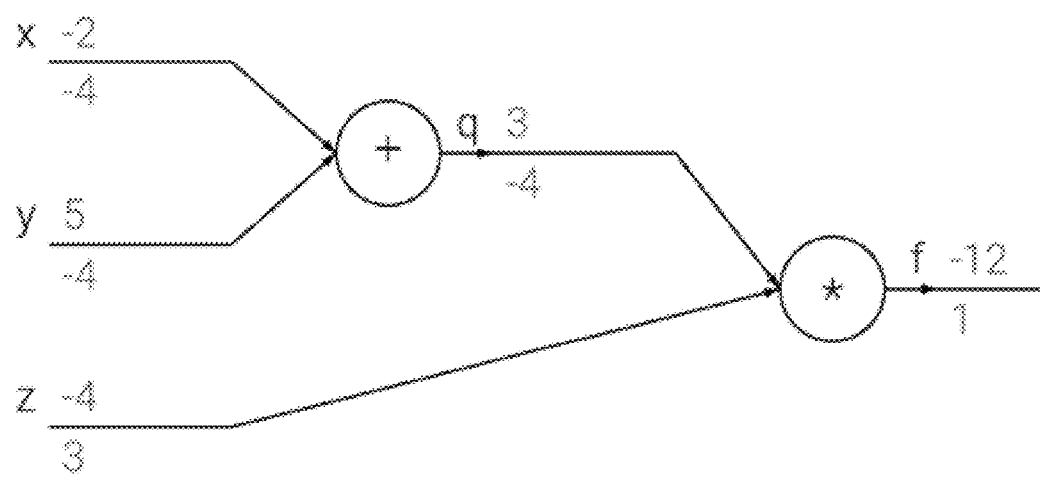
FIG. 6 illustrates an exemplary function in which input signals are used to determine a desired output via an intermediate result.

When setting up a net that computes the analytical gradient of some function, it can be described by a certain number of nodes, or gates, performing some particular operation, like the sum or the product by a constant. FIG. 6 illustrates one such operation, in which input signals are used to determine a desired output via an intermediate result.

During the forward pass of the input signals (x, y, z) through this net, each node will compute some intermediate result (q=x+y) and the output will be the desired $f(x, y, z)$. Meanwhile, each node can be programmed to compute the local gradient of its output with respect to its inputs. For example, for the node computing $$q = x+y, \frac{\partial q}{\partial x} \text{ and } \frac{\partial q}{\partial x}$$

can be derived.

Therefore, every node computes its outputs and its local gradient independently from each other node. After the forward propagation, every gate will receive the information necessary to compute the final gradient of $f$ during the backpropagation. Starting with the outermost node, every node feeds back to all the input gates the computed local gradient with respect to that input multiplied by the gradient signal coming from its output gate. For example, the gate computing $f=qz$ also computes $$\frac{\partial f}{\partial q} \text{ and } \frac{\partial f}{\partial z}$$

Knowing that $$\frac{\partial f}{\partial f} = 1,$$

and the gate computing q multiplies $$\frac{\partial q}{\partial x} \text{ and } \frac{\partial q}{\partial x}$$

computed during the forward pass by $$\frac{\partial f}{\partial q}$$

passed back from the $f$ gate.

Intuitively, it's like the gates, communicating between them by the gradient signal, request each other to increase or diminish their outputs by certain, well-defined amounts in order to increase the final output.

2.4 Neural Networks

Figure 7:
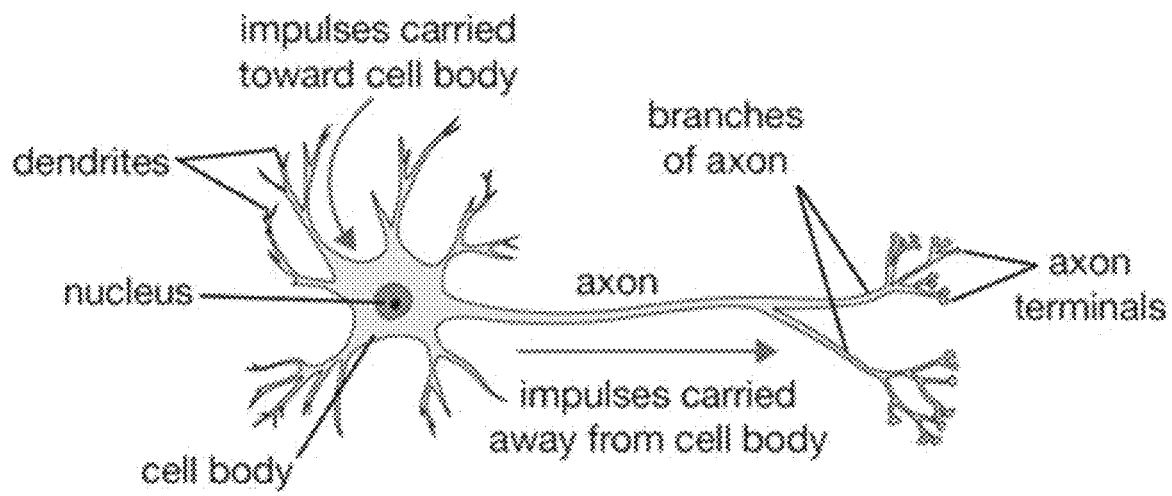
FIG. 7 depicts an exemplary biological neuron, which in certain embodiments may be used as a model for an artificial analogue of that neuron.

Drawing analogy from biological neural networks, one can define a typology of classifier called an artificial neural network. FIG. 7 depicts an exemplary biological neuron, which in certain embodiments may be used as a model for an artificial analogue of that neuron.

A neuron is the core computational unit of a brain. In a human brain there are about 86 billion neurons interconnected by means of around $10^{15}$ synapsis. Every neuron receives electrical pulses as inputs from dendrites and channels electrical output pulses through axons. The axons themselves are linked to dendrites belonging to other neurons by synapsis, and so on.

Within the cell body of a neuron, the input signals are summed up and, if said sum exceeds a threshold, the neuron shoots electrical pulses.

Figure 8:
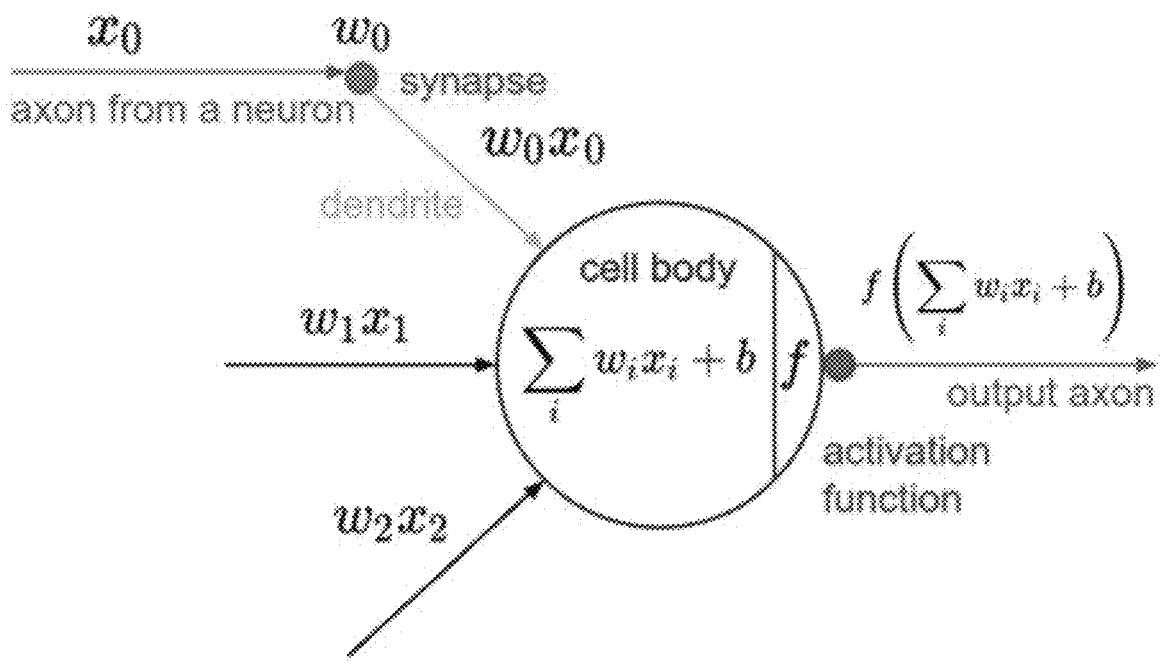
FIG. 8 depicts a corresponding mathematical model of an exemplary artificial neuron based on a biological neuron structure.

FIG. 8 depicts a corresponding mathematical model of an exemplary artificial neuron based on the biological neuron structure previously depicted. In modelling neural networks, it is assumed that only the pulses' fire rate brings information. In actual biological neural networks, in fact, different neurons have different purposes, and many other parameters are involved. The weights W can be interpreted as the synaptic force driving the pulses and the fire rate as an activation function. The synapsis weighs the dendrites' inputs $x_i$ by its synaptic force W, then the cell body operates a sum over these weighted signals, e.g., a dot product $\Sigma Wx_i$. The fire rate is represented with a non-linearity $f$ applied to the dot product, leading to $f(\Sigma Wx_i)$. In practice, a single neuron behaves like a linear classifier with the addition of an activation function.

2.4.1 Layer-Wise Architecture

FIG. 9 depicts a schematic diagram of a simplistic convolutional neural network. Just like in a brain, neural networks comprise collections of neurons linked in an acyclic graph, usually with a layer-wise structure. The connectivity between neurons of different layers may be complete or sparse, the latter meaning not all outputs of the current layer are connected to all inputs of the next layer. In the former case, the two layers are said to be fully-connected.

Neurons belonging to the output layer, the last layer of the network, do not require activation functions because their output represents the score function.

All layers between the input layer and the output layer are said to be hidden layers, because there is no interaction with the environment but exclusively between a layer and the previous/next, so they are hidden to the user.

Usually, a neural network is said to be a Deep Neural Network if about 20 layers deep or described by approximately $10^8$ hyper-parameters.

2.4.2 Representational Power

It is possible at this point to wonder why use ANN as classifiers, instead of linear classifiers.

One could wonder, at this point, what benefits adopting neural networks over simpler linear classifiers can lead. In fact, neural networks are basically clusters of linear classifiers with inter-layer activation functions.

The answer is that neural networks with at least one hidden layer are universal approximators: given a function $f(x)$ and $\varepsilon > 0$, a $g(x)$ implemented by a neural network can be found such that $|f(x)-g(x)|<\varepsilon$, $\forall x$. That is, $g(x)$ approximates $f(x)$ with a maximum error of $\varepsilon$.

In practice, a single hidden layer will not suffice, since the error £ will be too large to satisfy the equation for the whole input range.

It can be shown, however, that there is no remarkable benefit in designing standard neural networks with more than 3 hidden layers, whereas the converse is true for Convolutional Neural Networks: deep, convolutional neural networks show the best performances. Current, state-of-art neural networks are convolutional neural networks that employ from 5 to 20 hidden layers to approximate the classifying function.

Increasing the number of layers in a neural network is said to increase its capacity, the space of the representable $f(x)$ grows, meaning that the network is capable of approximately implement a growing number of non-linear classifiers. FIG. 10 depicts three alternative scenarios in which various quantities of hidden neurons are representationally depicted, along with a corresponding change in the representable space.

Conversely, too high a number of layers can lead to overfit, since $f(x)$ is determined by the training dataset and unknown to the designer. Nonetheless, the benefits of using deep neural networks overwhelm this drawback, which is dealt with by means of special techniques, like regularization penalty.

In fact, nets with fewer neurons are harder to be trained with local methods like gradient descent, since these methods show a tendency to converge towards relative minima rather than global minima of the loss function. Deep nets have a larger number of relative minima which is generally an undesired feature but all showing a lower loss function; variance of such minima is also smaller, meaning that there is way more solutions and all are about equally as good, relying less on the luck of random initialization.

2.4.3 Convolutional Neural Networks

In this section, convolutional neural networks are presented from a machine learning perspective, describing their architectures and their behaviour with regard to classification problem. The mathematical insights about the convolution operation are described further in 2.5.

A convolutional neural network is a deep neural network that performs convolutions between the weights and the inputs instead of the dot product.

It can ensure some degree of invariance to shift and distortion by combining three architectural properties: local receptive fields, parameter sharing and spatial sub-sampling.

The property of receptive fields' locality means that each neuron receives inputs only from a small neighborhood of the previous layer, allowing to extract elementary visual features such as oriented edges, end-points and corners.

Convolutional networks are particularly effective for image recognition, since images tend to be stationary, e.g., colors and shapes change in a smooth way within a frame. This suggests the parameter sharing, since the same features could be learned in different parts of the frame.

Another underlying assumption in convolutional networks' operation is that the input data are tensors (multi-dimensional matrices), and that such a structure brings useful information for classification.

From a hardware implementation perspective, using convolution instead of simple matrix multiplication leads to the following benefits:

- sparse operations: in most neural networks kernels are much smaller in magnitude than the input features. This leads to frequent sparse operations, e.g., multiplication by zero, greatly reducing the power consumption;
- smaller receptive field: being convolutional layers not fully-connected, the number of parameters to be stored is reduced. Hence, less memory is utilized and less operations are performed with respect to a standard neural network, further reducing power consumption;
- parameter sharing: being kernels shared between different neurons, a speed up of computation is allowed by either re-use of data or parallel computation of different kernels The architecture of a convolutional network may typically comprise three types of layers: convolutional layers, pooling layers and fully-connected layers.

In a fully-connected layer, all the neurons are connected to all the neurons of the previous layer, like in a standard neural network; convolutional and pooling layers will be briefly discussed in the next sections.

Figure 11:
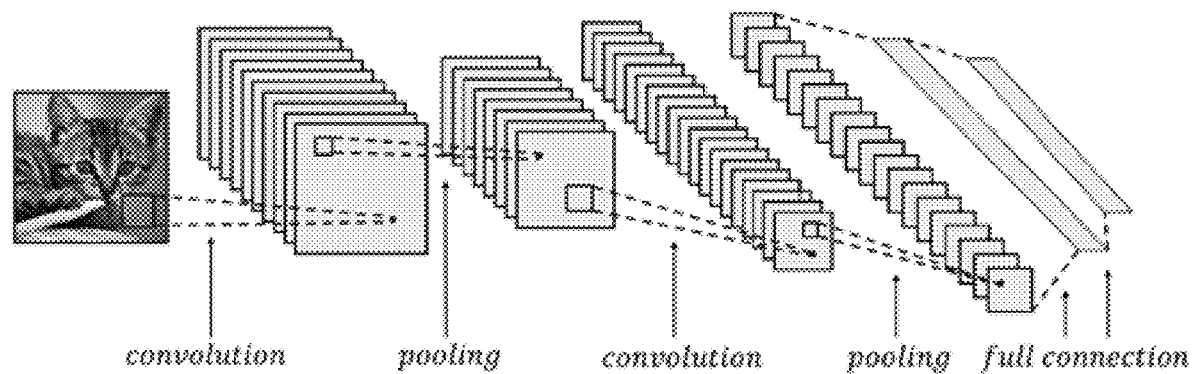
FIG. 11 depicts a typical arrangement of layers in a convolutional neural network.

These layers can be combined in many ways producing a number of different structures, however most convolutional networks follow the pattern shown in FIG. 11.

2.4.4 Convolutional Layer

Figure 12:
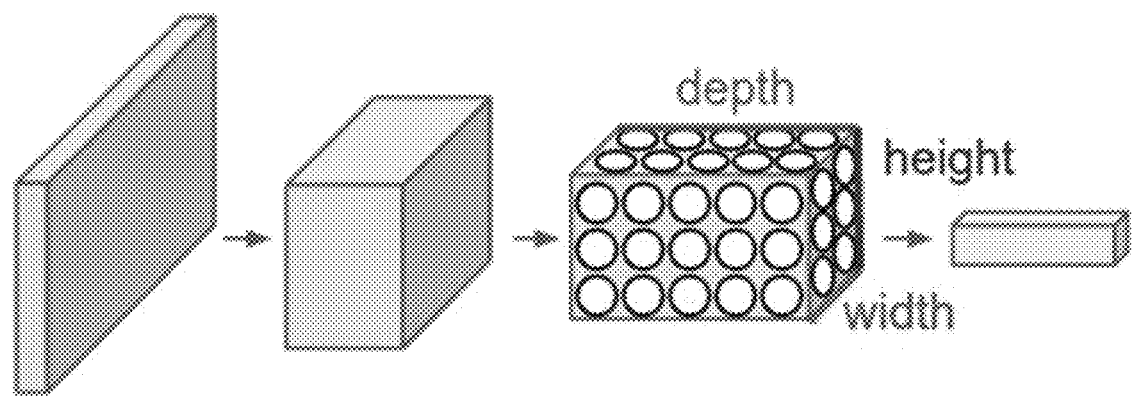
FIG. 12 depicts a three-dimensional layer structure in an exemplary convolutional neural network.

Neurons in a convolutional layer are usually organized in 3D volumes described by their width, height and depth, as exemplified by the illustration of FIG. 12. Every layer has a set of learnable filters, also known as kernels, comprising the weights. Generally, these kernels are very small along the width and height dimensions but extend throughout the whole depth of the layer and are shared by every neuron.

During the forward pass, every kernel is convoluted with the whole volume, computing the dot products between all the inputs and the corresponding kernels' entries: this way, multiple features can be extracted at each location of the input.

The output may include as many 2D activation maps as the depth of the layer. During the training, the net learns the kernels, and each kernel will be able to recognize a particular feature, like edges and faces in a picture.

2.4.5 Pooling Layer

Figure 13:
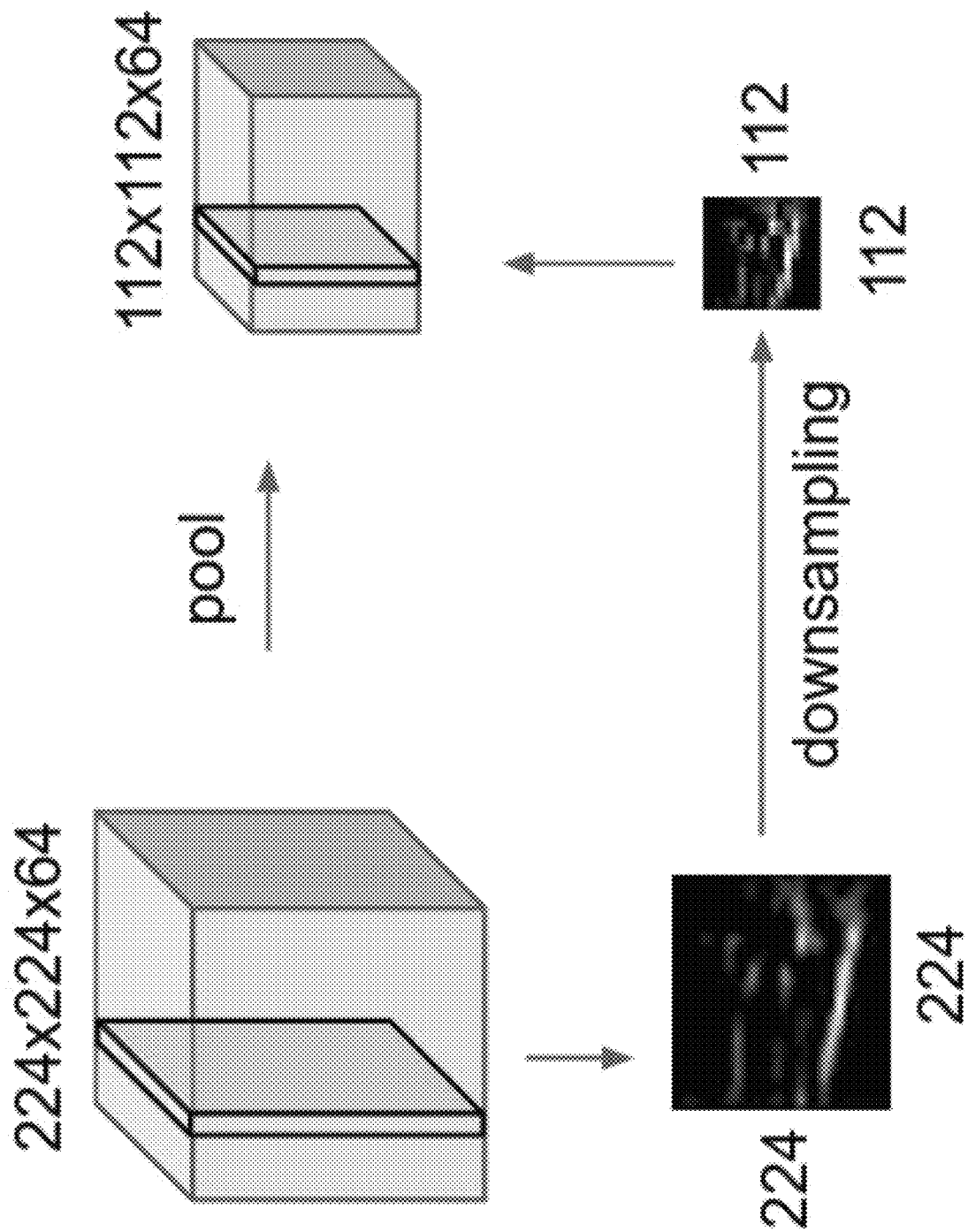
FIG. 13 depicts a simplified pooling operation utilized in conjunction with a downsampling operation for image recognition.

The pooling function is used to reduce the spatial dimension of the 3D volume representation among two subsequent convolutional layers, greatly reducing the number of hyper-parameters and the overfit. FIG. 13 depicts a simplified pooling operation utilized in conjunction with a downsampling operation for image recognition.

Pooling is performed by replacement of the output of the network at a certain location with the average over a spatial region that includes the nearby outputs.

It is generally a form of non-linear sub-sampling. For example, the max pooling operation forces the output of said location to be equal to the maximum output within a rectangular neighborhood. This is useful for it allows the representation to be invariant to small translations, if the input is translated by a small amount, the values of most of the pooled outputs do not change. This implies that a learned feature can be recognized everywhere in a frame. For example, when determining whether an image contains a face, the location of the eyes may not be known with pixel-perfect accuracy, as long as there are two eyes.

2.5 Convolution

The convolution * of two functions x(t) and w(t) is a linear operator of the form:

$$(x*w)(t) = \int_R f(\tau)g(t-\tau)d\tau \tag{2.9}$$

In a convolutional network, x is the input or input feature map, w is the kernels and the resulting output, x*w, is called feature map or output feature map. Indeed, only a discrete version of the convolution may be implemented in a computer, that is:

$$(x*w)(t) = \sum_{\tau=-\infty}^{+\infty} f(\tau)g(t-\tau) \tag{2.10}$$

called discrete convolution. It can be seen as a simple matrix multiplication with some entries fixed to be equal to others according to a certain law.

2.5.1 Discrete Convolutions

Essentially, neural networks perform affine transformations: a vector is received as input and is multiplied with a matrix to produce an output, a bias vector is usually added and the result passes through a non-linearity. This process can use any type of input, like images, sound clips or streams of raw data: whatever their dimensionality, their representation can always be flattened into a vector before the transformation.

These kinds of data show an intrinsic structure, they share various properties:
- they are stored as tensors;
- there are one or more axes along which the ordering is significant (e.g., width and height for a frame, time for a sound clip);
- the channel axis contains different "views" of the data (e.g., the red, green and blue channels of an image, the left and right channels of a stereo track, etc.).

As stated earlier, these properties are not exploited when an affine transformation is applied because all the axes are treated in the same way, losing the topological information that would be best to preserve; this can be done employing convolutions.

Figure 14:
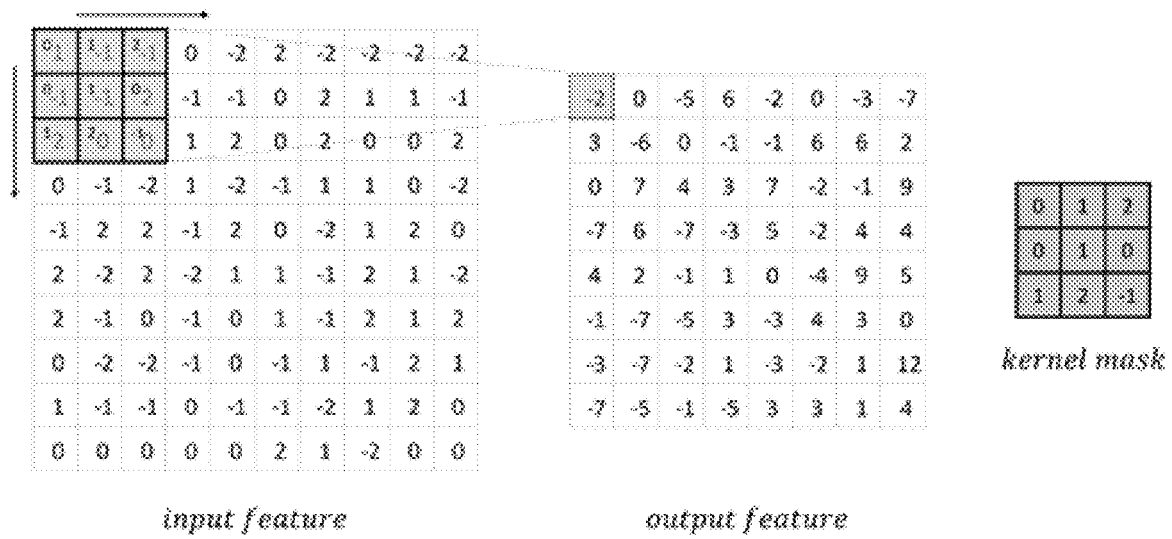
FIG. 14 depicts convolution in an exemplary convolutional neural network using a kernel mask of specified dimensions.

FIG. 14 depicts convolution in a CNN using a 3×3 kernel mask (or "kernel"). Kernels slide across the input feature map, and the product between each element of the kernel and the input element it overlaps is computed. The products are added up obtaining the output in the current location. The final output of this procedure is a matrix called output feature map.

This procedure may be repeated with different kernels, forming a number of output feature maps (output channels) equal to the number of kernels. Moreover, inputs may have multiple channels.

With multiple input and output feature maps, this set of kernels form a 4D array whose axes are the number of output channels, the number of input channels, the number of rows of the kernel and the number of columns of the kernel.

Each input channel is convolved with a different part of the kernel for each output channel. The corresponding output feature map is obtained by element-wise addition of the set of maps resulting from the previous operation. Hence, a set of output feature maps is obtained for each output channel.

Indeed, there is no restriction on the dimensionality of convolutions: in a 3D convolution, the kernel is a cuboid that slides across all three dimensions, height, width and depth; in a ND convolution, it is a N-dimensional shape that slides across height, width, depth and the remaining N−3 dimensions.

Therefore, the set of kernels is a (N+2)D array whose axes are the number of output channels n, the number of input channels m and the kernel sizes $k_j$ along each of the N dimensions, for $j \in [0, N-1]$ It can be shown that the output size $o_j$ of a layer along the j-th is affected by following properties:
- $i_j$: input size along axis j;
- $k_j$: kernel size along axis j;
- $s_j$: stride (distance between two consecutive positions of the kernel) along axis j;
- $p_j$: zero padding (number of zeros concatenated at the beginning and at the end of an axis) along axis j.

Moreover, it can further be shown that the choice of kernel size, stride and zero padding along axis j only affects the output size of axis j; thus, for the sake of simplicity, in what follows only 2D convolutions with square inputs, square kernels, same stride and same zero padding along both axes are taken into account, e.g., N=2, $i_1=i_2=i$, $k_1=k_2=k$, $s_1=s_2=s$, $p_1=p_2=p$.

2.5.2 Convolution Arithmetic

In this section, various cases of convolution will be analyzed to show what is the impact of the parameters described in the previous section.

No Zero Padding, Unit Strides

Figure 15:
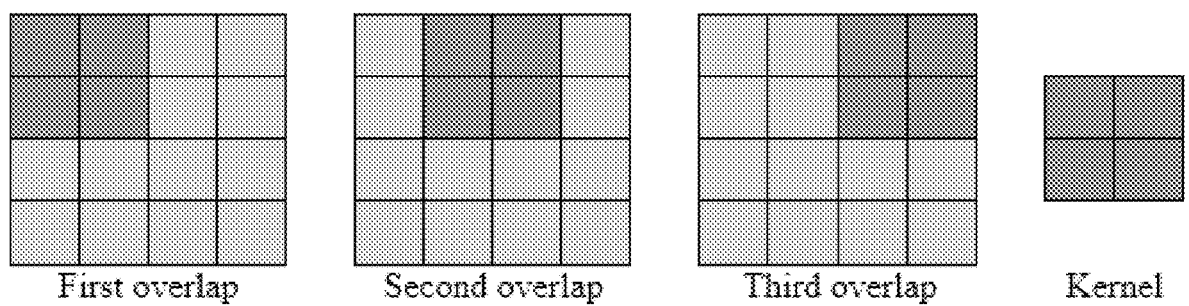
FIG. 15 depicts convolution of a 2×2 kernel with a 4×4 input feature map, using no zero padding and single-unit stride.

FIG. 15 depicts convolution of a 2×2 kernel with a 4×4 input feature map, using no zero padding and single-unit stride. It is the simplest case to analyze, and simply considers the kernel to slide across all the positions of the input map. The output size is defined by the number of possible overlaps of the kernel on the input. Considering the width axis, the kernel can start, for example, on the leftmost tile of the input. Sliding by steps of one along this dimension, it will eventually overlap with the rightmost tile of the input. It is evident then that the number of steps performed plus one determines the size of the output, since the starting position is taken into account. The same is true for the height axis.

Formally, it holds:

$$o = (i-k)+1, s=1, p=0 \tag{2.11}$$

For example, in FIG. 15, i=4, k=2 and thus o=3 overlaps determining the output feature map are depicted.

Zero Padding, Unit Strides

Figure 16:
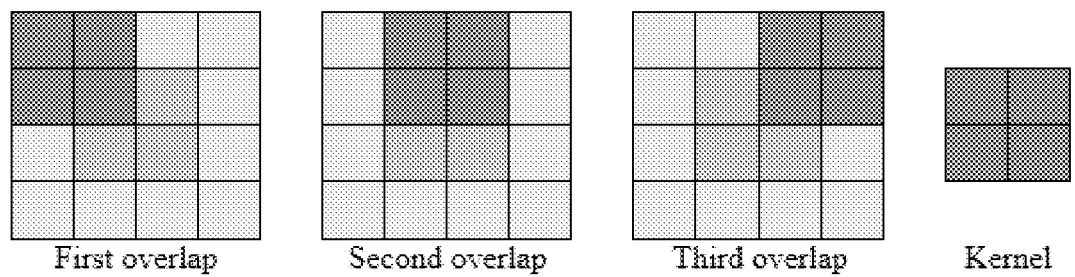
FIG. 16 depicts convolution of a 2×2 kernel with a 2×2 input feature map, using p=1 zero padding and single-unit stride.

FIG. 16 depicts convolution of a 2×2 kernel with a 2×2 input feature map, using p=1 zero padding and single-unit stride. Padding with p zeros changes the effective input size from i to i+2p, since p zeroes are added both at the beginning and at the end of the input therefore:

$$o=(i-k)+2p+1, s=1 \tag{2.12}$$

For example, in FIG. 16, i=2, k=2, p=1 and thus o=3 overlaps determining the output feature map are depicted.

Padding can be used to arbitrarily change the shape of the output feature map. For example, in the special case of half padding, p=⌊k−1⌋/2 (⌊•⌋ being the rounding operation) is selected in order to obtain:

$$o = (i-k) + 2p + 1 = (i-k) + \frac{2[k-1]}{2} + 1 = i \tag{2.13}$$

Hence, it is evident that half padding is used when it is necessary the output to be the same size as the input. Conversely, full padding is used to increase the output dimension, setting p=k−1:

$$o=(i-k)+2p+1=i+k-1 \tag{2.14}$$

In this case, every possible partial or complete overlap of the kernel on the input map is considered, hence the name full padding.

No Zero Padding, Non-Unit Strides

Figure 17:
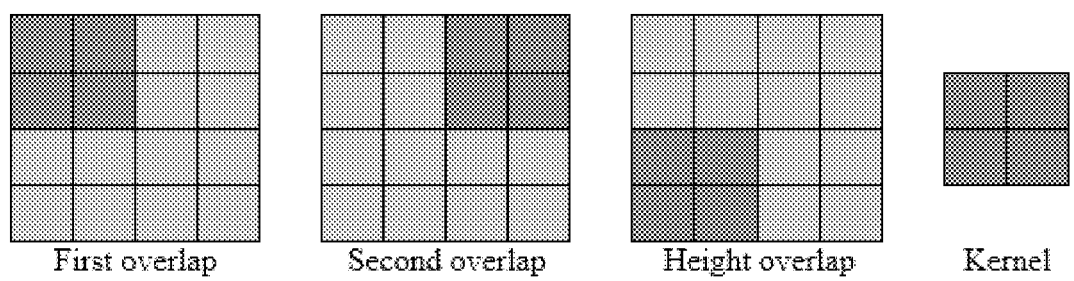
FIG. 17 depicts convolution of a 2×2 kernel with a 4×4 input feature map, using p=0 zero padding and stride=2.

FIG. 17 depicts convolution of a 2×2 kernel with a 4×4 input feature map, using p=0 zero padding and stride=2. With non-unit strides, sliding is performed by steps of s. The output size is equal again to the number of possible overlaps. Considering the width axis, the kernel starts on the leftmost tile; It slides by steps of size s until it touches the right side of the input. Then the number of steps will be equal to ⌊(i−k)/s⌋. Therefore:

$$o = \left\lfloor \frac{i-k}{s} \right\rfloor + 1, p = 0. \tag{2.15}$$

For example, in FIG. 17, i=4, k=2, s=2 and thus o=2 overlaps determining the output feature map are depicted.

Zero Padding, No-Unit Strides

Finally, it is very easy to expand Equation (2.11) to the most general case of zero padding of p and strides of s, simply joining together the results obtained from (2.12) and (2.15):

$$o = \left\lfloor \frac{i-k+2p}{s} \right\rfloor + 1 \tag{2.16}$$

III. RESIDUE NUMBER SYSTEMS

A general discussion concerning number systems is introduced here. The goal is to understand which properties of a particular class of unconventional number systems, namely residue number systems, can help accelerating operations in a CNN compared to conventional number systems such as fixed-radix systems or floating-point systems. A brief description of conventional number systems is provided: integer number systems are presented, with particular focus on weighted number systems and their properties. Residue number systems are introduced: the residual representation is presented, together with some fundamental arithmetic identities, arithmetic operations and its binary coding.

3.1 Number Systems

From a mathematical standpoint, a number system (or numeral system or system of numeration) is defined by:
  a notation for expressing numbers, generally by means of digits or symbols belonging to a finite set;
  an encoding procedure to determine said notation of a particular number;
  a decoding procedure to obtain a number from its encoded notation.

Encoding and decoding are performed according to an interpretation rule, a mathematical formula which relates notations with the corresponding represented numbers of the representation, called values.

3.1.1 Integer Number Systems

An integer number system is defined by a rule which allows the representation of a set of integers without ambiguity. One restriction placed on the rule is that two numbers in the system are not to have identical representations: representation is therefore unambiguous.

Such a system can thus be generated by any arbitrary procedure which comply with this rule. Theoretically, the range of this system (the number of representable integers) can be infinite, but practical implementations will be constrained by physical requirements, such as available amount of memory.

For a number system to be useful, it should also possess a structure: it means that algorithms that yield the representation of any number belonging to the range are available, given only the original numbers utilized to define the system; for example, this is the case of arithmetic operations.

3.1.2 Decimal Number Systems

The simplest example of a structured integer number system is the familiar decimal system: in this system, any positive integer x can be written as:

$$x = \sum_{i=0}^{n-1} x_i 10^i \tag{3.1}$$

where the $x_i \in [0,9]$ are said to be decimal digits. Theoretically, this system is of unlimited range, meaning that any integer can be expressed in it, regardless of its magnitude. In practice, the maximum representable integer depends on n, and is bound to $x_i=9$, $\forall i$, that is:

$$x_{max} = \sum_{i=0}^{n-1} 9 * 10^i = (99 \ldots 9)_{10} \tag{3.2}$$

In equation (3.2), the notation $(x_{n-1} x_{n-2} \ldots x_0)_m$ stands for x represented base m with n digits.

It is evident that this system has also a unique representation, and is non-redundant, every number is represented by a single combination of digits $(x_{n-1} x_{n-2} \ldots x_0)_{10}$. Furthermore, since every number x is obtained by sums of powers of 10, the system is also said to be a weighted number system: 10 is a constant known as base or radix, and $10^i$ are the corresponding weights of the representation. By analogy, this implies that digits $x_i$ weight more with increasing i. Their position within the string $(x_{n-1} x_{n-2} \ldots x_0)_{10}$ determines their significance, allowing for fast and easy relative-magnitude comparison and sign detection, as will be clarified in the next section.

3.1.3 Properties of Number Systems

As stated earlier, number systems may or may not possess one or more of the following properties:
- range;
- uniqueness;
- redundancy;
- weightiness.

A more detailed discussion about each of them and the necessary definitions will be presented in the following.

Range: as stated earlier, it is the interval of representation, over which every integer is represented unambiguously. It can be limited or unlimited, only the former being of practical use since physical systems can accommodate a limited number of digits. If limited, the range is usually specified by the word-length n.

Uniqueness: a number representation is unique if each number has a single representation. Both the decimal representation and the well-known 2's-complement binary representation are unique. On the other hand, 1's-complement binary representation or the decimal representation, when extended to negative numbers, are not unique, since two representations exist for zero, respectively $(00 \ldots 0)_2/(11 \ldots 1)_2$ and $+(00 \ldots 0)_{10}/-(00 \ldots 0)_{10}$. In general, systems with sign and magnitude representation are non-unique.

Redundancy: a number system is redundant if the number of combination of digits exceeds the cardinality of the system; in other words, no numbers are defined for certain symbols, which are therefore "spare". In practice, a redundant number system will be less efficient than a non-redundant one, and this may impact on the performances of actual realizations (e.g. reduced storing efficiency of memories).

It is evident that non-uniqueness implies redundancy, but the converse is not true. For instance, adding a parity digit to a 2's-complement binary representation leads to a unique number system, but also a redundant one, since half the combinations that could be used with an additional bit are forbidden.

Weightiness: a number system is weighted if any value x belonging to the system can be expressed by means of weights $w_i$ by the equation:

$$x = \sum_{i=0}^{n-1} w_i x_i \qquad (3.3)$$

As before, $x_i$ are the permissible digits of the representation. For weights that are successive powers of an integer r, called radix or base, the number system is said to be a fixed-radix system with weights $w_i = r^i$. Therefore, for decimal and binary systems, the radices are respectively 10 and 2. If the weights are arbitrary, the number system is said to be a mixed-radix system. Furthermore, both $x_i$ and $w_i$ may be negative. For example, in 2's-complement, it holds:

$$x = -2^{n-1} x_{n-1} + \sum_{i=0}^{n-2} 2^i x_i \qquad (3.4)$$

As stated in the previous section, weighted number systems may provide simplified relative-magnitude comparison and sign detection. In these systems, magnitude comparison of two numbers is a mere comparison of their digits in corresponding positions. While this is always true for fixed-radix systems, it may not necessarily hold for mixed-radix systems. For example, let $x_i \in [0,9]$, and let the representation of x be:

$$x = 4x_3 + 3x_2 + 2x_1 + x_0 \qquad (3.5)$$

This representation is weighted, but also non-unique. In fact, both 0009 and 0017 lead to the value 9. Therefore, even in a weighted system relative-magnitude comparison may be complex. The system is made unique in order to perform magnitude comparison, and it can be shown that this is obtained by limiting the magnitude of digits x such that:

$$|w_i| > \left| \sum_{j=0}^{i-1} w_j x_j \right|, \forall i \in [0, n-1] \qquad (3.6)$$

Equation (3.6) is satisfied if $x_i < w_i$.

The most common number systems employed in computer applications are binary systems and binary-coded decimal systems. This is due to their associated properties as number systems:
- being fixed-radix systems, relative-magnitude comparison of two numbers can be implemented easily;
- multiplication or division by a power of 2 (of 10) is performed by digit-wise shift;
- range extension is realized by adding digit positions;
- the logic utilized for performing addition is identical for all digit positions;
- overflow detection is easily implemented.

Unfortunately, benefits related to these attributes may be offset by some limitations imposed on its performances. Most arithmetic operations, especially addition and multiplication, involve carry propagation between subsequent digits, not only determining very long critical paths, but also imposing the operations to be performed in a sequential fashion. In fact, for all arithmetic operations in these two number systems, every digit of the result is a function of all previous digits, making it impractical to implement parallel operations when word-lengths are utilized.

Therefore, it would be desirable to process simultaneously all the digits in a parallel fashion, in order to overcome what might be considered a fundamental limitation on the speed of arithmetic operations. All the attempts that have been made to circumvent this speed limitation follow various approaches that can be classified essentially into two categories:
- methods that reduce the delays due to carry propagation with an overhead of specialized look-ahead circuitry;
- methods that make use of number systems with special carry characteristics.

This disclosure concerns residue number systems. However, a brief review of state-of-art arithmetic circuits is described below, together with some insight on carry-lookahead methodologies.

3.1.4 Properties of Residue Number Systems

Before presenting the algebra of reside classes and extensively describe the mathematical background that lies behind it, a preview of the properties of residue number systems within the context of integer number systems is given in this section.

As a result of the carry-free property of residue number systems, it is feasible to implement addition, subtraction and multiplication by combinatorial logic. In particular, the need for partial products in multiplication is eliminated.

Hence, a conventional computer would require more time to perform these operations than a residual one, given they are both implemented in the same technology and share the same range.

However, not being a weighted number system, the residue system does not benefit from some of the most of the advantageous attributes of binary and binary-coded decimal systems; division, relative-magnitude comparison, sign detection and overflow detection, which are frequently used computer operations, are very hard to perform, explaining why this kind of number system did not meet a widespread support.

This disclosure describes how this trend could be reverted for very specific applications where not only all the complex operations mentioned above are not necessary, but also timing, area occupation and power consumption requirements are very demanding.

As stated earlier, the residue number system is an integer number system, and its representation is unique, while it can be redundant or non-redundant, depending upon the desired application.

Even though nowadays techniques to represent fractional residue numbers exist, in what follows all operands and results of arithmetic operations will be considered integer numbers. This is consistent with most of the published literature, which is still based on an integer interpretation of the residue numbers.

From that, two consequences follow: there is loss of accuracy in evaluating quotients due to rounding errors, and the absolute value of the result will be larger than the inputs used for the computations.

One challenge as a result of the latter in applying residue arithmetic is that a residue design will most likely utilize a significantly larger output range than the input to keep the arithmetic result within the range of the machine. Alternatively, all the quantities may often undergo a rescaling process by means of division one of the slowest and most complex operations, thus the rescaling process may be very inefficient.

3.2 Algebra of Residue Classes

In this section, an unconventional number system based on modular arithmetic is presented: the residue number system. The necessary mathematical background will be provided, describing what a residue representation is, what are the underlying arithmetic identities and operations, and how residues are processed in a digital design.

3.2.1 Residue Representation

Like in a fixed-radix system, a residue number system is completely determined if the base is specified; however, there is no such thing as a fixed base in residue systems, which is replaced by a set of N integers $m_i$ called moduli (sing. modulus). In fact, residue systems represent an integer through a set of smaller ones.

In a RNS, a number X is represented by the N-tuple $(x_1, x_2, \ldots, x_N)$. The $x_i$ are the least positive remainders of X divided by said modulus of the RNS. A RNS is completely described by a pair-wise coprime moduli set $\{m_1, m_2, \ldots, m_N\}$. The dynamic range of the RNS is $M = m_1 m_2 \ldots m_N$. Operations within each modulus are independent from the other moduli. Each modulus utilizes specific arithmetic units, computations are carried out in a highly-parallel fashion and the complexity of such units depends on the magnitude of the relative modulus. Hence, the moduli set determines accuracy and complexity of the RNS. In this disclosure, we present an architecture based on moduli of the form $2^m$, $2^m-1$ since they facilitate maximizing the storing efficiency and are very simple to implement with fully-combinatorial logic.

$2^m$ arithmetic is just conventional, m-bit binary arithmetic. $2^m-1$ arithmetic is m-bit 1's-complement arithmetic with an end-around carry (EAC). One property of the $2^m-1$ modulus is its periodicity:

$$2^{k+nm} \bmod 2^m - 1 = 2^k \qquad (1)$$

where k, n and m are integers. This means that every bit in position k+nm is mapped in the equivalent position k<m and can be exploited to simplify modulo reduction of lengthy numbers by means of multi-operand adders (MOA).

For a given base $\{m_i\}_{i=1}^N = \{m_N, m_{N-1}, \ldots, m_1\}$, the residue representation of an integer x is the vector $(r_i)_{i=1}^N = (r_N, r_{N-1}, \ldots, r_1)$, where each $r_i$ is an integer value defined by:

$$x = q_i m_i + r_i, \forall i \in [1, N] \qquad (3.7)$$

where $q_i$ is the largest integer such that $0 \le q_i \le m_i - 1$. It is evident that $q_i$ is none other than the quotient of the division of x by $m_i$, while $r_i$ its remainder. In particular, the integer value of such division is denoted $q_i = [x/m_i]$, whereas its least positive remainder is denoted $r_i = |x|_{m_i}$, and defined the residue of x modulo $m_i$, or x mod $m_i$; $r_i$ is also known as the i-th residue digit of x. From Equation (3.7), thus, it holds:

$$x = \left[\frac{x}{m_i}\right] m_i + |x|_{m_i}, \forall i \in [0, N-1] \qquad (3.8)$$

Of course, x can also be negative, but $|x|_{m_i}$ will be positive by definition, whilst $[x/m_i]$ can be negative according to x.

This representation is unique, each integer has only one representation, since there exists only one least positive remainder for any number. However, the converse is not true, e.g. the remainder of both 5 and 8 modulo 3 is 2. This ambiguity of the residue representation can be avoided by selecting a certain range of the system so that two numbers in such a range cannot have the same representation. In the general case, it can be shown that two integers x and x' have the same residue representation for the moduli set $\{m_i\}_{i=1}^N$ if and only if (x−x') is an integer multiple of the least common multiple of the moduli, denoted M; that is $$M = l \cdot c \cdot m \cdot (m_N, m_{N-1}, \ldots, m_1) \qquad (3.9)$$

Further, if all $m_i$ are pairwise relatively prime, it holds:

$$M = \prod_{i=1}^N m_i \qquad (3.10)$$

Therefore, the residue representation is periodic, and to obtain an unambiguous representation its range may be restricted to a single period, called interval of definition. This is better understood by inspection of Table 3.1, which depicts the residue representation of $x \in [−4, 33]$ for the base $\{m_1, m_2, m_3\} = \{2, 3, 5\}$.

In this case, M=2*3*5=30, which is the period, and −4 and 26 have the same representation.

TABLE 3.1

Residues Moduli {2, 3, 5} of Numbers −4 to 33

| x | x mod 2 | x mod 3 | x mod 5 |
|---|---|---|---|
| −4 | 0 | 2 | 1 |
| −3 | 1 | 0 | 2 |
| −2 | 0 | 1 | 3 |
| −1 | 1 | 2 | 4 |
| 0 | 0 | 0 | 0 |
| 1 | 1 | 1 | 1 |
| 2 | 0 | 2 | 2 |
| 3 | 1 | 0 | 3 |
| 4 | 0 | 1 | 4 |
| 5 | 1 | 2 | 0 |
| 6 | 0 | 0 | 1 |
| 7 | 1 | 1 | 2 |
| 8 | 0 | 2 | 3 |
| 9 | 1 | 0 | 4 |
| 10 | 0 | 1 | 0 |
| 11 | 1 | 2 | 1 |
| 12 | 0 | 0 | 2 |
| 13 | 1 | 1 | 3 |
| 14 | 0 | 2 | 4 |
| 15 | 1 | 0 | 0 |
| 16 | 0 | 1 | 1 |
| 17 | 1 | 2 | 2 |
| 18 | 0 | 0 | 3 |
| 19 | 1 | 1 | 4 |
| 20 | 0 | 2 | 0 |
| 21 | 1 | 0 | 1 |
| 22 | 0 | 1 | 2 |
| 23 | 1 | 2 | 3 |
| 24 | 0 | 0 | 4 |
| 25 | 1 | 1 | 0 |
| 26 | 0 | 2 | 1 |
| 27 | 1 | 0 | 2 |
| 28 | 0 | 1 | 3 |
| 29 | 1 | 2 | 4 |
| 30 | 0 | 0 | 0 |
| 31 | 1 | 1 | 1 |
| 32 | 0 | 2 | 2 |
| 33 | 1 | 0 | 3 |

Finally, as stated before, x can be negative. Like in binary systems, the representation of negative numbers is arbitrary. For example, in a sign and magnitude representation, the absolute magnitude of a number may be represented by its residue code and the sign by and external bit; another choice may be to include the sign as part of the representation, partitioning the range accordingly and assigning signed numbers to a portion of it, like in 2's-complement binary representation. From the standpoint of consistency, the choice of the interval is arbitrary can be changed depending on the problem.

3.2.2 Arithmetic Identities

In what follows, residue arithmetic identities will be presented in order to prepare a solid mathematical foundation for additional disclosure below. All these relationships are derived from direct application of the equations defining residue system's representation, therefore will be presented without proof.

Residues of Multiples of m

If a number x is a multiple of m, x=my, it holds:

$$|x|_m = |my|_m = 0 \quad (3.11)$$

From (3.11) also results that, if $x \in [0, m-1]$, is not a multiple of m:

$$\left[\frac{x}{m}\right] = 0 \quad (3.12)$$

$$|x|_m = x \quad (3.13)$$

and since $|x|_m \in [0, m-1]$:

$$||x|_m|_m = |x|_m \quad (3.14)$$

These equations impact a hardware implementation perspective because to define the range of x for which modulo reduction—a difficult operation in hardware—can be avoided. Furthermore, it follows that:

$$|x + my|_m = x \quad (3.15)$$

$$\left[\frac{x + my}{m}\right] = \left[\frac{x}{m}\right] + m \quad (3.16)$$

Additive Inverse Modulo m

The quantity $|-x|_m$ is called additive inverse of x modulo m, and is defined as:

$$|-x|_m = |m-x|_m \quad (3.17)$$

The additive inverse is unique, and every number has one. Also, if $y=|-x|_m$ is the additive inverse of x, then x is also the additive inverse of y.

Addition and Subtraction Modulo m

Addition and subtraction in residue domain are performed as follows:

$$|x \pm y|_m = ||x|_m \pm |y|_m|_m = |x \pm |y|_m|_m \quad (3.18)$$

This can be further generalized to:

$$\left|\sum_i x_i\right|_m = \left|\sum_i |x_i|_m\right|_m \quad (3.19)$$

It is evident that the modulo m operation, from an algorithmic standpoint, can be performed at any step of the computation. The results of the intermediate computations could exceed the modulus, that is why, in most cases, the outmost modulo reduction is typically not avoided, even if reduction was performed after every intermediate step of processing. This is a consideration when designing modular arithmetic algorithms and their corresponding hardware implementations.

Multiplication Modulo m

Modular multiplication is analogous to modular addition:

$$|xy|_m = ||x|_m |y|_m|_m = |x|y|_m|_m \quad (3.20)$$

This can be generalized to:

$$\left|\prod_i x_i\right|_m = \left|\prod_i |x_i|_m\right|_m \quad (3.21)$$

Multiplicative Inverse Modulo m

The quantity $|1/x|_m$ is called multiplicative inverse of x modulo m, and is defined as:

$$|xy|_m = ||x|_m |y|_m|_m = |x|y|_m|_m \quad (3.22)$$

The multiplicative inverse is unique, and it only exists if the greatest common divisor of x and m is 1, i.e. they are pairwise coprime, with x≠0. Also, if $$y = \left|\frac{1}{x}\right|_m$$

is me multiplicative inverse of x, then x is also the multiplicative inverse of y.

Unlike additive inverse, there is no easy way to compute the multiplicative inverse from its definition: sometimes, $$\left|\frac{1}{x}\right|_m$$

is obtained empirically, simply substituting new values for it in equation (3.22) until it is satisfied, for some given x and m.

If m is a prime number p, Fermat's Theorem states that:

$$|x^p|_p = |x|_p \quad (3.23)$$

This can be exploited to express the multiplicative inverse for each x given m prime:

$$\left|\frac{1}{x}\right|_p = |x^{p-2}|_p \quad (3.24)$$

In fact, substituting (3.24) into (3.22), and using (3.23):

$$\left|x\left|\frac{1}{x}\right|_p\right|_p = |xx^{p-2}|_m = |xx^{1-2}|_m = 1 \quad (3.25)$$

3.2.3 Chinese Remainder Theorem

Actual devices based on residue numbers will most likely be integrated in a conventional digital system, thus communicating with other processing units that may or may not employ a residue representation. In the latter case, the proper conversion circuitry may be utilized, to correctly interpret residues in binary or binary-coded decimal systems. In an embodiment, this conversion is performed according to the Chinese Remainder Theorem.

This theorem states that, given the residue representation $(r_i)_{i=1}^N$ of x, it is possible to determine $|x|_M$, where M is the period of the representation as described in Section 3.2.1 above, if all moduli $\{m_i\}_{i=1}^N$ are pairwise relatively prime, or coprime:

$$|x|_M = \left|\sum_{i=1}^N \hat{m}_i \left|\frac{r_i}{\hat{m}_i}\right|_{m_i}\right|_M \quad (3.26)$$

$$\hat{m}_i = \frac{M}{m_i} \quad (3.27)$$

$$M = \prod_{i=1}^N m_i \quad (3.28)$$

It is evident that this conversion process presents many issues to be dealt with, both from an algorithmic and a physical point of view. It utilizes complex operations like divisions, evaluation of multiplicative inverses which was shown to be a difficult task—and a large modulo M reduction. Also, if x does not belong to [0, M−1], a proper translation of the range is utilized, e.g., if x∈[$t_0$, $t_0$+M−1], then $x = |x|_M + t_0$ if $|x|_M < t_0$, so relative-magnitude comparison is performed.

The backward conversion operation is, therefore, the performance bottleneck of every residue-based implementation, as will be more apparent in Chapter 4. The most efficient designs of conversion units available in the published literature are based on:

special moduli sets (or low-cost moduli sets), in which multiplicative inverses of $\hat{m}_i$ can be determined in a closed form;

alternative formulations of the Chinese Remainder Theorem.

For the latter case, we may utilize formulations of the theorem known as New Chinese Remainder Theorem I & II, and improvements thereon.

3.2.4 Arithmetic Operations

In the previous section was shown how the individual digits of a residue system are handled. This section will instead show how to handle words of digits, i.e. how arithmetic operations are performed in the residue representation as a whole.

Addition/Subtraction

If a number x has a residue representation $(x_i)_{i=1}^N = (x_N, x_{N-1}, \ldots, x_1)$ within the base $\{m_i\}_{i=1}^N = \{m_N, m_{N-1}, \ldots, m_1\}$, where $x_i$ is the remainder of x modulo $m_i$, addition/subtraction of two numbers x and y is performed as follows:

$$|x \pm y|_M = \left(\{|x_i \pm y_i|_{m_i}\}_{i=1}^N\right)_{\{m_i\}_{i=1}^N} = \quad (3.29)$$

$$\left(\{|x_N \pm y_N|_{m_N}, |x_{N-1} \pm y_{N-1}|_{m_{N-1}}, \ldots, |x_1 \pm y_1|_{m_1}\}\right)_{\{m_i\}_{i=1}^N}$$

Recalling from Section 3.1.2 that $(x_{n-1} x_{n-2} \ldots x_0)_m$ is the notation for x represented base m on n digits, equation (3.29) represents the sum of x and y in the residue number system determined by moduli set $\{m_i\}_{i=1}^N$ on N residual digits, given m is substituted with the whole moduli set.

From (3.29) the following facts are evident:

addition/subtraction utilizes no intermodular carries/borrows;

the sum is obtained modulo M.

The former was stated earlier and is now justified: it means that each residue digit of the result is dependent only on the corresponding residue digit of the operands. In this respect, it is fundamentally different from weighted number systems, where each digit depends also on the less significant digits.

The latter determines the maximum output range for operations in residue representation: if the sum exceeds M, an overflow occurs that could lead to errors, depending on the specific application.

Multiplication

Analogously, multiplication between two numbers x and y can be performed as:

$$|xy|_M = \left(\{|x_i y_i|_{m_i}\}_{i=1}^N\right)_{\{m_i\}_{i=1}^N} = \quad (3.30)$$

$$\left(\{|x_N y_N|_{m_N}, |x_{N-1} y_{N-1}|_{m_{N-1}}, \ldots, |x_1 y_1|_{m_1}\}\right)_{\{m_i\}_{i=1}^N}$$

Multiplication can always be implemented by repeated additions, so the same comments apply as to residue addition: multiplication is carry-free, and if the product exceeds M, an ambiguity arises from the periodic nature of the representation.

Nevertheless, multiplication is easily performed by means of look-up tables, whereas in conventional computers it is not feasible due to the large amount of entries utilized by said tables, namely $2^{2n}$ for n-bit words. In turn, each modulus utilizes $m_i^2$ entries, for a total of $\Sigma_{i=1}^{N} m_i^2$. Residue digits $x_i$ will necessarily be binary-coded on a word-length of $\lceil \log_2 m_i \rceil$ ($\lceil \cdot \rceil$ is the rounding up operation). If $m_i$ are chosen such that $\Sigma_i \lceil \log_2 m_i \rceil = \Sigma_i l_i = n$, the total number of entries will be $\Sigma_{i=1}^{N} 2^{2l_i}$. Thus, it is evident that the choice of the moduli may lead to a significant reduction of the look-up tables size. For example, assuming $l_i = n/N \forall i$, the number of utilized entries become $N 2^{2n/N} < 2^{2n}$, and for N=2 becomes $$2 * 2^{\frac{2n}{2}} = 2^{n+1}.$$

In addition, some properties of modular arithmetic can be exploited to further decrease this number, as will be shown later in Section 3.2.5, by a reduction of the multiplication truth table.

Forward Conversion

Equation (3.8) from Section 3.2.1 always allows to determine the residue representation of a number x. A straightforward way to implement the forward conversion would be to divide x by each $m_i$ and determine the remainder.

A better approach takes advantage of the binary representation of a number:

$$x = \sum_{i=0}^{n-1} x_i 2^i \quad (3.31)$$

where $x_i$ are the binary digits. Taking the modulo of (3.31):

$$|x|_{m_i} = \left| \sum_{i=0}^{n-1} x_i 2^i \right|_{m_i} = \left| \sum_{i=0}^{n-1} x_i |2^i|_{m_i} \right|_{m_i} \quad (3.32)$$

The powers of 2 modulo $m_i$ can be stored in look-up tables and the addition may be performed with a modular adder. This topic will be discussed more in detail in Chapter 4.

Mixed-Radix Reverse Conversion

In a residue computer, conversion of residue numbers could not be performed with the Chinese Remainder Theorem, since said computer would be equipped to perform modulo $m_i$ arithmetic, and not modulo M.

A procedure called Mixed-radix conversion can tackle this problem and perform reverse conversion without extra hardware for modulo M reduction by expressing the result in a mixed-radix number system.

Mixed-radix representation is significant in residue computation for the following two reasons:
- magnitude comparison is easily performed, being a weighted number system;
- conversion to certain mixed-radix systems is relatively fast.

Any mixed-radix number system is described by the following relationship:

$$x = \sum_{i=1}^{N} x_i \prod_{j=0}^{i-1} R_j = x_N(R_{N-1} R_{N-2} \ldots R_0) + \ldots + x_2(R_1 R_0) + x_1(R_0)|x|_{m_i} = \left| \sum_{i=0}^{n-1} x_i 2^i \right|_{m_i} = \left| \sum_{i=0}^{n-1} x_i |2^i|_{m_i} \right|_{m_i} \quad (3.33)$$

Where $x_i$ are the mixed-radix digits, $\{R_i\}_{i=1}^{N}$ the set of radices, $x_i \in [0, R_i-1]$ and $R_0=1$. The mixed-radix representation of x is denoted as $\langle x_i \rangle_{i=1}^{N} = \langle x_N, x_{N-1}, \ldots, x_1 \rangle$. The range of this representation depends on N, and is equal to [0, $\Pi_i R_i - 1$].

Within this range, each number has a unique representation. The weights in this system are the terms $w_i = \Pi_{j=0}^{i-1} R_j$.

Conversion from a residue representation to a mixed-radix one is performed as follows: first, a set of radices is selected such that $R_i = m_i$; this way, both systems are said to be mutually associated, and share the same range $\Pi_i R_i = \Pi_i m_i = M$.

Then, equation (3.33) becomes:

$$x = \sum_{i=1}^{N} x_i \prod_{j=0}^{i-1} m_j = x_N(m_{N-1} m_{N-2} \ldots m_1) + \ldots + x_2 m_1 + x_1 \quad (3.34)$$

Keeping in mind that x is a residue digit, the mixed-radix digits $x_i$ can easily be obtained by an iterative procedure that involves successive modulo reductions, divisions and subtractions. Since every mixed-radix weight $w_i$ is a multiple of some moduli, it is evident that the mixed-radix digits are the residues modulo $m_i$ of certain quantities that can be derived from Eq. (3.34):

$$x_i = \left| \frac{x - \sum_{j=1}^{i-1} x_j \sum_{k=0}^{j-1} m_k}{\prod_{j=0}^{i-1} m_j} \right|_{m_i} = \quad (3.35)$$

$$\left| \frac{x - [x_{i-1}(m_{i-2} m_{i-3} \ldots m_1) + \ldots + x_2 m_1 + x_1]}{m_{i-1} m_{i-2} \ldots m_1} \right|_{m_i}$$

Alternatively, one can think of $\Sigma_{j=1}^{i-1} x_j \Pi_{k=0}^{j-1} m_k$ in (3.35) as the residue modulo $\Pi_{j=0}^{i-1} m_j$ of x. In fact, applying the definition of residue (3.8):

$$\left[ \frac{x}{m} \right] = \frac{x - |x|_m}{m} \quad (3.36)$$

Comparing (3.35) and (3.36), it is evident that the quantity within the modulo reduction in (3.35) is the quotient of $x/\Pi_{j=0}^{i-1} m_j$, thus $\Sigma_{j=1}^{i-1} x_j \Pi_{k=0}^{j-1} m_k$ is its residue. The result of the subtraction in (3.35) will be of the form:

$$x - \sum_{j=1}^{i-1} x_j \prod_{k=0}^{j-1} m_k = \qquad (3.37)$$

$$\sum_{j=i}^{N} x_j \prod_{k=0}^{j-1} m_k = x_N(m_{N-1} m_{N-2} \ldots m_1) + \ldots + x_i(m_{i-1} m_{i-2} \ldots m_1)$$

With further manipulation of (3.37):

$$\sum_{j=i}^{N} x_j \prod_{k=0}^{j-1} m_k = \left( \prod_{k=0}^{i-1} m_k \right) \left( \sum_{j=i}^{N} x_j \prod_{k=i}^{j-1} m_k \right) = \qquad (3.38)$$

$$(m_{i-1} m_{i-2} \ldots m_1)[x_N(m_{N-1} m_{N-2} \ldots m_i) + \ldots + x_i]$$

It is evident that (3.38) can be divided by $\Pi_{k=0}^{i-1} m_k$, obtaining a number of the form (3.34). This whole procedure will be demonstrated with an example.

Consider a set of four moduli and let:

$$x = x_4 m_3 m_2 m_1 + x_3 m_2 m_1 + x_2 m_1 + x_1 \qquad (3.39)$$

Equation (3.39) is taken modulo $m_1$. Since all terms except the last one are multiples of $m_1$, $x_1 = x \bmod m_1$.

To obtain $x_2$, $x-x_1$ is formed and is divided by $m_1$, leading to:

$$\frac{x - x_1}{m_1} = x_4 m_3 m_2 + x_3 m_2 + x_2 \qquad (3.40)$$

Equation (3.40) is taken modulo $m_2$. Again, all terms except the last one are multiples of $m_2$, thus $x_2 = [(x-x_1)/m_1] \bmod m_2$.

To obtain $x_3$:

$$\frac{\frac{x - x_1}{m_1} - x_2}{m_2} = x_4 m_3 + x_3 \qquad (3.41)$$

$$x_3 = \frac{\frac{x - x_1}{m_1} - x_2}{m_2} \bmod m_3 \qquad (3.42)$$

To obtain $x_4$:

$$\frac{\frac{\frac{x - x_1}{m_1} - x_2}{m_2} - x_3}{m_4} = x_4 \qquad (3.43)$$

$$x_4 = \frac{\frac{\frac{x - x_1}{m_1} - x_2}{m_2} - x_3}{m_4} \bmod m_4 \qquad (3.44)$$

Obviously, the mod $m_4$ operation in (3.44) is redundant and can be omitted.

The mixed-radix conversion described utilizes N−1 residue operations, equally split between subtractions and multiplications. In this context, the term residue operation has a sequential time implication and is used as a raw estimate of operating speed.

3.2.5 Truth Table Reduction

The arithmetic tables for residue operations are essentially truth tables, from the standpoint of logic. Designing residue circuits will thus involve implementing a multivalued truth table for each residue digit. However, it is worth to examine the truth tables for eventual reductions prior to encoding them in binary representation.

It is possible to reduce the size of the truth tables by including a certain (usually negligible) amount of overhead circuitry prior to entering the table and after the result is read from it. For addition and multiplication, it is possible to reduce the number of entries from $m^2$ to $([m/2+1])^2$ for modulus m.

Multiplication

The truth-table-reduction method described here assumes a fast method for obtaining the additive inverse exists. If this is not the case, the overhead of circuitry may offset the benefits of the reduction.

The following equations denote the mode of entry into the table:

$$|xy|_m = \begin{cases} |xy|_m, & \text{if } x, y \leq \left[\frac{m}{2}\right] \\ |m - (m-x)y|_m, & \text{if } x > \left[\frac{m}{2}\right], y \leq \left[\frac{m}{2}\right] \\ |m - (m-y)x|_m, & \text{if } x \leq \left[\frac{m}{2}\right], y > \left[\frac{m}{2}\right] \\ |(m-y)(m-x)|_m, & \text{if } x, y > \left[\frac{m}{2}\right] \end{cases} \qquad (3.45)$$

Addition

For addition, its table reduction is more complicated and assumes a fast method for obtaining the additive inverse and for adding/subtracting [m/2] exists.

The following equations denote the mode of entry into the table:

$$|x + y|_m = \begin{cases} |x + y|_m, & \text{if } x, y \leq \left[\frac{m}{2}\right] \\ \left| y + \left(x - \left[\frac{m}{2}\right]\right) + \left[\frac{m}{2}\right] \right|_m, & \text{if } x > \left[\frac{m}{2}\right], y \leq \left[\frac{m}{2}\right] \\ \left| x + \left(y - \left[\frac{m}{2}\right]\right) + \left[\frac{m}{2}\right] \right|_m, & \text{if } x \leq \left[\frac{m}{2}\right], y > \left[\frac{m}{2}\right] \\ |(m-y) + (m-x)|_m, & \text{if } x, y > \left[\frac{m}{2}\right] \end{cases} \qquad (3.45)$$

3.2.6 Residue Digits Coding

In a digital circuit, only two-state devices are employed, hence a binary coding of the residue digits is necessary. There are many ways to perform such a coding and the particular method will obviously depend on the application. When choosing the appropriate binary coding for residue digits, the following points may be considered:
  storage efficiency;
  non-ambiguity of the binary coding, if digits are to be shared between different residue units (e.g. mixed-radix conversion);
  simple additive inverse determination;
  simple multiplicative inverse determination;
  simple magnitude comparison between digits of the same modulus;
  minimal circuitry complexity.

The selection of the encoding scheme is performed according to the individual application. To simplify this task, two categories of coding methods can be indicated: redundant coding and non-redundant coding.

Redundant Coding

In this case, the set of binary digits can represent a number of residue digits that exceeds the modulus m. The 1-out-of-m coding is an example. In this coding scheme, m states are represented by m binary digits. The residue digits are represented by a '1' in the corresponding position; for example, 3 is represented modulus 7 as 0000100, the word-length is 7 and the 3-rd bit is set to a high level.

It is evident that this scheme is very inefficient, in most cases even unfeasible for memory use. On the other hand, it is useful in the arithmetic units, because inverses are obtained easily, and allows easy magnitude determination.

Non-Redundant Coding

In this case, the set of binary digits can represent a number of residue digits that is equal to the modulus m.

If n is the binary word-length and m is the modulus, then $(2^n)!/(2^n-m)!$ different codings are possible. Two of the most useful codings are described in the following.

Fixed binary-weight code: this is the ordinary binary code, and has two principal advantages:
communication with non-residue systems is simple;
magnitude comparison between mixed-radix digits is simple.

On the other hand, this scheme does not permit easy computation of the inverses of residue digits and may thus utilize an overhead of logic.

1's-complement code: this code is similar to the standard 1's-complement code used in conventional computers and agrees with the fixed binary-weight code for the values of 1 to [m/2]. For larger values, the 1's-complement code is obtained taking the 1's-complement of the additive inverse of the digit. In particular, the fixed binary-weight code and the 1's-complement code are identical for moduli of values $2^n-1$.

It is evident that, in this system, the code for the additive inverse of a digit is easy to obtain, thus residue subtraction can be implemented with a modular adder. On the other hand, coding of a digit is usually dependent on the modulus.

For instance, 4 in the mod 5 system is represented by 110, since it is the additive inverse of 5−4=1, represented by 001; in the mod 7 system, however, 4 is represented by 100, so inter-modular communication may utilize an additional overhead of converters, which is undesirable.

Symmetric Residue System

Invariance of coding and ease of generating inverses are conflicting challenges—except where the moduli are of the form $2^n-1$—and can be solved employing symmetric residue systems.

They differ very little in structure from ordinary residue systems, and all the major advantages of the latter are retained. Each residue digit is defined to be the least absolute value remainder of x, when divided by m, whereas the ordinary residue system uses the least positive remainder.

A symmetric residue digit $/x/_m$ is defined by:

$$x = \left[\frac{x}{m}\right]m + /x/_m \quad (3.46)$$

where $/x/_m \in [-[m/2], [m/2]]$.

For the same set of moduli, the ordinary residue system is isomorphic to the symmetric system, thus all the theorems derived for the ordinary system are applicable if one replaces $|x|_m$ by $/x/_m$ or by $/x/_m+m$ depending on the range.

IV. MODULI CHOICE

A low accuracy of 16 bits inputs was set and 3-moduli sets of the kind shown in Table 1 were analyzed to experimentally determine which moduli sets are the most beneficial. To store the RNS inputs also on 16 bits, it must hold $l_1+l_2+l_3=16$. From Table 1, it is evident that the range is larger if moduli of the $2^m$ kind are smaller than the $2^m-1$ ones and if moduli are as close as possible in magnitude. On the other hand, modulo $2^m$ arithmetic utilizes less hardware, so it is desirable $2^m$ to be the largest modulus. In practice, a tradeoff between area and accuracy exists. In practical implementations, accuracy may not be an issue since CNNs are resilient to noise, so a moduli set that minimizes area may be preferred. From a timing perspective, we want the three moduli to be equilibrated, since the largest modulus will determine the performances' bottleneck. In fact, intra-modulus carries still exist, and the largest $l_i$ determines the longest delay path.

TABLE 1

Low-Cost 3-Moduli Sets

| | | | $\{2^{l_1}, 2^{l_2}-1, 2^{l_3}-1\}$ | | | | $\{2^{l_1}-1, 2^{l_2}, 2^{l_3}-1\}$ | | | | $\{2^{l_1}-1, 2^{l_2}-1, 2^{l_3}\}$ | | | |
|---|---|---|---|---|---|---|---|---|---|---|---|---|---|---|
| $l_1$ | $l_2$ | $l_3$ | $2^{l_1}$ | $2^{l_2}-1$ | $2^{l_3}-1$ | M | $2^{l_1}-1$ | $2^{l_2}$ | $2^{l_3}-1$ | M | $2^{l_1}-1$ | $2^{l_2}-1$ | $2^{l_3}$ | M |
| 1 | 2 | 13 | 2 | 3 | 8181 | 49146 | | | | | | | | |
| 1 | 4 | 11 | 2 | 15 | 2047 | 61410 | | | | | | | | |
| 1 | 7 | 8 | 2 | 127 | 255 | 64770 | | | | | | | | |
| 2 | 3 | 11 | 4 | 7 | 2047 | 57316 | 3 | 8 | 2047 | 49128 | 3 | 7 | 2048 | 43008 |
| 2 | 5 | 9 | 4 | 31 | 511 | 63364 | 3 | 32 | 511 | 49056 | 3 | 31 | 512 | 47616 |
| 3 | 3 | 10 | | | | | 7 | 8 | 1023 | 57288 | | | | |
| 3 | 4 | 9 | 8 | 15 | 511 | 61320 | | | | | 7 | 15 | 512 | 53760 |
| 3 | 5 | 8 | 8 | 31 | 255 | 63240 | 7 | 32 | 255 | 57120 | | | | |
| 3 | 6 | 7 | 8 | 63 | 127 | 64008 | 7 | 64 | 127 | 56896 | | | | |
| 4 | 5 | 7 | 16 | 31 | 127 | 62992 | 15 | 32 | 127 | 60960 | 15 | 31 | 128 | 59520 |
| 5 | 5 | 6 | | | | | 31 | 32 | 63 | | | | | |

It has been extensively shown in the previous sections that the properties of a particular residue number system strongly depend on the choice of the moduli set, and affect design choices regarding residue hardware.

On one hand, it is desirable to have the least number of moduli that is possible, because mixed-radix conversion has an execution time proportional to the number of moduli.

On the other hand, hardware complexity rises sharply with the size of the moduli, thus for a given range M, using many moduli of small magnitude may be preferred. If both M and the number of moduli are specified, empirical analysis has shown that selecting moduli very close in magnitude is usually the best option.

A first consideration in choosing the moduli regards the existence of unity multiplicative inverses, which greatly simplify a number of operations. For example, sets of N moduli in which all multiplicative inverses are unity can be obtained by certain recursive relationships.

These sets of moduli exhibit special advantages in performing mixed-radix conversions. It can be shown that analogous sets of convenient moduli exist if the conversion process uses the CRT.

A second consideration that can impact the choice of binary coding of the residues is storage efficiency, which is obviously maximized by non-redundant coding of the residues, and the attainable maximum is a function of the particular choice of the moduli.

Moduli of the form $2^m$ and $2^m-1$ have several notable benefits and sets that employ them are therefore generally known as special moduli sets or low-cost moduli sets.

In fact, the end-around carry principle, can be used for moduli with values $2^m-1$, whereas a standard n-bit binary adder can be employed for moduli $2^m$, greatly simplifying hardware requirements for addition and multiplication; this will be described in Chapter 4.

Moreover, their binary coding allows easy determination of additive inverses while maintaining the invariance property, and the multiplicative inverses are generally simple to determine. Finally, their storage efficiency is very high.

Residue Numbers

This disclosure is generally directed to the development of a Convolutional Accelerator, which is largely based on Multiply-And-Accumulate Units, four arithmetic operations are presented: Modular Addition/Subtraction in Section 4.1, Modular Multiplication in Section 4.2, Binary-To-Residue Conversion in Section 4.3 and Residue-To-Binary Coversion in Section 4.4.

4.1 Addition/Subtraction

This section is devoted to the description of algorithms for addition and subtraction in residue number systems, together with their correspondent hardware implementations. Either look-up tables or combinational logic methods may be employed. Obviously, modular adders can be modeled after conventional adders taking into account the proper corrections that residue numbers utilize for the special moduli sets. Otherwise, for arbitrary moduli sets, addition may not be implemented as efficiently, and different techniques may be employed.

4.1.1 Conventional Addition

In the following carry-ripple, carry-skip, carry-lookahead, carry-select, parallel prefix and carry-save adders will be covered in order to provide the basic knowledge about implementation methodologies and better understand how residue numbers' properties can be exploited to optimize their design.

Carry-Ripple Adder

Figure 18:
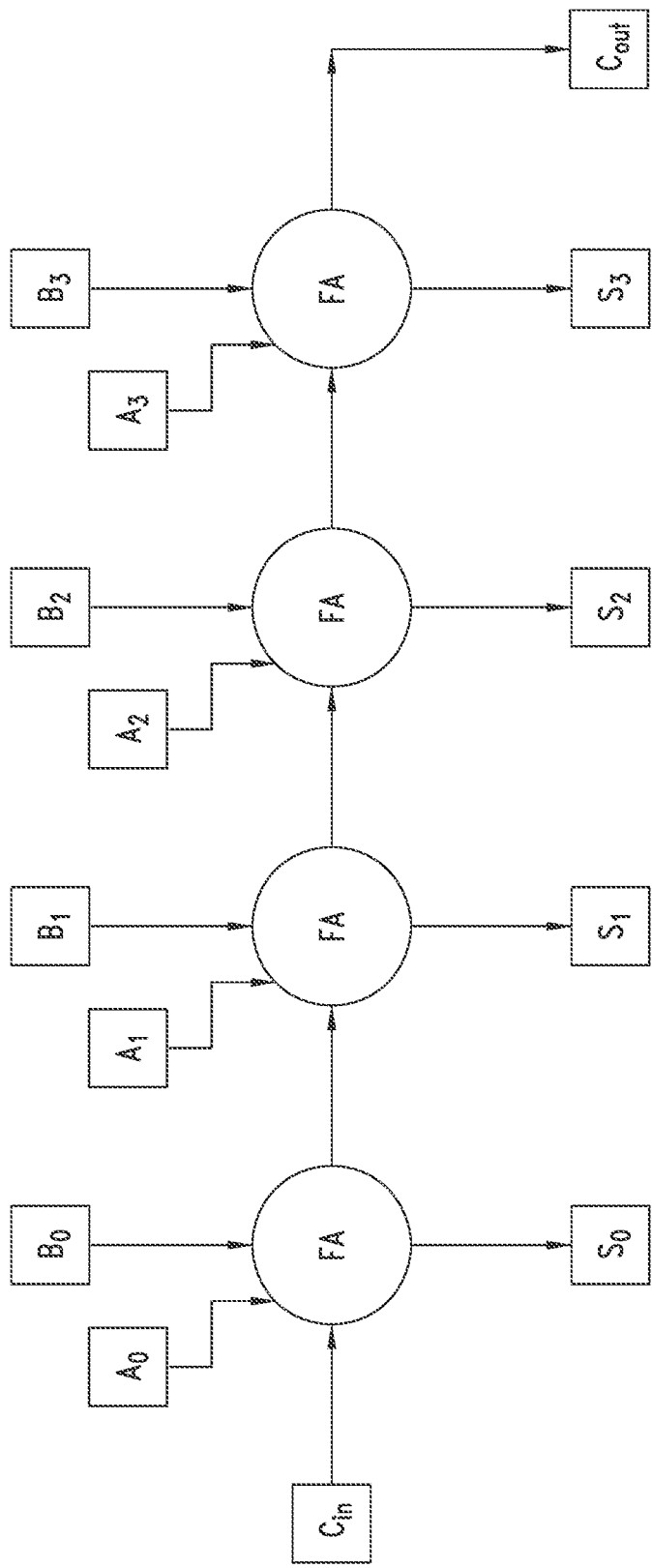
FIGS. 18-19 illustrate various exemplary embodiments of a ripple adder.

The ripple adder, exemplified as depicted in FIG. 18, is the most straightforward implementation of an adder circuit, comprising a chain of full-adders.

It is described by the following equations:

$$S_i = A_i \oplus B_i \oplus C_{i-1} \quad (4.1)$$

$$C_i = A_i B_i + (A_i \oplus B_i) C_{i-1} \quad (4.2)$$

where $A_i$ and $B_i$ are the addends for the i-th full-adder, $S_i$ is the corresponding sum and $C_i$ its output carry that is fed to the next full-adder. Thus, addition of two N-bits numbers results in a (N+1)-bits output.

The performance of the ripple adder may be evaluated by means of gate propagation delays. It is evident that this kind of adder is very slow, since carry can propagate from the first to the last full-adder, determining an operational time of O(N). If $t_{FA}$ is the time of delay propagation of a full-adder, the generation of the most significative bit, the output carry, will utilize at most N delays, leading to a total delay of $Nt_{FA}$. Due to the carry propagation, the evaluation of the output is performed in a serial fashion, whereas a parallel implementation is very desirable being the inputs $A_i$ and $B_i$ immediately available.

Figure 19:
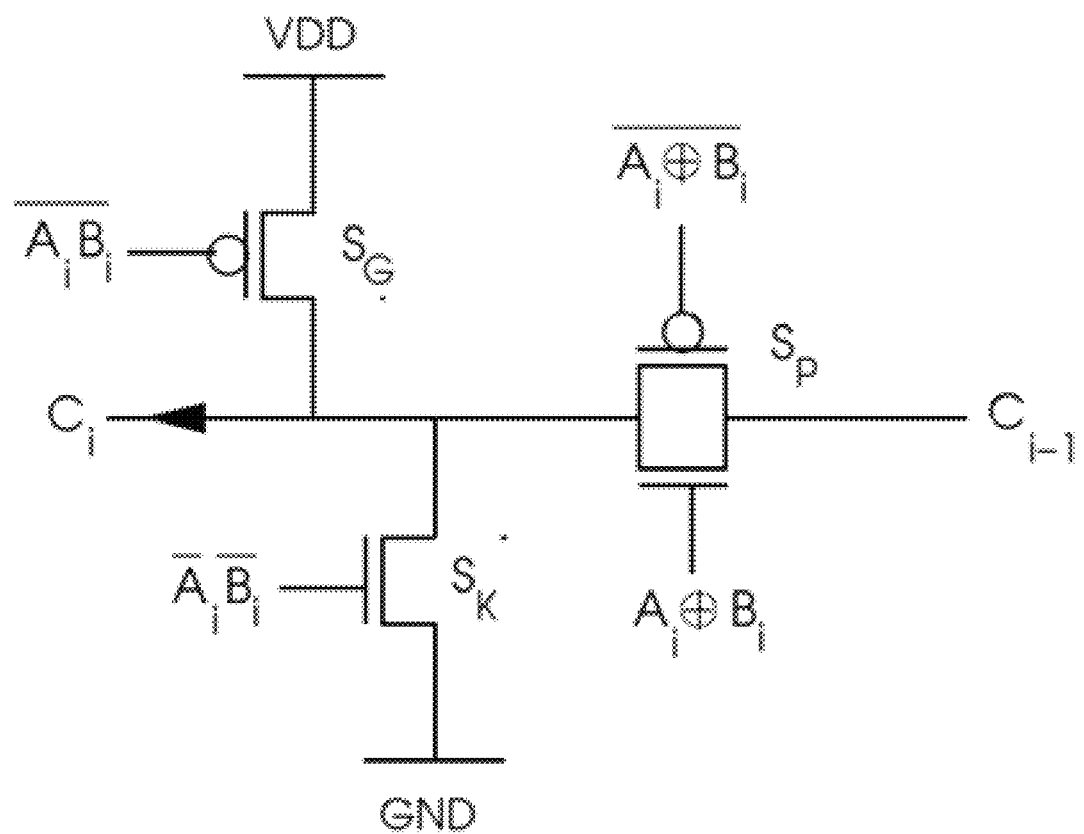

A common way to implement a ripple adder in CMOS technology is the Manchester Adder of FIG. 19, based on the Manchester Carry-Chain fast carry path. In practice, it includes a standard carry-ripple adder in which gates are replaced by much faster switches, like pass-transistor logic or transmission-gates logic.

It is well-known that ripple adders are very cheap and best suited when short word-lengths are employed, since carry propagation will not be a major issue with regard to delays; this makes ripple adders very appealing for use in residue numbers systems where sets of small moduli are chosen.

To perform subtraction with a ripple adder, the subtrahend input is negated and an input carry '1' is added if 2's-complement representation is chosen.

Carry-Select Adder

Figure 20:
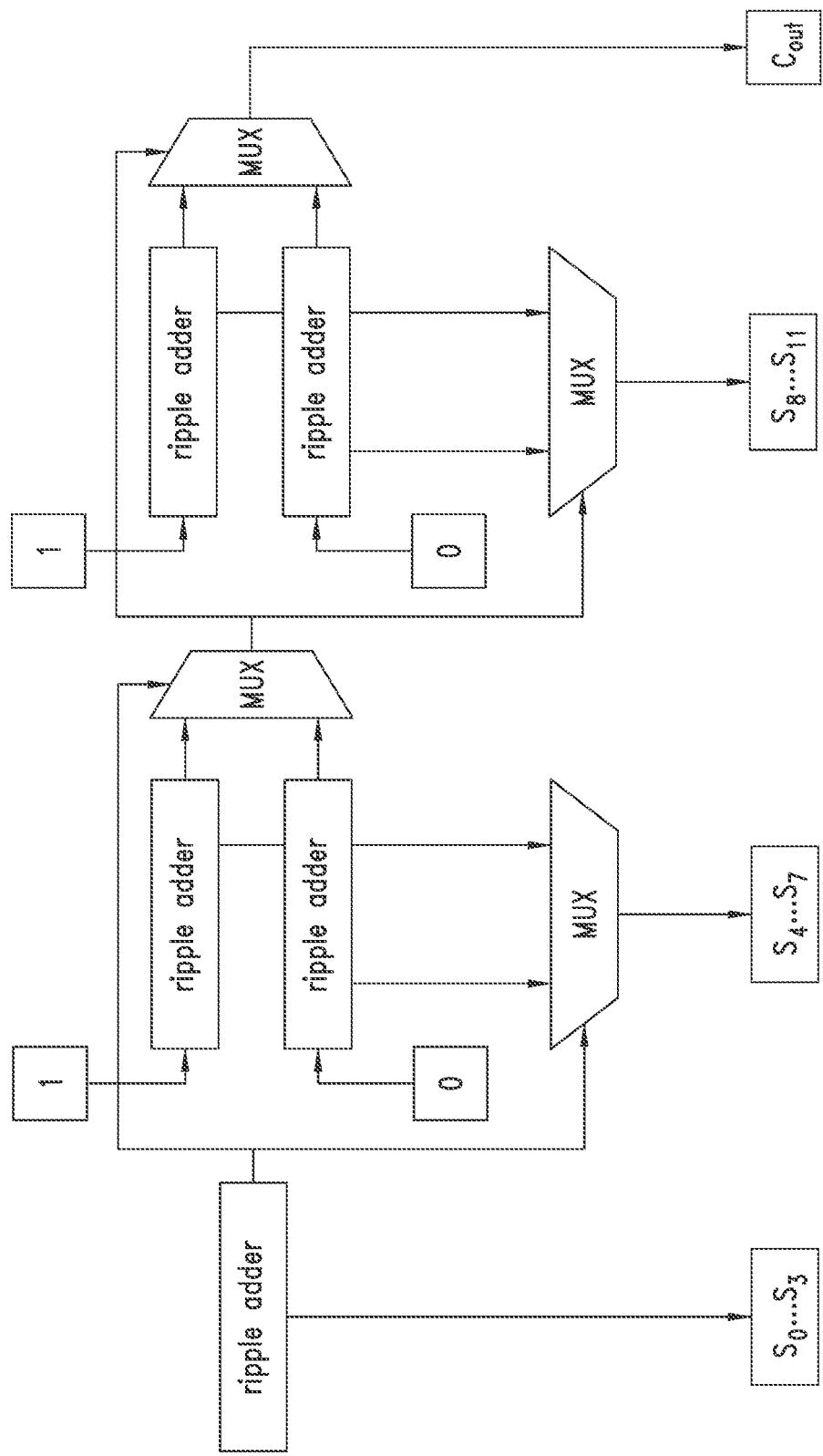
FIG. 20 illustrates an exemplary embodiment of a carry-select adder.

A simple, straightforward method to improve a ripple adder's performance is to reduce the addition of two N-bit words in a parallel addition of P blocks of M-bit words, where M and P are chosen such that N=MP. For each block, two ripple adders are instantiated with both input carries '1' and '0': this way, the propagation of the carry is anticipated by evaluating both cases, if carry is propagated to the next block or if it is not propagated. The final result of each block is selected by means of multiplexers according to the actual carry of the previous block. This is shown in FIG. 20.

The improvement obtained in terms of speed is evident, since every possible combination of sums is calculated concurrently as soon as inputs $A_i$ and $B_i$ are available. Thus, all ripple adders determine the same delay $Mt_{FA}$, with extra, sometimes negligible, delays due to P multiplexing operations.

Obviously, carry-select adders utilize a large amount of area, since every adder block is replicated and associated with additional circuitry for carry selection. It can be shown that, with proper selection of the P and M parameters, this kind of adder has an operational time of $O(\sqrt{N})$.

Carry-Skip Adder

For general-purpose architectures, where N is very large, carry-select adders are not suited due to their large area. Different approaches are employed to deal with carry propagation. The carry-skip (or carry-bypass) adder tackles this problem by skipping carry propagation whenever certain conditions are met, i.e. when a carry is to propagate through multiple full-adders. The basic principle is based upon the following.

Consider the truth table for the output carry described by equation (4.2):

TABLE 4.1

Addition Output Carry Truth Table

| A | B | $C_{in}$ | A ⊕ B | AB | $C_{out}$ |
|---|---|---|---|---|---|
| 0 | 0 | 0 | 0 | 0 | 0 |
| 0 | 0 | 1 | 0 | 0 | 0 |
| 0 | 1 | 0 | 1 | 0 | 0 |
| 0 | 1 | 1 | 1 | 0 | 1 |
| 1 | 0 | 0 | 1 | 0 | 0 |
| 1 | 0 | 1 | 1 | 0 | 1 |
| 1 | 1 | 0 | 0 | 1 | 1 |
| 1 | 1 | 1 | 0 | 1 | 1 |

It is evident that quantities p=A⊕B and g=AB are mutually exclusive; that is, p and g cannot be '1' at the same time for any combination of the inputs A, B, $C_{in}$. It also holds pg=0. These quantities are known as propagate and generate functions respectively, for they determine if either the input carry is propagated through the output carry or the output carry is generated by the sum of A and B, according to equation (4.2). Therefore, $C_{out}$=g+p$C_{in}$.

The propagate and generate functions are independent from the input carry and can be immediately evaluated as soon as inputs A and B are available; thus the output carry $C_{N-1}$ is propagated or generated depending on $A_i$ and $B_i$, and not on $C_i$, using a N-bit ripple-carry adder described by equations (4.1) and (4.2). This is better understood in the following example:

$$C_0 = g_0 + p_0 C_{in} \quad (4.3)$$

$$C_1 = g_1 + p_1 C_0 = g_1 + p_1(g_0 + p_0 C_{in}) \quad (4.4)$$

$$C_2 = g_2 + p_2 C_1 = g_2 + p_2(g_1 + p_1(g_0 + p_0 C_{in})) \quad (4.5)$$

It is evident that every carry $C_i$ is a function of every $g_i$ and $p_i$ and also of $C_{in}$.

Performing the products in (4.5), it holds:

$$C_2 = g_2 + p_2 g_1 + p_2 p_1 g_0 + p_2 p_1 p_0 C_{in} \quad (4.6)$$

Figure 21:
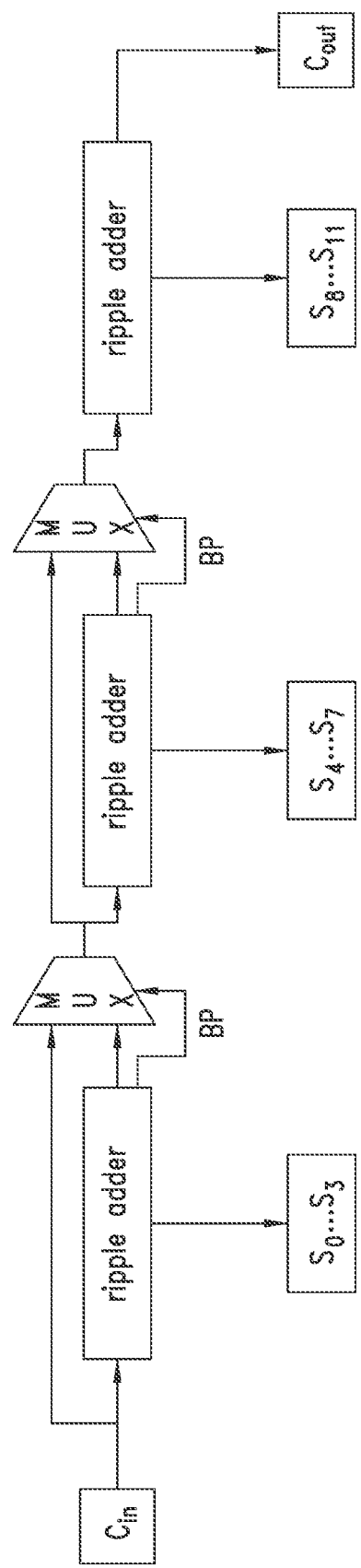
FIG. 21 illustrates an alternative exemplary embodiment of a carry-select adder.

Equation (CS4) is again of the form $C_{out}$=g+p$C_{in}$. Therefore, the quantity $g_2+p_2g_1+p_2p_1g_0$ is called block generate BG and $p_2p_1p_0$ block propagate BP, and again it can be demonstrated that these terms are mutually exclusive. One can decompose the addition of two N-bit numbers A and B in P blocks of M-bit words, and determine the block generate and propagate of each block. Ultimately, instead of selecting the appropriate carry for each block like in a carry-select adder, a skip is performed by extracting the block propagate function of each block and using it to multiplex the output carry of each block between the input carry or the carry generated within the block. This is shown in FIG. 21.

The block propagate signal is readily obtained by an AND operation between all propagate signals $p_i$ of a block, which are in turn extracted from the first half-adder block composing the full-adders.

Unfortunately, carry-skipping makes the propagation delay a stochastic variable, since it is unknown a priori if a certain block's carry will be generated or propagated. In fact, in the worst case, the first ripple adder block can generate its carry, which is then propagated through all the next blocks, leading to the same delay of an equivalent N-bits carry-select adder. In the best case, every ripple adder block skips its carry, leading to the delay of a single M-bits ripple adder. Therefore, carry-skip adders show competitive performances against carry-select adders, with much less area utilized for their implementation. Once again, with proper selection of P and M, operational time is of $O(\sqrt{N})$.

Carry-Lookahead Adder

The propagate and generate functions can be further exploited to speed up the addition, up to the point where carry computation is performed prior to the actual sum. With this architecture, no carry propagation ever occurs, thus obtaining the best performances in terms of speed even for very large N.

In fact, the critical delay path is constant with N.

First of all, inputs $A_i$ and $B_i$ are fed to a layer of half-adders, obtaining the $g_i$ and $p_i$. These, in turn, are fed to a carry-lookahead block that simultaneously produces every carry $C_i$ in parallel. Finally, a layer of XOR functions determines all the sums $S_i$, since, from (4.1), it holds that $S_i = p_i \oplus C_{i-1}$.

Figure 22:
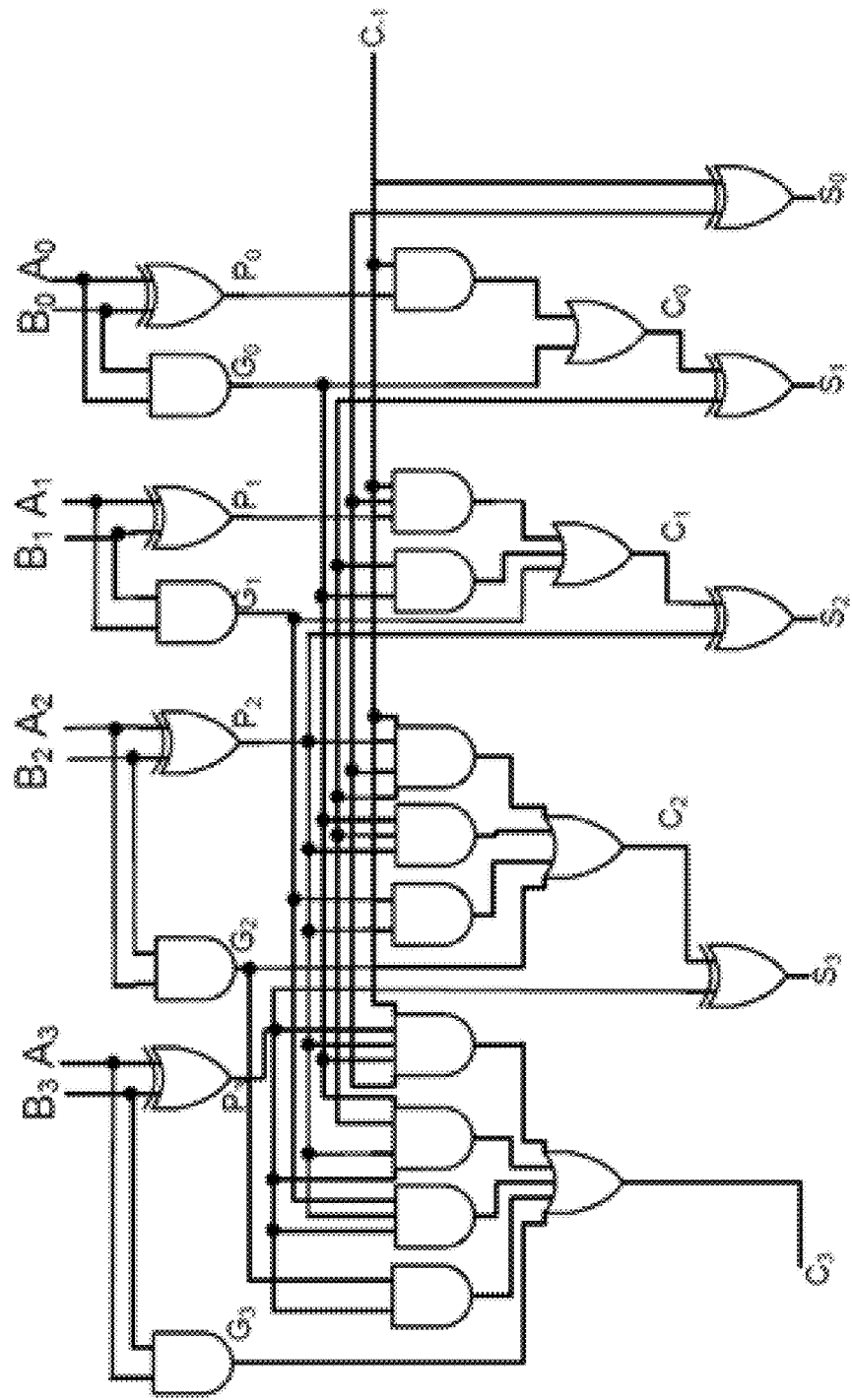
FIG. 22 illustrates an exemplary carry-lookahead block as may be utilized in one embodiment of a carry-lookahead adder.

A carry-lookahead block is shown in FIG. 22. It is evident that, for large N, the carry-lookahead block will present very large area, being highly irregular. Moreover, gates with undesirably large fan-in and fan-out are necessary, making carry-lookahead adders of very little practical use. One approach may involve decomposing the original carry-lookahead operation in smaller ones, in order to reduce area, irregularity, fan-in and fan-out; however, this will increase the delay.

Figure 23:
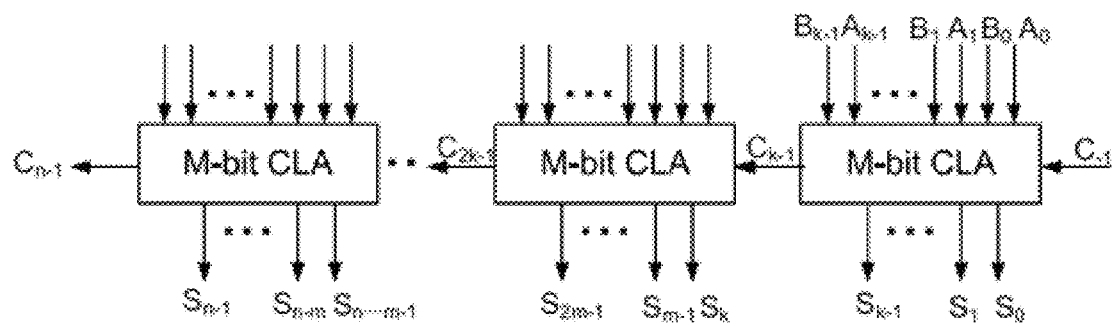
FIGS. 23-24 illustrate alternative exemplary embodiments of a carry-lookahead adder.
Figure 24:
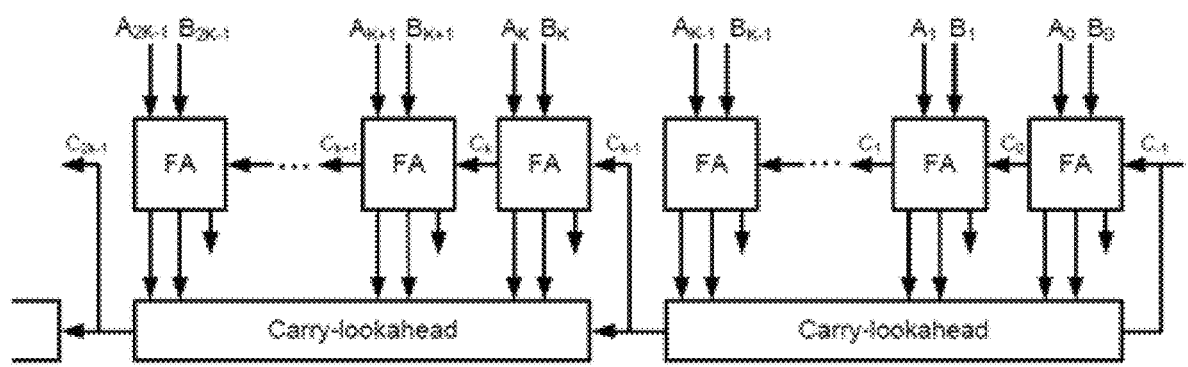

Two straightforward ways of doing so are the following:
  by arranging carries within blocks in a lookahead fashion, and between blocks in a rippled fashion (FIG. 23);
  by arranging carries within blocks in a rippled fashion and between blocks in a lookahead fashion (FIG. 24).

The former case deals directly with the fan-in and -out difficulties by splitting an N-bit adder into P, M-bits, smaller carry-lookahead adders. Indeed, its performances are limited by the inter-block rippling time, thus the delay will be proportional to P.

In the latter case, the N-bit adder is split into P, M-bits, smaller carry-ripple adders and overhead lookahead circuitry is employed; it may be selected such that N is large enough and M small enough that the loss in speed from rippling is outweighed by the gain from using lookahead. Performances are limited by rippling between the block-lookahead units.

Figure 25:
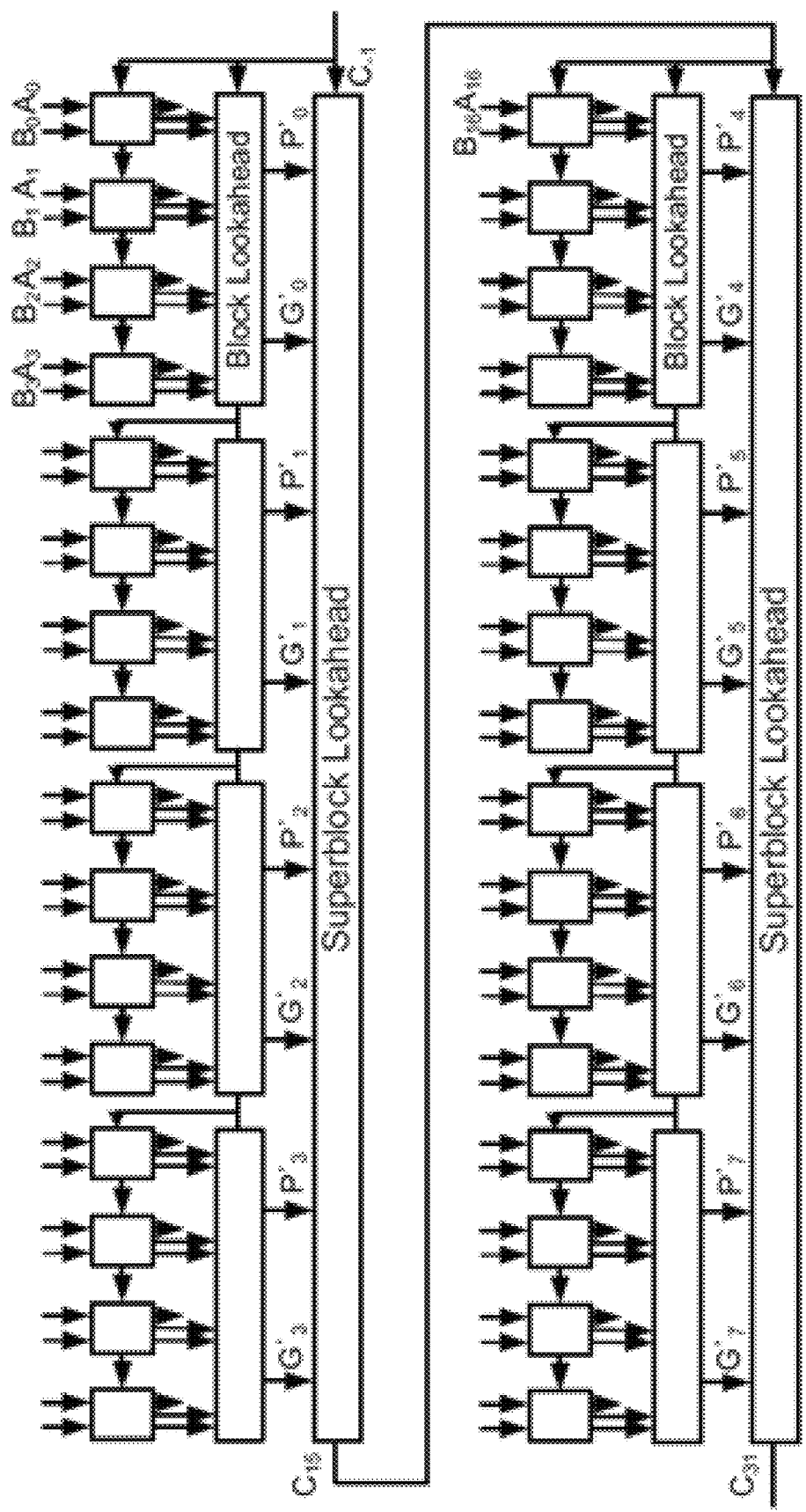
FIG. 25 illustrates an exemplary embodiment of a 32-bit, 2-level carry-lookahead adder.

Better performances are obtained by tree architectures, that is by using multiple levels of carry-lookahead circuits. An example for a 32-bit, 2-levels carry-lookahead adder is given in FIG. 25. In this implementation, the carry rippling chain between subsequent blocks shown in FIG. 24 is replaced by a second level of carry-lookahead that ripples its carry to the second block. Similarly, a second level of lookahead may be used to reduce the time associated with the inter-blocking rippling of the rippled carry lookahead when N is large.

The formulations above, however, are not well-suited to current VLSI ASIC technology, although some may be for FPGA technology. For ASIC there are better formulations known as parallel-prefix adders, in which the block generate and propagate functions play a fundamental role.

Parallel-Prefix Adder

Parallel-prefix adders are essentially more efficient variants of the two-level carry-lookahead adder. In current technology, they are among the best adders, well suited for high-speed addition of large numbers. They are based upon the so-called prefix problem: a prefix problem of computing the prefixes $$x_i = x_{i-1} \blacksquare a_i \tag{4.7}$$

given the set $\{a_i\}_{i=0}^{N-1}$ is closed under some associative operator ■, that is to be defined. The associativity of ■ allows prefixes to be computed in parallel. Carry propagation is a prefix problem and the ■ operator can be defined accordingly. Consider the following: from equation (4.6), the block generate and block propagate functions were defined as $BG = g_2 + p_2 g_1 + p_2 p_1 g_0$ and $BP = p_2 p_1 p_0$. It is evident that, with regard to BP, even the quantities $p_2 p_1$ and $p_1 p_0$ can be considered intermediate block propagate functions, respectively, of bits from 1 to 2 and from 0 to 1. In the general case, a block propagate function $P_i^j$ from bit i through bit j is defined as:

$$P_i^j = \prod_{k=i}^{j} p_k \tag{4.8}$$

Analogously, for BG, the quantities $g_1 + p_1 g_0$ and $g_2 + p_2 g_1$ are the intermediate block generate functions of bits from 0 to 1 and 1 to 2; in the general case $G_i^j$ is defined by:

$$G_i^j = \sum_{k=i}^{j} g_k \prod_{l=k+1}^{j} p_l \tag{4.9}$$

It is also evident that $G_0^2 = g_2 + p_2 g_1 + p_2 p_1 g_0$ can be obtained joining together $G_0^0 = g_0$, $G_1^2 = g_2 + p_2 g_1$ and $P_1^2 = p_2 p_1$:

$$G_0^2 = (g_2 + p_2 g_1) + (p_2 p_1) g_0 = G_1^2 + P_1^2 G_0^0 \tag{4.10}$$

Further generalizing:

$$G_i^j = G_{k+1}^j + P_{k+1}^j G_i^k \tag{4.11}$$

Equation (4.11) determines all the different ways in which the bit-level propagate and generate signals may be combined to get the corresponding block propagate and block generate signals, all the different ways to associate and prioritize the operations of addition and multiplication for evaluating $G_i^j$.

Analogously, for the block propagate holds:

$$P_i^j = P_{k+1}^j P_i^k \tag{4.12}$$

The operator ■ for the prefix problem of carry propagation is thus defined by the block generate and block propagate functions according to the equation:

$$(G_i^j, P_i^j) = (G_{k+1}^j, P_{k+1}^j) \blacksquare (G_i^k, P_i^k) = (G_{k+1}^j + P_{k+1}^j G_i^k, P_{k+1}^j P_i^k) \tag{4.13}$$

Furthermore, with regard to the carries $C_i$, (4.6) can be also generalized as:

$$C_i = G_0^i + P_0^i C_{in} \tag{4.14}$$

which, if the input carry is '0', further simplifies to:

$$C_i = G_0^i = j + P_j^i G_0^{j-1} \tag{4.15}$$

The sums $S_i$ are obtained, like in the carry-lookahead adder, according to:

$$S_i = p_i \oplus C_{i-1} = p_i \oplus G_0^{i-1} \tag{4.16}$$

Figure 26:
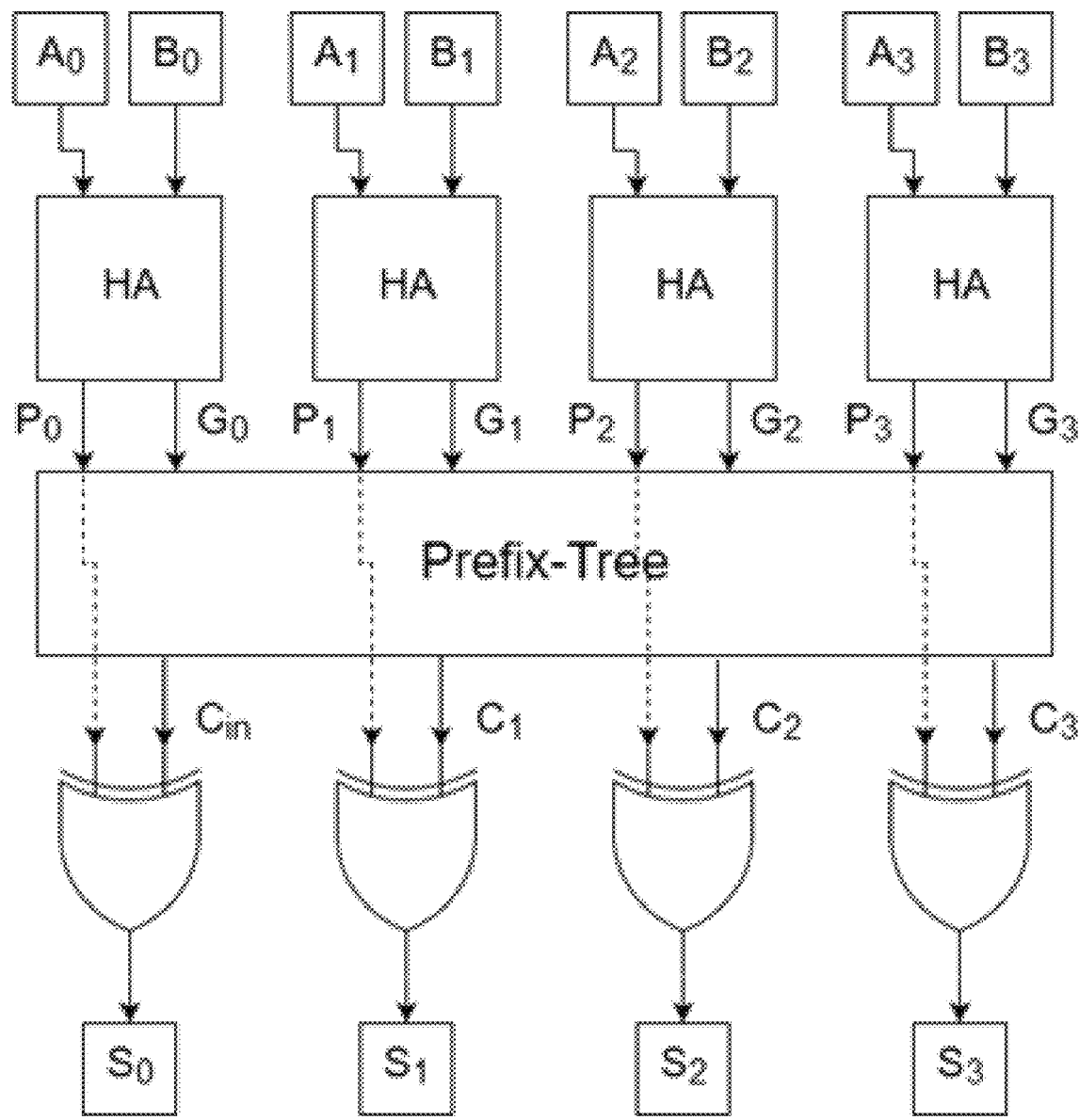
FIG. 26 illustrates an exemplary embodiment of a parallel-prefix adder.

One embodiment of a parallel-prefix adder is shown in FIG. 26 and includes a first layer of half-adders that produce bit-level carry propagate and generate signals, a parallel-prefix block, also called carry prefix tree, and a last layer of sum formation logic, like in a carry-lookahead adder.

The carry-prefix tree is designed so that, in the last level, $C_i = G_0^i$ is available for every i. The associativity of ■ allows to arbitrarily select the sub-terms in the corresponding full expressions of the block generate and propagate signals, which in turn determines fan-in, fan-out and wiring. Designing a parallel-prefix adder fundamentally consists in choosing the appropriate carry-prefix tree for a given set of specifications. Operational time, however, is always $O(\log_2 n)$, where n is the number of levels in the prefix tree.

Carry-Save Adder

As will be evident in the next sections, it is very common—if not necessary—in residue architectures to add up more than two operands at a time; this can be performed either by a sequence of multiple 2-operands additions or by the so-called carry-save approach.

The former is easily implemented by either replicating the standard adders shown earlier, in a parallel implementation, or by feeding back the output of a single adder as a new input, obtaining a serial implementation with smaller area but reduced throughput.

Figure 27:
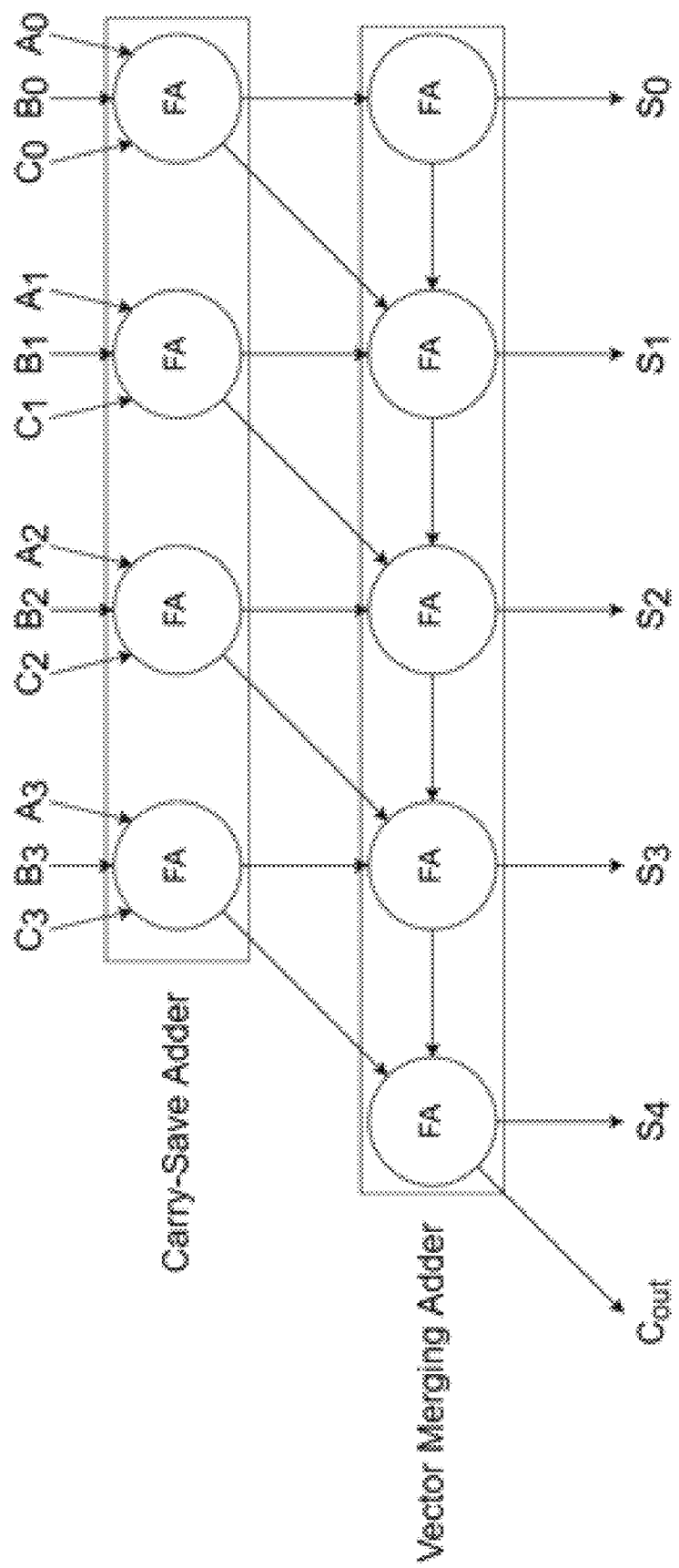
FIG. 27 illustrates an exemplary embodiment of a delayed-carry carry-save adder.

The latter is explained in the following: a Carry-Save Adder takes three operands and produces two outputs, a partial-sum vector (or simply sum vector) and a partial-carry vector (or carry vector). This is also called a delayed-carry representation as depicted in FIG. 27, and is based on the equation:

$$A + B = 2C + S \tag{4.18}$$

where A and B are the addend and the augend and C and S are the carry and sum vectors, with the factor 2 indicating that carries generated along the i-th position are propagated towards the (i+1)-th position.

These two vectors are fed into a Vector Merging Adder, which can be implemented by any of the adders described earlier, so that the carries are propagated to produce a result in conventional form. It is said that the carry and sum vectors are assimilated within the vector merging adder.

If more than three inputs are to be added, a carry-save line is added for each additional input.

The benefit of such a structure is that delaying carry assimilation to the next stages allows to equalize the delays within the carry-save tree, since all input digits are available at the same time; moreover, the carry-save tree, apart from being highly regular due to its matrix structure, has a fixed delay of $Mt_{FA}$, where M is the number of carry-save lines employed. M is always equal to the number of addends that exceed 3, plus 1, so the delay of the carry-save tree is very small compared to the word-length of the inputs involved. The vector merging adder, however, assimilates the partial carries, so its delay will be proportional to the word-length; that is why high-performances adders, like parallel-prefix ones, are usually employed for its realization.

4.1.2 Modular Addition

In general, any residue adder will be outperformed by standard equivalent adders both in terms of speed and area. The task of enhancing their performance may be easier if the modulus is small and known a priori. Modular addition can be implemented in different ways according to the kind of moduli set employed.

Arbitrary Moduli Set

Addition modulo q of two numbers A and B, digits of a residue representation (A, B<q), comprises:

$$|A+B|_q = \begin{cases} S = A+B, & S < q \\ S' = A+B-q, & S \geq q \end{cases} \quad (4.17)$$

Figure 28:
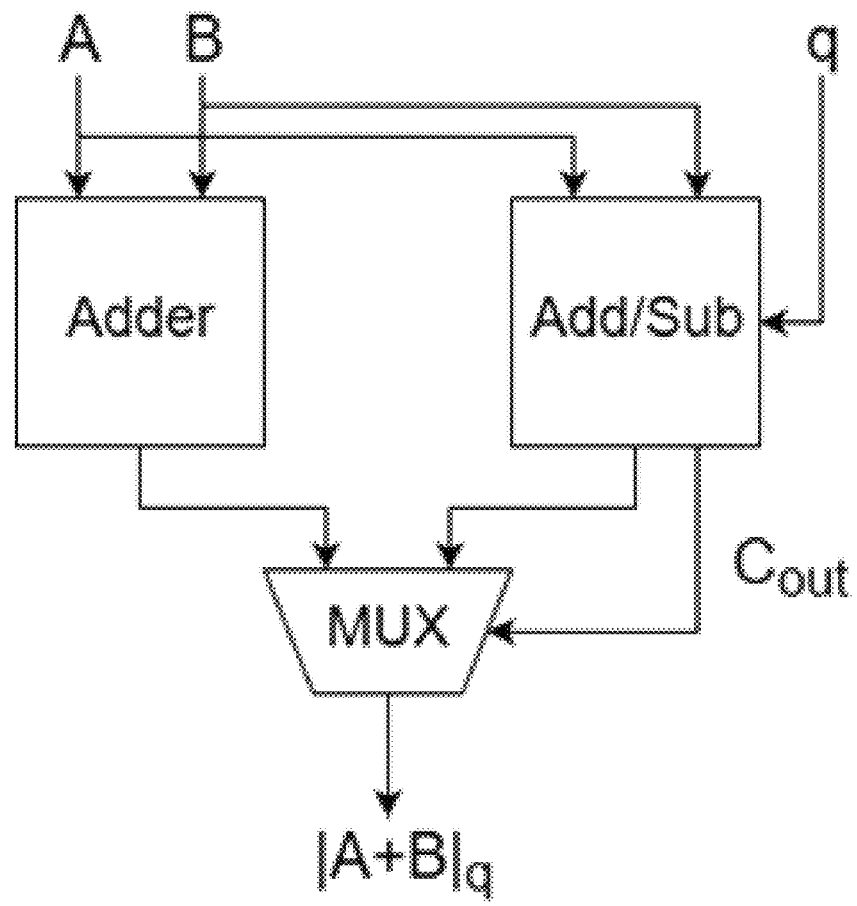
FIG. 28 illustrates a schematic representation of architecture suitable for use as a modulo adder.

One implementation of (4.17) comprises concurrently evaluating both expressions and then selecting one by checking the sign of S'; if this quantity is negative, it will mean that A+B does not exceed the modulus q. The subtraction of q is implemented by addition of $\bar{q}$, that is, its 2's-complement. The architecture described is shown in FIG. 28.

S and S' can also be computed in a carry-save fashion and sharing some logic. If q is small enough, look-up tables may be employed to realize the residue adder, addressing them by the concatenation of the two operands A and B.

All the different implementations of arbitrary modulus adders available, however, may be viewed as just simple variants of (4.17): for example, S and S' may be evaluated sequentially, so that, if a correct result is obtained from the first addition, the second may be skipped; this way, the average throughput increases but the latency becomes data dependent, determining synchronization issues.

Special Moduli Set

Moduli $2^m$, $2^m-1$ and $2^m+1$ can lead to very efficient implementations of modular arithmetic, since they are derived from standard adders with very little modifications.

In particular, $2^m$ adders are just regular m-bit adders; $2^m-1$ adders only utilize an end-around carry operation if numbers are represented in m-bit 1's-complement representation; $2^m+1$ adders can be easily implemented if a diminished-one representation of residues is used.

Modulus $2^m$

From equation (4.17), substituting the modulus $2^m$, it holds:

$$|A+B|_{2^m} = \begin{cases} S = A+B, & S < 2^m \\ S' = A+B-2^m, & S \geq 2^m \end{cases} \quad (4.18)$$

Subtraction of $2^m$ is equivalent, in binary representation, to subtracting a '1' in the m-th position. However, binary digits A and B range from 0 to $2^m-1$, from $(00 \ldots 0)_2$ to $(11 \ldots 1)_2$ represented on m bits, from bit position 0 to bit position m 1. Hence, if the result of the addition is on m+1 bits, the last bit is subtracted, which is equivalent to ignoring it. Hence, addiction modulus $2^m$ is just regular binary addition performed with a fixed word-length of m.

Modulus $2^m-1$

From equation (4.17), substituting the modulus $2^m-1$, it holds:

$$|A+B|_{2^m-1} = \begin{cases} S = A+B, & S < 2^m-1 \\ S' = A+B-(2^m-1), & S \geq 2^m-1 \end{cases} \quad (4.19)$$

It is evident that S is just a regular addition on m bits, since $S<2^m-1$ implies $S<2^m$. On the other hand, for S', with proper manipulation of (4.19), the following holds:

$$S' = A+B-2^m+1 = |A+B+1|_{2^m} \quad (4.20)$$

That is, when S exceeds the modulus $2^m-1$, its result modulo $2^m$ is taken and a correction factor of 1 is added. However, since $2^m-1$ is equal to $(11 \ldots 1)_2$, exceeding $2^m-1$ means that a carry in the m-th position is generated. Therefore, this carry can be used as a flag for the addition of the corrective factor; even better, the carry itself can be fed back and added to the resulting S, leading to $S'=S+C_{out}$. This operation is called End-Around Carry.

A problem arises when $S=2^m-1$: modulo reduction is performed, but $C_{out}=0$ leads to $S'=S=2^m-1$ instead of $S'=0$. This is solved by 1's-complement representation of the residues, where a double representation of 0 is allowed, namely $(00 \ldots 0)_2$ and $(11 \ldots 1)_2$.

A straightforward implementation of the residue adder would utilize the cascade of two conventional adders, with the output carry and the sum vector of the first adder feed as inputs to the second adder. The second adder may be omitted if the output carry of the first one is directly fed back to its input: in fact, considering a simple ripple-carry adder, it is well-known that the first full-adder has a free input carry port.

Unfortunately, this feedback path can create a race condition between the two stable states of the adder: this can be solved either by means of latches on the adder's output, or by an alternative technique in which only one representation for zero is allowed.

Figure 29:
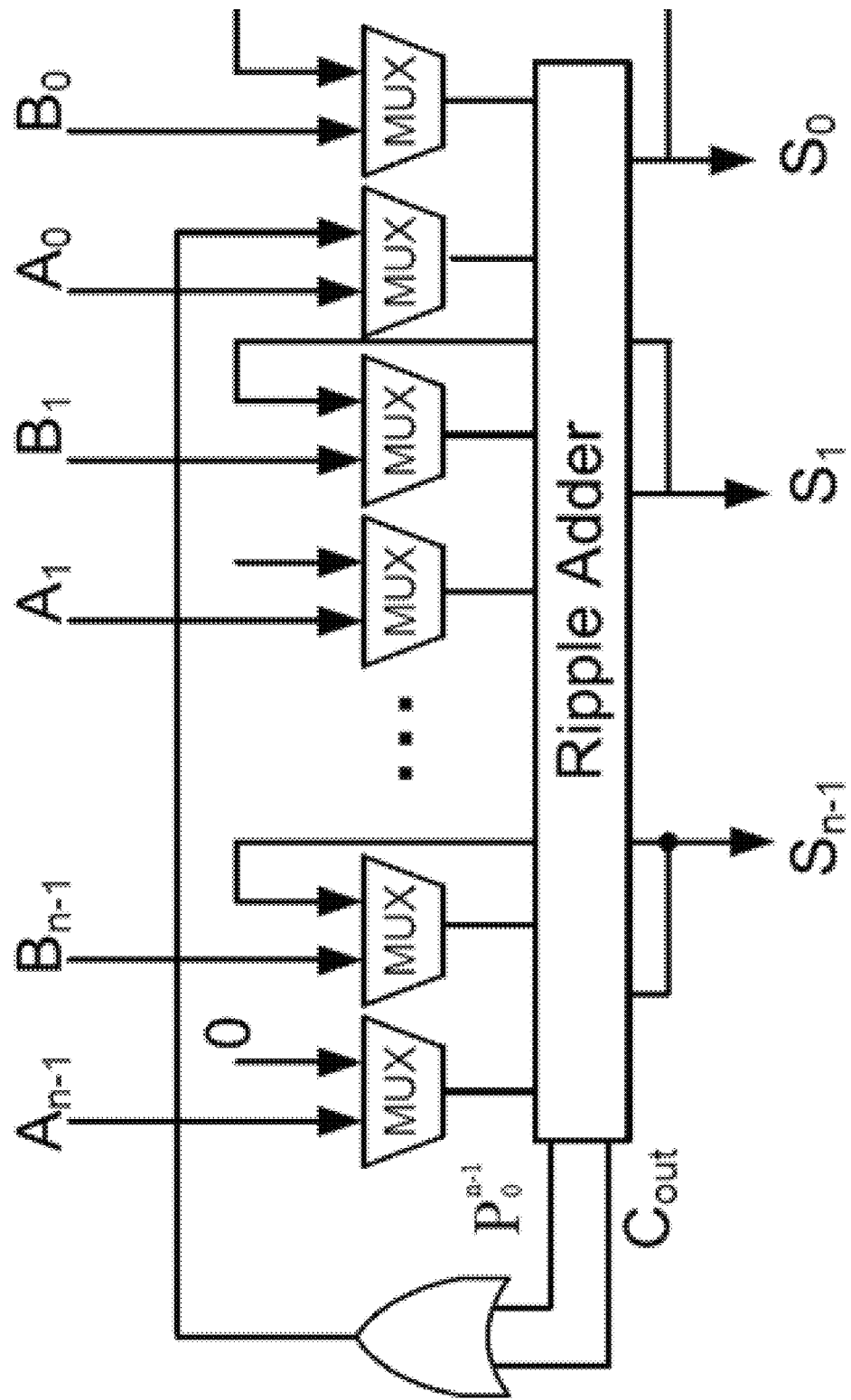
FIG. 29 illustrates an exemplary embodiment of a modulus-based ripple adder.

Since a result of $(11 \ldots 1)_2$ occurs when $P_0^{m-1}=1$, when the block propagate function is '1', $P_0^{m-1}$ can also be fed back to the ripple adder input. Therefore, the end-around carry is replaced by the combination of signals $P_0^{m-1}+C_{out}$, as shown in FIG. 29.

Once again, a formulation in terms of generate and propagate functions may be carried out, leading to carry-lookahead architectures. This kind of implementation eliminates any race condition, since the computation of carries is performed prior to the actual sum.

The design of a carry-lookahead modulo $2^m-1$ adder will be explained with an example.

For m=3, being initially $C_{in}=0$, the carry equations (4.3), (4.4) and (4.5) become:

$$C_0 = g_0 + p_0 C_{in} = g_0 \quad (4.21)$$

$$C_1 = g_1 + p_1(g_0 + p_0 C_{in}) = g_1 + p_1 g_0 \quad (4.22)$$

$$C_2 = g_2 + p_2(g_1 + p_1(g_0 + p_0 C_{in})) = g_2 + p_2 g_1 + p_2 p_1 g_0 \quad (4.23)$$

where $C_2$ is the $C_{out}$ signal that is fed back to the adder input port that accounts for $C_{in}$ to perform the end-around carry operation. Therefore, $C_{in}$ in the above equations is replaced with $C_2$, leading to:

$$C_0 = g_0 + p_0(g_2 + p_2 g_1 + p_2 p_1 g_0) \quad (4.24)$$

$$C_1 = g_1 + p_1(g_0 + p_0(g_2 + p_2 g_1 + p_2 p_1 g_0)) \quad (4.25)$$

$$C_2 = g_2 + p_2(g_1 + p_1(g_0 + p_0(g_2 + p_2 g_1 + p_2 p_1 g_0))) \quad (4.26)$$

As stated in Section 4.1.1, the generate and propagate functions are mutually exclusive, $p_i g_i = 0 \; \forall i$, thus (4.24), (4.25) and (4.26) can be further simplified, leading to:

$$C_0 = g_0 + g_2 p_0 + p_2 g_1 p_0 \quad (4.27)$$

$$C_1 = g_1 + p_1 g_0 + g_2 p_1 p_0 \quad (4.28)$$

$$C_2 = g_2 + p_2 g_1 + p_2 p_1 g_0 \quad (4.29)$$

Figure 30:
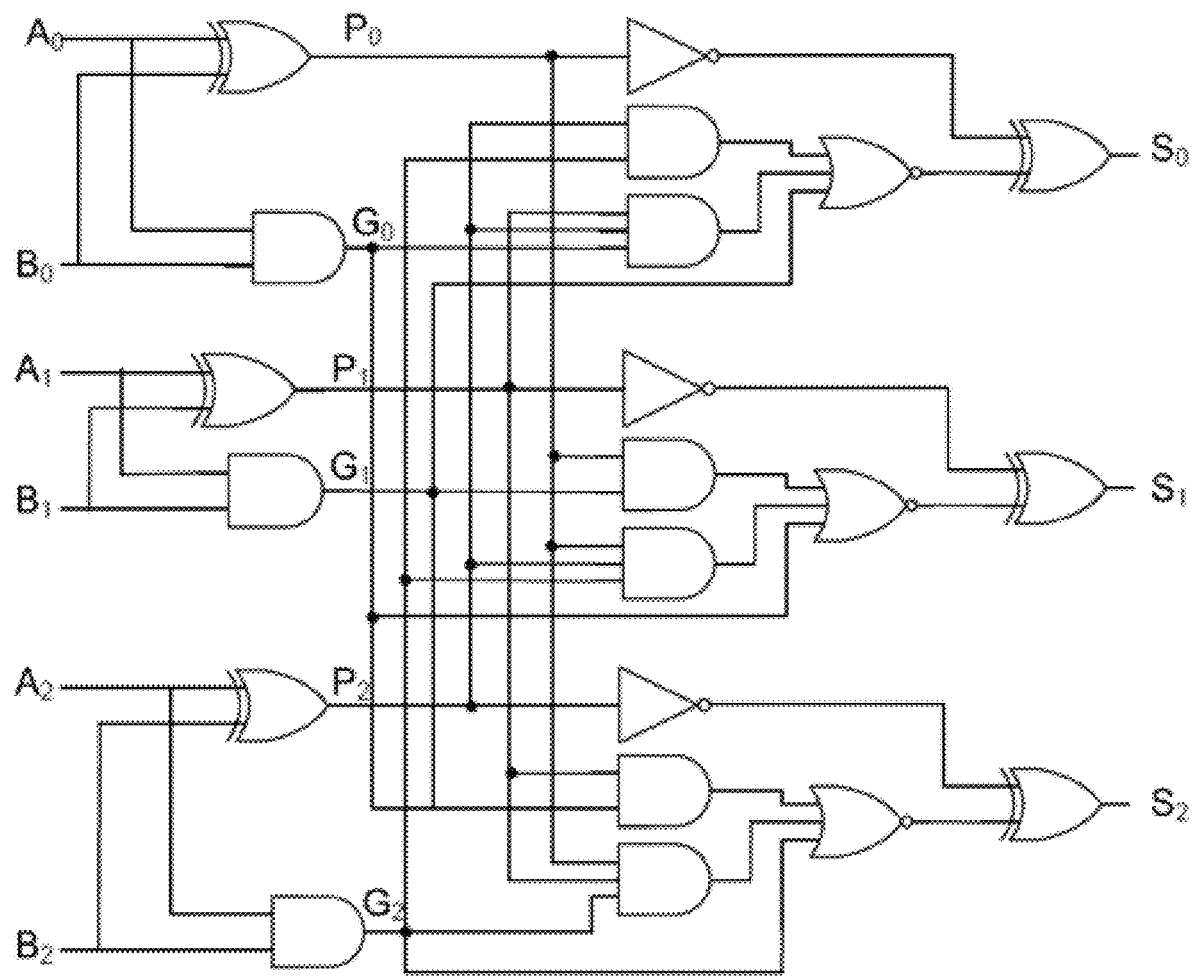

The resulting design is shown in FIG. 30. To avoid the zero representation redundancy, the sum formation equations $S_i = p_i \oplus C_{i-1}$ may be modified into $S_i = (p_i \overline{P_0^{m-1}}) \oplus C_{i-1}$ with a small overhead of circuitry; its correctness is verified considering that $P_0^{m-1}=1$ when $p_i=1$ $\forall i$, meaning that no carry is ever generated nor propagated, since $C_{in}=0$.

Carry-lookahead designs are extensible to multilevel lookahead or block lookahead, but they all still suffer from the lack of regularity and large fan-in and fan-out. Therefore, in some embodiments, parallel-prefix adders may be chosen over carry-lookahead implementations.

A parallel-prefix adder for modulo $2^m-1$ in 1's-complement can be obtained simply by adding to a standard parallel-prefix adder designed for $C_{in}=0$ an additional level of prefix operators and set $C_{in}=C_{out}$ from the preceding level.

A residue adder without zero redundancy is obtained setting $C_{in}=C_{out}+P_0^{m-1}$. As with standard parallel-prefix adders, tradeoffs between fan-out and delay depending on the prefix-tree depth will exist. Negative associations of this solution may include extra logic and the large fan-out utilized for $C_{in}$, which in turn increase area and operational time.

To avoid this extra level of prefix operators, the carry propagate and generate functions may be once again exploited like in the carry-lookahead residual adder by recirculating carries at every level of the prefix tree rather than recirculating a single carry in an additional tree-level.

This is better understood in the following example: for $m=3$, according to (4.13) and (4.15):

$$C_0=G_0^0=g_0 \tag{4.30}$$

$$C_1=G_0^1=g_1 \blacksquare g_0 \tag{4.31}$$

$$C_2=G_0^2=g_2 \blacksquare g_1 \blacksquare g_0 \tag{4.31}$$

Where $C_2$ is the $G_{out}$ end-around carry. Therefore, $C_{in}$ is taken into account in the above equations replacing it with $C_2$, leading to:

$$C_0=G_0^0 \blacksquare C_{in}=g_0 \blacksquare (g_2 \blacksquare g_1 \blacksquare g_0) \tag{4.32}$$

$$C_1=G_0^1 \blacksquare C_{in}=g_1 \blacksquare [g_0 \blacksquare (g_2 \blacksquare g_1 \blacksquare g_0)] \tag{4.33}$$

$$C_2=G_0^2 \blacksquare C_{in}=g_2 \blacksquare \{g_1 \blacksquare [g_0 \blacksquare (g_2 \blacksquare g_1 \blacksquare g_0)]\} \tag{4.34}$$

It can be demonstrated that $g_i \blacksquare g_j \blacksquare g_i = g_i \blacksquare g_j$, thus (4.32), (4.33) and (4.34) become:

$$C_0=g_0 \blacksquare g_2 \blacksquare g_1 \blacksquare g_0 = g_0 \blacksquare g_2 \blacksquare g_1 \tag{4.35}$$

$$C_1=g_1 \blacksquare g_0 \blacksquare g_2 \blacksquare g_1 = g_1 \blacksquare g_0 \blacksquare g_2 \tag{4.36}$$

$$C_2=g_2 \blacksquare g_1 \blacksquare g_0 \blacksquare g_2 = g_2 \blacksquare g_1 \blacksquare g_0 \tag{4.37}$$

It is evident that, from a higher abstraction level, the recirculation of the propagate and generate signals can be done at each existing prefix level instead of assigning it to only a last extra one; removing the extra prefix level thus leads to a faster design. This is depicted in FIG. 31.

Modulus $2^m+1$

Addition modulo $2^m+1$ is much more complex than addition modulo $2^m-1$, and practical implementations will show worse performance both in terms of speed and area. This is due to the fact that there is no easy way of detecting when A+B exceeds the modulus and correcting the result of the addition. Thus, two principal methods exist to perform modulo $2^m+1$ addition:

diminished-one representation of the residues;
direct addition.

Diminished-one addition: arithmetic modulo $2^m+1$ is carried out using a different representation of the residues A and B, i.e. the diminished-one representation, where the true values of A and B are stored as $A'=A-1$ and $B'=B-1$. Of course, zero cannot be represented and utilizes special treatment. Diminished-one addition is described by the following equations:

$$\Sigma = A+B = (A'+1)+(B'+1) \tag{4.38}$$

$$\Sigma' = \Sigma - 1 \tag{4.39}$$

$$\Sigma' = (A'+1)+(B'+1)-1 = A'+B'+1 \tag{4.40}$$

From equation (4.17), substituting the modulus $2^m+1$, it holds:

$$|A+B|_{2^m+1} = \begin{cases} S = A+B, & S < 2^m+1 \\ S' = A+B-(2^m+1), & S \geq 2^m+1 \end{cases} \tag{4.41}$$

Substituting (4.38), (4.39) and (4.40) into (4.41):

$$S = \Sigma = (A'+B'+1)+1 = \Sigma'+1 \tag{4.42}$$

$$S' = A+B-2^m-1 = |A+B-1|_{2^m} = |A'+B'+1|_{2^m} = |\Sigma'|_{2^m} \tag{4.43}$$

From (4.42), the magnitude check for $S<2^m+1$ in (4.41) is equivalent to $\Sigma'+1<2^m+1$, that is $\Sigma'<2^m$; during the modulus $2^m-1$ adder analysis, it was demonstrated that the latter is verified if no output carry is produced when computing $\Sigma'$.

Figure 32:
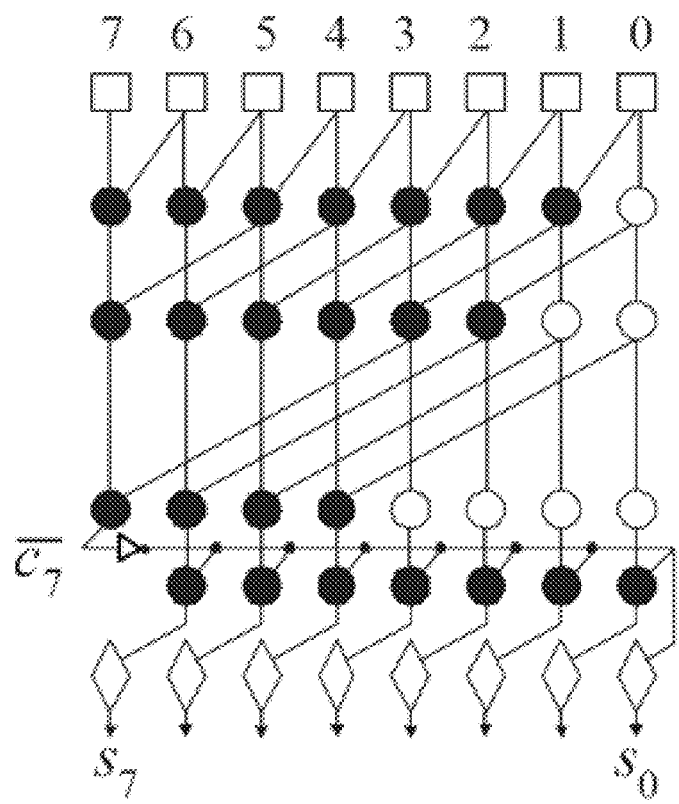

Further, from (4.42), it is evident that if no carry is produced, a '1' is added to $\Sigma'$; from (4.43), if a carry is produced, it is ignored due to the modulo $2^m$ reduction. This is equivalent to recirculate an inverse end-around carry, since '1' is added when $C_{out}=0$ and '0' when $C_{out}=1$, leading to $|A+B|_{2^m+1}=\Sigma'+\overline{C_{out}}$. Hence, any modulo $2^m-1$ adder described earlier can be employed to compute $|A+B|_{2^m+1}$ provided the end-around carry is inverted and the necessary overhead of converters from/to diminished-one representation is available, as shown in FIG. 32.

Direct addition: due to the complexity of determining whether A+B exceeded the modulus $2^m+1$, in a direct addition method $X=A+B-(2^m+1)$ is computed instead of A+B, and then a correction is performed if it leads to a negative result.

Therefore X will lead to the correct result if $A+B \geq 2^m+1$, $X \geq 0$; otherwise, it will be $X<0$. In the latter case, $2^m+1$ is added back to X, leading to $|X+2^m+1|_{2^m+1}$. However, for $A+B<2^m$, $X<-1$, the modulo $2^m+1$ reduction is equivalent to a modulo $2^m$ reduction, leading to:

$$|X+2^m+1|_{2^m+1} = |X+2^m+1|_{2^m} = |X+1|_{2^m} \tag{4.44}$$

For $X=-1$, the correct result is just $2^m$, therefore $2^m+1$ is added: $2^m$ is added by setting the m-th bit to 1 and 1 is added as an input carry $C_{in}=1$ to an extra level of prefix operator, if a parallel-prefix implementation is chosen. Hence:

$$|A+B|_{2^m+1} = \begin{cases} X, & X \geq 0 \\ |X+1|_{2^m}+2^m, & X = -1 \\ |X+1|_{2^m}, & X < -1 \end{cases} \tag{4.45}$$

A straightforward implementation of (4.45) includes a carry-save adder to obtain partial sums $PS_i$ and partial carries $PC_i$ of inputs A, B and $-(2^m+1)$, assuming a 2's-complement representation for negative numbers. The $PS_i$ and $PC_i$ are then assimilated in a vector merging adder—a parallel-prefix adder, in this case—and an extra level of prefix operators absorbs the corrective '1'.

The magnitude detection on X is performed as follows: the sign bit of the result will be '1' ($X<-1$) only if $C_m=C_{m-}$ $_1$=0, thus the correction is obtained by both adding the inverse end-around carry and setting the sum's most significative bit to '0'. This is due to the fact that the most significative bits of A, B and $-(2^m+1)$, being represented on m+1 bits in 2's-complement, will respectively be 0, 0 and 1.

Figure 33:
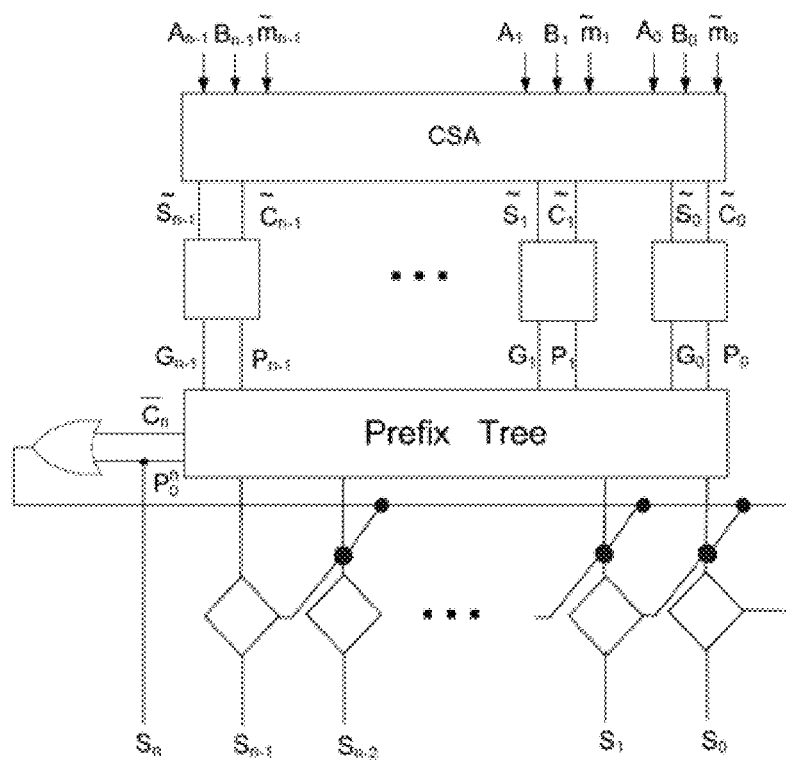
FIG. 33 illustrates an exemplary embodiment of a modulus-based carry-save adder.

X=−1 is instead verified when the result of the assimilation is a string of bit '1', e.g. $P_0{}^m$=1. Therefore, $P_0{}^m$ is added as an end-around carry and the sign bit of the result is set to Pr. The final architecture is shown in FIG. 33. Once again, it will be appreciated that the extra level of prefix operators in the prefix-tree may be eliminated.

4.2 Multiplication

In this section, a review of algorithms for conventional multiplication will be first issued, and then it will be shown how these algorithms may be modified to be employed in residue multiplication.

Like modular addition, modular multiplication may be implemented by look-up tables or combinational logic. The performance of both methods strongly depends on the moduli set, and very different implementations are available for both arbitrary moduli sets and special moduli sets.

Since multiplication is essentially a series of addition, modular reduction can be either carried out throughout the entire process of multiplication, or just in the last step, on the final product that results from a conventional multiplication.

4.2.1 Conventional Multiplication

The standard algorithm for multiplication of binary numbers is shown in Table 4.2 for a N=3 bits case.

TABLE 4.2

Multiplication Algorithm

| 32 | 16 | 8 | 4 | 2 | 1 | |
|---|---|---|---|---|---|---|
| | | | $a_2$ | $a_1$ | $a_0$ | x |
| | | | $b_2$ | $b_1$ | $b_0$ | = |
| | | | $a_2b_0$ | $a_1b_0$ | $a_0b_0$ | + |
| | | $a_2b_1$ | $a_1b_1$ | $a_0b_1$ | | + |
| | $a_2b_2$ | $a_1b_2$ | $a_0b_2$ | | | = |
| $p_5$ | $p_4$ | $p_3$ | $p_2$ | $p_1$ | $p_0$ | |

Mathematically, the above operation is described as:

$$AB = \left(\sum_{j=0}^{N-1} A_i 2^i\right)\left(\sum_{j=0}^{N-1} B_j 2^j\right) = \sum_{i=0}^{N-1}\sum_{j=0}^{N-1} A_i B_j 2^{i+j} \quad (4.46)$$

It can also be seen as an addition of properly shifted versions of partial products between the binary digits $A_i$ and B:

$$AB = \sum_{i=0}^{N-1} A_i 2^i B = \sum_{i=0}^{N-1} 2^i PP_i \quad (4.47)$$

This operation may be realized cascading two nets, the first determining the partial products on a $N^2$ matrix, and the second compressing the partial products on a 2N-bits vector. For a N×M multiplication, the output will be on N+M bits. However, this architecture is not very efficient since no kind of parallelism is exploited and also the routing networks are highly congested.

Figure 34:
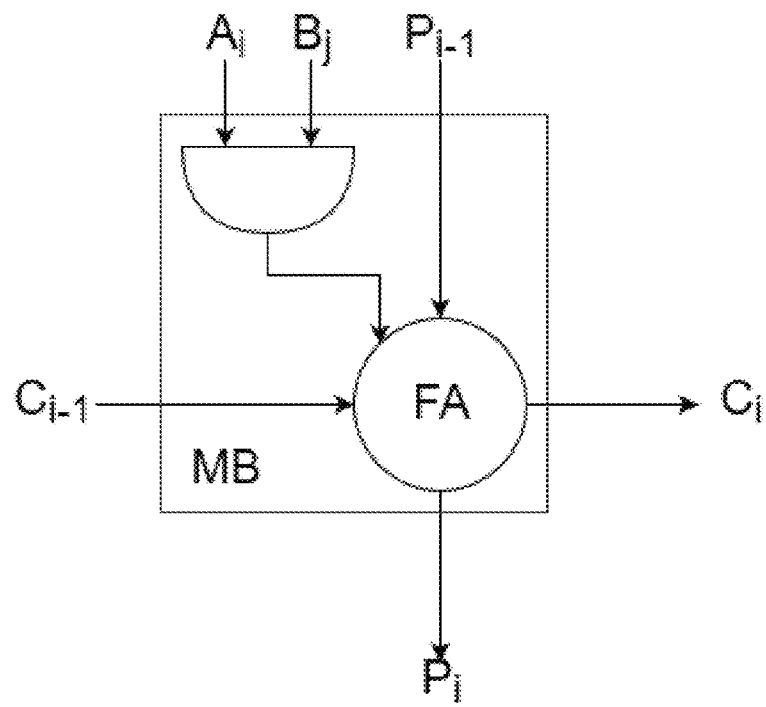
FIG. 34 illustrates an exemplary multiplication block suitable for use within one embodiment of an array multiplier.

One way to get around these problems is to introduce a standard cell, the multiplication block, depicted in FIG. 34. It is basically a full-adder that adds up the partial product $A_iB_j$, the previous partial product $P_{i-1}$ from the same column and the carry from the previous row $C_{j-1}$. This produces the current partial product along the i-th column $P_i$ and the next carry along the j-th row $C_j$.

Figure 35:
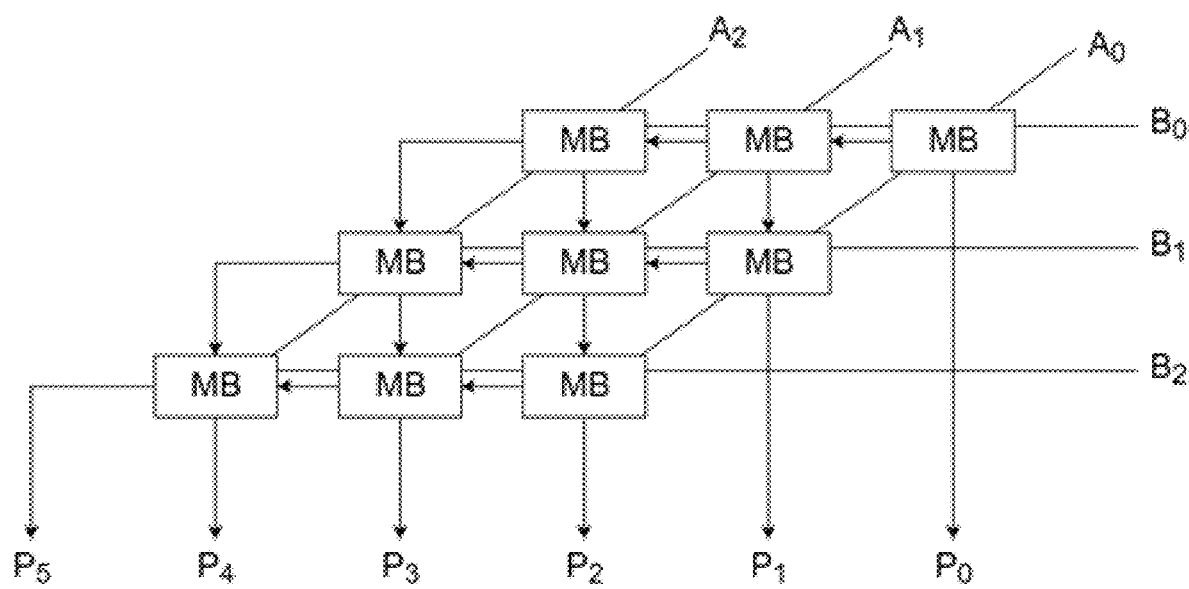
FIG. 35 illustrates an exemplary embodiment of an array multiplier.

The overall structure that makes use of the multiplication blocks is called an array multiplier and is shown in FIG. 35.

Since every multiplication block performs an AND operation and an addition, it is essentially a bit-slice level multiply-and-accumulate unit. Further, the addition of a partial product can be speeded up using carry-save structures for the carry propagation within the multiplication blocks.

High-Radix Multiplication

In the previous algorithm, a radix of the multiplication of two was implicitly used, that is, every partial product was shifted according to powers-of-two positional weights. Partial products can also be formed by taking several bits of the multiplier at a time, e.g. two for radix-4 multiplication, three for radix-8 multiplication, and so forth. Then, they are shifted accordingly, by the number of multiplier-bits selected.

TABLE 4.3

Radix-4 Multiplication

| 64 | 16 | 4 | 1 | |
|---|---|---|---|---|
| | | $a_3a_2$ | $a_1a_0$ | x |
| | | $b_3b_2$ | $b_1b_0$ | = |
| | | $(a_{3\ 2})(b_1b_0)$ | $(a_1a_0)(b_1b_0)$ | + |
| | $(a_3a_2)(b_3b_2)$ | $(a_1a_0)(b_3b_2)$ | | = |
| $p_7p_6$ | $p_5p_4$ | $p_3p_2$ | $p_1p_0$ | |

Both multiplicand and multiplier are partitioned in blocks of $\log_2 R$ digits, where R is the radix. Each block of the multiplicand is then multiplied for each block of the multiplier, and the results are then added up with appropriate shifting for significance.

Figure 36:
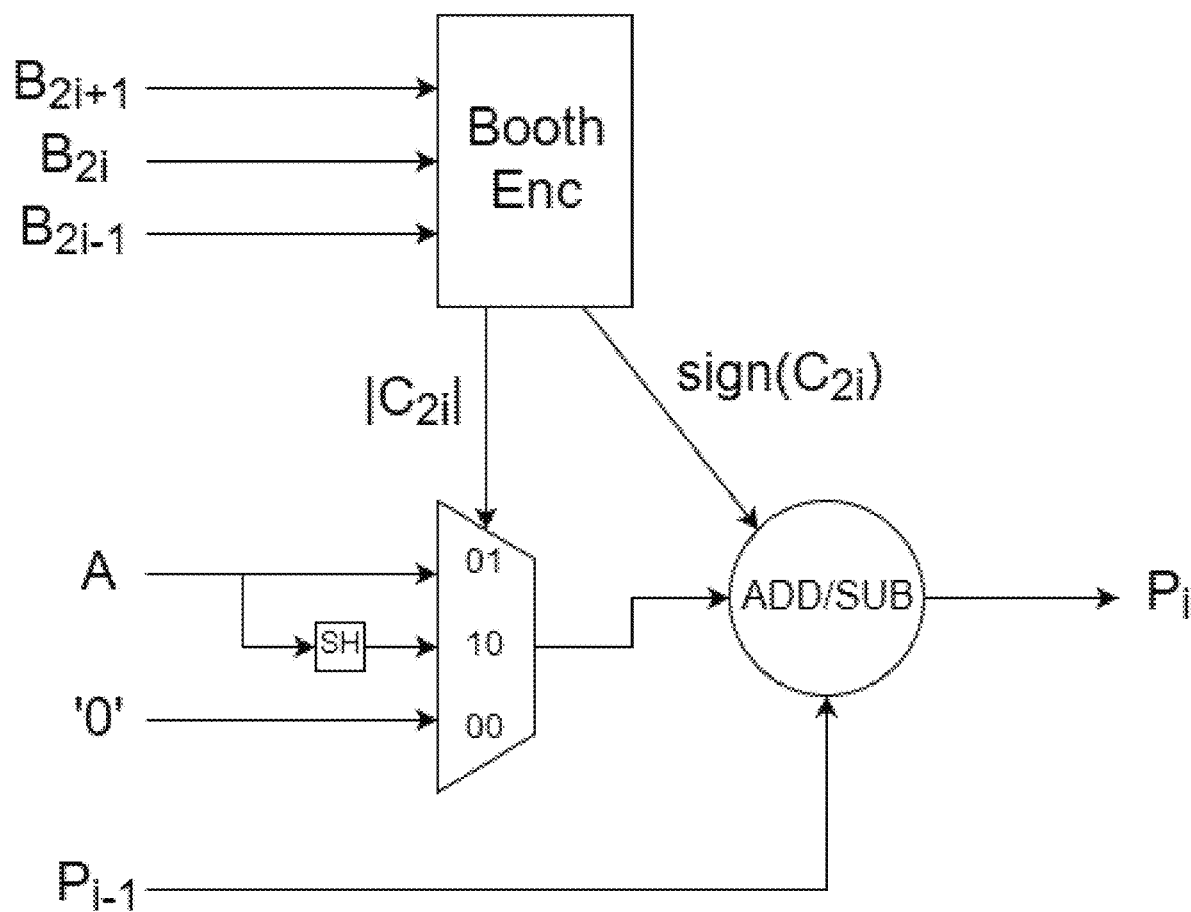
FIG. 36 illustrates an exemplary embodiment of a partial products generator.

A fully-combinatorial approach to high-radix multiplication is not very effective, since at least a vector merging adder for each sub-multiplication is utilized if carry-save trees are employed, and assimilation of partial carries and sums is known to be a slow operation. It is more convenient to perform sub-multiplications by means of small look-up tables and add the resulting partial products with combinatorial logic. An exemplary partial products generator is depicted in FIG. 36. However, such multipliers have little practical use for conventional multiplication, since Booth's Algorithm implementations of multiplication are a much better way to accomplish high-radix multiplication.

Booth's Algorithm

Consider the following: the word $(11 \ldots 1)_2$ of N bits is equal to $\Sigma_{i=0}^{N-1} 2^i = 2^N - 1$. It is evident that the right-hand term is much easier to compute than the left-hand term: the latter utilizes N sums, whereas the former utilizes a single subtraction corresponding to the position of the least significant bit and an addition corresponding to the position immediately after the most significant bit. This principle can be applied to simplify multiplication by recoding one of the two factors from conventional binary representation to a redundant-signed-digit notation; e.g. for radix-4, the redundant-signed-digit set is $\{-2, -1, 0, 1, 2\}$, for radix-8, the redundant-signed-digit set is $\{-3, -2, -1, 0, 1, 2, 3\}$. This is obtained by partitioning said factor as described in the following example for a radix-4 Booth encoding and examining the last bit of the preceding partition.

Let A and B be N-bit signed numbers, with N=4; for radix-R Booth encoding, with R=4, first B is split in $(\log_2 R)$-bit blocks, in this case 2-bit blocks:

$$B=(-b_3 2^3 + b_2 2^2) + (b_1 2^1 + b_0 2^0) \quad (4.48)$$

To account for the last bit of each partition, one can add and subtract terms of the $b_i 2^i$ kind without modifying the multiplication result:

$$B=(-b_3 2^3 + b_2 2^2) + (b_1 2^1 + b_0 2^0) \quad (4.49)$$

$$B=(-b_3 2^3 + b_2 2^2 + b_1 2^2) + (-b_1 2^1 + b_0 2^0 + b_{-1} 2^0) \quad (4.50)$$

Here, $b_{-1}=0$ was inserted only for symmetry reasons, without modifying the algorithm. By further manipulating equation (4.50), it holds:

$$B=2^2(-2b_3 + b_2 + b_1) + 2^0(-2b_1 + b_0 + b_{-1}) = 2^2 C_2 + C_0 \quad (4.51)$$

The terms $C_{2i} = 2b_{2i+1} + b_{2i} + b_{2i-1}$ are described by the following truth table:

TABLE 4.4

Truth table for the Booth Algorithm

| $b_{2i+1}$ | $b_{2i}$ | $b_{2i-1}$ | $C_{2i}$ | sign($C_{2i}$) | $|C_{2i}|$ |
|---|---|---|---|---|---|
| 0 | 0 | 0 | 0 | 0 | 0 |
| 0 | 0 | 1 | 1 | 0 | 1 |
| 0 | 1 | 0 | 1 | 0 | 1 |
| 0 | 1 | 1 | 2 | 0 | 2 |
| 1 | 0 | 0 | −2 | 1 | 2 |
| 1 | 0 | 1 | −1 | 1 | 1 |
| 1 | 1 | 0 | −1 | 1 | 1 |
| 1 | 1 | 1 | 0 | 0 | 0 |

Finally, the product is evaluated as:

$$AB = 2^2 A C_2 + A C_0 \quad (4.52)$$

Since the signal $|C_{2i}|$ only assumes the values 0, 1 or 2, it can drive a multiplexer selecting between 0, A and SH(A,1), where SH(x, y) is a left shift operation of y bits performed on operand x. Shift operation can be performed in a simple hard-wired form. Furthermore, signal sign($C_{2i}$) determines if the term $A C_{2i}$ is to be added or subtracted. Finally, the product by $2^{2i}$ is again a simple shift of 2i positions.

In general, a Booth multiplication will be of the form:

$$AB = \sum_{i=0}^{\lceil N/p \rceil - 1} A 2^{ip} C_{ip} \quad (4.53)$$

where $p = \log_2 R$; it comprises $\lceil N/p \rceil$ additions or subtractions of shifted versions of the un-coded operand, plus the logic for the $C_{ip}$. By contrast, conventional multiplication as described in (4.47) utilizes N additions, $N^2$ AND operations and hard-wired shift operations.

Each term $2^{ip} C_{ip}$ may be evaluated by a Booth cell, which may include:
- a Booth encoder, which represents $C_{ip}$, that can be implemented either by a look-up table or a simple combinational logic block;
- a N-bit, configurable adder that accumulates the partial products and can perform subtraction;
- a multiplexer to select the right version of the multiplicand A;
- several shifters, depending on the design.

This cell can either be replicated to obtain a parallel design or looped on itself to implement a serial multiplication that utilizes $\lceil N/p \rceil$ cycles; in the former case, shifters will be hard-wired, while in the latter shift registers will be utilized.

Wallace-Tree Multiplier

Except for Booth recoding of the multiplicand, there is not much room for improvements in standard array multipliers. To speed up multiplication, one can intervene on the array topology, but the number of multiplication blocks remains fixed to N×M.

Figure 37:
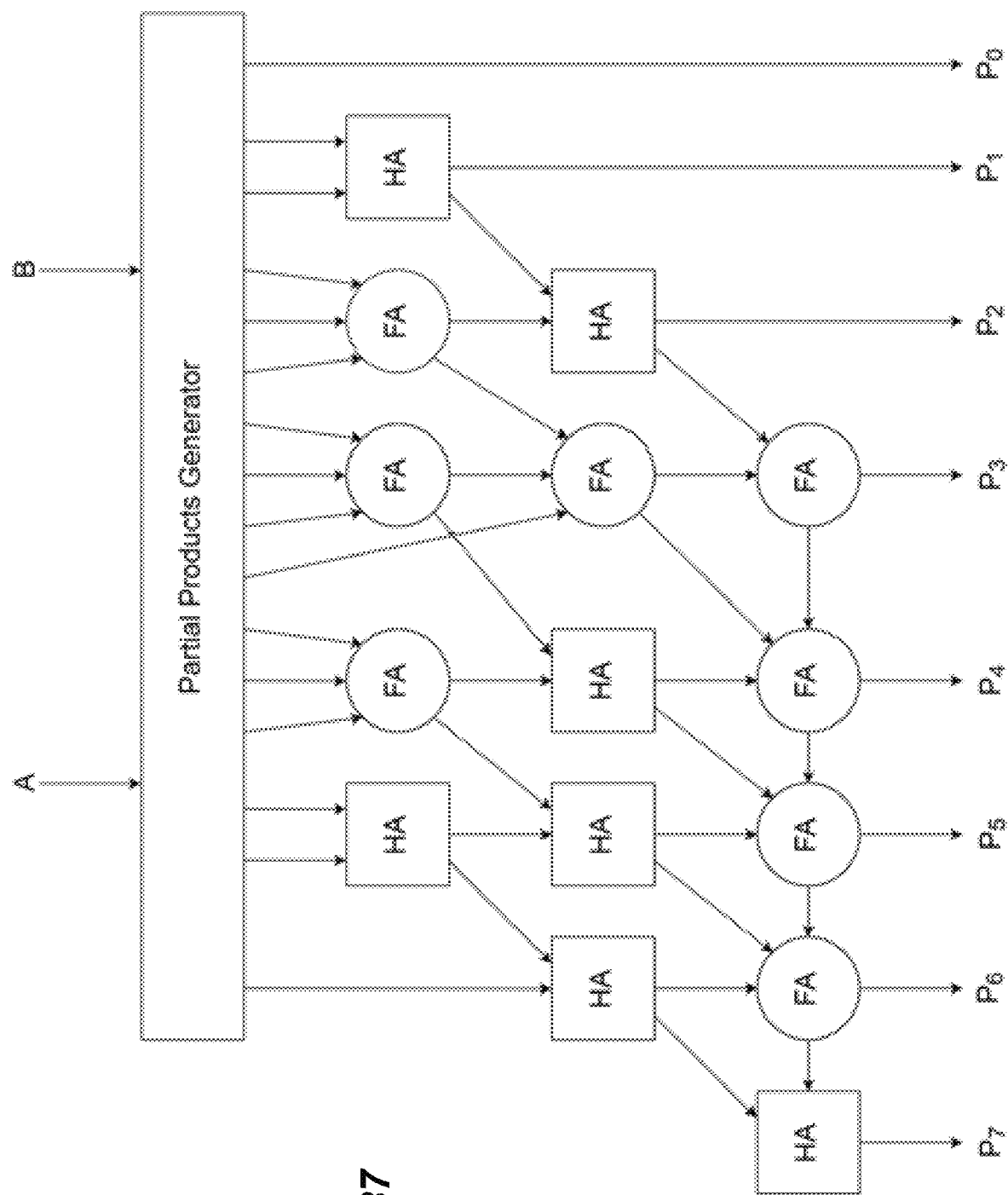
FIG. 37 illustrates an exemplary embodiment of a Wallace-tree multiplier.

Another solution may be adding as many partial products as possible at each level of a carry-save tree array multiplier by using more than one carry-save adder per level. In fact, a carry-save adder can be thought of as a 3:2 compressor, so partial products are taken in as many groups of three as possible. The design is performed by an iterative procedure that stops when only one partial sum and one partial carry are left for the assimilation to occur. This multiplier is known as Wallace-Tree Multiplier. Of course, Wallace-trees are much less regular than a standard array multiplier, thus routing may be an issue for practical implementations. A Wallace-tree implementation is shown in FIG. 37.

4.2.2 Modular Multiplication

Like modular addition, modular multiplication implementations are divided in two categories: multipliers for arbitrary moduli sets and for special moduli sets.

Arbitrary Moduli Set

For arbitrary moduli sets, two main categories of modular multiplier exist:
- multipliers that compute the product P=AB and then perform a final modulo reduction on P;
- multipliers that compute the reduced partial products $|PP_i|_q = |\Sigma_i A B_i 2^i|_q$ and add them modulo q.

As always, look-up-table-based methods may be preferred over fully-combinatorial implementations for arbitrary moduli sets in some embodiments, especially if the moduli are very small. Nevertheless, moduli are usually known at design-time, so that advantage can be taken, and certain simplifications can be made even for combinational logic.

Quarter-Square Multiplier

Modular multiplication by means of look-up tables may be performed according to:

$$|AB|_q = \left| \frac{||A+B|_q^2 - |A-B|_q^2}{4} \right|_q \quad (4.54)$$

Figure 38:
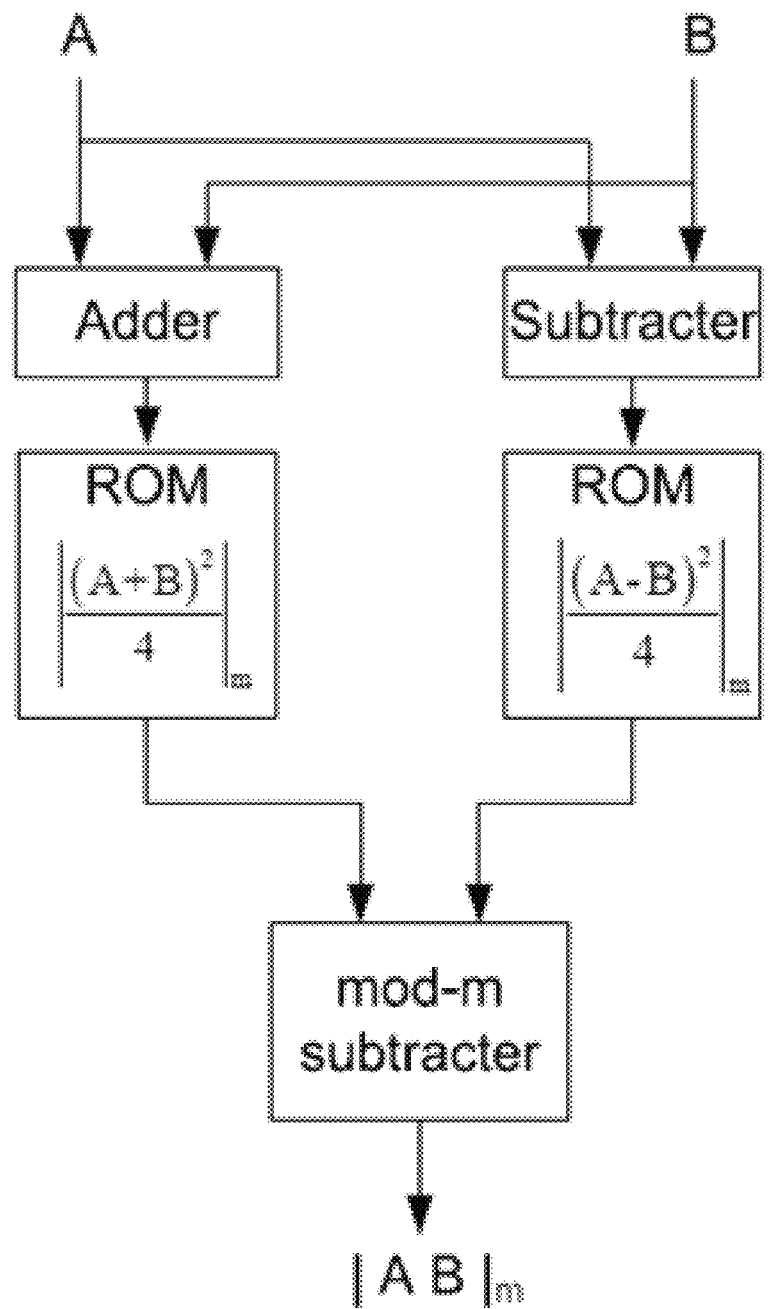
FIG. 38 illustrates an exemplary embodiment of an architecture suitable for implementing a quarter-square modular multiplier.

A straightforward implementation of (4.54) may be implemented as depicted in FIG. 38, which comprises two adders, one performing A+B and the other A−B, two ROMs performing the quarter-squaring and finally a modulo adder to perform the subtraction of the squared values. Instead of ROMs, combinational logic performing the easier (and cheaper) squaring operation may also be employed. In an all-ROM implementation, modular adders would be also replaced by look-up tables.

This algorithm may be employed when modulus and divisor are relatively prime, utilizing the multiplicative inverse of 4; therefore, not every modulus with 2 as a factor is considered.

Index-Calculus Multiplication

Figure 39:
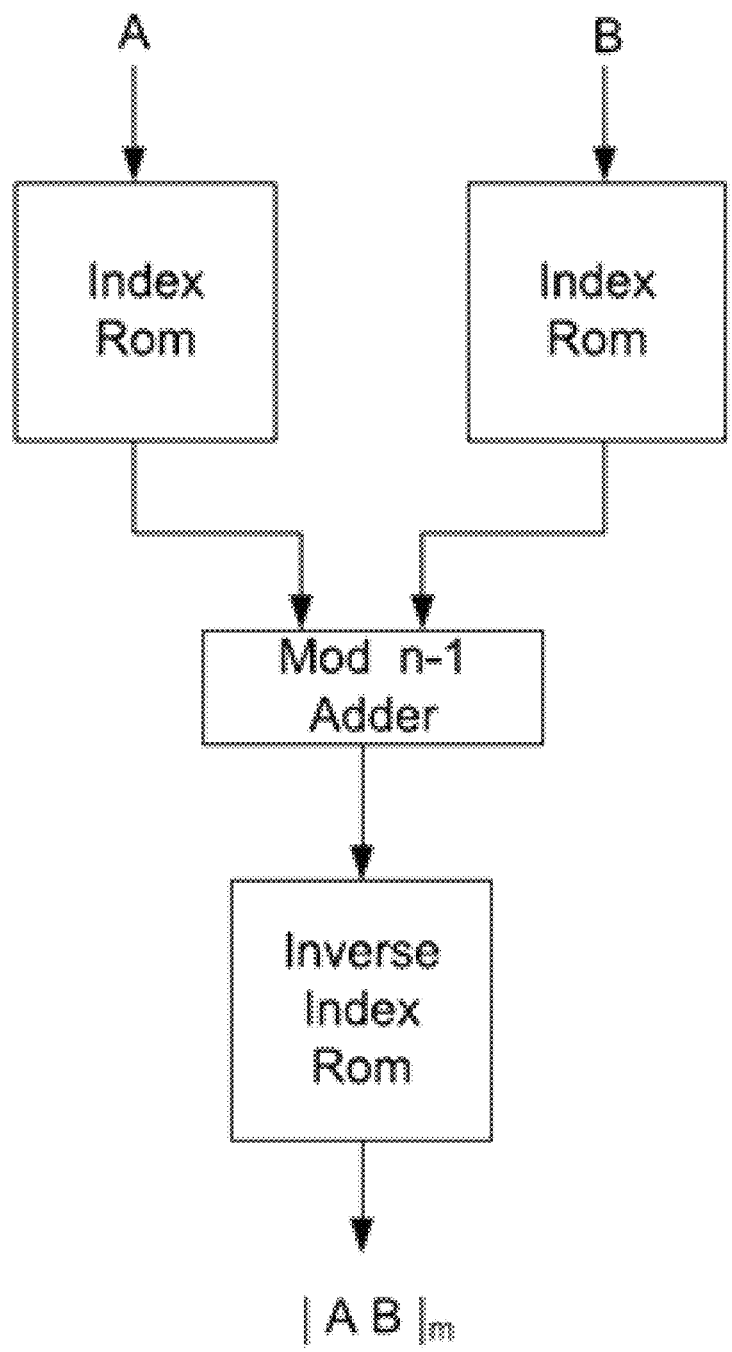
FIG. 39 illustrates a functional block diagram of an example embodiment of an index multiplier.

Modular multiplication may also be performed by index-calculus; if the modulus is a prime number, every non-zero element of the corresponding set of residues can be obtained as a power of 2 (in general, a power of some generator g), so that every residue number A and B may be defined according to:

$$A = |2^i|_q \tag{4.55}$$

where i is said to be the index of A modulus q for the generator 2. Furthermore, it can be shown that multiplication modulo q is isomorphic to addition modulo q−1, that is:

$$|AB|_q = |2^{|i+j|_{q-1}}|_q \tag{4.56}$$

i and j can be obtained addressing a look-up table with A and B, $|i+j|_{q-1}$ can be computed by a modular adder with modulus q−1 and $|AB|_q$ may be obtained addressing a third look-up table with the result of the addition. A functional block diagram of an example embodiment of an index multiplier is shown in FIG. 39.

This implementation utilizes a single adder while the quarter-square utilizes three adders, but moduli are bound to be prime numbers, and additional logic is utilized for zero detection, since $2^i > 0$.

It is evident that both the presented multipliers may not be suitable for large moduli, since ROM sizes increase exponentially with the moduli; thus, for large moduli multiplication, combinational-logic multipliers are preferred.

Modular Reduction of Partial Products

Figure 40A:
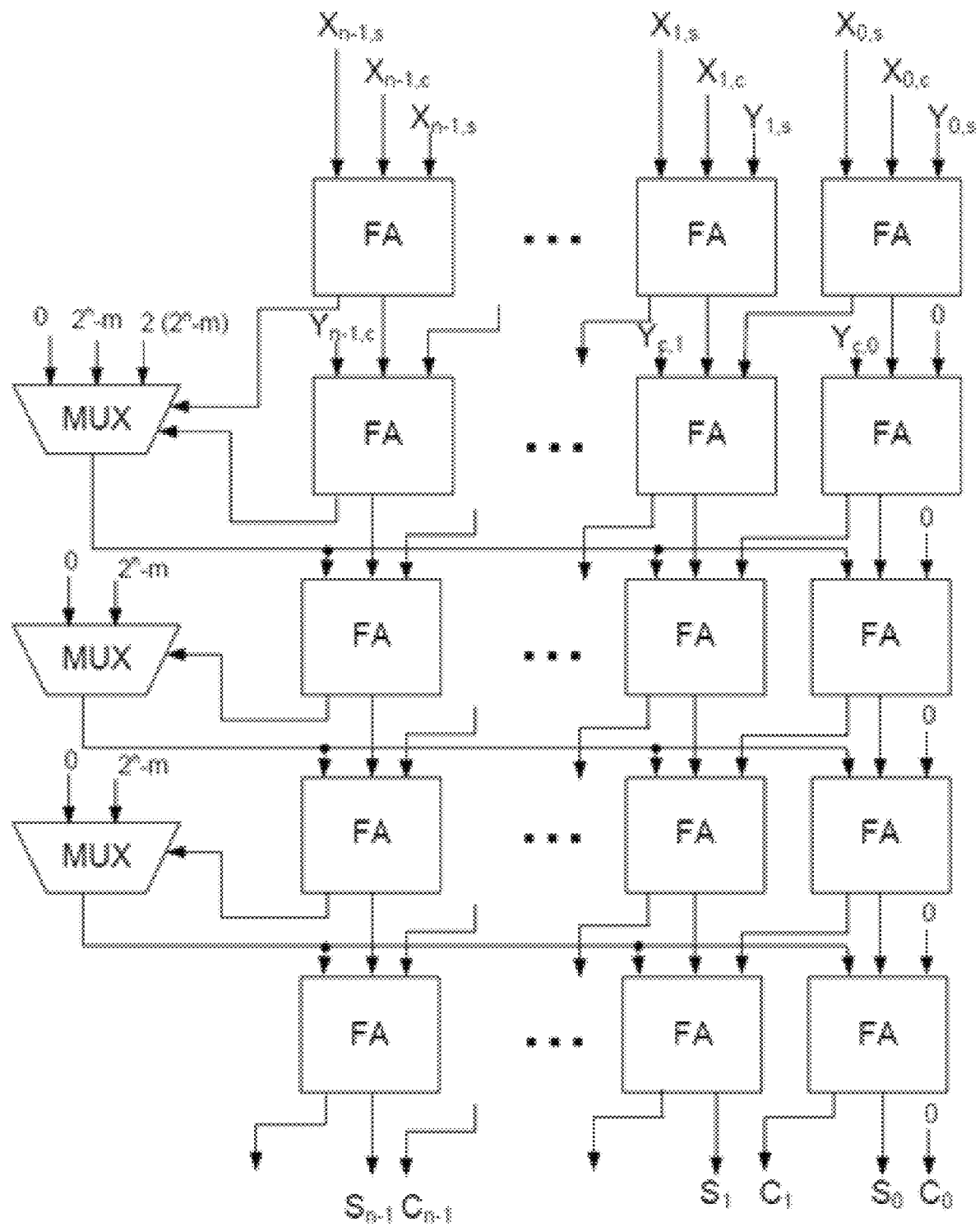
Figures 1, 40B:
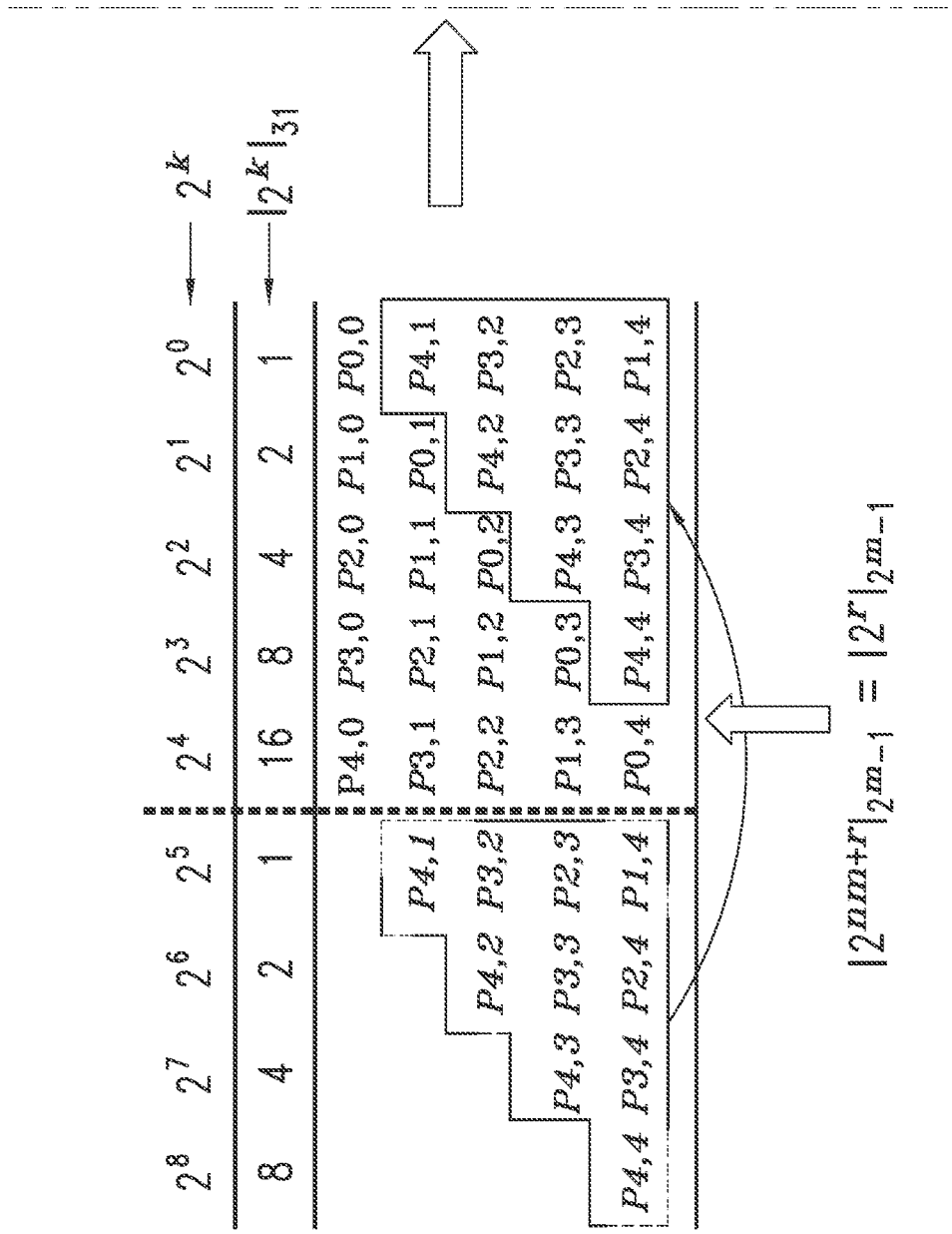
Figure 40B:
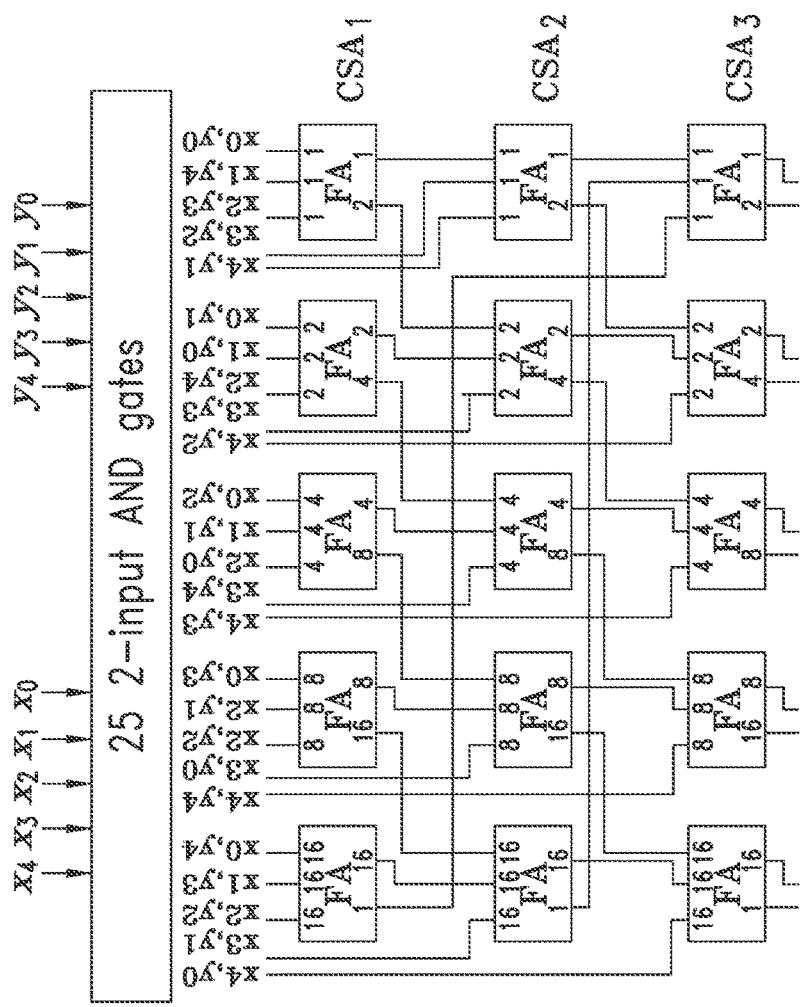
Figure 2:
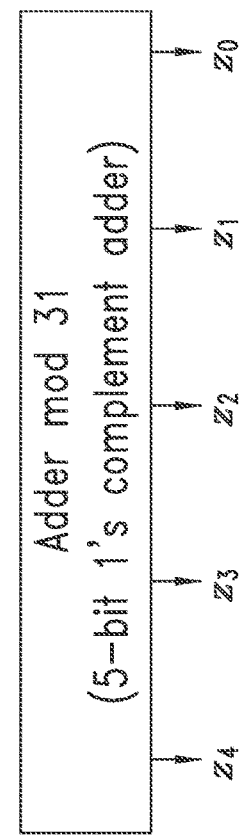

In this class of multipliers, each partial product is reduced modulo q before being added. A carry-save tree of reduced partial products may be demonstrated in which each carry-save level includes a correction term of 0, −q and −2q, and multiplexers to select the correction term. This is shown in FIG. 40.

This design can be slightly improved either by Booth recoding or using 4:2 compressors.

Special Moduli Sets

Since multiplication is essentially a series of additions of partial products, the same considerations made for modular addition with special moduli sets hold for modular multiplication: in particular, modulo $2^m$ multiplication is just regular multiplication on a fixed word-length of m, whereas modulo $2^m-1$ multiplication will involve end-around carries. Modulo $2^m+1$ is of course more complicated, but still less complex than arbitrary modulus multiplication; anyway, in what follows, only modulo $2^m-1$ multiplication is considered.

Modulus $2^m-1$

Modular reduction of partial products for the special modulus $2^m-1$ is very efficient since modulo $2^m-1$ reduction comprises an end-around carry operation, as stated previously. However, the partial products all have a different significance, partial product $PP_i$ is added along the i-th position. However, the Property of Periodicity of modulus $2^m-1$ can be exploited. Consider the following:

$$|2^{m_1}|_{2^m-1} = |2^m - 1 + 1|_{2^m-1} = 1 \tag{4.57}$$

$$|2^{nm+r}|_{2^m-1} = ||2^m|_{2^m-1}^n |2^r|_{2^m-1}|_{2^m-1} = |2^r|_{2^m-1} \tag{4.58}$$

where n and r are both integers, and r<m, meaning it is the remainder modulo m of the exponent. The above equations show that a bit '1' in position $2^{nm+r}$ is always mapped in position $2^r$. For example, for m=3, bit 4 is mapped into bit 1, bit 5 into 2, bit 6 into 3, bit 7 again into bit 1, and so on cyclically. As another example, modulo $2^3-1=7$ reduction of $(1001)_2=9$ is equivalent to the addition $(001)_2+(001)_2=(010)_2=2$. If the result of such addition is not on 3 bits, a second addition is performed, and so on iteratively until there is no more end-around carry. For example: reduction modulo 7 of $(11111)_2=31$ is $(111)_2+(011)_2=(1010)_2=10\rightarrow$ $(010)_2+(001)_2=(011)_2=3$, for a total number of two end-around carry operations. Example conceptual implementations are shown in FIGS. 40A and 40B.

Equation (4.58) states that, if a bit '1' should be added along the i-th position, it is instead added along the (i−nm)-th position. Each partial product $PP_i = AB_i 2^i$, reduced modulo $2^m-1$, leads to:

$$|PP_i|_{2^m-1} = |AB_i 2^i|_{2^m-1} = \left|\left(\sum_{j=0}^{m-1} A_j 2^j\right) B_i 2^i\right|_{2^m-1} = \left|\sum_{j=0}^{m-1} A_j B_i 2^{i+j}\right|_{2^m-1} \tag{4.59}$$

In the above equation, $A_j B_i$ is either '0' or '1', and it is added along the (j+i)-th position. However, if j+i exceeds m, it is added along the (j+i−m)-th position.

For example, applying the property of periodicity on Table 4.2, it becomes:

TABLE 4.5

| Modulo $2^m - 1$ Multiplication | | | | | |
|---|---|---|---|---|---|
| 32 | 16 | 8 | 4 | 2 | 1 |
|  |  |  | $a_2$ | $a_1$ | $a_0$ | x |
|  |  |  | $b_2$ | $b_1$ | $b_0$ | = |
|  |  | $a_2 b_0$ | $a_1 b_0$ | $a_0 b_0$ | + |
|  |  | $a_1 b_1$ | $a_0 b_1$ | $a_2 b_1$ | + |
|  |  | $a_0 b_2$ | $a_2 b_2$ | $a_1 b_2$ | = |
|  | $p_4$ | $p_3$ | $p_2$ | $p_1$ | $p_0$ |

In this example, m=3, hence bits along the 4-th, 5-th and 6-th columns are added along the 1-st, 2-nd and 3-rd.

Therefore, multiplication for a factor $2^i$ comprises a left circular shift of the i-th partial product of i positions, every bit that is shifted out left is re-inserted on the right of the word if it exceeds the most significant position.

Figure 41:
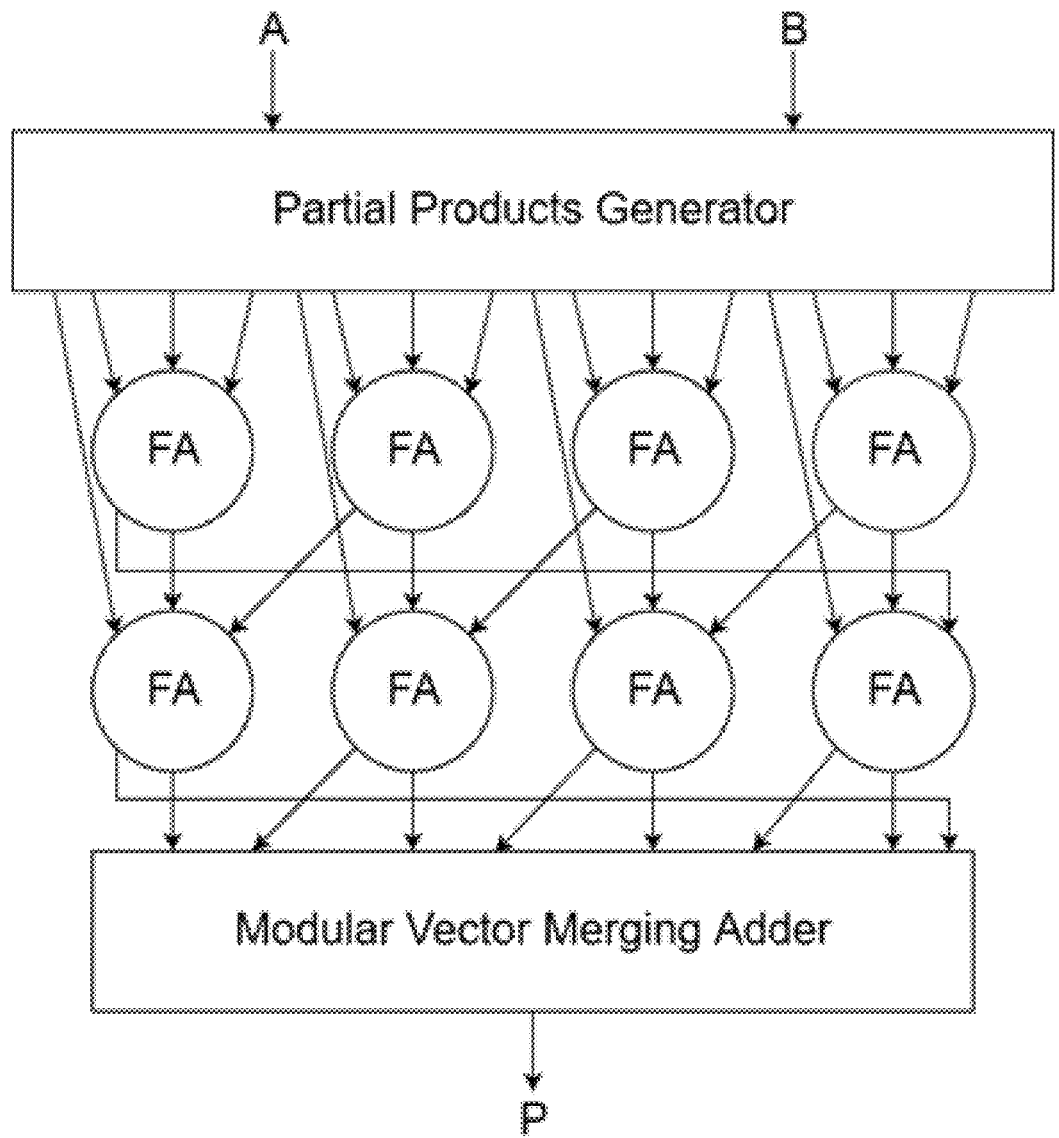
FIG. 41 illustrates an exemplary embodiment of an architecture suitable for implementing a carry-save tree of reduced partial products.

Modular addition of these circularly-shifted versions of the partial products can be performed in a carry-save adder tree with end-around carries at each level of the tree, as shown in FIG. 41. This can be further extended to high-radix multiplication or Booth recoding.

4.3 Forward Conversion

The discussion about the forward conversion from binary to residue numbers shall also be divided according to arbitrary moduli sets and special moduli sets of the form $\{2^m-1, 2^m, 2^m+1\}$ and extensions thereof. The basic principle behind computing the residue of a number $|X|_q$ is division of X by q. Since division is an expensive operation in hardware, it is rarely used, whence the importance of special moduli sets. Division is avoidable in the case of other moduli as well, but the hardware utilized will not be as simple.

Forward conversion may again be realized using look-up tables, combinational logic or a combination of both. Converters for the special moduli sets are implemented in combinational logic due to their simplicity, whereas those for arbitrary sets will be most likely look-up-tables-based converters. Indeed, the overall complexity of the conversion circuit depends upon the selection of the moduli set and the specific application: for signal processing applications, usually, large dynamic ranges are utilized, which are obtained either by large sets of small moduli or small sets of large moduli. The amount of memory used in these converters is proportional to both the magnitude of involved numbers and the number of moduli belonging to the set. Although forward converters for special moduli sets are easy to implement, if large moduli are utilized, then complex processing units might also be utilized, offsetting the benefits of such sets.

4.3.1 Special Moduli Set

Since modulo $2^m$ arithmetic is just conventional arithmetic with a fixed bit-width of m bits, the following will cover only modulo $2^m-1$ and $2^m+1$ hardware implementations.

A decimal number encoded in a binary representation is described by:

$$X = \sum_{i=0}^{n-1} x_i 2^i, \; x_i \in \{0, 1\} \tag{4.60}$$

therefore, its residue will be:

$$|X|_q = \left| \sum_{i=0}^{n-1} x_i 2^i \right|_q = \left| \sum_{i=0}^{n-1} x_i |2^i|_q \right|_q \tag{4.61}$$

since $x_i$ is always less than q. Then, the evaluation of $|2^i|_q$ is utilized together with a final modulo operation. For modulus $q=2^m-1$, as stated in Section 4.1.2, modulo reduction comprises an end-around carry addition. Also, the property of periodicity shown in Section 4.2.2 can be exploited.

A similar property exists for modulus $2^m+1$; it holds:

$$|2^m|_{2^m+1} = |2^m+1-1|_{2^m+1} = -1 \tag{4.62}$$

$$|2^{nm+r}|_{2^m+1} = ||2^m|_{2^m+1}{}^n |2^r|_{2^m+1}|_{2^m+1} = |(-1)^n |2^r|_{2^m+1}|_{2^m+1} \tag{4.63}$$

where n and r are both integers, and r<m. This means that $|2^{nm+r}|_{2^m+1}$ is either $|2^r|_{2^m+1}$ if n is even or its additive inverse $|-2^r|_{2^m+1} = |2^m+1-2^r|_{2^m+1}$ if n is odd.

Residues $x_i = |X|_{q_i}$ are obtained by nominally dividing X by $q_i$, where $\{q_1, q_2, q_3\} = \{2^m-1, 2^m, 2^m+1\}$. $x_2$ is computed by taking the m least significant bits of X, which are the bits that are "left out" when a m bit right-shift is performed; hardware-wise, it is a simple, hardwired operation and it is equivalent to a division by $2^m$.

To determine $x_1$ and $x_3$, given that the range of X is on 3m bits, since the dynamic range M is $2^m(2^m-1)(2^m+1)=2^{3m}-2^m-1$, it is possible to partition X in three m-bit blocks:

$$B_1 = \sum_{i=0}^{n-1} x_i 2^i \tag{4.64}$$

$$B_2 = \sum_{i=0}^{n-1} x_i 2^{i-m} \tag{4.65}$$

$$B_3 = \sum_{i=0}^{n-1} x_i 2^{i-2m} \tag{4.66}$$

X is thus equal to $B_1+B_2 2^m+B_3 2^{2m}$ and exploiting the properties of periodicity for modulo $2^m-1$ and modulo $2^m+1$, it holds:

$$x_1 = |B_1+B_2 2^m+B_3 2^{2m}|_{q_1} = |B_1+B_2+B_3|_{q_1} \tag{4.67}$$

$$x_3 = |B_1+B_2 2^m+B_3 2^{2m}|_{q_3} = |B_1-B_2+B_3|_{q_3} \tag{4.68}$$

In fact, being the $B_i$ represented on m bits, they're automatically reduced modulo $2^m-1$ and $2^m+1$, hence $x_1$ and $x_3$ can be evaluated by means of proper modulo adders.

Figure 42:
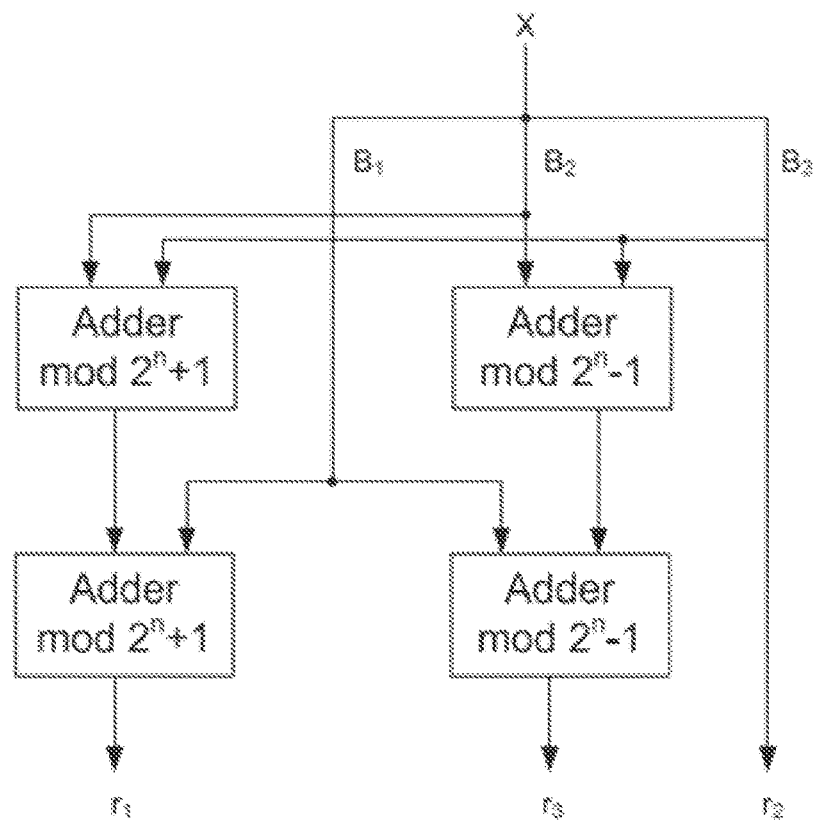
FIG. 42 illustrates an exemplary implementation for forward conversion in a residual domain.

FIG. 42 shows a basic implementation for forward conversion as described above. To improve the converter's performance a carry-save approach can be employed. Indeed, hardware complexity can be reduced if conversion is done sequentially but doing so will result in a linear increase in conversion time.

4.3.2 Arbitrary Moduli Set

Arbitrary moduli sets are usually adopted whenever the special moduli sets impose some constraints. Selecting moduli of small magnitude can greatly simplify the realization of the necessary processing elements of the next stages of calculation, but the forward conversion will be harder to implement. So forward conversions with arbitrary moduli sets tend to be complex and utilize elaborate hardware.

Look-Up Tables

In principle, look-up tables, typically implemented as ROMs, can be employed directly by having tables that store all possible residues and which are addressed by the numbers whose residues are utilized.

Indeed, look-up tables may utilize a large amount of memory, but these methods of conversion can be very useful and even competitive with combinational logic circuits if certain properties of residue numbers or techniques that reduce basic problems to simpler ones are exploited, like the truth tables reduction shown in Chapter 2.

The idea behind look-up table conversion is to store all possible $|2^i|_q$ values and add them modulo q. Supposing to partition the input data X in k blocks $B_i$ of p-bits words, with both k and p integers, then:

$$|X|_q = \left| \sum_{i=0}^{k-1} B_i 2^{ip} \right|_q = \left| \sum_{i=0}^{n-1} |B_i 2^{ip}|_q \right|_q \tag{4.69}$$

Figure 43:
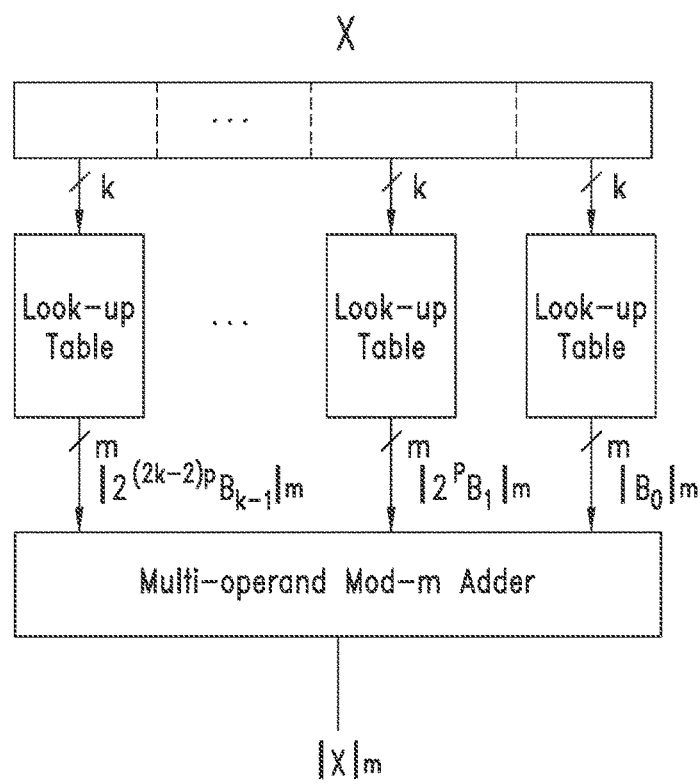
FIG. 43 illustrates an exemplary implementation for forward conversion utilizing a plurality of look-up table modules.

In such an arrangement, all the possible values of $|B_i 2^{ip}|_q$ are stored in k look-up tables, addressed by $B_i$, and summed up in a modular adder, as depicted in FIG. 43. Of course, ROMs show high regularity and density, meaning lower costs than a combinational-logic implementation, but performances are usually inferior.

Even though the choice of the number of partitions k and their bit-width p may seem arbitrary, a technique exists to determine these parameters, and is based on the cyclic or periodic property of $2^n$ mod q. This property refers to the eventual repetition of residues as n increases; e.g. for q=3, the values of $2^n$ mod q follow a pattern that repeats itself every 2 values of n, that is, every successive 2 powers of 2. Numerically, for 1, 2, 4, 8, 16 and so on the residues are 1, 2, 1, 2, 1 and so on. Indeed, this is not true if q is a power of 2, as each residue will then be zero, and also the length of the period depends on the specific modulus. Thus, some residues show longer periods than others; q−1 is known to be the basic period whereas any shorter period is known to be a short period.

Further, for some moduli, all $2^n$ mod q values are different within a period so that all q−1 residues are to be stored; e.g. for q=11, $2^n$ mod 11 ∈{1, 2, 4, 8, 5, 10, 9, 7, 3, 6} and the period is q−1=10, consequently 10 values are to be stored. For q=21, $2^n$ mod 21∈{1, 2, 4, 8, 16, 11} with a short period of 6, only 6 values are to be stored, representing a small amount of memory if compared to the magnitude of the modulus. It will be appreciated that, rather than on the word length of residues, the complexity of the forward converter will depend upon their periodicity.

With that in mind, it is evident that, for a modulus q with period T, the decimal number to be converted X is partitioned in k blocks of T bits, where kT is the bit-width of X', the padded version up to kT bits of X. The sets of residues for the different T-bit blocks will be the same because of the periodicity, with each block determining the same set of $2^T$ different values. The T-bit blocks are added, and the residue of any T-bit number and the result of the final modular additions are obtained from a look-up table in which the residues of $2^n$ mod q are stored for n=0, ..., T.

Combinational Logic

Unfortunately, look-up table methods cannot provide competitive performances compared to fully-combinatorial implementations, where circuitry sharing can be exploited to greatly reduce hardware complexity.

Fully-combinatorial approaches to perform forward conversion are based on Modular Exponentiation. Consider the following:

$$|2^n|_q = |2^{\Sigma_{i=0}^{N-1} n_i 2^i}|_q = \left|\prod_{i=0}^{N-1} 2^{n_i 2^i}\right| \quad (4.70)$$

where n is a N-bit word whose digits are $n_i$. Furthermore, since $n_i \in \{0,1\}$, an equivalent function can be built that maps $n_i$ in $2^{n_i 2^i}$:

$$2^{n_i 2^i} = \begin{cases} 1, & n_i = 0 \\ 2^{2^i}, & n_i = 1 \end{cases} \Rightarrow 2^{n_i 2^i} = (2^{2^i} - 1)n_i + 1 \quad (4.71)$$

leading to:

$$|2^n|_q = \left|\prod_{i=0}^{N-1} 2^{n_i 2^i}\right|_q = \left|\prod_{i=0}^{N-1} [(2^{2^i} - 1)n_i + 1]\right|_q \quad (4.72)$$

Expanding the products in the previous equation:

$$\left|\prod_{i=0}^{N-1} [(2^{2^i} - 1)n_i + 1]\right|_q = $$

$$\left|\prod_{i=0}^{N-1} (2^{2^i} - 1)n_i + \sum_{j=0}^{N-1} \sum_{i=1}^{p_{N-j}} \prod_i (N, N-j) + 1\right|_q \quad (4.73)$$

where $$p_{N-j} = C_{N-j}^N = \frac{N!}{(N-j)!j!} \text{ and } \sum_{i=1}^{p_{N-j}} \prod_i (N, N-j)$$

represents the sum of $p_{N-j}$ products taken (N−j) terms at a time, and each term is of the form $(2^{2^{N-j}}-1) n_{N-j}$. This expression can be synthesized as a logic function g(n).

Alternatively, only the first k terms of (4.70) can be transformed according to (4.71), leading to:

$$|2^n|_q = \left|\prod_{i=N-k}^{N-1} [(2^{2^i} - 1)n_i + 1] * \prod_{i=0}^{N-k-1} 2^{n_i 2^i}\right|_q \quad (4.74)$$

This way, g will be a function of $\{n_i\}_{i=N-k}^{N-1}$ instead of n, and the remaining $\{n_i\}_{i=0}^{N-k-1}$ digits are used to multiplex between different versions of g, said $g_j$, for j=0, ..., $2^{N-k}-1$. Finally, a number X is decomposed as $X = \Sigma_i x_i 2^i$, and modular exponentiation can be performed on each of the $2^i$, and every $|2^i|_q$ are summed up to obtain $|X|_q = |\Sigma|2^i|_q|_q$. Modular exponentiation is carried out simultaneously on all bits of a given binary number, requiring a number of multiplexers equal to the product of the bit-width of X and bit-width of the largest modulus, plus a logic function generator and a multi-operand modulo adder for adding the partial residues.

4.4 Backward Conversion

As described in Chapter 3, the Chinese Remainder Theorem is a useful theorem that allows the backward from residue numbers to their binary representation.

Equations (3.26), (3.27) and (3.28) from Section 3.3.2 describe how to perform this conversion:

$$|x|_M = \left|\sum_{i=1}^{N} \hat{m}_i \left|\frac{r_i}{\hat{m}_i}\right|_{m_i}\right|_M \quad (4.75)$$

$$\hat{m}_i = \frac{M}{m_i} \quad (4.76)$$

$$M = \prod_{i=1}^{N} m_i \quad (4.77)$$

It is evident that this operation is very hard to perform, since it utilizes a large modulo M reduction and products by some constants that may be very large depending on the moduli set. In fact, equation (4.75) can be modified considering:

$$\left|\frac{r_i}{\hat{m}_i}\right|_{m_i} = r_i \left|\frac{1}{\hat{m}_i}\right|_{m_i} \quad (4.78)$$

where $r_i$ is already reduced modulo $m_i$ and $$\left|\frac{1}{\hat{m}_i}\right|_{m_i}$$

is the multiplicative inverse of $\hat{m}_i$, which is a constant. The quantity $$M_i = \hat{m}_i \left|\frac{1}{\hat{m}_i}\right|_{m_i}$$

is a constant trial multiplies $r_i$, so (4.75) becomes:

$$|x|_M = \left|\sum_{i=1}^{N} M_i r_i\right|_M \quad (4.79)$$

Figure 44:
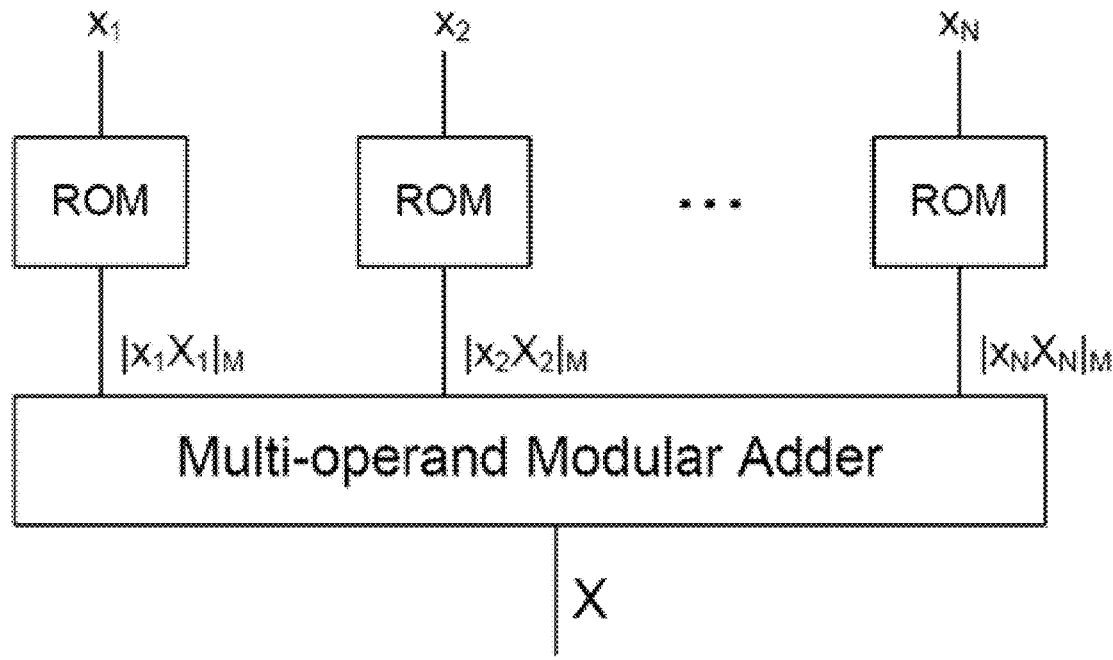
FIG. 44 is a conceptual illustration of a fully-combination implementation using look-up tables.

A straightforward implementation of (4.79) may be obtained by N multipliers evaluating the products in parallel and then a large modulo M multi-operand modular adder. In a fully-combinatorial implementation, the multipliers may be optimized if the $M_i$ are known at design time (which is generally true if the moduli are fixed), whereas in a look-up table implementation the products may be stored in a ROM that is addressed by $r_i$. FIG. 44 is a conceptual illustration of a fully-combination implementation using look-up tables.

4.4.1 Special Moduli Set

It is evident that, for a large dynamic range, the multipliers in the previous implementation will either show large area or there will be many of them, depending on how the moduli sets are chosen, if as a few large moduli or a large set of small moduli.

As stated in Section 3.2.7, the best performances with regard to backward conversion may be obtained if moduli with unit multiplicative inverse are chosen, or moduli whose inverse can be obtained in a closed form. However, this kind of sets may not be optimal for the forward conversion or for the intermediate processing of data. Indeed, special moduli sets are very useful for both operations and are appealing also for the backward conversion.

An example of such a converter generally shows that the moduli of the special moduli set $\{m_3, m_2, m_1\} = \{2^m-1, 2^m, 2^m+1\}$ have a multiplicative inverse in closed form:

$$\hat{m}_1 = \frac{M}{m_1} = 2^m(2^m - 1) \quad (4.80)$$

$$\hat{m}_2 = (2^m + 1)(2^m - 1) \quad (4.81)$$

$$\hat{m}_3 = 2^m(2^m + 1) \quad (4.82)$$

$$\left|\frac{1}{\hat{m}_1}\right|_{m_1} = \left|\frac{1}{2^m(2^m-1)}\right|_{(2^m+1)} = 2^{m-1} + 1 \quad (4.83)$$

$$\left|\frac{1}{\hat{m}_2}\right|_{m_2} = 2^m - 1 \quad (4.84)$$

$$\left|\frac{1}{\hat{m}_3}\right|_{m_3} = 2^{m-1} \quad (4.85)$$

The above equations result in a simplification of the original Chinese Remainder Theorem:

$$x = \left[\frac{x}{2^m}\right] 2^m + r_2 \quad (4.86)$$

$$\left[\frac{x}{2^m}\right] = |(C - r_1) + (A + B)|_{2^{2m}-1} \quad (4.87)$$

$$A = |(2^{2m-1} + 2^{m-1})r_3|_{2^{2m}-1} \quad (4.88)$$

$$B = |(2^{2m} - 2^m - 1)r_2|_{2^{2m}-1} \quad (4.89)$$

$$C = |(2^{2m-1} + 2^{m-1})r_1|_{2^{2m}-1} \quad (4.90)$$

Finally, the property of periodicity of residues can further simplify equations (4.88), (4.89) and (4.90), leading to a very compact and fast design, since most operations are just hard-wired shift and the large modulo M reduction becomes a smaller modulo $2^{2m}-1$ reduction.

4.4.2 Arbitrary Moduli Set

For arbitrary moduli sets many different implementations exist that employ a variant of the Chinese Remainder Theorem or a mixed-radix conversion. However, the most general and yet relatively cheap formulations of the Chinese Remainder Theorem are the New Chinese Remainder Theorem I and II, as stated in Chapter 3. These formulations essentially consider a mixed-radix representation of the operand in which the mixed-radix digits because they are expressed as functions of the residues. Recalling, from equation (3.34), the mixed-radix representation associated with a residue system:

$$x = \sum_{i=1}^{N} x_i \prod_{j=0}^{i-1} m_j \quad (4.91)$$

where the $x_i$ are mixed-radix digits. The new formulation relates $x_i$ and $r_i$ as:

$$x_i = k_{i-1}(r_i - r_{i-1}) \quad (4.92)$$

where the $k_i$ are multiplicative inverses defined by:

$$k_i = \left|\frac{1}{\prod_{j=1}^{i} m_j}\right|_{\prod_{j=i+1}^{N} m_j} \quad (4.93)$$

Therefore, the New Chinese Remainder Theorem is stated as follows:

$$x = \left|\sum_{i=1}^{N} k_{i-1}(r_i - r_{i-1}) \prod_{j=0}^{i-1} m_j\right|_M \quad (4.94)$$

The above equation may be manipulated to highlight the $r_i$:

$$x = \left|r_N k_{N-1} \prod_{j=0}^{N-1} m_j + \sum_{i=1}^{N-1} r_i(k_{i-1} - k_i m_i) \prod_{j=0}^{i-1} m_j\right|_M \quad (4.95)$$

Finally, performing the modulo reduction on the quantities $(k_{i-1} - k_i m_i) \Pi_{j=0}^{i-1} m_j$ and using the property $|kx|_{km} = k|x|_m$:

$$x = \left|r_N |k_{N-1}|_{m_N} \prod_{j=0}^{N-1} m_j + \sum_{i=1}^{N-1} r_i |k_{i-1} - k_i m_i|_{Q_i} \prod_{j=0}^{i-1} m_j\right|_M \quad (4.96)$$

$$Q_i = \prod_{j=i+1}^{N} m_j \quad (4.97)$$

The quantities $|k_{i-1}-k_im_i|_{Q_i}$ and $|k_{N-1}|_{m_N}$ can be computed and stored as coefficients $a_i$ and $a_N$, leading to:

$$x = \left| \sum_{i=1}^{N} r_i a_i \prod_{j=0}^{i-1} m_j \right|_M \quad (4.98)$$

The coefficients $a_i$ also have a mixed-radix representation, and it is chosen according to (4.91) such that:

$$a_i \prod_{j=0}^{i-1} m_j = \sum_{j=i}^{N} a_{ij} \prod_{k=0}^{j-1} m_k \quad (4.99)$$

Figure 45:
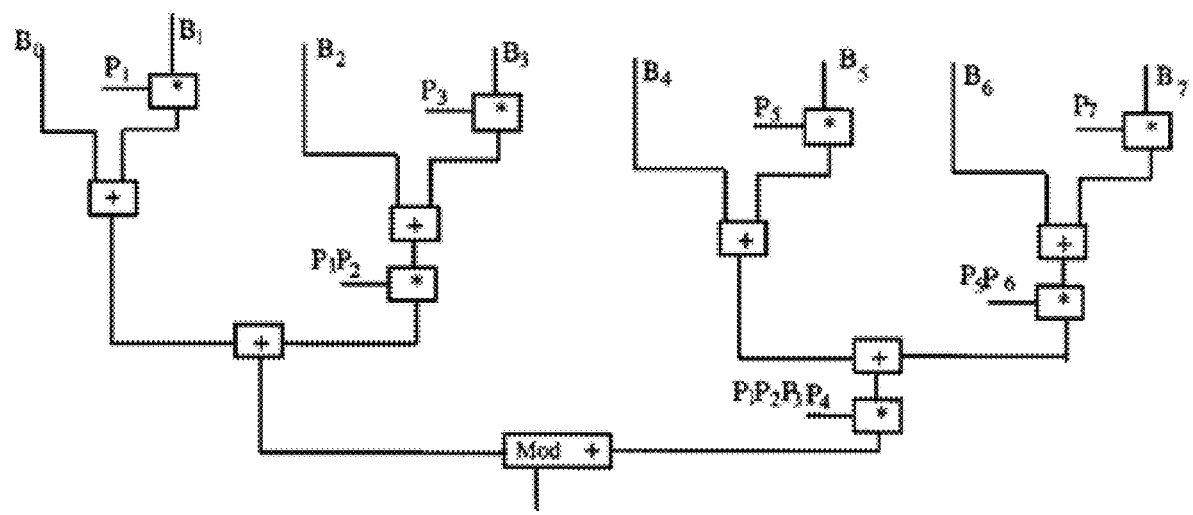
FIG. 45 illustrates an exemplary architecture for one embodiment of a multiplier utilizing an adder-based tree structure.

The $a_{ij}$ are thus the elements of a matrix, called characteristic matrix of the residue system. Since the $a_{ij}$ are mixed-radix digits, it holds $a_{ji} < m_i$. Hence the coefficients of the characteristic matrix can be stored and are also small numbers compared to the factors $M_i$ that appear in (4.79); this simplifies the computation of the products and allows to employ tree structures of adders for the additions, as exemplified in FIG. 45. Furthermore, the characteristic matrix can be reconfigured if different moduli set are to be employed and this algorithm is valid for any moduli set.

V. BUILDING BLOCKS

The architecture of an embodiment of a convolutional accelerator is now provided, together with a detailed explanation of the building blocks of the architecture, the design methodologies and the benefits in terms of area, timing and power consumption.

As stated earlier, the convolution operations in a convolutional neural network consume most of the power. Therefore, multiply-and-accumulate units may be significant factors for power consumption. On the other hand, in order to implement convolutional neural networks in real-time, system integrated environments such as IoT, wearables and smart sensors, the overall area of a convolution accelerator should be as small as possible.

In Section 5.1, the first architectural considerations arising from the analysis of convolutional neural networks' and residue number systems' peculiar properties are discussed; in Section 5.2, a brief description of an embodiment of a Neural Networks Framework is issued; Section 5.3 extensively describes the building blocks of an embodiment of a convolutional accelerator that was developed; finally, the results of the design synthesis are shown in Section 5.4.

5.1 Benefits of Residual Convolution Accelerators

To evaluate a single element of the output feature map's tensor, a certain amount of kernel-feature multiplications, depending on height and width of the kernels and number of channels, is performed together with the corresponding accumulations. In fact, it is not uncommon to divide a single large convolution into batches of smaller ones. Therefore, a fixed initial latency that depends on the batch size exists. In this whole period of time, if calculations are performed in the residual domain, there is no need to convert the intermediate results back to binary representation.

Also, weights are always evaluated with backpropagation off-line and then stored; therefore, the stage of binary-to-residue conversion for weights can be omitted if these are directly stored in residual representation.

To accelerate convolutions and obtain a high throughput, one can also exploit the fact that, in most convolutional nets, data are organized in a streamed fashion (e.g. stream video in face recognition applications). A certain number of multiply-and-accumulate units can process a data stream in parallel and could provide a throughput of one output feature data per cycle, if the kernel dimensions are known a priori.

Therefore, to offset the increment in area that is utilized by implementing also forward and backward conversion blocks together with the multiply-and-accumulate units, one can use a single forward converter for multiple multiply-and-accumulate operations, since convolutional nets employ parameter sharing (reuse of the feats), and a single backward converter, since a conversion operation is utilized only after a whole accumulation round.

By a power consumption standpoint, one can exploit convolutional nets' algorithmic-level noise resiliency to promote low-precision arithmetic, making it possible to perform approximate operations in a residual domain. One benefit of residue number system is that every digit is computed in parallel, there are no inter-modular carries to be propagated: this leads to both reduced delay critical paths and consequently reduced power dissipation.

5.2 Acceleration Framework

This disclosure integrates the designed residual convolution accelerator within a framework for neural networks hardware acceleration. Here, the architecture of such framework will be briefly discussed in order to explain certain design choices, such as the delayed modulo reduction approach that was exploited in the multiply-and-accumulate units.

First of all, most neural networks' applications are real-time applications, e.g. speech recognition. Feature data will most likely be streams of raw data or raster-scan frames. Hence, data transfer within the framework is supported in a streamed fashion, which improves data reuse, reduces memory traffic and provides flexibility.

In an embodiment, multiple convolution accelerators are built-in and data streams to these accelerators can be reconfigured to run various typology of neural networks: accelerators can be chained together (e.g., as depicted in FIG. 46A) to evaluate two or more layers of a neural network without storing data before their dispatch to the next accelerator, or data streams can be forked to different accelerators (e.g., as depicted in FIG. 46B) to perform convolution of multiple kernels in parallel, massively exploiting feature data reuse.

Both chaining and forking are key features of convolutional acceleration, but they are particularly fit for a residual implementation. Thanks to forking, a single binary-to-residue conversion can be performed on feature data, and then converted residue data can be shared between different residual accelerators; thanks to chaining, multiple batches within a layer (or multiple convolutional layers if activations are somehow performed in the residual domain) can be performed before residue-to-binary conversion.

Therefore, less hardware is utilized because only a single forward converter and a single backward converter can manage multiple multiply-and-accumulate units; furthermore, less power is consumed since these operations are performed less frequently. This is conceptually illustrated in FIG. 47A, where a forward converter and a backward converter are employed for each multiple-and-accumulate unit, and FIG. 47B, where a single forward converter and a single backward converter manage multiple multiply-and-accumulate units.

Figure 48:
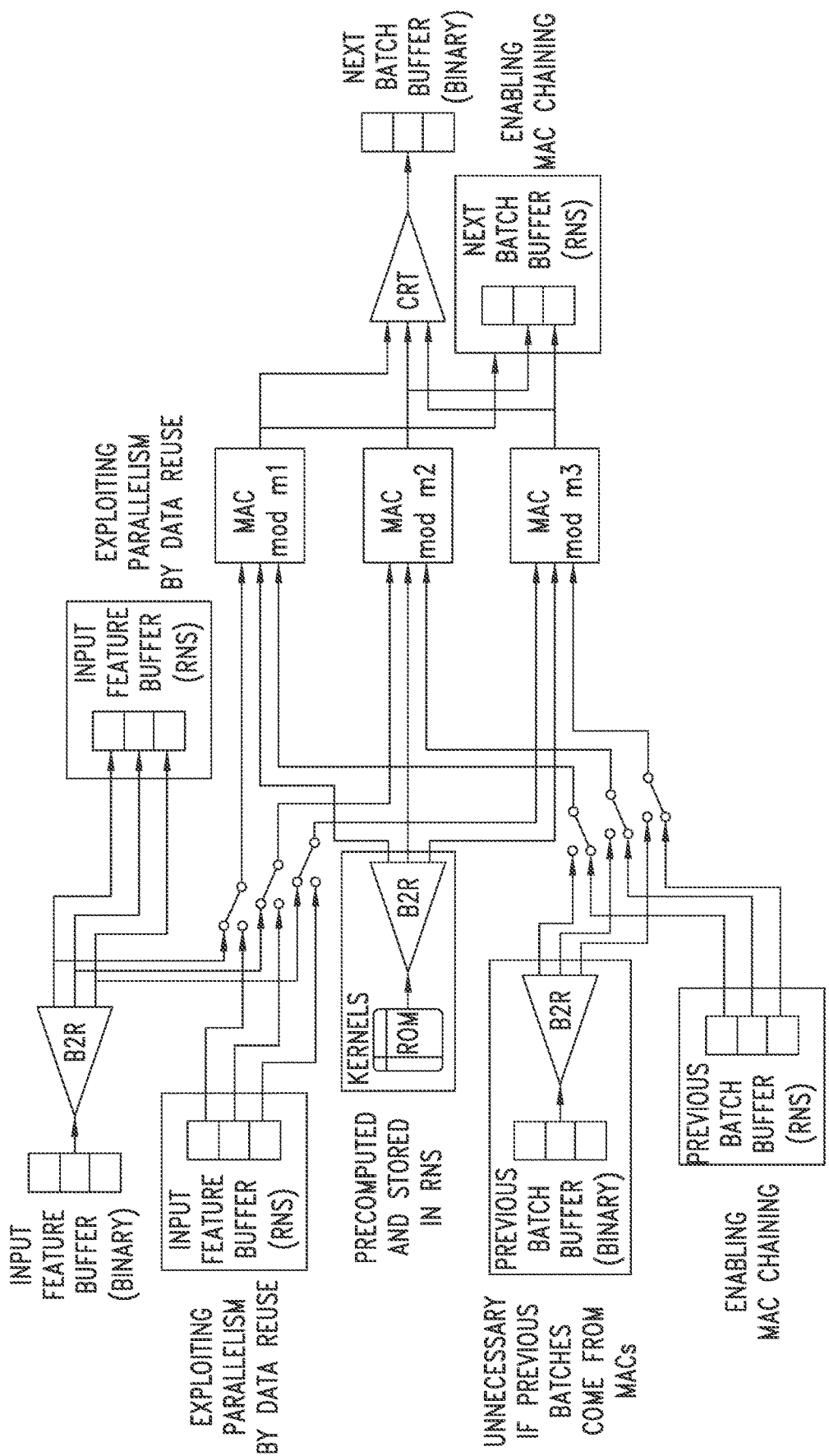
FIG. 48 illustrates an exemplary embodiment of a MAC cluster in a residue-based convolutional accelerator.

However, different convolutional accelerators may also be used in parallel to process different feature data, kernels or even neural networks, therefore, for the sake of flexibility, a certain minimum number of both forward and backward converters are instantiated. This is indeed a drawback from an area occupation standpoint, although, from a power consumption perspective, if proper switching mechanisms are provided, converters may be bypassed and turned off when unused. In practice, a trade-off exists between area occupation and a number of converters. The above considerations lead to the architecture of a MAC cluster conceptually depicted in FIG. 48.

5.3 Building Blocks

Hybrid RNS/binary architectures utilize converters to/from conventional representation. Convolutions are performed by MACs. Hence, a forward converter (FWC), a backward converter (BWC) and three modular MACs are utilized.

Convolutions only need a stage of multiplication and a stage of addition to be performed, plus a feedback register to keep track of the accumulations. However, in residual domain, modulo reduction operations are performed that are associated with different hardware implementations depending on the kind of moduli used.

This disclosure focused on the low-cost moduli sets with moduli of the $2^m$ and $2^m-1$ kind.

Therefore, the building blocks of the architecture are the following:

modulo $2^m$ forward converter;
modulo $2^m$ multiply-and-accumulate unit;
modulo $2^m-1$ forward converter;
modulo $2^m-1$ multiply-and-accumulate unit;
backward converter.

The structures were descripted in Verilog language, and various descriptions based on actual design considerations were tested in order to obtain the least possible area after a hardware synthesis for each block, since the EDA synthesis tool ultimately infers which gates to instantiate.

The structures were also made configurable at design-time, in order to experimentally determine which combinations of moduli are best suited with regard to area occupation and achievable dynamic range of the moduli set.

Considering sets of 3 moduli such that every residue number is stored in 16 bits, only a finite number of sets are useful:

sets of the $\{2^{l_1}, 2^{l_2}-1, 2^{l_3}-1\}$ kind;
sets of the $\{2^{l_1}-1, 2^{l_2}, 2^{l_3}-1\}$ kind;
sets of the $\{2^{l_1}-1, 2^{l_2}-1, 2^{l_3}\}$ kind.

For each set, $l_1+l_2+l_3=16$ in order to contain the data within the same number of bits as a conventional 16-bits implementation, to perform a fair comparison. Also, it is verified that these moduli are pair-wise relatively prime. Ultimately, the moduli sets of interest have been described in Table 5.1.

TABLE 5.1

| $l_1$ | $l_2$ | $l_3$ | $m_1$ | $m_2$ | $m_3$ | M | $m_1$ | $m_2$ | $m_3$ | M | $m_1$ | $m_2$ | $m_3$ | M |
|---|---|---|---|---|---|---|---|---|---|---|---|---|---|---|
| 1 | 2 | 13 | 2 | 3 | 8181 | 49146 | | | | | | | | |
| 1 | 4 | 11 | 2 | 15 | 2047 | 61410 | | | | | | | | |
| 1 | 7 | 8 | 2 | 127 | 255 | 64770 | | | | | | | | |
| 2 | 3 | 11 | 4 | 7 | 2047 | 57316 | 3 | 8 | 2047 | 49128 | 3 | 7 | 2048 | 43008 |
| 2 | 5 | 9 | 4 | 31 | 511 | 63364 | 3 | 32 | 511 | 49056 | 3 | 31 | 512 | 47616 |
| 3 | 3 | 10 | | | | | 7 | 8 | 1023 | 57288 | | | | |
| 3 | 4 | 9 | 8 | 15 | 511 | 61320 | | | | | 7 | 15 | 512 | 53760 |
| 3 | 5 | 8 | 8 | 31 | 255 | 63240 | 7 | 32 | 255 | 57120 | | | | |
| 3 | 6 | 7 | 8 | 63 | 127 | 64008 | 7 | 64 | 127 | 56896 | | | | |
| 4 | 5 | 7 | 16 | 31 | 127 | 62992 | 15 | 32 | 127 | 60960 | 15 | 31 | 128 | 59520 |
| 5 | 5 | 6 | | | | | 31 | 32 | 63 | | | | | |

One can easily notice that the dynamic range tends to be larger if moduli of the $2^m$ kind are chosen to be the smaller ones, and if moduli of the $2^m-1$ kind are very close in value. It also tends to be smaller if the modulo $2^m$ grows up. In fact, the smallest one, 43008, is the range of the set $\{3,7,2048\}$, where 2048 is the largest power of 2 being considered.

However, from a hardware standpoint, especially regarding area occupation, the trends follow an opposing direction: the $2^m$ kind of moduli utilizes the smallest amount of combinational logic. Hence, it is desirable this modulo to be larger than the two others. In practice, there is a trade-off between dynamic range and area, that is, between accuracy and area. Anyway, if a minimum dynamic range is utilized, we choose the smallest available range that satisfies the specifications on accuracy, because that range will most likely provide the minimum achievable area.

5.3.1 Forward Converter

Figure 50:
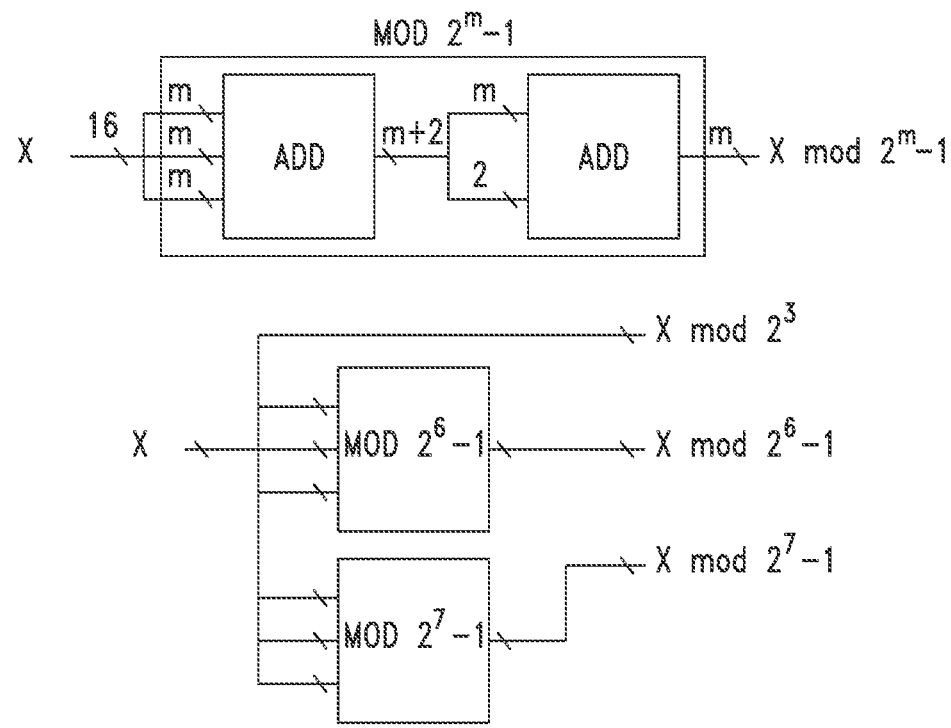

The FWC performs three modular reductions on a 16 bits input. $2^m$ reduction is made by taking only the m least significant bits. $2^m-1$ reduction is performed according to the property of periodicity: m-bits words are formed partitioning the 16 bits input and added up in a MOA. The result is further reduced in the same way. This is shown in FIG. 50, depicting Modulo $2^m-1$ reduction and an embodiment of a forward converter in accordance with various techniques described herein.

The modulo $2^m$ forward converter is a wired operation, in which the m least significative bits of the input (the features) are to be converted.

Figure 49:
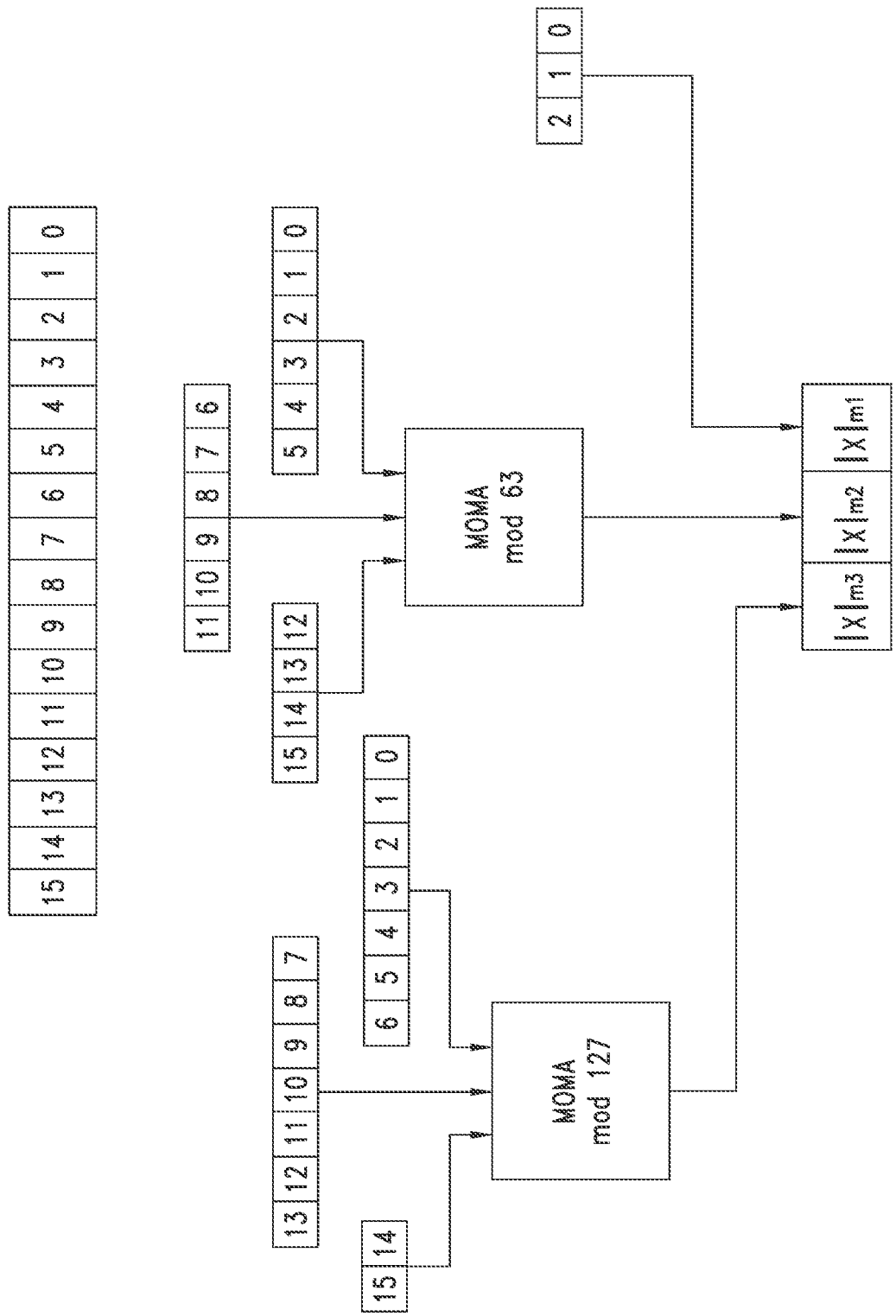
FIGS. 49-51 illustrate exemplary implementations of modulo $2^m-1$ forward converters.

One embodiment of the modulo $2^m-1$ forward converter, as depicted in FIG. 49, includes a multi-operand modulo adder that sums up all the partitions of m bits of the input. For example, for modulus 63, m=6, and if the input is coded on 16 bits, the multi-operand modulo adder adds up the first 6 bits from 0 to 5, the second 6 from 6 to 11, and the remaining 4 bits from 12 to 15. In general, the multi-operand modulo adder adds up $$b = \left\lceil \frac{N}{m} \right\rceil$$

words of m bits, where N is word length, and a last word of $|N|_m$ bits.

The multi-operand modulo adder architecture includes a carry-save adder structure with end-around carry, that is, the last carry of each line of adders' carry vector is added in the first column of the next line. Finally, the sum and carry vectors of the CSA are added up in a modulo $2^m-1$ modular vector merging adder.

However, since adding the end-around carry in the vector merging adder could lead to race-conditions, and since multiple end-around carry operations may be utilized, the double representation of 0 redundancy may be eliminated as described in Section 4.1.2.

The forward conversion operation described is algorithmically equivalent to the following: since the multi-operand modulo adder sums up b words of m bits and 1 word of $|N|_m$ bits, if no end-around carry is taken into account, its output is expected to be represented on (m+b+1)−1 bits. This output is obviously not reduced modulo $2^m-1$, since it is encoded on m+b bits, so the output can be further partitioned in 2 words of m and b bits (assumed b≤m) and summed up. Further, if the 0 redundancy is eliminated, there will be no need for the end-around carry operation.

Figure 51:
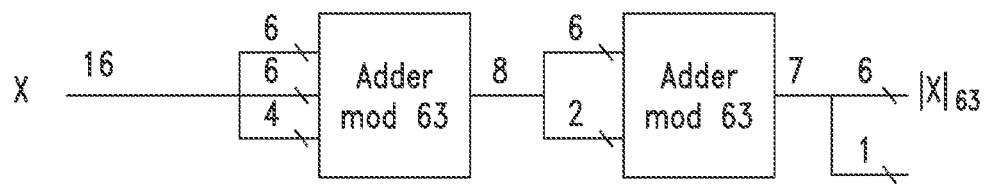

This is better understood in the following example, described with respect to FIG. 51. A modulo 63 (6 bits) forward conversion of a 16 bits number includes, in the worst case, adding up $(111111)_2+(111111)_2+(1111)_2=(10001101)_2$. Addition of the first 6 least significative bits with the remaining 2 most significative bits for a 8-bit word could lead to end-around carry with the combinations (10 111110)$_2$ and (01 111111)$_2$. The former case is obviously impossible, since the worst case is $(10001101)_2$, while the latter can be avoided by 0 redundancy elimination: for (01 111111)$_2$, instead of adding $(111111)_2+(01)_2$, $(000000)_2+(01)_2$ is performed, which does not lead to end-around carry.

It is worth noting that a Fused Add-Multiply approach could be exploited to fuse together the forward conversion and the multiply-and-accumulate unit, since the forward converter performs an addition of the input partitions, to further reduce the overall hardware complexity.

Anyway, in the described architecture, multiple multiply-and-accumulate units share the feature data, therefore a single forward converter suffices.

5.3.2 MAC Units

Figure 52:
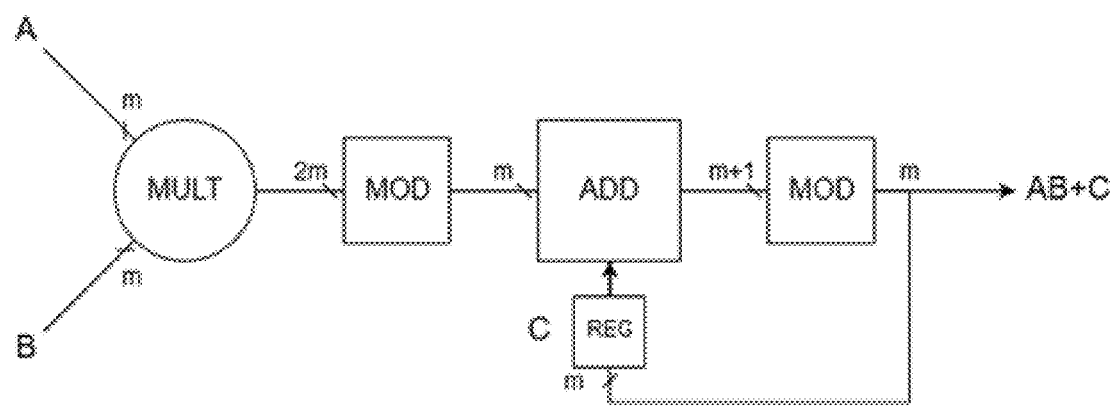
FIG. 52 illustrates an exemplary embodiment of a residual multiply-and-accumulate unit.

A straightforward residual multiply-and-accumulate unit is conceptually shown in FIG. 52, equipped with a multiplier, a first modulo reduction, an adder, a second modulo reduction, and a feedback register to store the accumulations. However, some properties of residue numbers can be exploited to further simplify the hardware, or even omit parts of it.

The modulo $2^m$ multiply-and-accumulate unit's multiplier is a Wallace-tree multiplier in which all the hardware utilized for the evaluation of the most significant m bits is omitted. The same is true for the adder.

Figure 53:
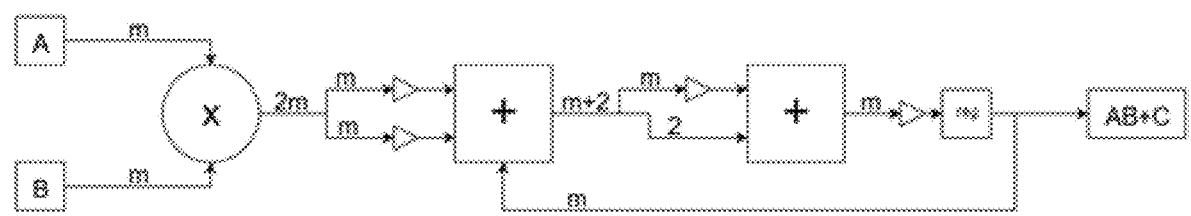
FIGS. 53-54 illustrate exemplary embodiments of a modulo $2^m-1$ multiply-and-accumulate circuit.

A modulo $2^m-1$ multiply-and-accumulate unit, depicted as part of FIG. 53, also utilizes a multiplier that can also be a simple Wallace-tree multiplier. It is possible to exploit the property of periodicity by ignoring the modulo reduction and adding together the m least significant bits, m most significative bits and the accumulation stored in the register. Therefore, if the stored accumulation is also on m bits, the adder's output will be on m+2 bits (sum of 3 m-bits words). Finally, an end-around carry operation is performed, summing the remaining m and 2 bits together. The result will be on m bits as expected without additional modulo operations, if proper 0 redundancy elimination is performed, as shown earlier.

To further reduce area occupation of the multiply-and-accumulate units, the following two strategies were implemented:
multiplication truth tables reduction;
delayed modulo reduction approach.

Multiplication Truth Tables Reduction

Of course, most of the effort in reducing the multiply-and-accumulate units' area occupation its associated with the multiplier, since its area grows quadratically with the input dimensions, whereas an adder area occupation grows linearly with the input dimensions. As previously stated in Chapter 2, a reduction of the truth tables for multiplication can be performed in order to reduce a m*m multiplication to a (m−1)*(m−1) one.

Two factors for this reduction are considered:
there should be an easy way to determine whether a number is greater than $$\left[\frac{2^m-1}{2}\right];$$

there should be an easy way to determine the additive inverse of a number.

Since modulo $2^m-1$ numbers are coded in 1's-complement, the former point is satisfied by checking the most significant bit of the number. For example, for $$m=4, 2^m-1=15, \left[\frac{2^m-1}{2}\right]=7,$$

numbers from 0 to 14 will be coded accordingly to the following table.

TABLE 5.2

| 1's-Complement of 4-bit Numbers | | | |
|---|---|---|---|
| X ≤ 7 | | X > 7 | |
| X | (X)$_2$ | X | (X)$_2$ |
| 0 | 0000 | 8 | 1000 |
| 1 | 0001 | 9 | 1001 |
| 2 | 0010 | 10 | 1010 |
| 3 | 0011 | 11 | 1011 |
| 4 | 0100 | 12 | 1100 |
| 5 | 0101 | 13 | 1101 |
| 6 | 0110 | 14 | 1110 |
| 7 | 0111 | 15 (0) | 1111 (0000) |

It is evident from the table that the most significant bit of X determines whether it belongs to X≤7 or X>7; it is also evident that, since 1's-complement representation is an implicit sign representation, one could think of numbers X>7 as of negative numbers. In fact, a negative number X in the residual domain is represented by its additive inverse $2^m-1-X=(11\ldots11)_2-X=\overline{X}$.

On the other hand, the additive inverse is easily obtained by performing a bit-wise inversion of the numbers. For example, the additive inverse of 4 mod 15 is 15−4=11; being 4=(0100)$_2$ in 1's-complement representation, bit-wise inversion of (0100)$_2$ leads to (1011)$_2$=11, as expected. Since $|AB|_q$ (q=$2^m-1$) is to be computed, if numbers $$X \le \left\lfloor \frac{2^m - 1}{2} \right\rfloor$$

are thought or as positive numbers and numbers $$X > \left\lfloor \frac{2^m - 1}{2} \right\rfloor$$

as negative, three cases are taken into account:
A and B both positive;
A positive and B negative or A negative and B positive;
A and B both negative.

If both A and B are positive, $|AB|_q$ is a standard multiplication on $(m-1)*(m-1)$ bits, being the most significative bit of both numbers '0'.

If A is positive and B negative, it means $B=-\overline{B}$, and $|AB|_q=|-A\overline{B}|_q=|q-A\overline{B}|_q$ is computed, so both B and the multiplication's result is to be inverted. Of course, $\overline{B}$ will have the most significative bit equal to '0', like A, and the multiplication will again be on $(m-1)*(m-1)$ bits.

If both A and B are negative, $A=\overline{A}$, $B=-\overline{B}$ and $|AB|_q=|(-\overline{A})(-\overline{B})|_q=|\overline{AB}|_q$ is, again, a standard multiplication on $(m-1)*(m-1)$ bits, being the most significant bit of both numbers '0'.

Figure 54:
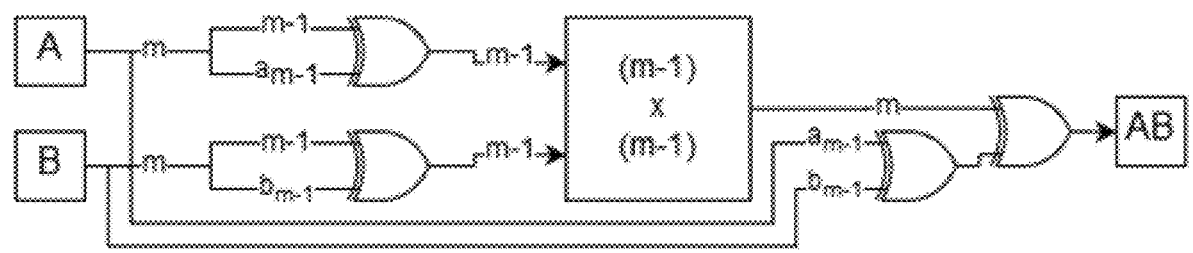

Hence, some simple operations are performed: if A's most significative bit is '1', A is inverted, that is, if $A=(a_{m-1}, a_{m-2}, \ldots, a_0)$, $A'=A \oplus a_{m-1}$, where $\oplus$ is the XOR operation (the same holds for B, i.e. $B'=B \oplus b_{m-1}$). To check if A is positive and B negative or A negative and B positive, $c=a_{m-1} \oplus b_{m-1}$ is computed. Finally, the result of $P'=|A'B'|_q$ is inverted according to c, that is, $P=P' \oplus c$. This is shown in FIG. 54.

The modulo $2^m-1$ multiply-and-accumulate unit's multiplier can be a simple Wallace-tree multiplier of $(m-1)*(m-1)$ bits, with a small overhead of auxiliary circuitry (XOR operations). The multiplier's output will be on $2(m-1)$ bits instead of $2m$ bits. Modulo reduction, however, cannot be ignored exploiting the property of periodicity and adding the resulting m least significative bits and $m-2$ most significative bits in the accumulator. This is due to fact that the eventual bit-wise inversion $P' \oplus c$ is performed on the reduced value, that is on m bits, and ultimately skipping this modulo reduction will lead to errors. This will be demonstrated with an example when putting together the truth table reduction with the delayed reduction.

Delayed Modulo Reduction Approach

Figure 55:
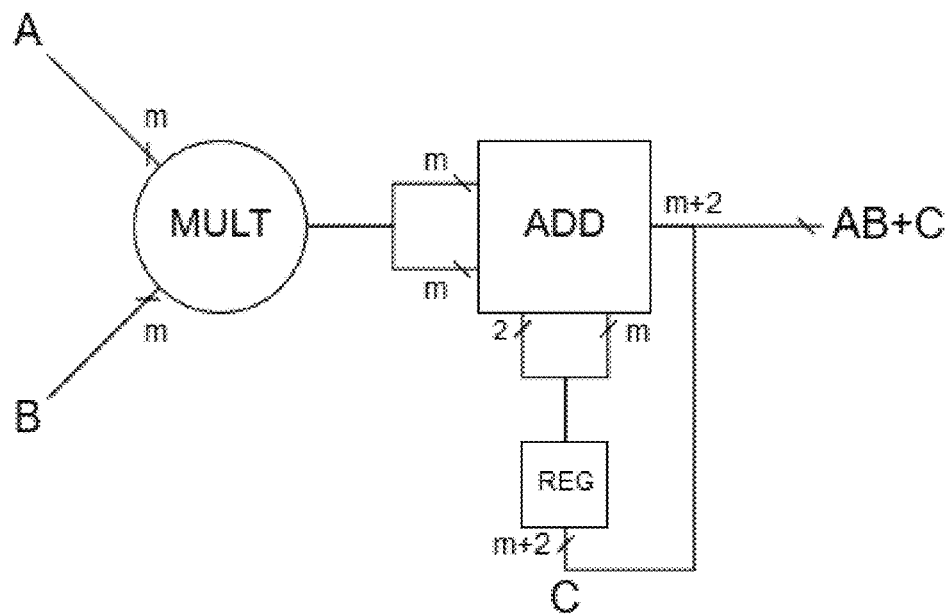
FIG. 55 illustrates one implementation of a multiply-and-accumulate circuit.

Since modulo reduction is expensive with regard to a standard implementation of any arithmetic operation (an overhead of at least m adders is utilized to perform end-around carry), one could think about delaying modulo reduction of the accumulator output and performing it only during the last step of an accumulation round. Moreover, this utilizes the maximum number of accumulations being known a priori to properly size the accumulator's output. However, the property of periodicity can be used to avoid the size of the accumulator output to increase indefinitely. The previous accumulation from the feedback register can be partitioned in m least significant bits and r remaining bits and added to the m least significant bits and m most significant bits of the multiplier output, as shown in FIG. 55.

To determine r, we consider:
1. after the first cycle of operation the feedback register stores a value of 0, so the output can be at most coded on m+1 bits;
2. after the second cycle 3m-bit words plus a 1-bit word are summed, leading to at most m+3 bits;
3. after the third cycle, 3m-bit words plus a 3-bit word are summed, leading to at most m+3 bits. Therefore, m+3 bits is the greatest size the output could reach.

However, performing a more careful analysis, it is found that m+2 bits is the greatest size the output can reach, as shown in the following example.

For modulo 63 (m=6), after the first cycle, in the worst case the addition is $(111111)_2+(111111)_2=(1111110)_2$ (6+6 bits, result is on 7=6+1 bits). After the second cycle the worst case is $(111111)_2+(111111)_2+(111111)_2+(1)_2=(10111110)_2$ (6+6+6+1 bits, result on 8=6+2 bits). After the third cycle the worst case is $(111111)_2+(111111)_2+(111111)_2+(11)_2=(11000000)_2$ (6+6+6+2 bits, result on 8 bits). Therefore, in this embodiment, 8 bits is the greatest size the output can reach.

The final modulo reduction will then be performed during the backward conversion process, once every accumulation round. Actually, since the multiplier's output could be inverted according the truth table reduction method, as stated earlier, prior to this inversion the output undergoes a modulo reduction.

However, in order to avoid such reduction, the $2m-2$ bits output of the multiplier can be zero padded up to $2m$ bits. Doing so means that, in place of $P'=|A'B'|_q$, $P''=A'B'$ is evaluated, zero padded and then $P=P'' \oplus c$ will be no longer on m, but on $2m$ bits. This new output is then partitioned and fed in the accumulator accordingly to the property of periodicity. The following example will better clarify this point.

For modulo 15 (m=4, if $A=(1000)_2$ and $B=(0111)_2$, $A*B=(00111000)_2$ and $A*B$ mod $15=(0011)_2+(1000)_2=(1011)_2$. Applying the truth table reduction method:
1) A'=not $A=(0111)_2$;
2) $B'=B=(0111)_2$;
3) $P''=A'*B'=(00\ 110001)_2$;
4) P=not $P''=(11001110)_2$;
5) P mod $15=[(1100)_2+(1110)_2]$ mod $15=(11010)_2$ mod $15=(0001)_2+(1010)_2=(1011)_2$.

Without zero padding of P'', the result would be:
1) A'=not $A=(0111)_2$;
2) $B'=B=(0111)_2$;
3) $p''=(110001)_2$;
4) P=not $P''=(001110)_2$;
5) P mod $15=(00)_2+(1110)_2=(1110)_2 \ne (1011)_2$.

With these optimizations, the area of multiply-and-accumulate units was reduced of about 37% with respect to a standard residual multiply-and-accumulate implementation.

Of course, the backward conversion will show a larger area due to the inclusion of the final modulo reduction stages, but the overall area will be averaged down if multiple multiply-and-accumulate units are to be instantiated and all of them use the same backward conversion block.

Figure 56:
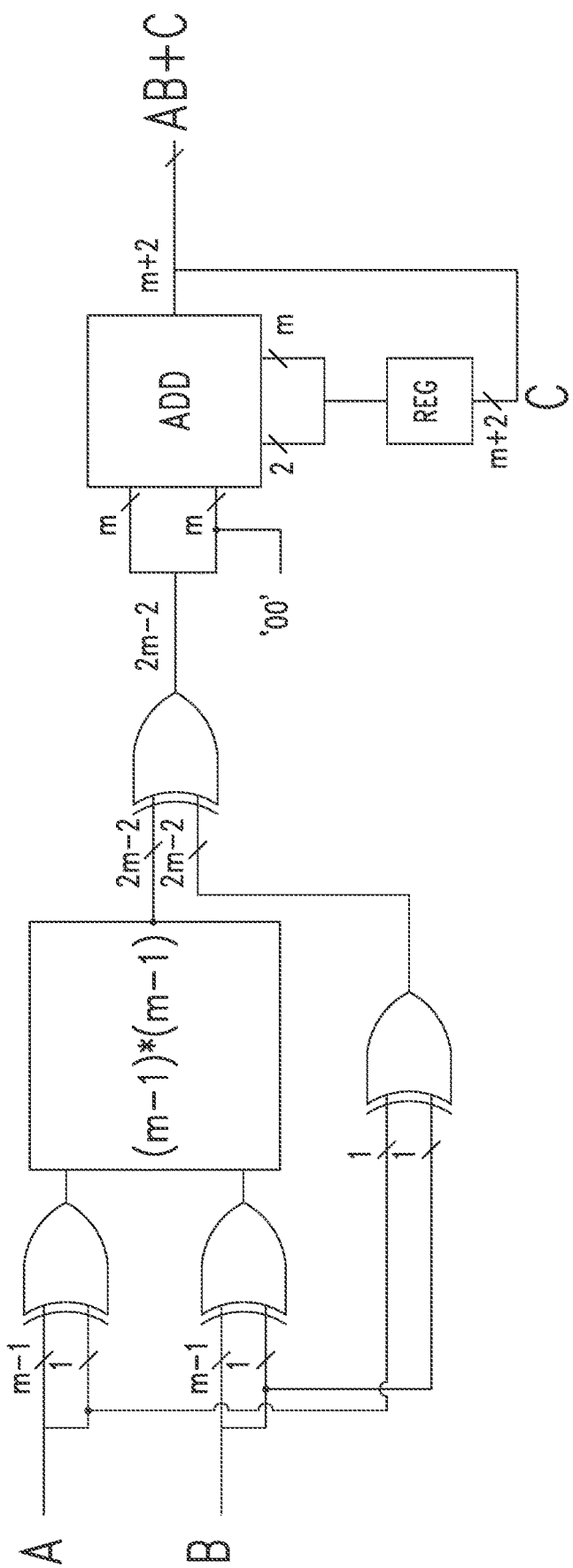
FIG. 56 illustrates an exemplary embodiment of a $2^m$ modular MAC in accordance with techniques described herein.

An embodiment of a $2^m$ modular MAC in accordance with techniques described herein is shown in FIG. 56, and may be made of a modified m-bit input multiplier in which all the circuitry utilized to evaluate the bits with significance greater than $m-1$ is removed, and a similarly modified m-bits input adder. The described $2^m-1$ modular MAC exploits the truth table reduction of the multiplication, the periodicity and a delayed modulo reduction approach. The first strategy allows to reduce a modular $m \times m$ multiplication into a $(m-1) \times (m-1)$ one with an extra, usually negligible overhead of XOR gates. The output of the reduced multiplication will be on $2m-2$ bits. This is zero padded to $2m$ bits and then partitioned according to the periodicity. The partitions are added up in a MOA together with the previous accumulation. The output of the MOA will be on m+2 bits if the previous accumulation is reduced on m bits (addition of 3 m-bit words). The modulo reduction is avoided feeding back the unreduced MAC output to the MOA since there is no need to perform it until an accumulation round is complete. It will be later performed in the BWC. To avoid an indefinite increment of the MOA's output bit-width, periodicity can be exploited to partition the output that is fed back, too. 3 strings of m bits and 1 string of 2 bits are then added in the MOA, whose output will be fixed on m+2 bits. To summarize, the described RNS MAC utilizes a (m−1)×(m−1) multiplier and a 4 inputs, m-bit adder.

5.3.3 Backward Converter

Figure 57:
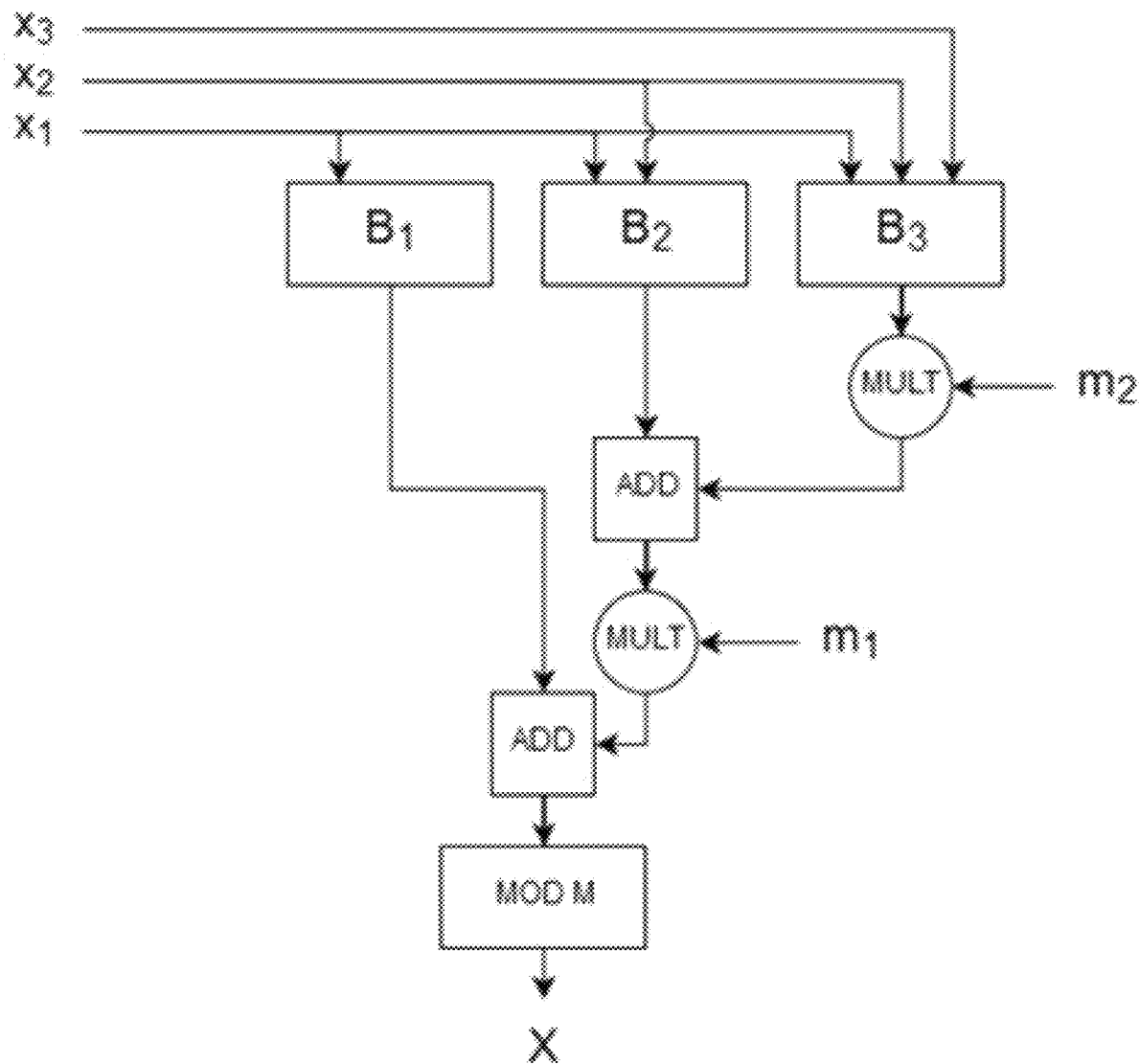
FIG. 57 illustrates an exemplary embodiment of a backward converter in accordance with techniques described herein.

An embodiment of a backward converter in accordance with techniques described herein may be based on the New Chinese Remainder Theorem I. The theorem states that, for moduli $m_i$ such that $m_i > 2m_{i-1}$ for $i=0, \ldots, N-1$, with N number of moduli, the following holds:

$$X = B_1 + m_1 B_2 + m_1 m_2 |B_3|_{m_3} \bmod M \quad (5.1)$$

where $M = \Pi_{i=0}^{N-1} m_i$, $B_1 = a_{11} x_1$, $B_2 = a_{12} x_1 + a_{22} x_2$, $B_3 = a_{13} x_1 + a_{23} x_2 + a_{33} x_3$, the $a_{ij}$ are elements of the so-called characteristic matrix, which is determined by iterative mixed-radix conversions, and the $x_i$ are the remainders modulo $m_i$ of X (See Section 4.4.2). An algorithmic approach to depicting an embodiment of a backward converter is provided in FIG. 57.

The New Chinese Remainder Theorem I is a very useful theorem because previous implementations of backward converters, based on the basic Chinese Remainder Theorem or mixed-radix conversions, were either too slow or too large from an area occupation standpoint. Even though, the backward converter is still the largest building block, if considered alone, and since it only operates once every accumulation round, the least efficient. Nevertheless, some more optimizations are achievable if the moduli set are chosen accordingly.

First of all, in order to produce a parametric design for the backward converter, it was deprived of moduli-set-dependent optimizations, e.g. simplification of the $a_{ij}$ products by exploiting residue properties such as periodicity. Some of these optimizations have been described previously herein, and additional embodiments may utilize various patterns of characteristic matrix elements or optimize the implementation for a particular fixed set of moduli.

As disclosed herein, for every moduli set in Table 5.1, the following holds:

$$X = x_1 + m_1 |B_2 + m_2 |B_3|_{m_3}|_{m_3 m_2} \quad (5.2)$$

Two points are demonstrated: first, that the above equation holds, that no large modulo M reduction is utilized; second, that the quantity $B_2 + m_2 |B_3|_{m_3}$ is less than $2m_3 m_2$, in order to minimize the hardware utilized for the modulo reduction operation.

The first point can be demonstrated keeping in mind that:

$$|mX|_{mb} = m|X|_b \quad (5.3)$$

$$|X+Y|_m = ||X|_m + |Y|_m|_m \quad (5.4)$$

Starting from (5.2) and using (5.4):

$$X = \quad (5.5)$$
$$B_1 + m_1 B_2 + m_1 m_2 |B_3|_{m_3} \bmod M = |B_1 + |m_1 B_2 + m_1 m_2 |B_3|_{m_3}|_M|_M$$

being $M = m_3 m_2 m_1$, using (5.3) and supposing $B_1 = x_1$:

$$X = |x_1 + m_1 |B_2 + m_2 |B_3|_{m_3}|_{m_3 m_2}|_M \quad (5.6)$$

The characteristic matrix elements $a_{ij}$ are always smaller than or equal to $m_j$ if $m_i > 2m_{i-1}$, while remainders modulo $m_i$ are always smaller than $m_i$, leading to:

$$x_1 + m_1 |B_2 + m_2 |B_3|_{m_3}|_{m_3 m_2} \le m_1 + m_1 (m_3 m_2 - 1) = \quad (5.7)$$
$$m_3 m_2 m_1 - 1 < M$$

This means that no large modulo M reduction is utilized, but a smaller modulo $m_3 m_2$ one.

$B_1 = x_1$ is easily demonstrated considering that $a_{11} = |1 - k_1 m_1|_M \bmod m_1$, where $k_1$ is the multiplicative inverse of $m_1$ modulo $m_3 m_2$, e.g., $k_1 m_1 = 1 \bmod m_3 m_2$:

$$a_{11} = |1 - k_1 m_1|_M \bmod m_1 = (1 - k_1 m_1 + nM) \bmod m_1 \quad (5.8)$$

Since both $k_1 m_1$ and nM, where n is an integer, are multiples of $m_1$, $a_{11} = 1$, therefore $B_1 = a_{11} x_1 =$
For the latter point, demonstrating that $B_2 + m_2 |B_3|_{m_3} < 2m_3 m_2$:

$$B_2 + m_2 |B_3|_{m_3} = a_{12} x_1 + a_{22} x_2 + m_2 |B_3|_{m_3} \le m_2 (m_1 - 1) + m_2 (m_2 - 1) + m_2 (m_3 - 1) \quad (5.9)$$

For the chosen moduli set, $m_i > 2m_{i-1}$, leading to:

$$m_2 (m_1 - 1) + m_2 (m_2 - 1) + m_2 (m_3 - 1) \le 2m_1 (m_1 - 1) + 2m_1 (2m_1 - 1) + 2m_1 (4m_1 - 1) = 14m_1^2 - 2m_1 \quad (5.10)$$

Therefore, $2m_3 m_2 \le 2(4m_1)(2m_1) = 16 m_1^2$. Hence:

$$B_2 + m_2 |B_3|_{m_3} \le 14 m_1^2 - 2m_1 < 16 m_1^2 \quad (5.11)$$

and the second point is proven. Actually, some of the moduli in Table 5.1 do not satisfy the condition $m_i > 2m_{i-1}$, like the set {2,3,8191}. However, the initial assumption is that $m_i > \Sigma_{j=1}^{i-1} m_j$, automatically satisfied if $m_i > 2m_{i-1}$; in this case the same results are valid. This condition is not satisfied only for the set {31,32,63}, being 63=32+21, nevertheless it can be shown that the $a_{ij}$ are small enough for the previous relationships to hold. In fact, the characteristic matrix for the set {31,32,63} is:

$$\begin{pmatrix} a_{11} & a_{21} & a_{31} \\ a_{12} & a_{22} & a_{32} \\ a_{13} & a_{23} & a_{33} \end{pmatrix} = \begin{pmatrix} 1 & 0 & 0 \\ 1 & 31 & 0 \\ 2 & 1 & 56 \end{pmatrix} \quad (5.12)$$

Therefore, being $2m_3 m_2 = 4032$:

$$B_2 + m_2 |B_3|_{m_3} \le 30 + 31*31 + 32*62 \le 2975 < 4032 \quad (5.13)$$

Hence, the second point is proven even for this kind of moduli. This further demonstration is not a general theorem but was proven to be true for the set {31,32,63}.

Figure 58:
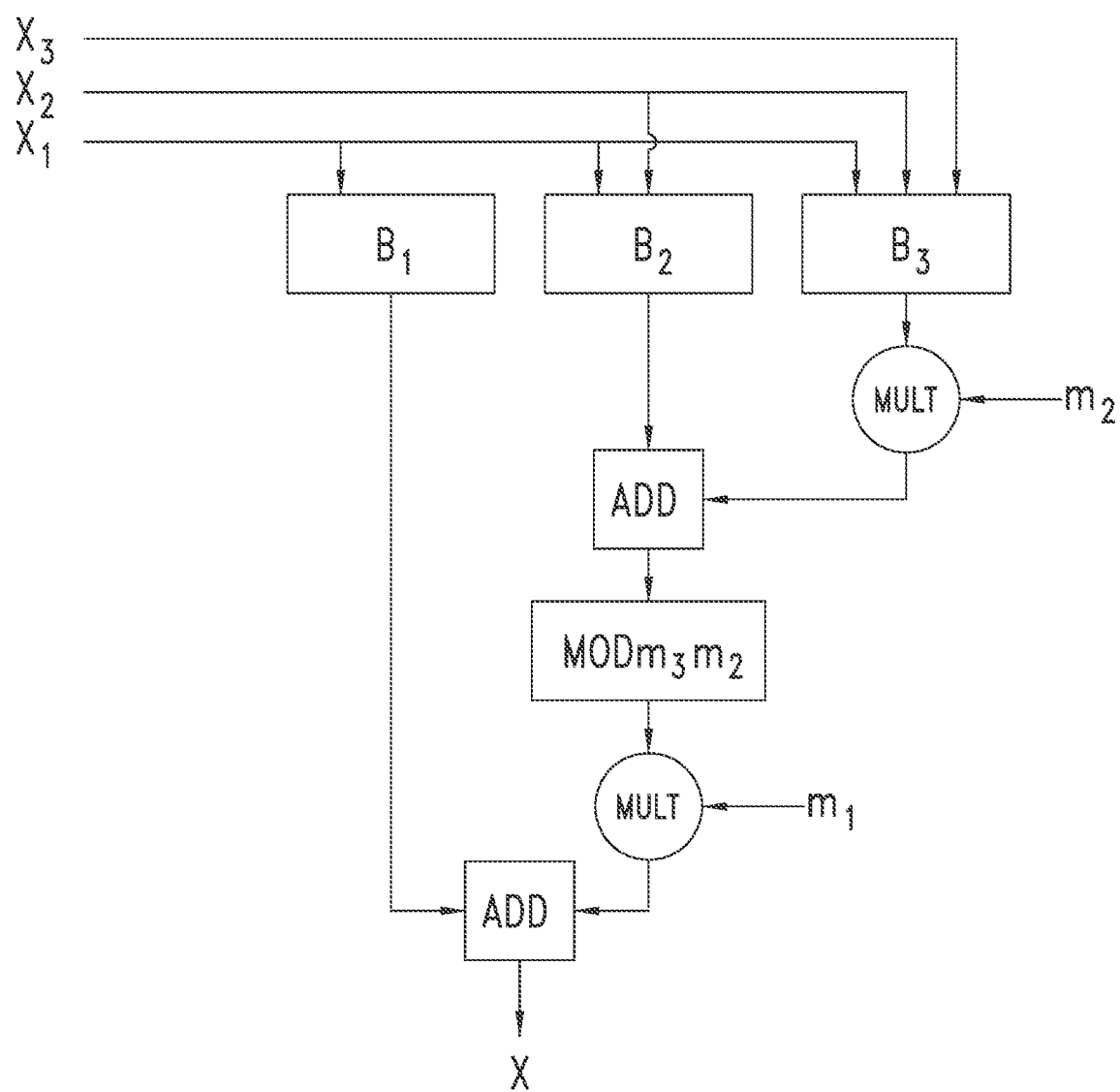
FIG. 58 illustrates an exemplary embodiment of a modulo $m_3 m_2$ backward converter in accordance with techniques described herein.
Figure 59:
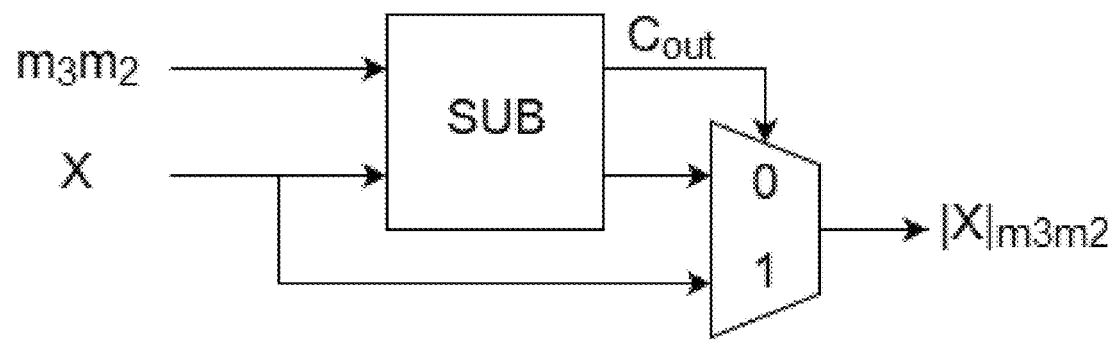
FIG. 59 depicts a modulo $m_3 m_2$ sign selection block for use in a backward converter.

The modulo $m_3 m_2$ reduction can be implemented in one embodiment as depicted in FIG. 58, by subtraction of $m_3 m_2$ from the quantity $A=B_2+m_2|B_3|_{m_3}$ extended of 1 bit for sign detection, and checking whether the result is positive or negative, selecting a result between A or $A-m_3m_2$ with a multiplexer, as conceptually depicted in FIG. 59. If the result is negative, it means that A is already smaller than $m_3m_2$, therefore A is selected; if positive, A was larger or equal to $m_3m_2$, therefore $A-m_3m_2$ is selected. Both results are reduced of 1 bit since the result is always implicitly positive in the residual domain.

Moreover, in the described implementation, the multiply-and-accumulate units' output of moduli $2^m-1$ kind are not reduced, so, as stated earlier, the backward conversion block performs a modulo reduction operation on these inputs prior to their actual conversion to the standard domain.

For example, for the {8,63,127} base (3, 6 and 7 bits), multiply-and-accumulate units' output will be $\tilde{x}_3$, $\tilde{x}_2$ and $x_1$, respectively on 9, 8 and 3 bits. Therefore, $\tilde{x}_3$ and $\tilde{x}_2$ are reduced to $x_3=|\tilde{x}_3|_{m_3}$ and $x_2=|\tilde{x}_2|_{m_2}$. However, since $B_3$ already utilizes a modulo $m_3$ reduction, $\tilde{x}_3$ can be used in place of $x_3$, and the same delayed modulo reduction approach used for multiply-and-accumulate units can be applied in the backward converter.

In addition, $|B_3|_{m_3}$ is obtained by means of a multi-operand modulo adder which adds up the partitions of the products $a_{13}x_1$, $a_{23}x_2$ and $a_{33}\tilde{x}_3$. In fact, being the moduli set of $\{2^{l_1}, 2^{l_2}-1, 2^{l_3}-1\}$ kind, the elements $a_{i3}$ at most of $l_3$ bits, $x_1$ of $l_1$ bits, $x_2$ of $l_2$ bits and $\tilde{x}_3$ of $l_3+2$ bits, the products will be respectively on $l_1+l_3$, $l_2+l_3$ and $2l_3+2$ bits. Therefore, the multi-operand modulo adder will add 4 words of $l_3$ bits, 1 word of $l_2$ bits, 1 word of $l_1$ bits and 1 word of 2 bits, and its output will be on $l_3+6$ bits.

Figure 60:
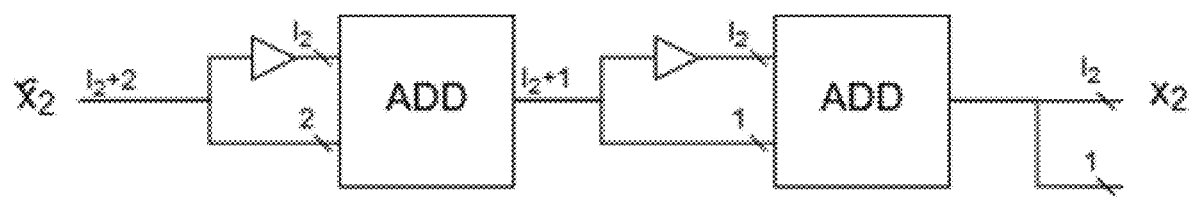
FIG. 60 illustrates a modulo reduction block in accordance with techniques described herein.

This output is still to be reduced, thus a second multi-operand modulo adder will add up the partitions of the first multi-operand modulo adder's output, e.g., $l_3$ least significative bits and the remaining 6 most significative bits if $l_3 \geq 6$, or $$b = \left[\frac{l_3+6}{l_3}\right]$$

words of $l_3$ bits and 1 word of $|l_3+6|_{m_3}$ if $l_3<6$. Since in Table 5.1 there is no $m_3$ such that $l_3<6$, the second multi-operand modulo adder can be replaced with a standard modular adder. The total number of addition operations utilized is independent from the moduli choice and the output will be on $l_3+1$ bits. A conceptual configuration is illustrated in FIG. 60.

Figure 61:
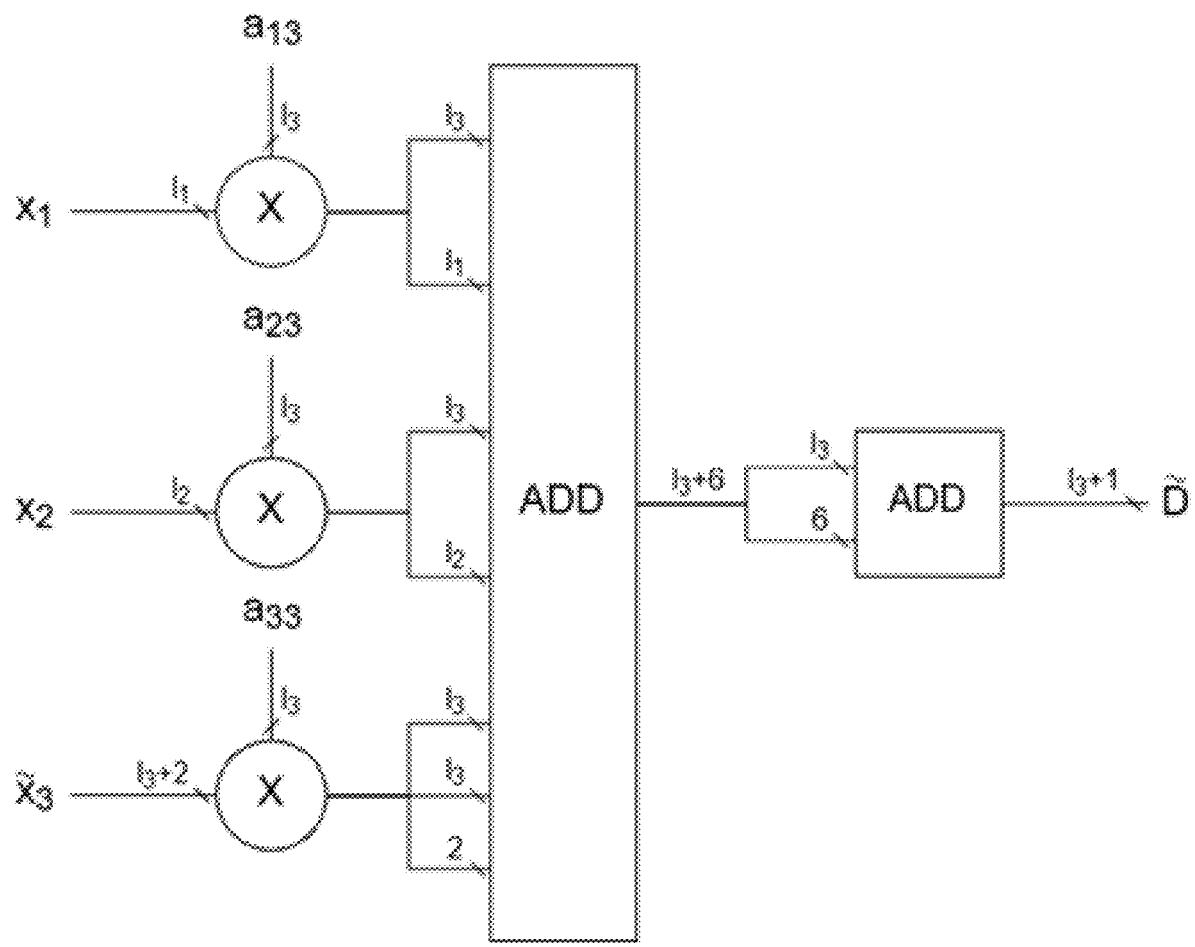
FIG. 61 illustrates an exemplary implementation of an end-around carry operation in accordance with techniques described herein.

In principle, an end-around carry operation should be performed on $|B_3|_{m_3}$ evaluated as described above to pass from $l_3+1$ to $l_3$ bits; however, since a second, modulus $m_3m_2$, reduction operation is performed on $B_2+m_2|B_3|_{m_3}$, the end-around carry can be ignored if the result is less than $2m_3m_2$. This was demonstrated experimentally for each moduli set in Table 5.1. Therefore, instead of $D=|B_3|_{m_3}$ of $l_3$ bits, $\tilde{D}$ of $l_3+1$ bits is computed and fed to the next stage of conversion. This is depicted in FIG. 61.

Figure 62:
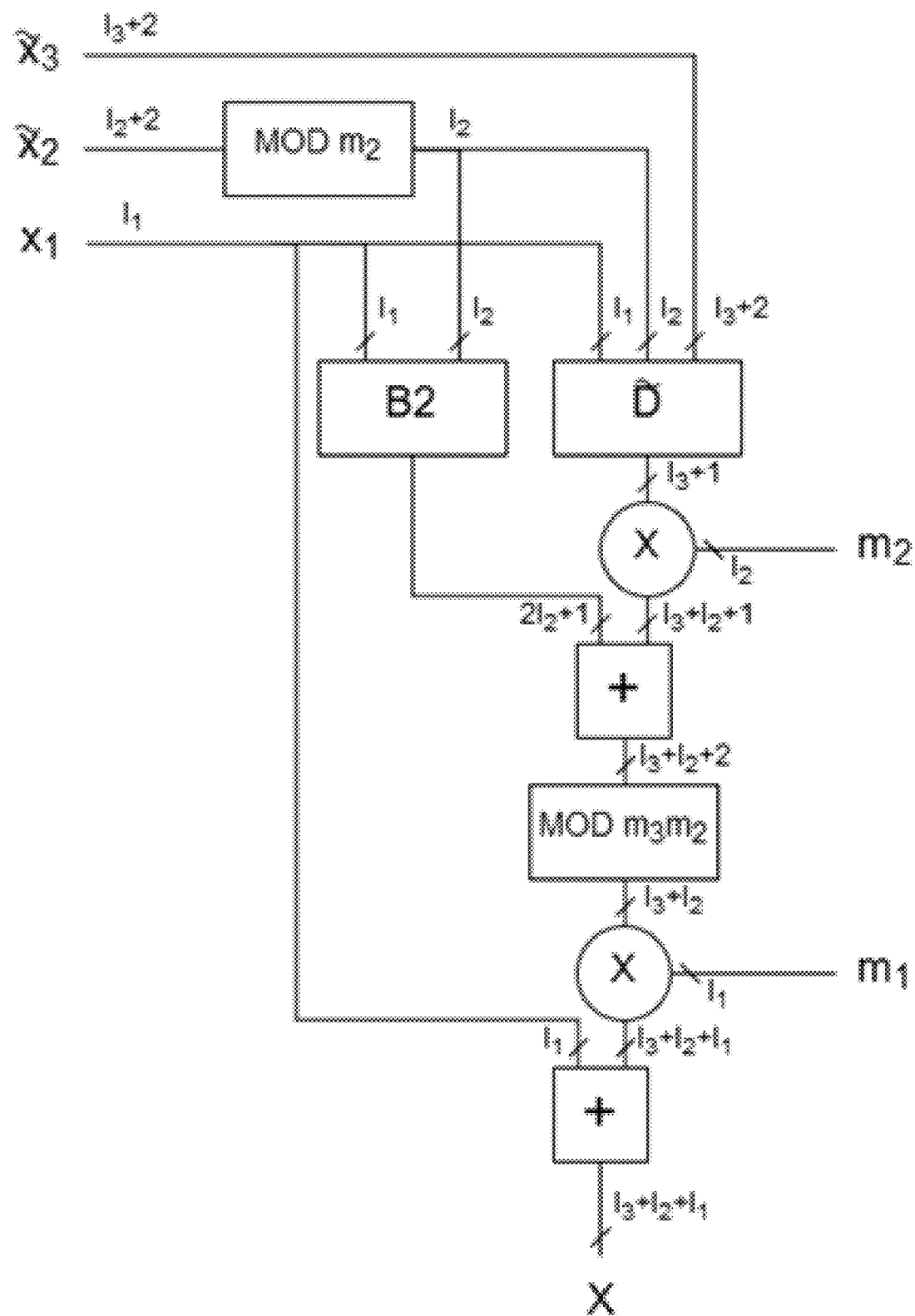
FIG. 62 illustrates an exemplary embodiment of a backward converter in accordance with techniques described herein.

An embodiment of a backward converter is shown in FIG. 62. It will be appreciated that with these optimizations, the area of the backward converter was reduced by about 50% with respect to a standard backward converter implementation based on the New Chinese Remainder Theorem I. This is of particular interest due to the fact that the described implementation shows an area reduction even though the modulo reduction operations that should have been performed in the multiply-and-accumulate units were performed in this block.

The BWC is based on the New Chinese Remainder Theorem I (New CRT-I), which, for 3-moduli sets such that $m_i > 2m_{i-1}$, is stated as:

$$X=B_1+m_1B_2+m_1m_2|B_3|_{m_3} \mod M \quad (2)$$

$$B_1=a_{11}x_1, B_2=a_{12}x_1+a_{22}x_2, B_3=a_{13}x_1+a_{23}x_2+a_{33}x_3 \quad (3)$$

The $a_{ij}$ are elements of the so-called characteristic matrix of the RNS. Further simplification of (2) was performed, leading to the described BWC design:

$$X=x_1+m_1|B_2+m_2|B_3|_{m_3}|_{m_3m_2} \quad (4)$$

Equation (4) implies that no large modulo M reduction is utilized, but a smaller 1/231/22 one. For the considered moduli sets, the quantity $A=B_2+m_2|B_3|_{m_3}$ is always smaller than $2m_3m_2$, which means that modulo $m_3m_2$ reduction may be performed by a simple subtraction of $m_3m_2$ from A. Instead of $x_2$ and $x_3$, the MACs provide their unreduced versions $x_2\%$ and $x_3\%$. $x_2\%$ is reduced as shown in the FWC section. On the other hand, there is no need to reduce $x_3\%$ since it will be multiplied by $a_{33}$ and then undergo a modulo $m_3$ reduction. $B_3$ is evaluated with a MOA that adds up the partitions of the products $a_{13}x_1$, $a_{23}x_2$ and $a_{33}x_3\%$. The MOA adds 7 words of at most $l_3$ bits, thus its output will be on $l_3+6$ bits. This output is reduced likewise, adding $l_3$ and 6 bits, being $l_3 \geq 6$. The output, denoted $\tilde{D}$, will be on $l_3+1$ bits, thus being unreduced. Since a modulo $m_3m_2$ reduction will be performed on A, the reduction of $\tilde{D}$ can be ignored, being $B_2+m_2\tilde{D}<2m_3m_2$.

5.4 Results

All the building blocks were implemented as stand-alone units. To perform an evaluation of the timing constraints, the designs were synthesized with additional banks of registers as input and output stages, even though, in principle, they behave as fully-combinatorial blocks.

Therefore, the metrics of interest are Combinational Area, Total Area, Slack and Power Consumption; however, with regard to power consumption, only raw estimations were performed. Both combinational and total area are described in terms of number of equivalent logic gates.

Indeed, the final, integrated design of the whole convolutional accelerator will be even more optimized (e.g. some non-combinatorial circuitry may be unnecessary), thus the results presented here are most likely an underestimation of the true achievable performances.

5.4.1 Moduli Sets Comparison

As described in Section 3.2.7, selecting the best moduli set for a specific application is significant. A comparison in performances was performed between some of the moduli sets depicted in Table 5.1 to understand which one is the most beneficial, particularly with regard to both area and achievable dynamic range.

The selected moduli sets are the following:
$\{2^1, 2^2-1, 2^{13}-1\}=\{2, 3, 8191\}$, M=49146
$\{2^1, 2^7-1, 2^8-1\}=\{2, 127, 255\}$, M=64770
$\{2^2, 2^3-1, 2^{11}-1\}=\{4, 7, 2047\}$, M=57316
$\{2^3, 2^4-1, 2^9-1\}=\{8, 15, 511\}$, M=61320
$\{2^3, 2^6-1, 2^7-1\}=\{8,63,127\}$, M=64008
$\{2^4, 2^5-1, 2^7-1\}=\{16, 31,127\}$, M=62992

The equivalent range that can be obtained on 16-bit is $2^{16}=65536$. The comparison is also made with a standard 32-bit multiply-and-accumulate unit.

The synthesis of the designs were obtained with a constrained clock frequency of 1 GHz and a CMOS 28 nm library in the corner case of a slow process, −40° C. and 0.80 V.

Figure 63:
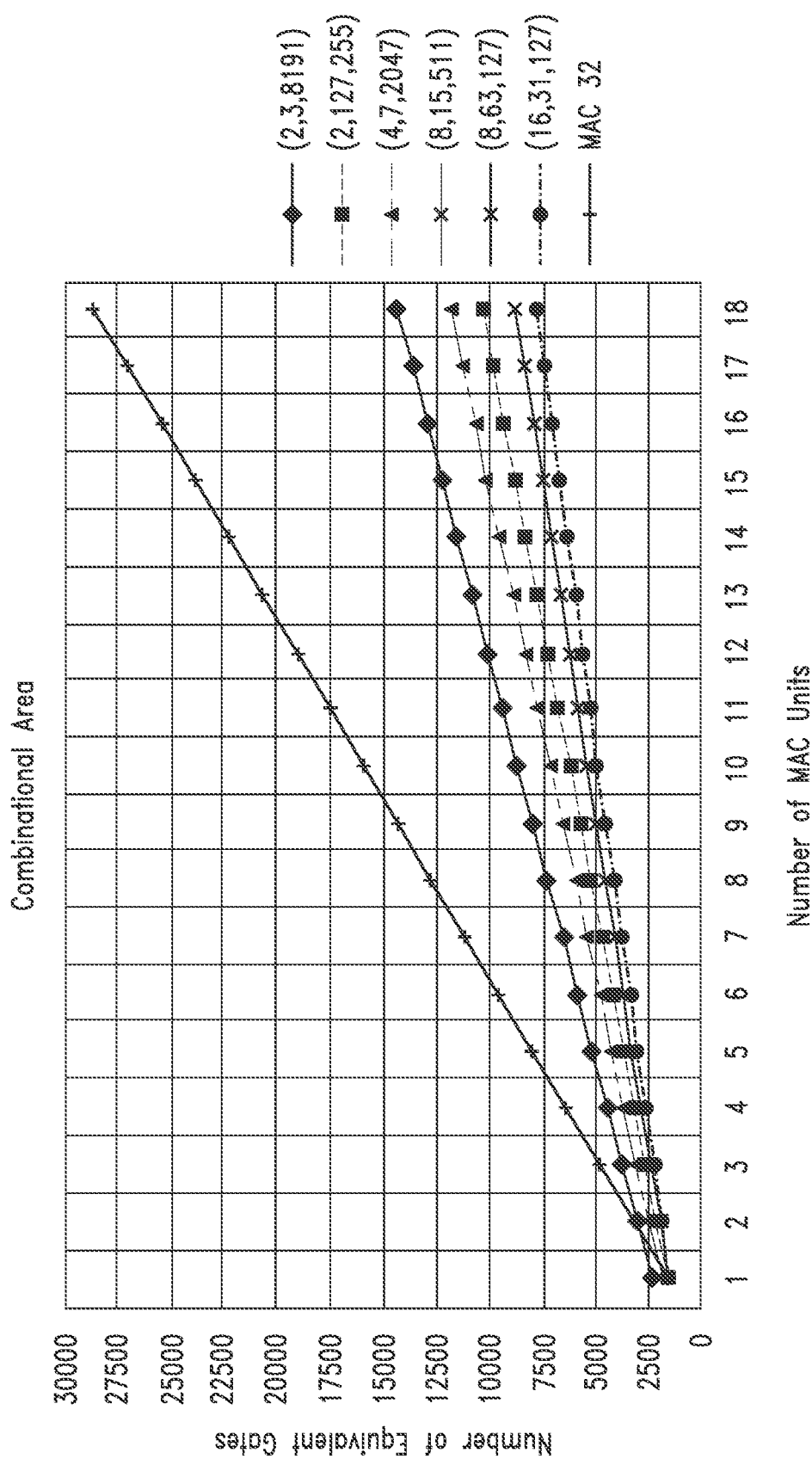
FIG. 63 illustrates relative combinational area based on a quantity of utilized MAC units for a variety of selected moduli sets.
Figure 64:
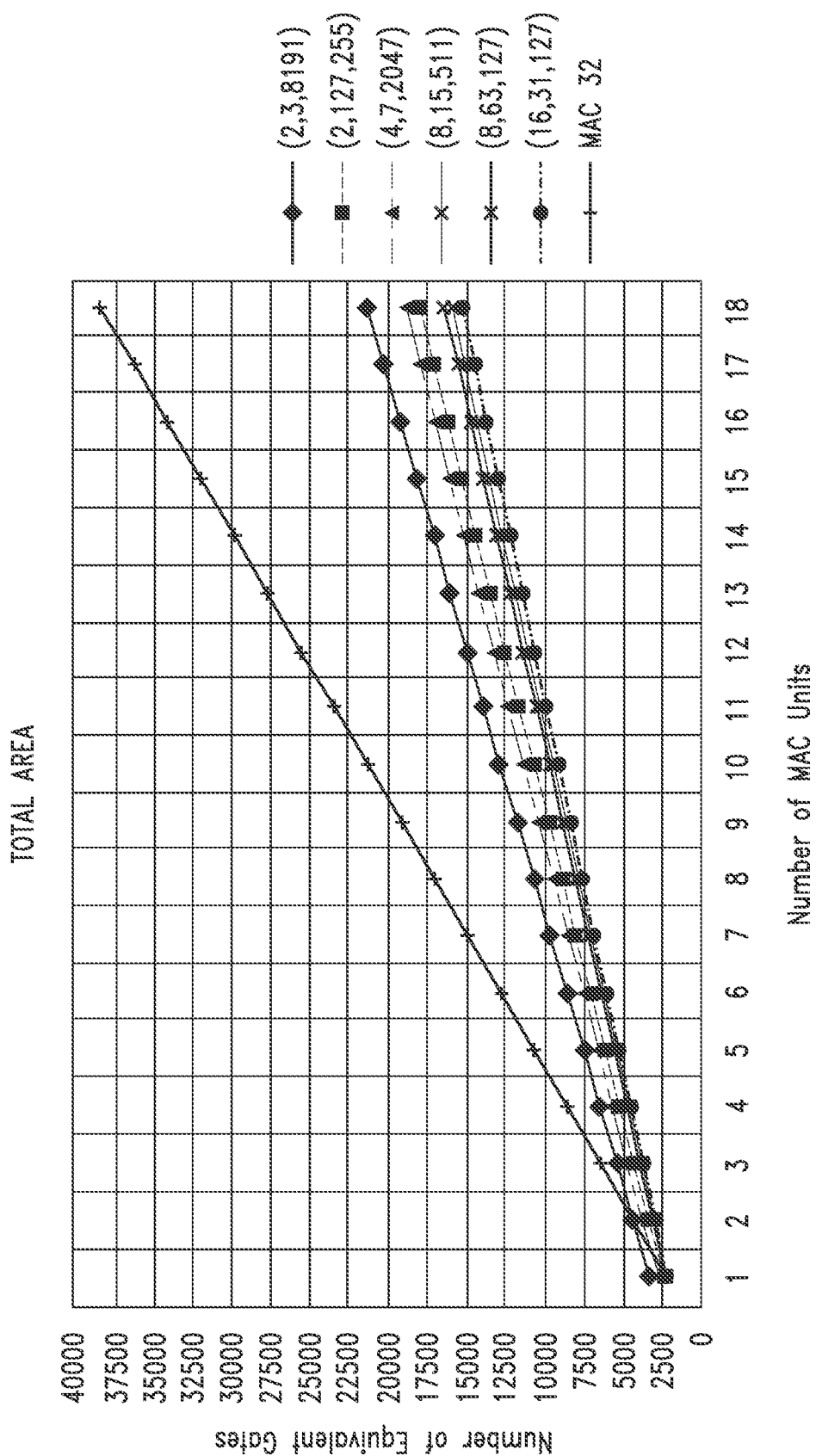
FIG. 64 illustrates relative total area based on a quantity of utilized MAC units for a variety of selected moduli sets.

FIG. 63 and FIG. 64 show how the overall area of the described designs grows when clusters of multiply-and-accumulate units are formed. Indeed, only one forward converter and one backward converter are utilized for each cluster.

The area of a cluster is evaluated as:

$$N_{MAC} * A_{MAC} + A_{FWD} + A_{CRT} \quad (5.14)$$

where $N_{MAC}$ is the number of multiply-and-accumulate units per cluster, $A_{MAC}$ is the area of a single unit, $A_{FWD}$ is the area of the forward converter and $A_{CRT}$ is the area of the backward converter; the last two terms are zero for the standard 32-bit multiply-and-accumulate unit. It is evident that the benefits of such an arrangement increase with increasing $N_{MAC}$. However, as stated in Section 5.2, a minimum number of converters may be utilized to provide for flexibility and multiple chaining and/or forking, so the number of multiply-and-accumulate units per cluster cannot grow indefinitely.

Figure 65:
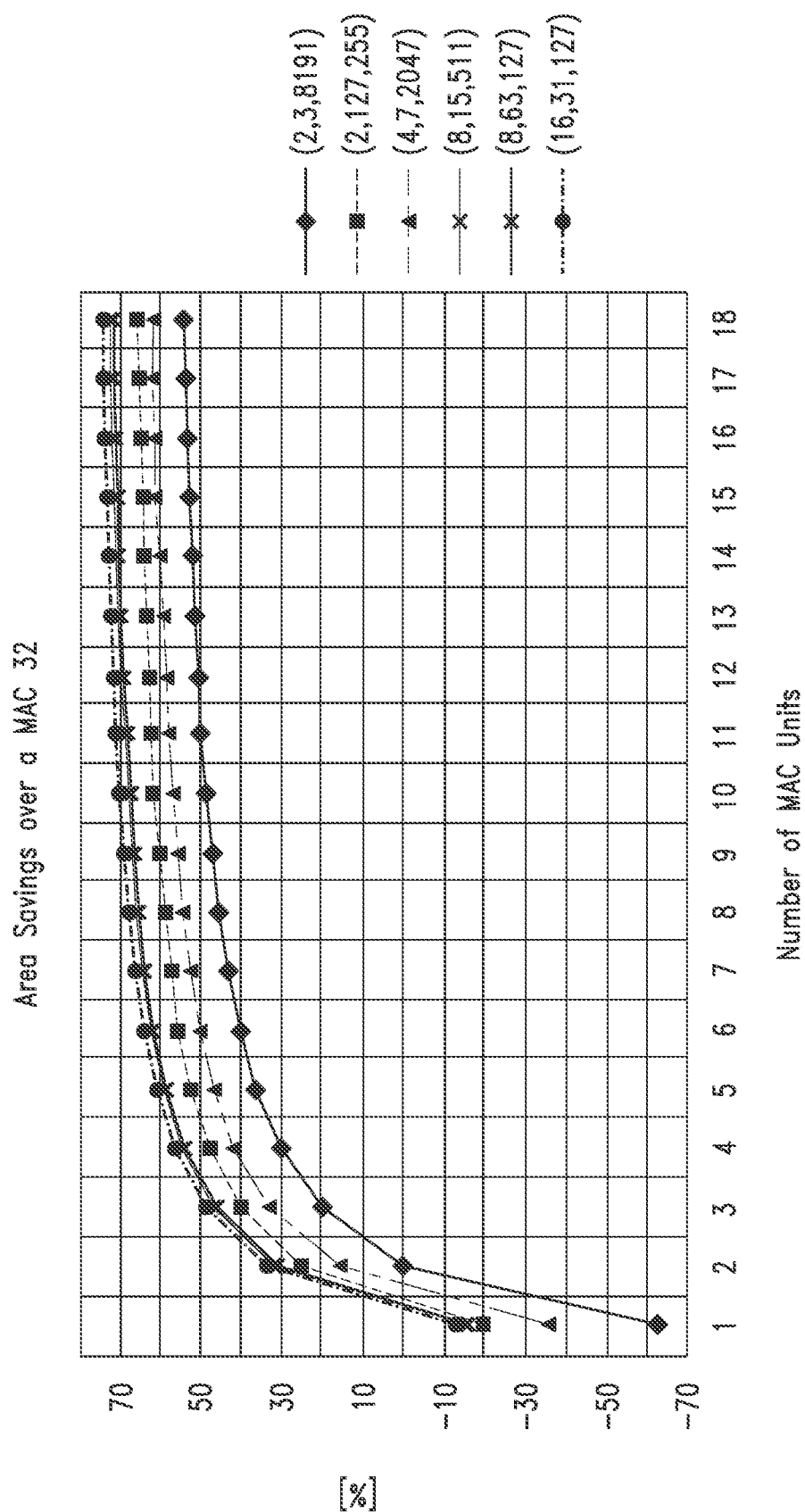
FIG. 65 illustrates relative area savings based on a quantity of utilized MAC units for a variety of selected moduli sets.

FIG. 65 shows the percentage of area reduction of residue accelerators with respect to the standard 32-bit implementation, with increasing number of multiply-and-accumulate units per cluster. It is evident that instantiating a single multiply-and-accumulate unit per cluster leads to a greater area than a standard implementation, as expected. Also, there are benefits even with just $N_{MAC}=2$.

However, the impact on the area reduction tends to quickly decrease, so $N_{MAC}$ do not need to be too much large.

Figure 66:
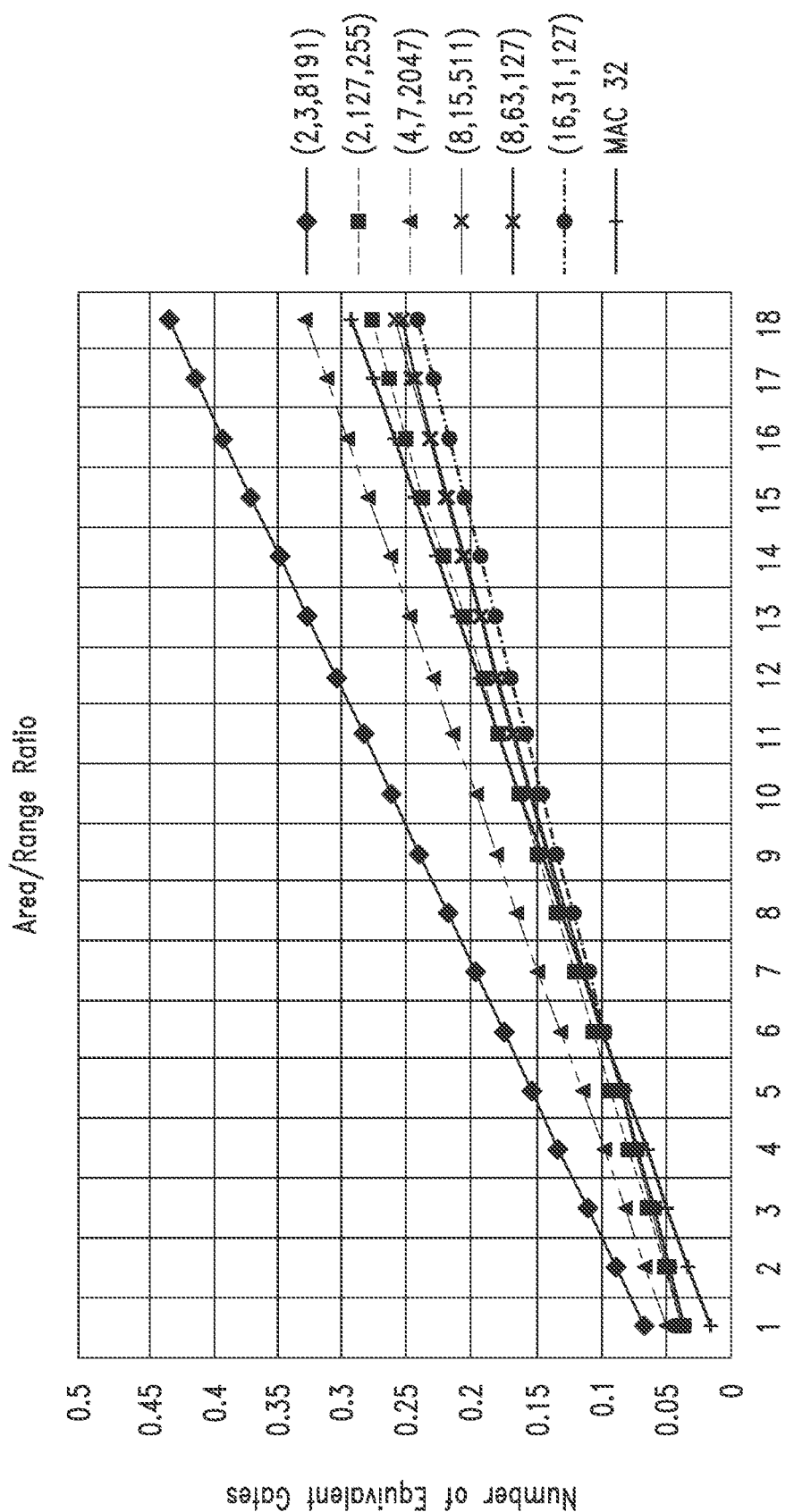
FIG. 66 illustrates relative area/range ratios based on a quantity of utilized MAC units for a variety of selected moduli sets.

To determine which moduli set is the most beneficial not only from an area occupation perspective but also to achieve a large dynamic range, the ratio between area and range is evaluated. The higher the ratio, the lowest the performances are, since low area and high range are desired. This is shown in FIG. 66.

Figure 67:
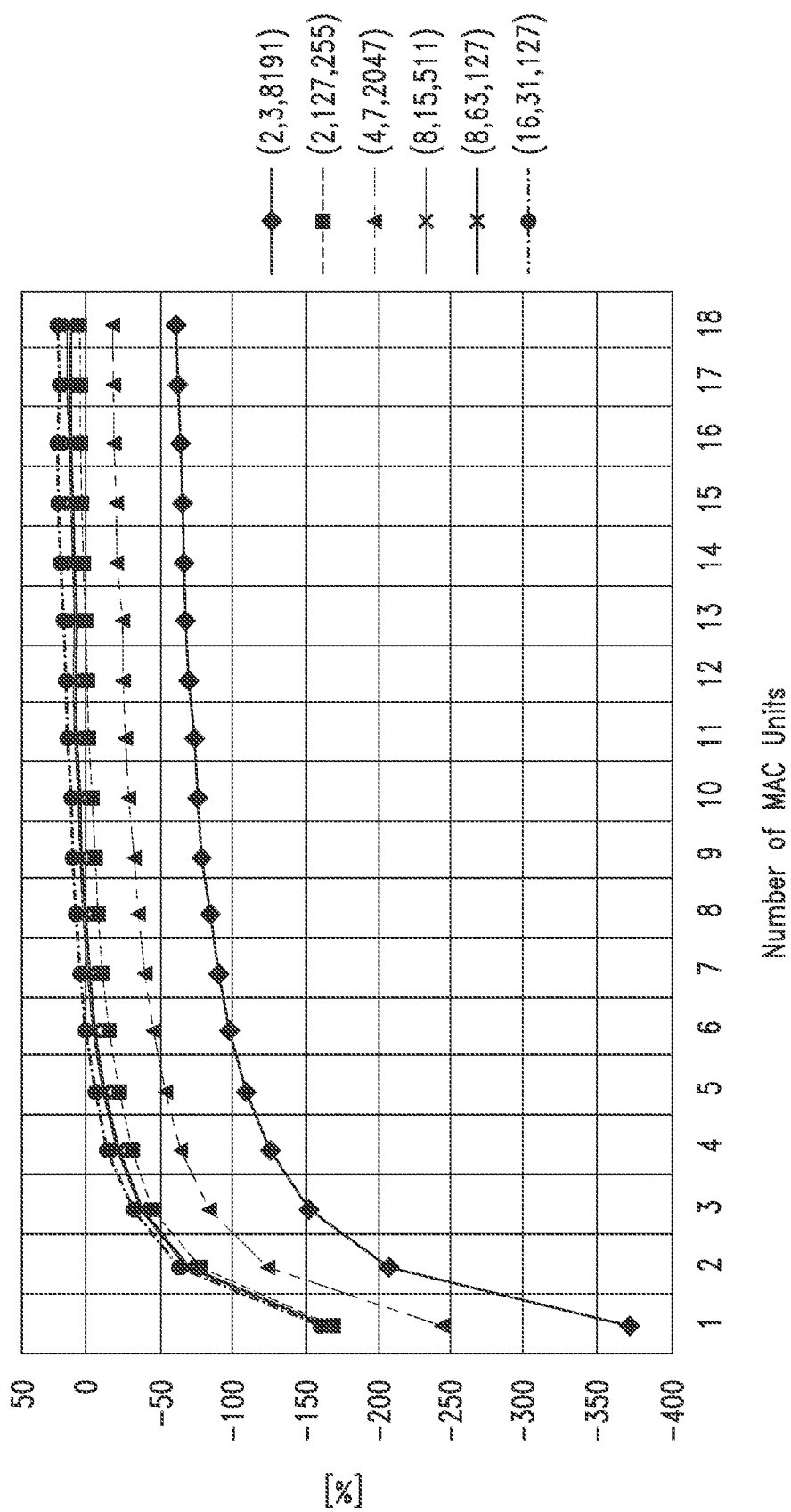
FIG. 67 illustrates relative area/range savings based on a quantity of utilized MAC units for a variety of selected moduli sets.

It is evident that the standard 32-bit implementation has the lowest ratio for $N_{MAC} \leq 7$, and some moduli sets become competitive above this number. Moduli {2, 3, 8191} and {4, 7, 2047} are always worse than the standard 32-bit implementation. As before, the ratio area-over-range percentage with respect to the 32-bit implementation is shown in FIG. 67. According to this parameter, there are benefits in term of area-over-range only above approximately $N_{MAC}=7$. If accuracy is less significant, smaller $N_{MAC}$ may be considered, like $N_{MAC}=3$.

From the above analysis, it is evident that the best moduli set is {16, 31,127} both in terms of area and dynamic range efficiency; the best dynamic range is obtained by {2, 127, 255}, which is also competitive with {16, 31,127} area-wise. The moduli sets with a single large modulus, {2, 3, 8191} and {4, 7, 2047}, are both very inefficient from a dynamic range perspective, and show a larger area than the other moduli sets.

5.4.2 Corner Cases Comparison

In what follows, a comparison of area, power and timing over different corner cases with regard to the moduli set {8, 63, 127} is issued. Only the multiply-and-accumulate unit was taken into account.

Figure 68:
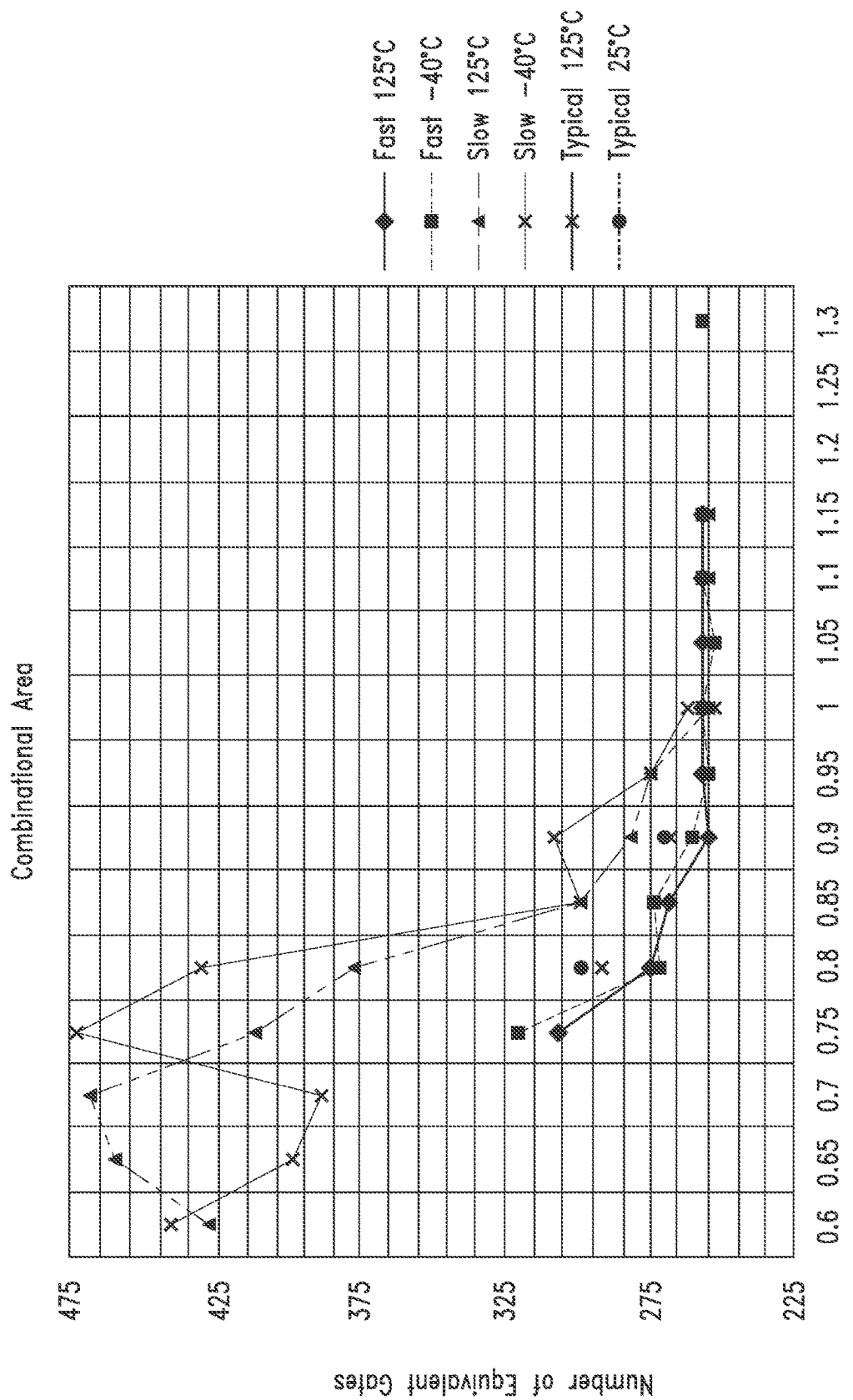
FIG. 68 illustrates relative combinatorial areas across a range of respective voltages for a variety of selected corner cases.

In FIG. 68, the combinatorial area with respect to the voltage is shown within different corner cases. The cases are described by the following labels:

TABLE 5.3

| Corner Cases of Test | | | | | |
|---|---|---|---|---|---|
| Process | $T_{max}$ | $T_{min}$ | $V_{max}$ | $V_{min}$ | $\Delta V$ |
| Fast | 125° C. | −40° C. | 1.3 | 0.75 | 0.05 |
| Slow | 125° C. | −40° C. | 1 | 0.6 | 0.05 |
| Typical | 125° C. | 25° C. | 1 | 0.8 | 0.1 |

It is evident that the overall area of a multiply-and-accumulate unit can increase up to approximately a factor of 2, and that the worst performances are due to the slow processes. With increasing temperature, the area tends to decrease but it has no strong impact on the fast and typical processes. Finally, area decreases with increasing voltage: for the fast and typical processes, the decrease of area is within the 25% of the smallest value, whereas for the slow process this reduction is more dramatic.

Figure 69:
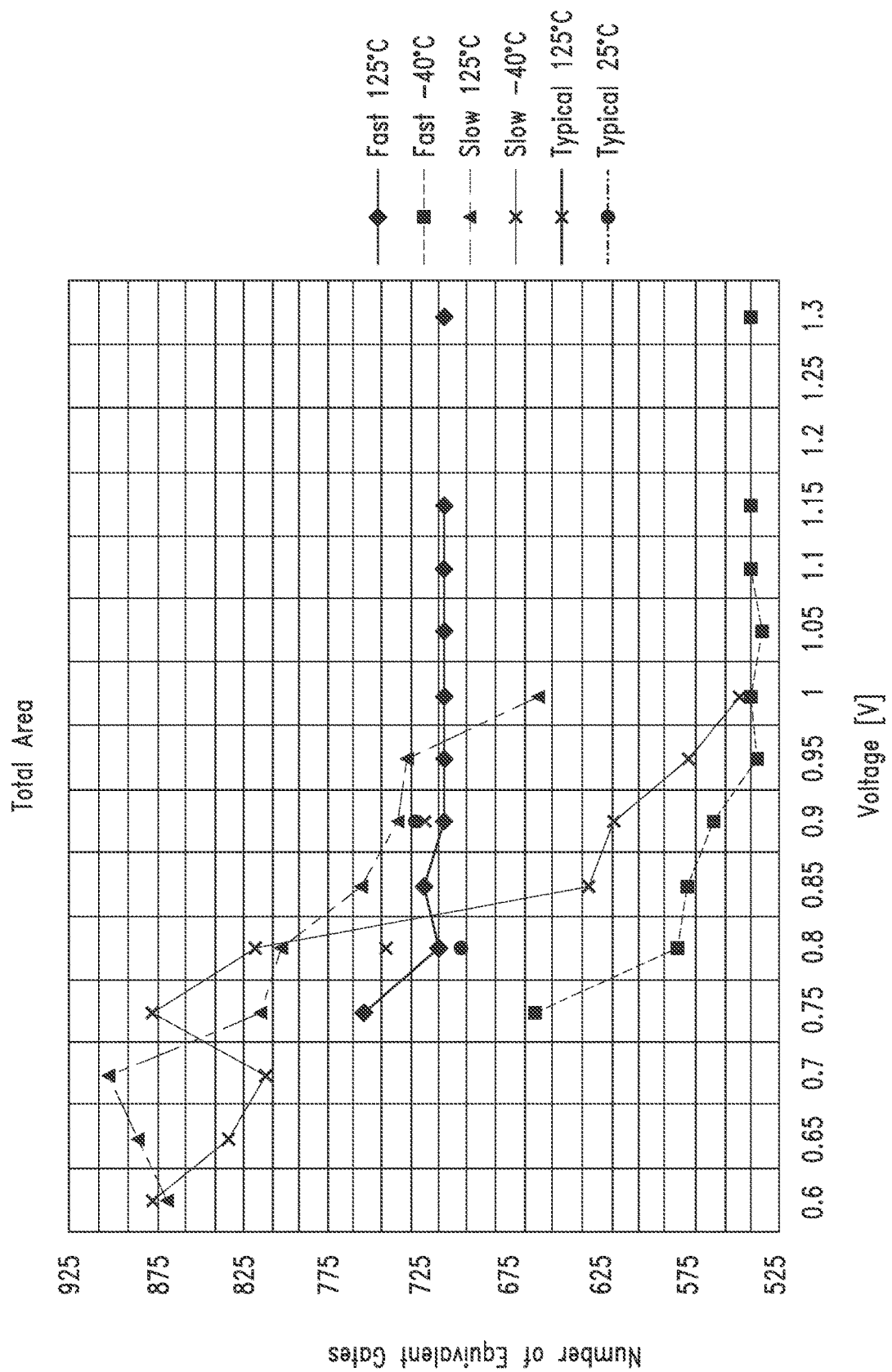
FIG. 69 illustrates relative total areas across a range of respective voltages for a variety of selected corner cases.
Figure 70:
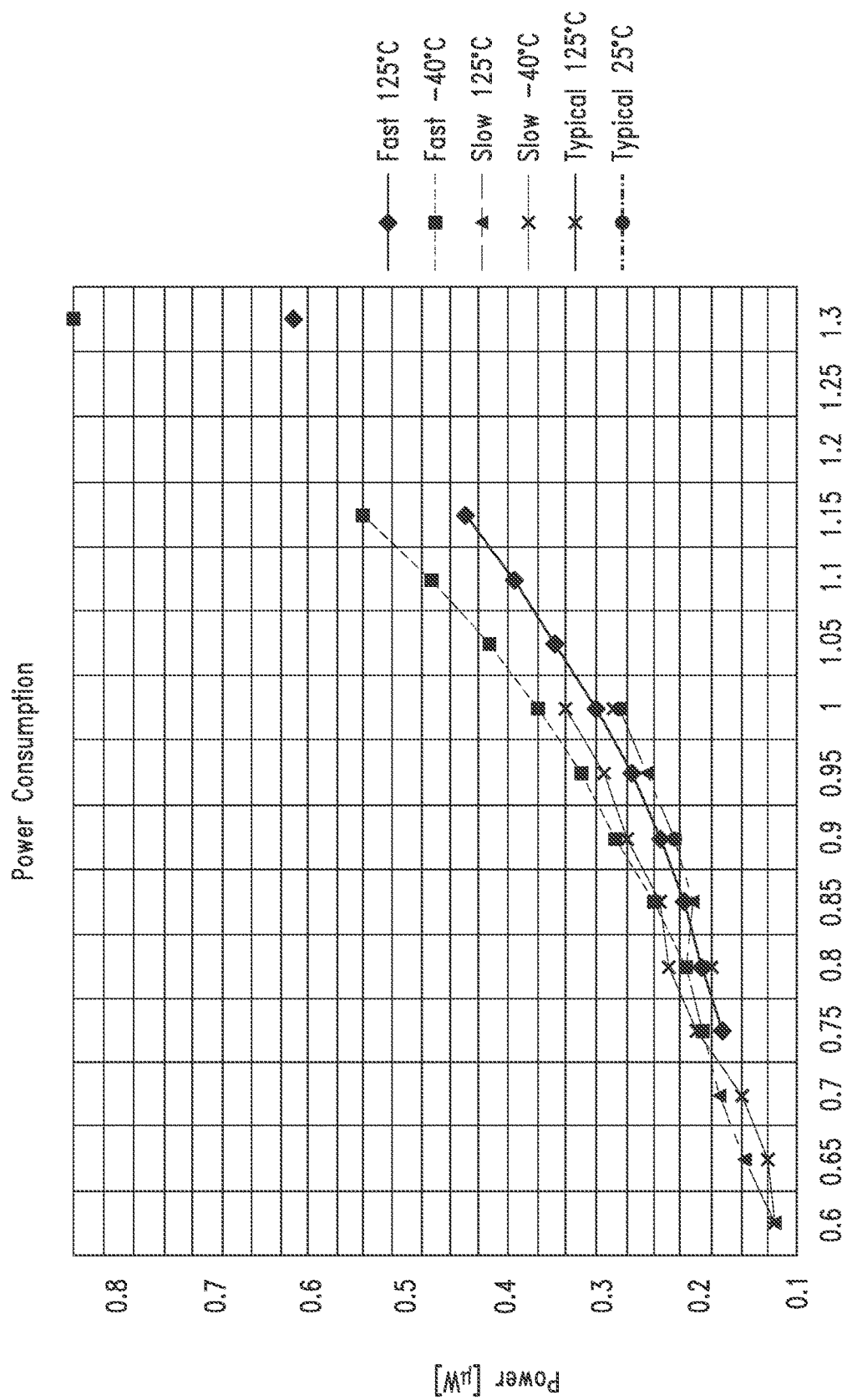
FIG. 70 illustrates relative power consumption across a range of respective voltages for a variety of selected corner cases.
Figure 71:
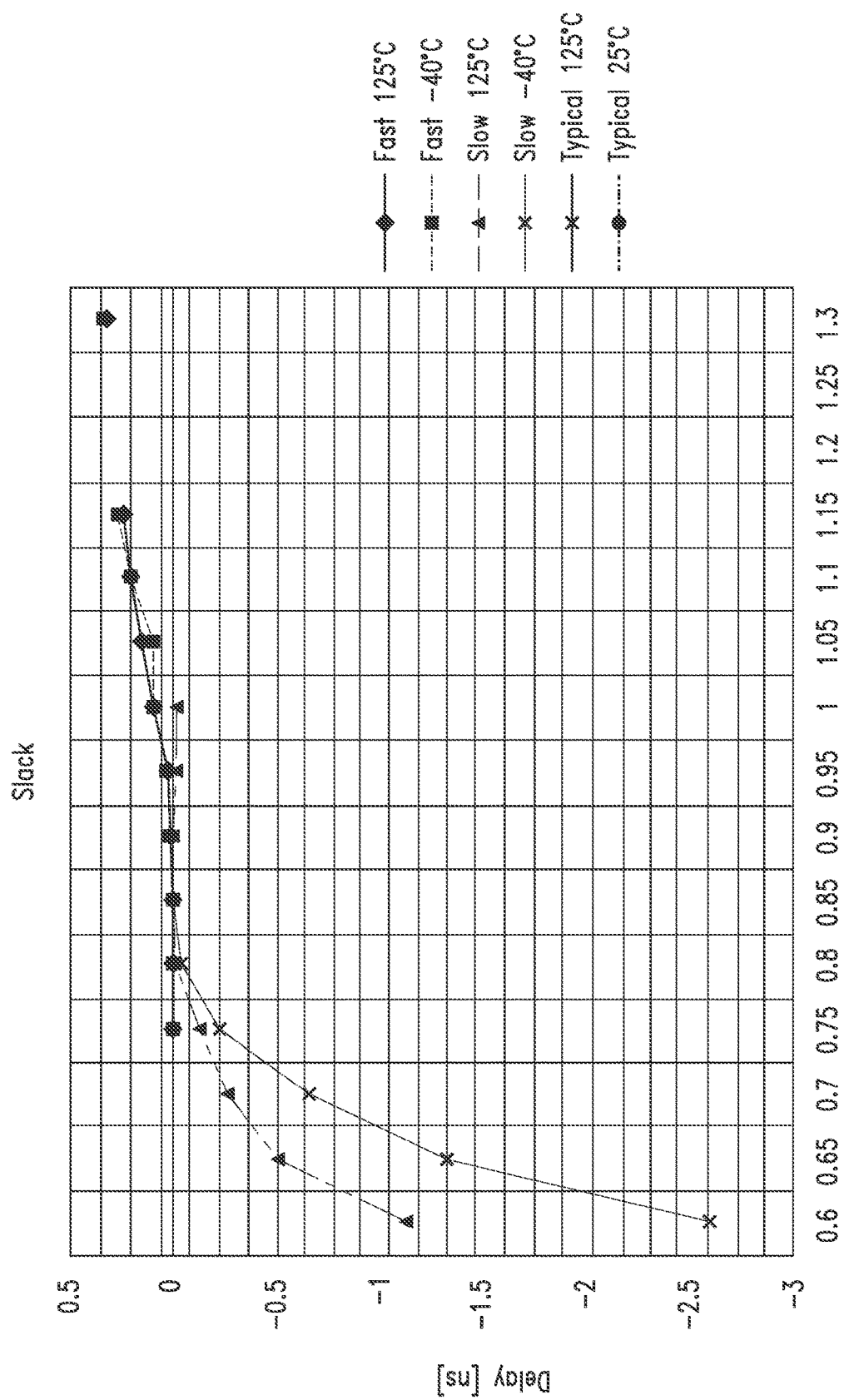
FIG. 71 illustrates relative slack across a range of respective voltages for a variety of selected corner cases.

In FIG. 69, FIG. 70 and FIG. 71, the total area, the power consumption and the slack with respect to the voltage are shown within different corner cases. As expected, both power consumption and slack increase with the voltage.

5.4.3 Clustering Comparison

In this section, the overall combinational and total area of a convolutional accelerator are shown with respect to how clustering of the multiply-and-accumulate units is performed.

Figure 72:
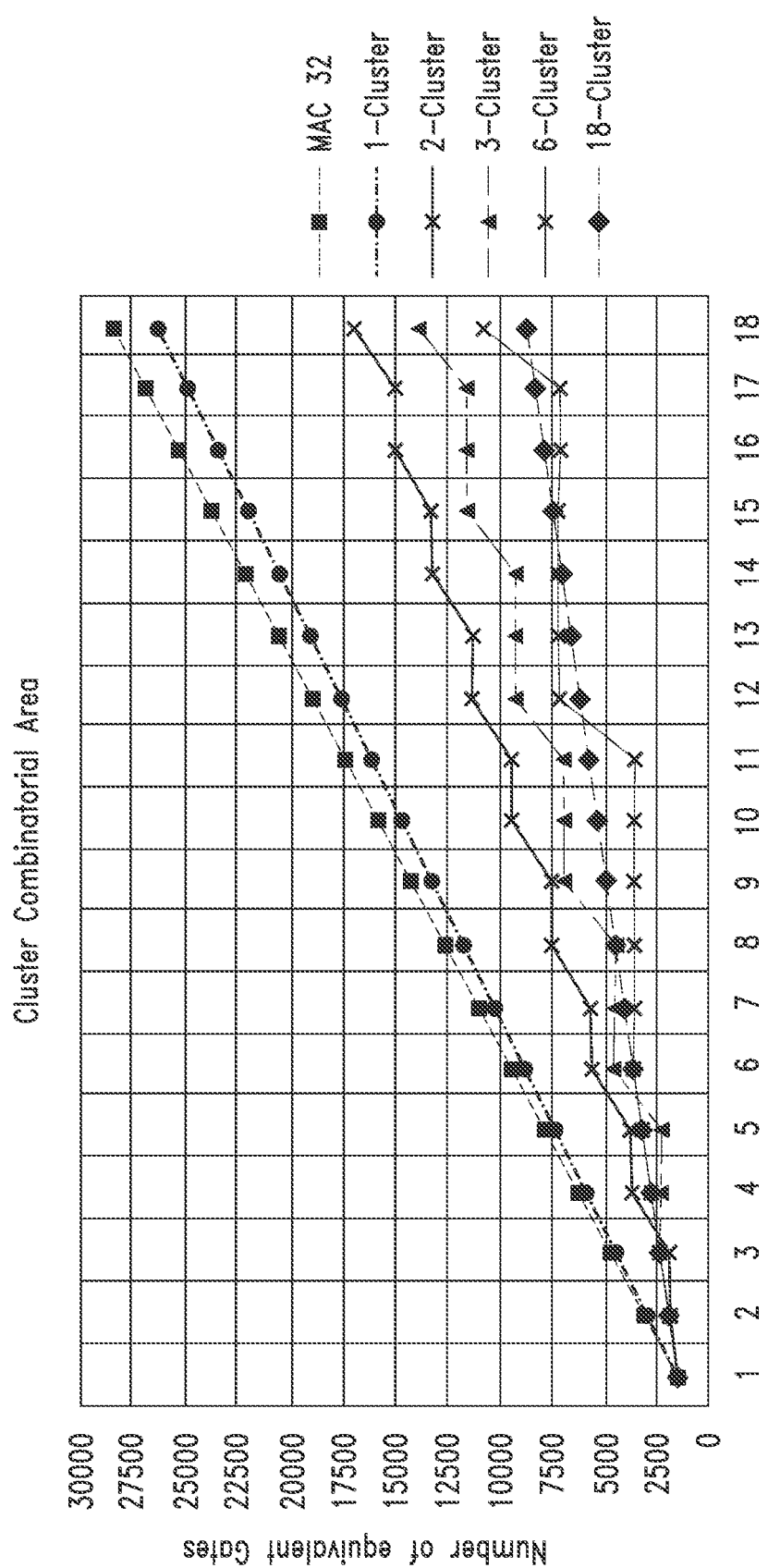
FIG. 72 illustrates relative cluster combinatorial areas based on a quantity of utilized MAC units for a variety of selected cluster types.
Figure 73:
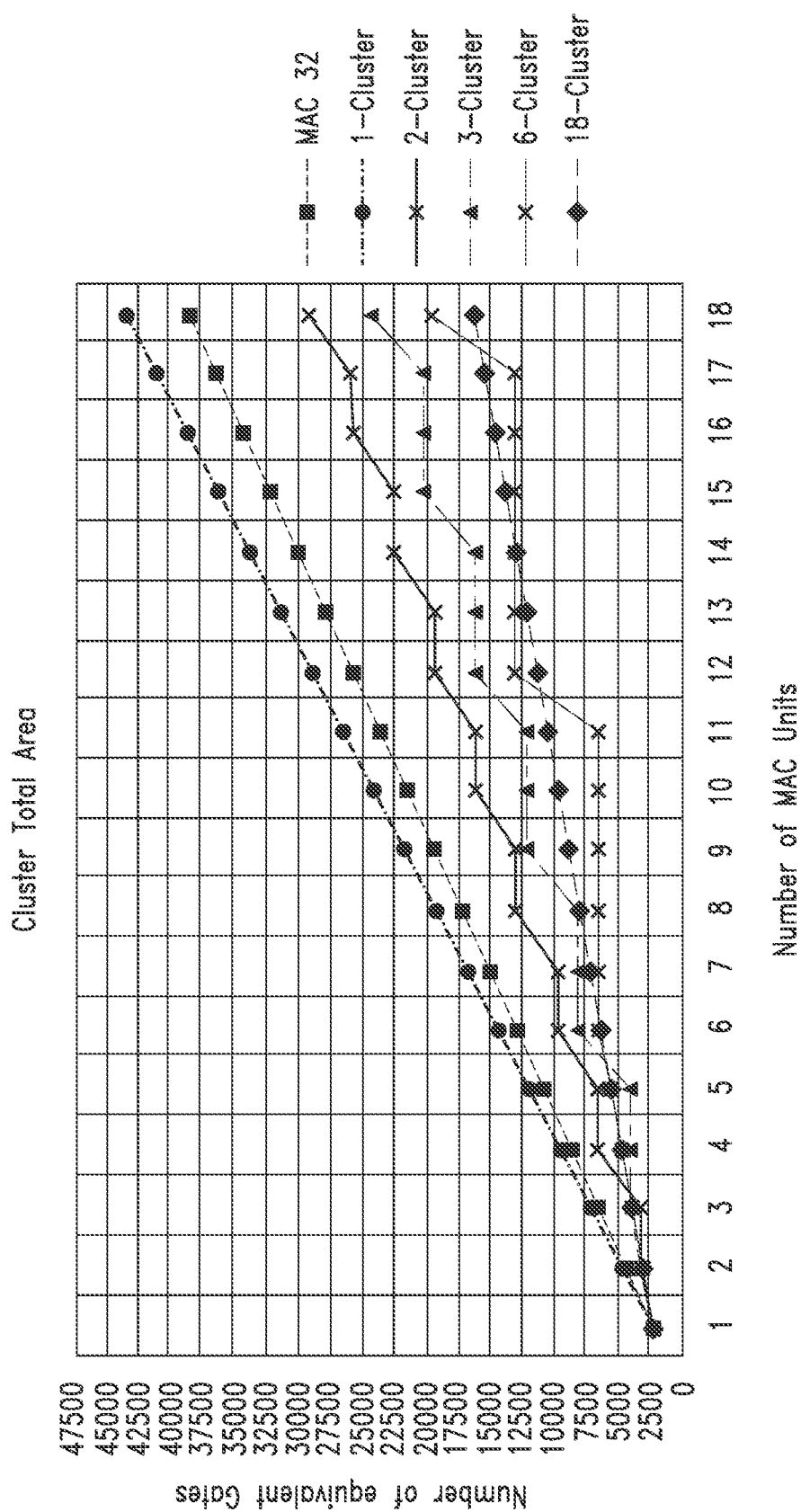
FIG. 73 illustrates relative cluster total areas based on a quantity of utilized MAC units for a variety of selected cluster types.

In FIG. 72 and FIG. 73 are shown the area for clustering of $N_{MAC}=1, 2, 3, 6$ and 18, e.g., a backward and a forward converter are instantiated for each cluster. It is evident that the larger $N_{MAC}$ is, the smaller the area is. Furthermore, one would expect a clustering of $N_{MAC}=1$ to occupy a larger area than the standard 32-bit implementation: although this is true for the total area, from the standpoint of combinational area a benefit still exists.

Figure 74:
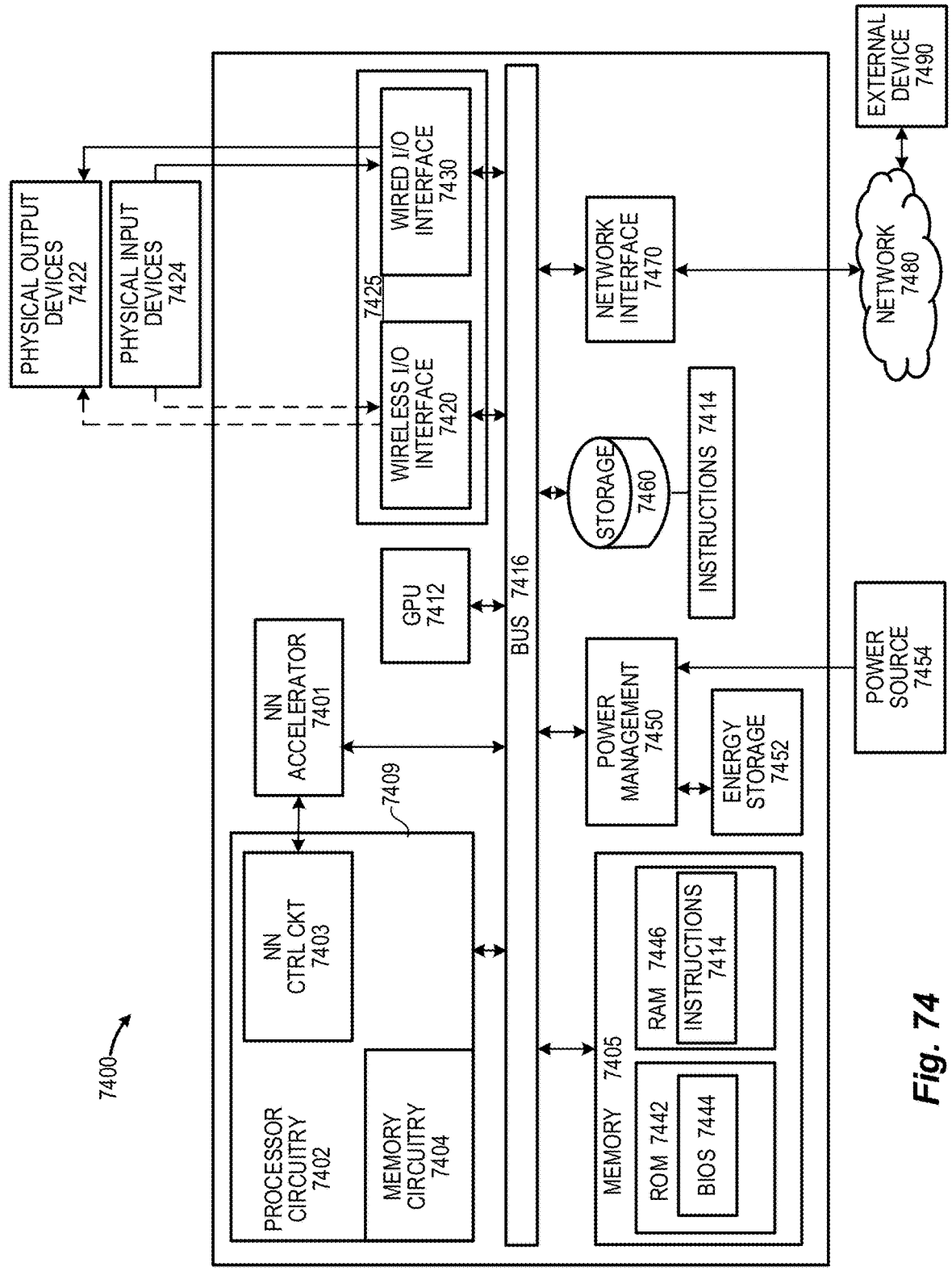
FIG. 74 depicts an embodiment of a processor-based device in which a convolution accelerator operates in conjunction with a system-on-chip and a coupled co-processor subsystem to provide an accelerated neural network in accordance with one or more techniques presented herein.

FIG. 74 is a schematic diagram of an exemplary electronic processor-based device 7400 that includes a neural network accelerator subsystem 7401 in accordance with techniques described herein. In the depicted embodiment, a semiconductor package 7409 includes processor circuitry 7402 and on-chip processor memory circuitry 7404 (e.g., SRAM memory such as cache memory circuitry or LLC memory circuitry) configurable to provide neural network control circuitry 7403 capable of performing operations to provide a neural network (such as a CNN, DCNN, ANN, or other neural network) in conjunction with the neural network accelerator 7401. In the depicted embodiment, the processor-based device 7400 additionally includes the following: a graphical processing unit 7412, a wireless input/output (I/O) interface 7420, a wired I/O interface 7430, system memory 7405, power management circuitry 7450, a non-transitory storage device 7460, and a network interface 7470. The following discussion provides a brief, general description of the components forming the illustrative processor-based device 7400. As a non-limiting example, the processor-based device 7400 may comprise: a smartphone or other mobile computing device, wearable computer, portable computing device, handheld computing device, desktop computing device, server, blade server device, workstation, etc.

In at least the depicted embodiment, the processor-based device 7400 includes graphics processor circuitry 7412 capable of executing machine-readable instruction sets and generating an output signal capable of providing a display output to a system user. Those skilled in the relevant art will appreciate that the illustrated embodiments as well as other embodiments may be practiced with other processor-based device configurations, including portable electronic or handheld electronic devices such as smartphones, portable computers, wearable computers, consumer electronics, personal computers ("PCs"), network PCs, minicomputers, server blades, mainframe computers, and the like. The processor circuitry 7402 may include any number of hardwired or configurable circuits, some or all of which may include programmable and/or configurable combinations of electronic components, semiconductor devices, and/or logic elements that are disposed partially or wholly in a PC, server, or other computing system capable of executing machine-readable instructions.

The processor-based device 7400 includes a bus or similar communications link 7416 that communicatively couples and facilitates the exchange of information and/or data between various system components including the processor circuitry 7402, the graphics processor circuitry 7412, one or more interfaces 7425 (including wireless I/O interfaces 7420 and one or more wired I/O interfaces 7430), the system memory 7405, one or more storage devices 7460, and/or one or more network interfaces 7470. It will be appreciated that although the processor-based device 7400 may be referred to herein as a singular device, this is not intended to limit the embodiments to a single processor-based device 7400; in certain embodiments, there may be more than one processor-based device 7400 that incorporates, includes, or contains any number of communicatively coupled, collocated, or remote networked circuits or devices.

The processor circuitry 7402 may include any number, type, or combination of currently available or future developed devices capable of executing machine-readable instruction sets. The processor circuitry 7402 may include but is not limited to any current or future developed single- or multi-core processor or microprocessor, such as: one or more systems on a chip (SOCs); central processing units (CPUs); digital signal processors (DSPs); graphics processing units (GPUs); application-specific integrated circuits (ASICs), programmable logic units, field programmable gate arrays (FPGAs), and the like. Unless described otherwise, the construction and operation of the various blocks shown in FIG. 74 will be readily apprehended by those skilled in the relevant art, and need not be described in further detail herein. The bus 7416 that interconnects at least some of the components of the processor-based device 7400 may employ any currently available or future developed serial or parallel bus structures or architectures.

In embodiments, the processor circuitry 7402 and the on-chip processor memory circuitry 4804 are disposed in a semiconductor package 7409. The semiconductor package 7409 may additionally include the neural network control circuitry 7403. In some implementations, the processor circuitry 7402 may provide all or a portion of either or both the neural network control circuitry 7403.

The system memory 7405 may include read-only memory ("ROM") 7442 and random access memory ("RAM") 7446. A portion of the ROM 7442 may be used to store or otherwise retain a basic input/output system ("BIOS") 7444. The BIOS 7444 provides basic functionality to the processor-based device 7400, for example by causing the processor circuitry 7402 to load and/or execute one or more machine-readable instruction sets 7414. In embodiments, at least some of the one or more machine-readable instruction sets may cause at least a portion of the processor circuitry 7402 to provide, create, produce, transition, and/or function as a dedicated, specific, and particular machine—including, as non-limiting examples: a word processing machine, a digital image acquisition machine, a media playing machine, a gaming system, a communications device, a smartphone, or other dedicated machines.

The processor-based device 7400 may include at least one wireless input/output (I/O) interface 7420. The at least one wireless I/O interface 7420 may be communicatively coupled to one or more physical output devices 7422 (tactile devices, video displays, audio output devices, hardcopy output devices, etc.). The at least one wireless I/O interface 7420 may communicatively couple to one or more physical input devices 7424 (pointing devices, touchscreens, keyboards, tactile devices, etc.). The wireless I/O interface 7420 may include one or more of any currently available or future developed wireless I/O interface, examples of which include but are not limited to a Bluetooth® interface, near field communication (NFC) interface, and the like.

The processor-based device 7400 may include one or more wired input/output (I/O) interfaces 7430. The at least one wired I/O interface 7430 may be communicatively coupled to one or more physical output devices 7422 (tactile devices, video displays, audio output devices, hardcopy output devices, etc.). The at least one wired I/O interface 7430 may be communicatively coupled to one or more physical input devices 224 (pointing devices, touchscreens, keyboards, tactile devices, etc.). The wired I/O interface 7430 may include any currently available or future developed I/O interface. Exemplary wired I/O interfaces include but are not limited to: universal serial bus (USB), IEEE 1394 ("FireWire"), and similar.

The processor-based device 7400 may include one or more communicatively coupled, non-transitory, data storage devices 7460. The data storage devices 7460 may include one or more hard disk drives (HDDs) and/or one or more solid-state storage devices (SSDs). The one or more data storage devices 7460 may include any current or future developed storage appliances, network storage devices, and/or systems. Non-limiting examples of such data storage devices 7460 may include any current or future developed non-transitory storage appliances or devices, such as one or more magnetic storage devices, one or more optical storage devices, one or more electro-resistive storage devices, one or more molecular storage devices, one or more quantum storage devices, or various combinations thereof. In some implementations, the one or more data storage devices 7460 may include one or more removable storage devices, such as one or more flash drives, flash memories, flash storage units, or similar appliances or devices capable of communicable coupling to and decoupling from the processor-based device 7400.

The one or more data storage devices 7460 may include interfaces or controllers (not shown) communicatively coupling the respective storage device or system to the bus 7416. The one or more data storage devices 7460 may store, retain, or otherwise contain machine-readable instruction sets, data structures, program modules, data stores, databases, logical structures, and/or other data useful to the processor circuitry 7402 and/or graphics processor circuitry 7412, and/or one or more applications executed on or by the processor circuitry 7402 and/or graphics processor circuitry 7412. In some instances, one or more data storage devices 7460 may be communicatively coupled to the processor circuitry 7402, for example via the bus 7416 or via one or more wired communications interfaces 7430 (e.g., Universal Serial Bus or USB); one or more wireless communications interfaces 7420 (e.g., Bluetooth®, Near Field Communication or NFC); and/or one or more network interfaces 7470 (IEEE 802.3 or Ethernet, IEEE 802.11, or WiFi®, etc.).

The processor-based device 7400 may include power management circuitry 7450 that controls one or more operational aspects of the energy storage device 7452. In embodiments, the energy storage device 7452 may include one or more primary (i.e., non-rechargeable) or secondary (i.e., rechargeable) batteries or similar energy storage devices. In embodiments, the energy storage device 7452 may include one or more supercapacitors or ultracapacitors. In embodiments, the power management circuitry 7450 may alter, adjust, or control the flow of energy from an external power source 7454 to the energy storage device 7452 and/or to the processor-based device 7400. The power source 7454 may include, but is not limited to, a solar power system, a commercial electric grid, a portable generator, an external energy storage device, or any combination thereof.

For convenience, the processor circuitry 7402, the storage device 7460, the system memory 170, the graphics processor circuitry 7412, the wireless I/O interface 7420, the wired I/O interface 7430, the power management circuitry 7450, and the network interface 7470 are illustrated as communicatively coupled to each other via the bus 7416, thereby providing connectivity between the above-described components. In alternative embodiments, the above-described components may be communicatively coupled in a different manner than illustrated in FIG. 74. For example, one or more of the above-described components may be directly coupled to other components, or may be coupled to each other, via one or more intermediary components (not shown). In another example, one or more of the above-described components may be integrated into the semiconductor package 7409 and/or the graphics processor circuitry 7412. In some embodiments, all or a portion of the bus 7416 may be omitted and the components are coupled directly to each other using suitable wired or wireless connections.

CONCLUSIONS

In this disclosure, a hardware implementation for accelerating convolutions in convolutional neural networks was provided. One or more embodiments described herein are based on the residue representation of kernels and features.

An investigation of the advantages in terms of area, power and delay of the described architecture was presented. In particular, many different hardware implementations were described, and the choice of the best moduli sets for the specific application was further investigated.

The design was optimized exploiting both the properties of convolutional neural networks and the properties of residue number systems. This led to major improvements with regard to area reduction against a standard 32-bit multiply-and-accumulate unit implementation.

In additional embodiments, moduli set of the $2^m+1$ kind may be taken into account for a fully-combinatorial implementation, as well as ROM implementations for arbitrary moduli sets. Moduli sets with many moduli of small magnitude may be employed instead of 3 moduli of the form $2^m$ and $2^m-1$. For the sake of reconfigurability, SIMD structures may be taken into account to improve the throughput with multiple kernels configurations, as well as clock gating to reduce the power consumption when pruning is performed.

The reconfigurability may also regard the moduli sets, allowing run-time selection of the dynamic range if a lower accuracy may be tolerated.

From an algorithmic perspective, Booth recoding of multiplication may be employed, an Approximate Chinese Remainder Theorem can be utilized, and mixed-radix conversion may be preferred over the New Chinese Remainder Theorem if it leads to lower area and dissipation.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A system, comprising:
an addressable memory array;
one or more processing cores; and
an accelerator framework coupled to the addressable memory and including a Multiply ACcumulate (MAC) hardware accelerator cluster, the MAC hardware accelerator cluster having:
a binary-to-residual converter, which, in operation, converts binary inputs to a residual number system, wherein converting a binary input to the residual number system includes a reduction modulo $2^m$ and a reduction modulo $2^m-1$, where m is a positive integer;
a plurality of MAC hardware accelerators, which, in operation, perform modulo $2^m$ multiply-and-accumulate operations and modulo $2^m-1$ multiply-and-accumulate operations; and
a residual-to-binary converter, wherein a MAC hardware accelerator of the plurality of MAC hardware accelerators includes a seven-bit multiply-and-accumulate circuit, a six-bit multiply-and-accumulate circuit, and a three-bit multiply-and-accumulate circuit.

2. The system of claim 1, wherein the accelerator framework comprises a plurality of MAC hardware accelerator clusters.

3. The system of claim 1, wherein the reduction modulo $2^m-1$ is performed based on a property of a periodicity.

4. The system of claim 1, wherein the residual-to-binary converter, in operation, performs reduction operations on outputs of the MAC hardware accelerators.

5. The system of claim 1 wherein, in operation, the accelerator framework multiplies input weight values by input feature values, the weight values are retrieved as residual numbers, and the binary-to-residual converter converts feature values to the residual number system.

6. The system of claim 1, wherein the residual-to-binary converter, in operation, performs conversions based on the Chinese Remainder Theorem.

7. The system of claim 1, wherein the residual-to-binary converter, in operation, performs conversions based on a modified Chinese Remainder Theorem.

8. The system of claim 1, wherein the reduction modulo $2^m$ is performed using the seven-bit multiply-and-accumulate circuit, the reduction modulo $2^m-1$ is performed using the six-bit multiply-and-accumulate circuit, and the six-bit multiply-and-accumulate circuit comprises two six-bit adders.

9. The system of claim 1, wherein the reduction modulo $2^m$ is performed on the m least significant bits of the binary input, and the reduction modulo $2^m-1$ is performed based on a periodicity.

10. A system, comprising:
an addressable memory array;
one or more processing cores; and
an accelerator framework coupled to the addressable memory and including a Multiply ACcumulate (MAC) hardware accelerator cluster, the MAC hardware accelerator cluster having:
- a binary-to-residual converter, which, in operation, converts binary inputs to a residual number system, wherein converting a binary input to the residual number system includes a reduction modulo $2^m$ and a reduction modulo $2^m-1$, where m is a positive integer;
- a plurality of MAC hardware accelerators, which, in operation, perform modulo $2^m$ multiply-and-accumulate operations and modulo $2^m-1$ multiply-and-accumulate operations; and
- a residual-to-binary converter, wherein a MAC hardware accelerator of the plurality of MAC hardware accelerators comprises a (m −1)-bit multiplier and a plurality of logic gates.

11. The system of claim 10, wherein the MAC hardware accelerator comprises a m-bit adder and a register.

12. A Multiply ACcumulate (MAC) hardware accelerator, comprising:
- a binary-to-residual converter, which, in operation, converts binary inputs to a residual number system, wherein converting a binary input to the residual number system includes a reduction modulo $2^m$ and a reduction modulo $2^m-1$, where m is a positive integer;
- a MAC circuit, which, in operation, performs modulo $2^m$ multiply-and-accumulate operations and modulo $2^m-1$ multiply-and-accumulate operations; and
- a residual-to-binary converter, wherein the MAC circuit includes a seven-bit multiply-and-accumulate circuit, a six-bit multiply-and-accumulate circuit, and a three-bit multiply-and-accumulate circuit.

13. The MAC hardware accelerator of claim 12, wherein the residual-to-binary converter, in operation, performs reduction operations on outputs of the MAC circuit.

14. The MAC hardware accelerator of claim 12 wherein, in operation, the MAC circuit multiplies input weight values by input feature values, the weight values are retrieved as residual numbers, and the binary-to-residual converter converts feature values to the residual number system.

15. The MAC hardware accelerator of claim 12, wherein the reduction modulo $2^m$ is performed using the seven-bit multiply-and-accumulate circuit, the reduction modulo $2^m-1$ is performed using the six-bit multiply-and-accumulate circuit, and the six-bit multiply-and-accumulate circuit comprises two six-bit adders.

16. The MAC hardware accelerator of claim 12, wherein the reduction modulo $2^m$ is performed on the m least significant bits of the binary input, and the reduction modulo $2^m-1$ is performed based on a periodicity.

17. The MAC hardware accelerator of claim 12, comprising a second MAC circuit.

18. A Multiply ACcumulate (MAC) hardware accelerator, comprising:
- a binary-to-residual converter, which, in operation, converts binary inputs to a residual number system, wherein converting a binary input to the residual number system includes a reduction modulo $2^m$ and a reduction modulo $2^m-1$, where m is a positive integer;
- a MAC circuit, which, in operation, performs modulo $2^m$ multiply-and-accumulate operations and modulo $2^m-1$ multiply-and-accumulate operations; and
- a residual-to-binary converter, wherein the MAC circuit comprises a (m −1)-bit multiplier and a plurality of logic gates.

19. The MAC hardware accelerator of claim 18 wherein the MAC circuit comprises a m-bit adder and a register.

20. A method, comprising:
- converting, using a binary-to-residual converter, a binary input to a residual number system, the converting including a reduction modulo $2^m$ and a reduction modulo $2^m-1$, where m is a positive integer;
- multiplying, using a Multiple ACcumulate (MAC) circuit, the converted binary input by a second input, the multiplying including a modulo $2^m$ multiply-and-accumulate operation and a modulo $2^m-1$ multiply-and-accumulate operation; and
- generating, using a residual-to-binary converter, a binary output based on a result of the multiplying, wherein the MAC circuit comprises a (m −1)-bit multiplier and a plurality of logic gates.

21. The method of claim 20, comprising performing the reduction modulo $2^m-1$ based on a property of a periodicity.

22. The method of claim 20, wherein the second input is a weight value in a residual number format, and the binary input is a feature value.

23. The method of claim 22, comprising generating an output of a convolutional neural network based on the binary output.

24. The method of claim 20, wherein generating the binary output includes applying the Chinese Remainder Theorem.

25. The method of claim 20, wherein generating the binary output includes applying a modified Chinese Remainder Theorem.

* * * * *